United States Patent [19]
Fukutani et al.

[11] Patent Number: 5,661,694
[45] Date of Patent: Aug. 26, 1997

[54] PROGRAMMABLE SEMICONDUCTOR MEMORY DEVICE

[75] Inventors: Yutaka Fukutani; Tomohiro Nakayama; Seizi Hirayama; Waichiro Fujieda; Arayama Youji; Atsushi Fujii; Yoshitaka Takahashi; Masanori Nagasawa; Masakazu Kimura; Tutomu Taniguti; Hiroyuki Fujimoto, all of Kawasaki, Japan

[73] Assignee: Fujitsu Limited, Kawasaki, Japan

[21] Appl. No.: 237,303

[22] Filed: May 3, 1994

[30] Foreign Application Priority Data

| May 14, 1993 | [JP] | Japan | 5-113458 |
| Dec. 13, 1993 | [JP] | Japan | 5-312303 |
| Feb. 18, 1994 | [JP] | Japan | 6-021479 |
| Feb. 18, 1994 | [JP] | Japan | 6-021480 |

[51] Int. Cl.[6] .................................................. G11C 8/00
[52] U.S. Cl. ...................... 365/233.5; 365/233; 365/194; 365/193; 365/195
[58] Field of Search .................. 365/230.01, 233, 365/233.5, 194, 193, 195

[56] References Cited

U.S. PATENT DOCUMENTS

| 4,858,197 | 8/1989 | Aono et al. | 365/233.5 |
| 5,243,575 | 9/1993 | Sambandan et al. | 365/233.5 |

*Primary Examiner*—Viet Q. Nguyen
*Attorney, Agent, or Firm*—Staas & Halsey

[57] ABSTRACT

A semiconductor memory device is provided with terminals for receiving a chip enable signal and an address signal, an internal circuit, and an internal control signal generating circuit for generating a predetermined internal control signal which makes an output timing of the semiconductor memory device same regardless of a level of the address signal when the chip enable signal undergoes a transition from an inactive level to an active level. The internal circuit is deactivated in response to the inactive level of the chip enable signal and is activated in response to the active level of the chip enable signal.

7 Claims, 96 Drawing Sheets

BIT LINE

FIG. 12
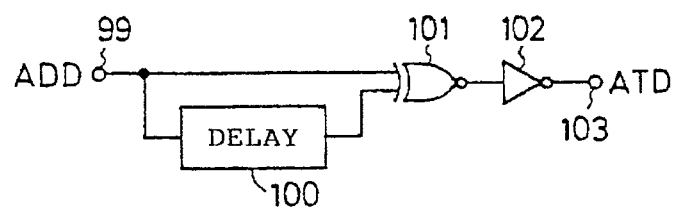
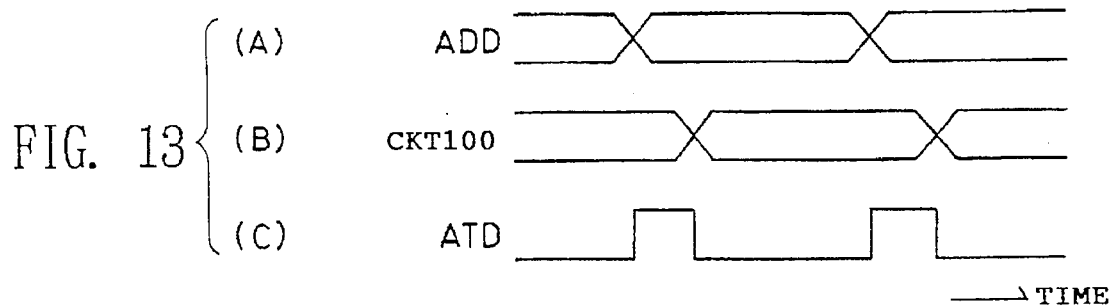
FIG. 13

FIG. 25
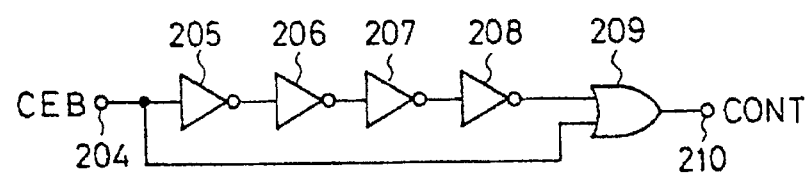
FIG. 26 {
(A) CEB
(B) INV 208
(C) CONT
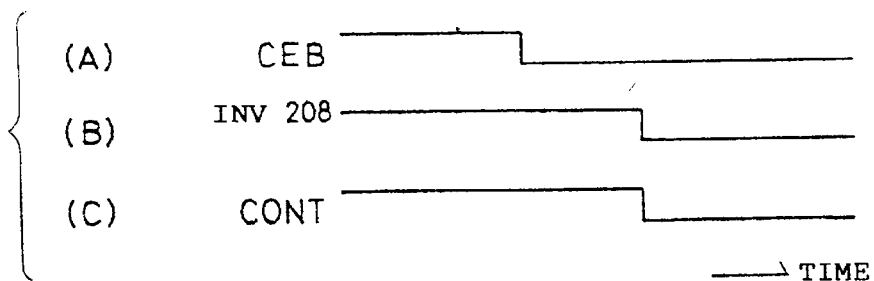
→ TIME (A) CEP
(B) INV 215
(C) CONT F I G. 8 2
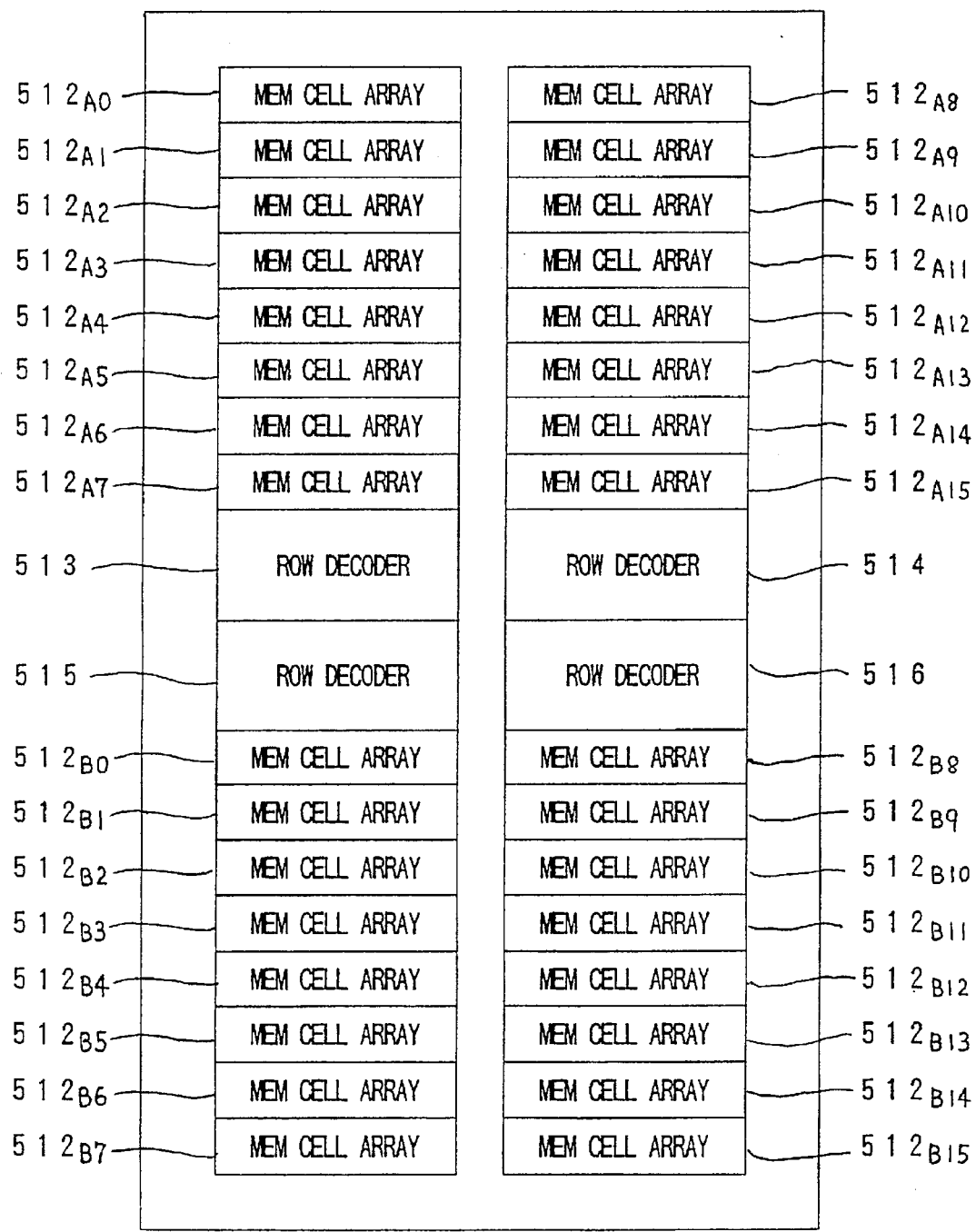

F I G. 1 0 2
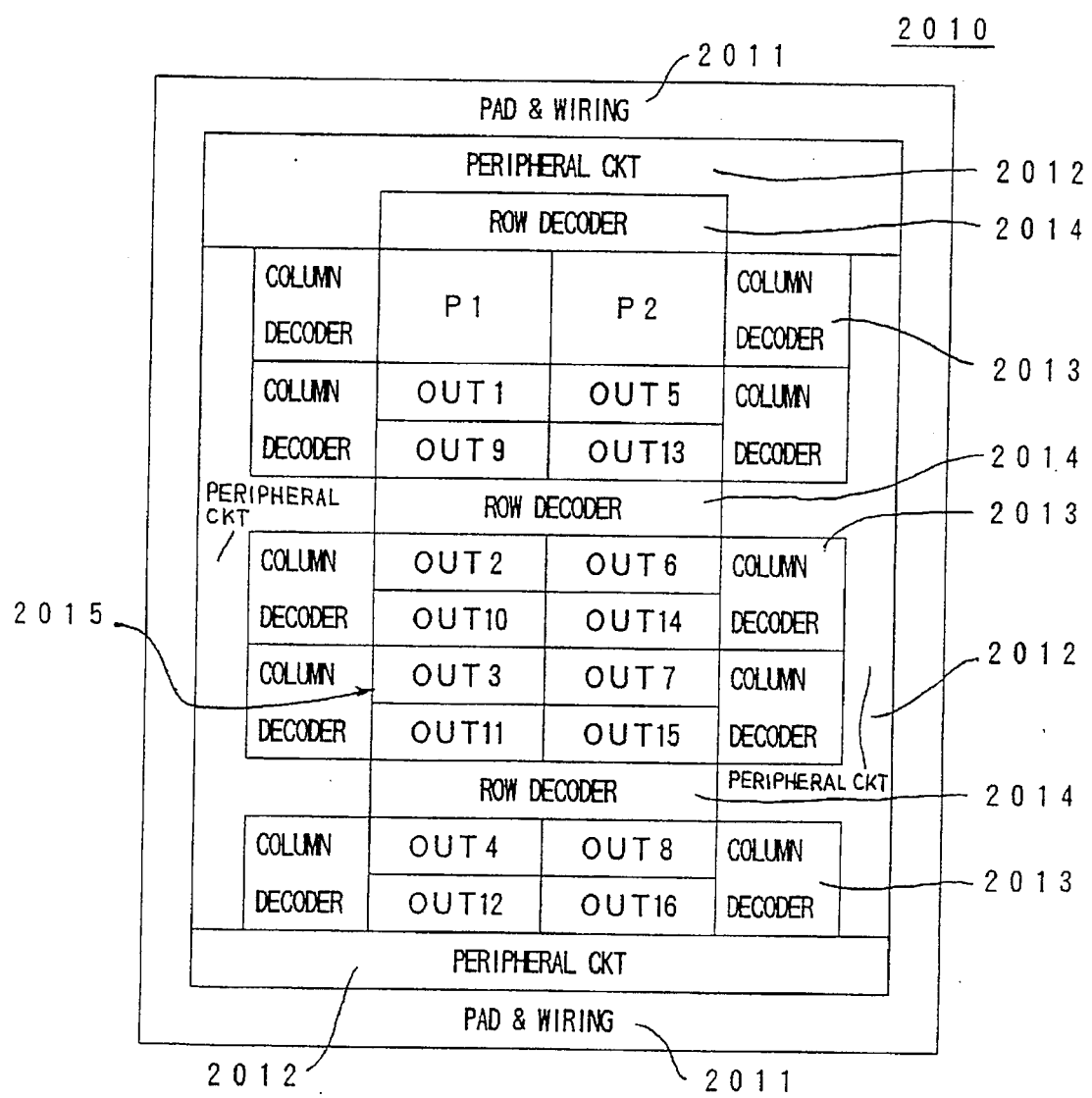

FIG. 104

| JF | I/0 1 | I/0 2 | I/0 3 |
|---|---|---|---|

FIG. 105

| I/0 3 | I/0 2 | I/0 1 | SPECIFIED CELL PLANE TO BE REMEDIED |
|---|---|---|---|
| 0 | 0 | 0 | OUT 1, OUT 9 |
| 0 | 0 | 1 | OUT 2, OUT 10 |
| 0 | 1 | 0 | OUT 3, OUT 11 |
| 0 | 1 | 1 | OUT 4, OUT 12 |
| 1 | 0 | 0 | OUT 5, OUT 13 |
| 1 | 0 | 1 | OUT 6, OUT 14 |
| 1 | 1 | 0 | OUT 7, OUT 15 |
| 1 | 1 | 1 | OUT 8, OUT 16 |

5,661,694

1

PROGRAMMABLE SEMICONDUCTOR MEMORY DEVICE

BACKGROUND OF THE INVENTION

The present invention generally relates to semiconductor memory devices, and more particularly to a programmable semiconductor memory device such as a mask read only memory (ROM) which can be programmed by a mask which is used during the chip production process in order to record data.

SUMMARY OF THE INVENTION

First, a description will be given of a first conceivable example of the mask ROM, by referring to FIGS. 1 through 4.

FIG. 1 shows an important part of the first conceivable example of the mask ROM. In FIG. 1, an address buffer 1 is used to input to the inside an address signal AIN which is supplied from the outside. The address signal AIN is input to an address signal input terminal 2. An internal chip enable signal CEB is input to an internal chip enable signal input terminal 3. This internal chip enable signal CEB has the same phase relationship to a chip enable signal /CE which is supplied from the outside and specifies whether to put an internal circuit to an active state or to an inactive or standby state. In this specification, the symbol "/" in front of a signal name such as /CE indicates an inverted signal of CE (or "CE bar"). The address buffer 1 includes an OR circuit 4, and an internal address signal ADD which has the same phase relationship to the address signal AIN which is supplied from the outside is output from an internal address signal output terminal 5.

An address pulse signal generating circuit 6 generates an address pulse signal ADDP (address transition signal ATD) which indicate a transition of the address signal AIN when the address signal AIN makes the transition. The address pulse signal generating circuit 6 includes inverters 7 through 9, OR circuits 10 through 12, and an AND circuit 13.

An output control pulse signal generating circuit 14 generates an output control pulse signal ALP for controlling output of data read from a memory cell array (not shown) to the outside. A chip enable pulse signal CEP which is generated when the chip enable signal /CE makes a transition from a high potential (high level) to a low potential (low level) is input to a chip enable pulse signal input terminal 15. The output control pulse signal generating circuit 14 includes an OR circuit 16, and the output control pulse signal ALP is output from an output control pulse signal output terminal 17.

FIG. 2 shows a CEB and CEP signal generating circuit which generates the internal chip enable signal CEB and the chip enable pulse signal CEP.

The CEB and CEP signal generating circuit shown in FIG. 2 includes a chip enable signal input terminal 18 to which the chip enable signal /CE is input, inverters 19 through 22, and OR circuit 23, an AND circuit 24, and internal chip enable signal output terminal 25 from which the internal chip enable signal CEB is output, and a chip enable pulse signal output terminal 26 from which the chip enable pulse signal CEP is output.

FIG. 3 is a timing chart for explaining the operation of the CEB and CEP signal generating circuit shown in FIG. 2. In FIG. 3, (A) shows the voltage waveform of the chip enable signal /CE, (B) shows the voltage waveform of the internal chip enable signal CEB, and (C) shows the voltage waveform of a chip enable pulse signal CEP.

2

Accordingly, the waveforms at various parts of the circuit shown in FIG. 1 become as shown in FIG. 4. In FIG. 4, (A) shows the voltage waveform of the address signal AIN, (B) shows the voltage waveform of the chip enable signal /CE, and (C) shows the voltage waveform of the internal chip enable signal CEB. In addition, in FIG. 4, (D) shows the output voltage waveform of the OR circuit 10, (E) shows the output voltage waveform of the OR circuit 11, and (F) shows the voltage waveform of the address pulse signal ADDP. Further, in FIG. 4, (G) shows the voltage waveform of the chip enable pulse signal CEP, (H) shows the voltage waveform of the output control pulse signal ALP, and (I) shows the transition of the output data DOUT.

In other words, according to the first conceivable example of the mask ROM, the output data DOUT is output is synchronism with the falling edge of the output control pulse signal ALP.

In FIG. 4, $t_{CE}$ shown in (I) indicates a chip enable access time from a time when the address is ascertained by the transition of the chip enable signal /CE from the high level (inactive level) to the low level (active level) to a time when the output data DOUT is output.

Next, a description will be given of a second conceivable example of the mask ROM, by referring to FIGS. 5 and 6.

FIG. 5 shows an important part of the second conceivable example of the mask ROM. In FIG. 5, an address buffer 27 is used to input to the inside an address signal AIN which is supplied from the outside. The address signal AIN is input to the address signal input terminal 28. A chip enable signal /CE is supplied from the outside to a chip enable signal input terminal 29.

The address buffer 27 includes a chip enable signal input terminal 30 which is input with an internal chip enable signal CE which has an inverted relationship to the chip enable signal /CE, a NOR circuit 31, inverters 32 through 37, and NAND circuits 38 and 39. The address buffer 27 also includes an internal address signal output terminal 40 from which an internal address signal ADD is output, and an internal address signal output terminal 41 from which an internal address signal /ADD is output. The internal address signal ADD has the same phase relationship to the address signal AIN, and the internal address signal /ADD has the inverted relationship to the internal address signal ADD.

An address pulse signal generating circuit 42 generates an address pulse signal ADDP. The address pulse signal generating circuit 41 includes NOR circuits 43 and 44, inverters 45 through 51, a NAND circuits 52, and an OR circuit 53.

An output control pulse signal generating circuit 54 includes a chip enable pulse signal input terminal 55 to which a chip enable pulse signal CEP is input, an OR circuit 56, and an output pulse signal output terminal 57 from which an output control pulse signal ALP is output.

FIG. 6 is a timing chart for explaining the operation of the circuit shown in FIG. 5.

In FIG. 6, (A) shows the voltage waveform of the address signal AIN, (B) shows the voltage waveform of the chip enable signal /CE, and (C) shows the voltage waveform of the internal chip enable signal CE. In addition, in FIG. 6, (D) shows the voltage waveform of the address pulse signal ADDP, (E) shows the voltage waveform of the chip enable pulse signal CEP, (F) shows the voltage waveform of the output control pulse signal ALP, and (G) shows the transition of the output data DOUT.

In this second conceivable example of the mask ROM, the output data DOUT is also output in synchronism with the falling edge of the output control pulse signal ALP.

In FIG. 6, $t_{CE}$ shown in (G) indicates a chip enable access time from a time when the address is ascertained by the transition of the chip enable signal /CE from the high level (inactive level) to the low level (active level) to a time when the output data DOUT is output.

Next, a description will be given of a third conceivable example of the mask ROM, by referring to FIGS. 7 through 10.

FIG. 7 shows an important part of the third conceivable example of the mask ROM. In FIG. 7, a chip body 58 includes memory cell arrays 59 through 62 having a 1024×1024×2 bit construction, an address buffer 63, row decoders 64 and 65, column decoders 66 through 69, sense amplifiers 70 through 73, an output buffer 74, and a logic circuit 75.

Row address signals A0 through A9 and column address signals A10 through A19 are input to the address buffer 63. The row decoder 64 decodes the row address signals A0 through A9 output from the address buffer 63, and selects a block selection line and a word line with respect to the memory cell arrays 59 and 60. The row decoder 65 decodes the row address signals A0 through A9 output from the address buffer 63, and selects a block selection line and a word line with respect to the memory cell arrays 61 and 62.

The column decoders 66 through 69 respectively decode the column address signals A10 through A19 output from the address buffer 63, and output column selection signals for selecting columns of the memory cell arrays 59 through 62. The sense amplifiers 70 through 73 respectively detect data read from the memory cell arrays 59 through 62. The output buffer 74 outputs the data detected by the sense amplifiers 70 through 73 to the outside.

In FIG. 7, the illustration of column gates for selecting the columns of the memory cell arrays 59 through 62 based on the column selection signals output from the column decoders 66 through 69 is omitted.

The logic circuit 75 inputs a chip enable signal /CE and an output enable signal /OR from the outside, and outputs control signals for controlling the operations of the address buffer 63, the sense amplifiers 70 through 73, the output buffer 74 and the like.

The sense amplifiers 70 through 73 respectively have the construction shown in FIG. 8 for 1 bit. In FIG. 8, the sense amplifier portion includes a power supply line 75 for supplying a power supply voltage VCC, a resistor 76 which forms a load, a nMOS transistor 77, an inverter 78, and a bit line 79 which is selected by the column gate.

The output buffer 74 has the construction shown in FIG. 9 for 1 bit. In FIG. 9, the output buffer portion includes a power supply line 80 for supplying the power supply voltage VCC, an internal output enable signal input terminal 81, an internal output enable signal input terminal 82, a sense amplifier output input terminal 83, a NAND circuit 84, a NOR circuit 85, a pMOS transistor 86, a nMOS transistor 87, and a data output terminal 88. An internal output enable signal OE which has the inverted relationship to an output enable signal /OE is input to the internal output enable signal input terminal 81. An internal output enable signal OEB which has the same phase relationship to the output enable signal /OE is input to the internal output enable signal input terminal 82. A sense amplifier output SOUT is input to the sense amplifier output input terminal 83.

In this output buffer 74, the internal output enable signal OE has the high level and the internal output enable signal OEB has the low level at the time of the reading.

As a result, when the sense amplifier output SOUT has the high level, the output level of the NAND circuit 84 becomes low, the pMOS transistor 86 turns ON, the output level of the NOR circuit 85 becomes low, the nMOS transistor 87 turns OFF, and the level of the output data DOUT becomes high.

On the other hand, when the sense amplifier output SOUT has the low level, the output level of the NAND circuit 84 becomes high, the pMOS transistor 86 turns OFF, the output level of the NOR circuit 85 becomes high, the nMOS transistor 87 turns ON, and the level of the output data DOUT becomes low.

FIG. 10 is a timing chart for explaining the read operation of the third conceivable example of the mask ROM shown in FIG. 7. In FIG. 10, (A) shows the address signals A0 through A19, (B) shows the sense amplifier outputs SOUT of the sense amplifiers 70 through 73, and (C) shows the change in the data D0 through D7 output from the output buffer 74. In FIG. 10, TCY shown in (A) denotes the cycle time, and TAC shown in (C) denotes the address access time.

Next, a description will be given of a fourth conceivable example of the mask ROM, by referring to FIGS. 11 through 16.

FIG. 11 shows an important part of the fourth conceivable example of the mask ROM. In FIG. 11, a chip body 89 includes a memory cell array 90, an address buffer 91, a row decoder 92, a column decoder 93, a sense amplifier 94, a sense amplifier output latch circuit 95, an ATD signal generating circuit 96, and a clock signal generating circuit 97.

An address signal is input to the address buffer 91. The row decoder 92 decodes a row address output from the address buffer 91, and selects a block selection line and a word line with respect to the memory cell array 90. The column decoder 93 decodes a column address signal output from the address buffer 91, and outputs a column selection signal which is required to select a column of the memory cell array 90.

In FIG. 11, the illustration of a column gate for selecting the column of the memory cell array 90 based on the column selection signal output from the column decoder 92 is omitted.

The sense amplifier 94 amplifies data read from the memory cell array 90, and the sense amplifier output latch circuit 95 latches the output of the sense amplifier 94. The ATD signal generating circuit 96 generates an ATD signal which indicates a transition of the address signal generating circuit 97 generates a clock signal CLK which is to be supplied to the sense amplifier output latch circuit 95 based on the ATD signal.

For example, the ATD signal generating circuit 96 may have the construction shown in FIG. 12. In FIG. 12, the ATD signal generating circuit 96 includes an address signal input terminal 99 to which an address signal ADD is input, a delay circuit 100, an exclusive-NOR circuit 101, an inverter 102, and an ATD signal output terminal 103 from which the ATD signal is output.

FIG. 13 is a timing chart for explaining the operation of the ATD signal generating circuit 96 shown in FIG. 12. In FIG. 13, (A) shows the voltage waveform of the address signal ADD, (B) shows the output of the delay circuit 100, and (C) shows the voltage waveform of the ATD signal.

For example, the clock signal generating circuit 97 may have the construction shown in FIG. 14. In FIG. 14, the clock signal generating circuit 97 includes an ATD signal input terminal 104 to which the ATD signal is input, a delay circuit 105, a NOR circuit 106, inverters 107 and 108, and a clock signal output terminal 109 from which the clock signal CLK is output.

FIG. 15 is a timing chart for explaining the operation of the clock signal generating circuit 97 shown in FIG. 14. In FIG. 15, (A) shows the ATD signal, and (B) shows the clock signal CLK.

When the clock signal CLK has the low level, the sense amplifier output latch circuit 95 carries out the operation of reading the output of the sense amplifier 94. On the other hand, when the clock signal CLK has the high level, the sense amplifier output latch circuit 95 carries out a latch operation.

Accordingly, the signal waveforms at various parts of the fourth conceivable example of the mask ROM shown in FIG. 11 become as shown in FIG. 16. In FIG. 16, (A) shows the voltage waveform of the power supply voltage VCC, (B) shows the voltage waveform of the address signal ADD, (C) shows the voltage waveform of the ATD signal, (D) shows the voltage waveform of the clock signal CLK, and (E) shows the voltage waveform of the output data DOUT.

Next, a description will be given of a fifth conceivable example of the mask ROM, by referring to FIGS. 17 through 21.

FIG. 17 shows an important part of the fifth conceivable example of the mask ROM. In FIG. 17, a chip body 110 includes main cell arrays $111_0$ through $111_{15}$, a parity cell array 112, an address buffer 113, a row decoder 114, a column decoder 115, a sense amplifier 116, an output correction circuit 117, a redundant address storage circuit 118, and an output buffer 119.

The main cell arrays $111_0$ through $111_{15}$ store regular data, and the parity cell array 112 stores parity data. An address signal from the outside is input to the address buffer 113. The row decoder 114 decodes a row address signal output from the address buffer 113, and selects a block selection line and a word line with respect to the main cell arrays $111_0$ through $111_{15}$ and the parity cell array 112. The column decoder 115 decodes a column address signal output from the address buffer 113, and outputs a column selection signal which is required to select a column of the main cell arrays $111_0$ through $111_{15}$ and the parity cell array 112. The sense amplifier 116 amplifies data read from the main cell arrays $111_0$ through $111_{15}$ and the parity cell array 112.

In FIG. 17, the illustration of a column gate for selecting a column of the man cell arrays $111_0$ through $111_{15}$ and the parity cell array 112 based on the column selection signal output from the column decoder 115 is omitted.

In addition, in FIG. 17, D0, D1, ..., D15 denote data read from the main cell arrays $111_0$, $111_2$, ..., $111_{15}$, and PD denotes parity data read from the parity cell array 112.

The output correction circuit 117 corrects the data D0, D1, ..., D15 output from the main cell arrays $111_0$, $111_1$, ..., $111_{15}$, The redundant address storage circuit 118 stores a redundant address and a column address (address indicating D0, D1, ..., or D15) of the output data having the data value which is doubtful.

For example, the redundant address storage circuit 118 has the construction shown in FIG. 18 which is provided with a 1-bit storage circuit.

In FIG. 18, the redundant address storage circuit 118 includes an erasable programmable read only memory (EPROM) cell transistor 120 which forms a storage element, nMOS transistors 121 and 122, a pMOS transistor 123, an inverter 124, a pMOS transistor 125, and a nMOS transistor 126.

In this redundant address storage circuit 118, the gate of the nMOS transistor 122 is set of 0 V and the nMOS transistor 122 turns OFF when making a write with respect to the EPROM cell transistor 120. In addition, the gate of the EPROM cell transistor 120 is set to a high voltage VPP of 10 V, for example, the drain and gate of the nMOS transistor 121 is set to the high voltage VPP, and the drain of the EPROM cell transistor 120 is set to the high voltage VPP. By this setting, the thermoelectrons which are generated due to the avalanche breakdown occurring in the vicinity of the drain of the EPROM cell transistor 120 are injected to the floating gate of the EPROM cell transistor 120. When making no write, no injection of the thermoelectrons is made with respect to the floating gate of the EPROM cell transistor 120.

On the other hand, when making a read, the drain of the nMOS transistor 121 is set to VCC, the gate of the nMOS transistor 121 is set to 0 V, and the nMOS transistor 121 is turned OFF. In addition, the gate of the nMOS transistor 122 is set to VCC, and the nMOS transistor 122 is turned ON. Further, the control gate of the EPROM cell transistor 120 is set to 5 V.

When the write has been made with respect to the EPROM cell transistor 120, the EPROM cell transistor 120 is OFF as shown in FIG. 19, and the level at a node 127 is high and the level of the output is low.

But when no write has been made with respect to the EPROM cell transistor 120, the EPROM cell transistor 120 is ON as shown in FIG. 20. In this case, a current I flows from the power supply VCC to the ground is the pMOS transistor 123 and the EPROM cell transistor 120. The level at the node 128 is low, and the level of the output is high.

For example, the output correction circuit 118 has the construction shown in FIG. 21.

In FIG. 21, the output correction circuit 118 includes a defective output inverting circuit 128, a decoder 129, a parity computing circuit 130, and a comparator circuit 131.

The defective output inverting circuit 128 inverts 1 bit of the output data which is the subject of the correction out of the output data D0 through D15 read from the main cell array $111_0$ through $111_{15}$, and outputs the other bits as they are. For example, when the output data D1 is the subject of the correction, the defective output inverting circuit 128 output D0, /D1, D2, ..., D15 as the output data.

The decoder 129 decodes the column address signal of the output data having the data value which is doubtful and supplied from the redundant address storage circuit 118.

The parity computing circuit 130 obtains a 1-bit parity from the output data D0 through D15 read from the main cell arrays $111_0$ through $111_{15}$. The comparator circuit 131 compares the parity computed by the parity computing circuit 130 and the parity data read from the parity cell array 120, and supplies a result of the comparison to the defective output inverting circuit 128, so as to specify whether or not it is necessary to correct the output data specified by the decoder 129.

When the address indicated by the address signal which is supplied from the outside matches the redundant address stored in the redundant address storage circuit 118, suppose for example that the output data D1 is specified by the decoder 129 as the output data having the data value which is doubtful. In this case, when the parity output from the parity computing circuit 130 and the parity data read from the parity cell array 112 match in the comparator circuit 131, the defective output inverting circuit 128 does not correct the output data D1, and D0, D1, D2, ..., D15 are output to the outside as the output data. On the other hand, when the parity output from the parity computing circuit 130 and the parity data output from the parity cell array 112 do not match in the comparator circuit 131, the defective output inverting circuit 128 inverts the output data D1, and D0,/D1, D2, . . . , D15 are output to the outside as the output data.

Next, a description will be given of a sixth conceivable example of the mask ROM, by referring to FIGS. 22 and 23. This sixth conceivable example of the mask ROM produces a 16-bit output by arranging NAND type cells including 16 nMOS transistors connected in series and having gates connected to word lines. The selected word line is set to the low level, and the non-selected word line is set to the high level.

FIG. 22 shows an important part of the sixth conceivable example of the mask ROM. In FIG. 22, a chip body 132 includes memory cell arrays $133_0$ through $133_{15}$, and row decoders 134 through 137. 1-bit data is output from each of the memory cell arrays $133_0$ through $133_{15}$. The row decoder 134 selects the block selection line and the word line with respect to the memory cell arrays $133_0$ through $133_3$. The row decoder 135 selects the block selection line and the word line with respect to the memory cell arrays $133_4$ through $133_7$. The row decoder 136 selects the block selection line and the word line with respect to the memory cell arrays $133_8$ through $133_{11}$. The row decoder 137 selects the block selection line and the word line with respect to the memory cell arrays $133_{12}$ through $133_{15}$.

FIG. 23 shows the circuit construction of the row decoder 134. The other row decoders 135 through 137 have the circuit constructions which are the same as that of the row decoder 134.

In FIG. 23, the row decoder 134 includes block selection line selecting circuits 138 and 139, word line selecting circuits 140 and 141, and a NAND circuit 142.

The block selection line selecting circuit 138 selects one of block selection lines BS0 through BS7 of the memory cell arrays $133_0$ and $133_1$ based on block selection line selecting signals BS0B through BS7B. The block selection line selecting circuit 139 selects one of the block selection lines BS0 through BS7 of the memory cell arrays $133_2$ and $133_3$ based on the block selection line selecting signals BS0B through BS7B.

The word line selecting circuit 140 selects one of word lines WL0 through WL15 of the memory cell arrays $133_0$ and $133_1$ based on word line selecting signals WS0 through WS15. In addition, the word line selecting circuit 141 selects one of the word lines WL0 through WL15 of the memory cell arrays $133_2$ and $133_3$ based on the word line selecting signals WS0 through WS15.

In FIG. 23, signals ROW00 and ROW10 control the active state of the row decoder 134, that is, control the active states of the block selection line selecting circuits 138 and 139 and the word line selecting circuits 140 and 141.

The NAND circuit 142 controls the active state of the block selection line selecting circuits 138 and 139 and the word line selecting circuits 140 and 141. This NAND circuit 142 includes pMOS transistors 143 and 144, and nMOS transistors 145 and 146.

When the signal ROW00 has the high level and the signal ROW10 has the high level, the output level of the NAND circuit 142 becomes low, and the block selection line selecting circuits 138 and 139 and the word line selecting circuits 140 and 141 are activated.

(1) Problems of the first conceivable example:

In the circuit shown in FIG. 1, if the chip enable signal /CE undergoes a transition from the high level to the low level when the address signal AIN has the low lever, the address pulse signal ADDP is generated. However, if the chip enable signal /CE undergoes the transition from the high level to the low level when the address signal AIN has the high level, no address pulse signal ADDP is generated, as may be seen from FIG. 4.

As a result, the output control pulse signal ALP which is generated by taking the OR of the address pulse signal ADDP and the chip enable pulse signal CEP has a different pulse width and the timing of the falling edge is shifted between the case where the chip enable signal /CE undergoes the transition from the high level to the low level when the address signal AIN has the low level and the case where the chip enable signal /CE undergoes the transition from the high level to the low level when the address signal AIN has the high level.

For this reason, according to the first conceivable example of the mask ROM which is provided with the circuit shown in FIG. 1, the access speed of the chip enable access becomes unstable. In other words, the access speed becomes slower for the low level of the address signal AIN compared to the case where the address signal AIN has the high level, and a high-speed read operation was prevented thereby.

(2) Problems of the second conceivable example:

In the circuit shown in FIG. 5, if the chip enable signal /CE undergoes a transition from the high level to the low level when the address signal AIN has the low level, the address pulse signal ADDP is generated. However, no address pulse signal ADDP is generated if the chip enable signal /CE undergoes the transition from the high level to the low level when the address signal AIN has the high level, as may be seen from FIG. 6.

As a result, the output control pulse signal ALP which is generated by taking the OR of the address pulse signal ADDP and the chip enable pulse signal CEP has a different pulse width and the timing of the falling edge is shifted between the case where the chip enable signal /CE undergoes the transition from the high level to the low level when the address signal AIN has the low level and the case where the chip enable signal /CE undergoes the transition from the high level to the low level when the address signal AIN has the high level, as may be seen from FIG. 6.

For this reason, according to the second conceivable example of the mask ROM which is provided with the circuit shown in FIG. 5, the access speed of the chip enable access becomes unstable. In other words, the access speed becomes slower for the low level of the address signal AIN compared to the case where the address signal AIN has the high level, and a high-speed read operation was prevented thereby.

(3) Problems of the third conceivable example:

In the third conceivable example of the mask ROM shown in FIG. 7, the cycle time TCY is set longer than the address access time TAC, as may be seen from FIG. 10. Hence, no address change is permitted until a time amounting to the address access time TA or more elapses from the time when the address determination is made, and a high-speed read operation was prevented thereby.

(4) Problems of the fourth conceivable example:

In the fourth conceivable example of the mask ROM shown in FIG. 11, no ATD signal is generated at the time when the power supply voltage VCC is turned ON. In this case, the sense amplifier output latch circuit 95 does not make a read operation, and an undefined data is output as may be seen from FIG. 16. Thus, there was a problem in that a normal data cannot be obtained in this case.

(5) Problems of the fifth conceivable example:

In the 1-bit storage circuit shown in FIG. 18 which is includes in the redundant address storage circuit 118 shown in FIG. 17, a current flows from the VCC power supply to the ground via the pMOS transistor 123, the nMOS transistor 122 and the EPROM cell transistor 120 at the time of the read when no write has been made to the EPROM cell transistor 120, as may be seen from FIG. 20.

Accordingly, in the fifth conceivable example of the mask ROM which is provided with the redundant address storage circuit 118 having the 1-bit storage circuit shown in FIG. 18, there was a problem in that the power consumption becomes large.

In addition, in the output correction circuit 117 included in the fifth conceivable example of the mask ROM shown in FIG. 17, the output data having the doubtful data value and specified by the address signal output from the redundant address storage circuit 118 is inverted when the address indicated by the address signal supplied from the outside matches the redundant address stored in the redundant address storage circuit 118 match and the parity output from the parity computing circuit 130 shown in FIG. 21 and the parity data read from the parity cell array 112 do not match.

For this reason, if the output data having the doubtful data value is a defective data which is not fixed to the high or low level, for example, there was a problem in that a normal output data cannot be obtained.

(6) Problems of the sixth conceivable example:

In the sixth conceivable example of the mask ROM shown in FIG. 22, the word lines of all of the memory cell arrays $133_0$ through $133_{15}$ are driven within 1 cycle at the time of the read. Hence, there was a problem in that the power consumption is large.

Accordingly, it is a general object of the present invention to provide a novel and useful semiconductor memory device in which the problems described above are eliminated.

Another and more specific object of the present invention is to provide a semiconductor memory device comprising means for receiving a chip enable signal and an address signal, an internal circuit coupled to the means, and an internal control signal generating circuit generating a predetermined internal control signal which makes an output timing of the semiconductor memory device same regardless of a level of the address signal when the chip enable signal undergoes a transition from an inactive level to an active level, where the internal circuit is deactivated in response to the inactive level of the chip enable signal and is activated in response to the active level of the chip enable signal. According to the semiconductor memory device of the present invention, it is possible to obtain the predetermined internal control signal which does not have a shift in the output timing and is stable. For example, when this predetermined internal control signal is used as an output control pulse signal for controlling the output timing of the data to the outside, it is possible to make the chip enable access time for the case where the address signal has one level the same as the chip enable access time for the case where the address signal has the other level. For this reason, it is possible to stabilize the chip enable access time, and accordingly realize a high-speed data read.

Still another object of the present invention is to provide a semiconductor memory device comprising means for receiving a chip enable signal and an address signal, an internal circuit coupled to the means, a chip enable pulse signal generating circuit generating a chip enable pulse signal having a predetermined pulse width when the chip enable signal undergoes a transition from an inactive level to an active level, where the internal circuit is deactivated by the inactive level of the chip enable signal and is activated by the active level of the chip enable signal, an address pulse signal generating circuit generating an address pulse signal having a predetermined pulse width if the chip enable signal undergoes the transition from the inactive level to the active level when the address signal has a first level out of first and second levels, and generating no address pulse signal if the chip enable signal undergoes the transition from the inactive level to the active level when the address signal has the second level, an address pulse signal through control circuit controlling passing of the address pulse signal output from the address pulse signal generating circuit so as not to pass the address pulse signal if the chip enable signal undergoes the transition from the inactive level to the active level when the address signal has the first level, and an internal control signal generating circuit generating a predetermined internal control signal by carrying out a logical sum process on outputs of the address pulse signal through control circuit and the chip enable pulse signal generating circuit. According to the semiconductor memory device of the present invention, it is possible to obtain the predetermined internal control signal which does not have a shift in the output timing and is stable. For example, when this predetermined internal control signal is used an output control pulse signal for controlling the output timing of the data to the outside, it is possible to make the chip enable access time for the case where the address signal has one level the same as the chip enable access time for the case where the address signal has the other level. For this reason, it is possible to stabilize the chip enable access time, and accordingly realize a high-speed data read.

A further object of the present invention is to provide a semiconductor memory device comprising means for receiving a chip enable signal and an address signal, an internal circuit coupled to the means, a chip enable pulse signal generating circuit generating a chip enable pulse signal having a predetermined pulse width when the chip enable signal undergoes a transition from an inactive level to an active level, where the internal circuit is deactivated by the inactive level of the chip enable signal and is activated by the active level of the chip enable signal, an address pulse signal generating circuit generating an address pulse signal when the chip enable signal undergoes the transition from the inactive level to the active level regardless of a level of the address signal, and an internal control signal generating circuit generating a predetermined internal control signal by carrying out a logical sum process on outputs of the address pulse signal through control circuit and the chip enable pulse signal generating circuit. According to the semiconductor memory device of the present invention, it is possible to obtain the predetermined internal control signal which does not have a shift in the output timing and is table. For example, when this predetermined internal control signal is used as an output control pulse signal for controlling the output timing of the data to the outside, it is possible to make the chip enable access time for the case where the address signal has one level the same as the chip enable access time for the case where the address signal has the other level. For this reason, it is possible to stabilize the chip enable access time, and accordingly realize a high-speed data read.

Another object of the present invention is to provide a semiconductor memory device comprising an address buffer receiving a predetermined address signal, first through nth address storage circuits successively storing the predetermined address signal successively output from the address buffer, first through nth memory regions from which data are read by decoding the predetermined address signal output from the first through nth address storage circuits, where the first through nth memory regions are provided in correspondence with the first through nth address storage circuits, and an output switching circuit successively switching and outputting the data read from the first through nth memory regions. According to the semiconductor memory device of the present invention, it is possible to make the cycle time 1/n that of the conceivable mask ROM even if the address access time is set the same as the conceivable mask ROM. In other words, the cycle time can be made shorter than the address access time. For this reason, it is possible to increase the amount of data read per unit time and to realize a high-speed data read.

Still another object of the present invention is to provide a semiconductor memory device comprising an address counter outputting an address signal indicating an address value by successively incrementing or decrementing from an initial value which is an address value indicated by a predetermined address signal, first through nth address storage circuits successively storing and outputting the address signal output from the address counter, first through nth memory regions from which data are read by decoding the address signal output from the first through nth address storage circuits, where the first through nth memory regions are provided in correspondence with the first through nth address storage circuits, and an output switching circuit successively switching and outputting the data read from the first through nth memory regions. According to the semiconductor memory device of the present invention, it is possible to make the cycle time 1/n that of the conceivable mask ROM even if the address access time is set the same as the conceivable mask ROM. In other words, the cycle time can be made shorter than the address access time. For this reason, it is possible to increase the amount of data read per unit time and to realize a high-speed data read.

A further object of the present invention is to provide a semiconductor memory device comprising an address transition signal generating circuit generating an address transition signal which indicates a transition of an address signal, a memory region storing data, a sense amplifier amplifying the data read from the memory region, a sense amplifier output latch circuit reading and latching a sense amplifier output which is output from the sense amplifier, and a sense amplifier output latch control circuit controlling the sense amplifier output latch circuit so as not to enter a latch operation state and to enter a read operation state when a power supply turns ON. According to the semiconductor memory device of the present invention, when the power supply turns ON, the sense amplifier output latch circuit starts a read operation, and the data corresponding to the address signal when the power supply turns ON is output. In other words, it is possible to make the read operation immediately after the power supply turns ON. As a result, it is possible to realize a high-speed data read.

Another object of the present invention is to provide a semiconductor memory device comprising a redundant address storage circuit, and a 1-bit storage circuit provided within the redundant address storage circuit, where the 1-bit storage circuit comprises a first switching element having first and second contacts and a control terminal, a high voltage side power supply being coupled to the first contact of the first switching element during a read, the first switching element conducting when a low potential is applied to the control terminal thereof and non-conducting when a high potential is applied to the control terminal thereof, a second switching element having a first and second contacts and a control terminal, a high voltage side power supply being coupled to the first contact of the second switching element during the read, the second switching element conducting when a low potential is applied to the control terminal thereof and non-conducting when a high potential is applied to the control terminal thereof, a first fuse having a first end coupled to the second contact of the first switching element and to the control terminal of the second switching element, and a second end coupled to a low voltage side power supply, and a second fuse having a first end coupled to the second contact of the second switching element and to the control terminal of the first switching element, and a second end coupled to the low voltage side power supply, an output being obtained via the second contact of the second switching element by cutting the first or second fuse. According to the semiconductor memory device of the present invention, the first switching element turns ON, the second switching element turns OFF and the output level becomes high when the first fuse is cut and the second fuse is not cut. On the other hand, the first switching element turns OFF, the second switching elements turns ON and the output level becomes low when the first fuse is not cut and the second fuse is cut. Hence, a path for a current to flow from the high voltage side power supply to the low voltage side power supply does not exist, and a current will not flow regularly. Therefore, it is possible to reduce the power consumption of the semiconductor memory device.

Still another object of the present invention is to provide a semiconductor memory device comprising means for receiving an address signal, an output correction circuit correcting output data, and a redundant address storage circuit, where the redundant address storage circuit comprises a storage circuit supplying a column address of an output data having a doubtful data value when an address indicated by the address signal matches a redundant address, and putting an output thereof to a high impedance state when the address indicated by the address signal and the redundant address differ.

A further object of the present invention is to provide a semiconductor memory device comprising a redundant address storage circuit, and a 1-bit storage circuit provided within the redundant address storage circuit, where the 1-bit storage circuit comprises a first non-volatile memory cell transistor having a source, and a drain and a control gate which are coupled to a high voltage side power supply during a read, the first non-volatile memory cell transistor being electrically writable, and a second non-volatile memory cell transistor having a source coupled to a low voltage side power supply, and a drain and a control gate which are coupled to the source of the first non-volatile memory cell transistor during the read, the second non-volatile memory cell transistor being electrically writable, an output being obtained via the source of the first non-volatile memory cell transistor by making a write to the first or second non-volatile memory cell transistor. According to the semiconductor memory device of the present invention, the first non-volatile memory cell transistor turns OFF, the second non-volatile memory cell transistor turns ON and the output level becomes low when the write is made with respect to the first non-volatile memory cell transistor. On the other hand, the first non-volatile memory cell transistor turns ON, the second non-volatile memory cell transistor turns OFF and the output level becomes high when the write is made with respect to the second non-volatile memory cell transistor. Hence, a path for a current to flow from the high voltage side power supply to the low voltage side power supply does not exist, and a current will not flow regularly. Therefore, it is possible to reduce the power consumption of the semiconductor memory device.

Another object of the present invention is to provide a semiconductor memory device comprising a redundant address storage circuit, and a 1-bit storage circuit provided within the redundant address storage circuit, where the 1-bit storage circuit comprises a first switching element having first and second contacts and a control terminal, a high voltage side power supply being coupled to the first contact of the first switching element, the first switching element conducting when a low potential is applied to the control terminal thereof and non-conducting when a high potential is applied to the control terminal thereof, a second switching element having first and second contacts and a control terminal, a high voltage side power supply being coupled to the first contact of the second switching element, the second switching element conducting when a low potential is applied to the control terminal thereof and non-conducting when a high potential is applied to the control terminal thereof, a first non-volatile memory cell transistor having a drain coupled to the second contact of the first switching element during a read, a source coupled to a low voltage side power supply, and a control gate supplied with a read voltage, the first non-volatile memory cell transistor being electrically writable, and a second non-volatile memory cell transistor having a drain coupled to the second contact of the second switching element during the read, a source coupled to the low voltage side power supply, and a control gate supplied with the read voltage, the second non-volatile memory cell transistor being electrically writable, an output being obtained via the source of the first non-volatile memory cell transistor by making a write to the first or second non-volatile memory cell transistor. According to the semiconductor memory device of the present invention, the first non-volatile memory cell transistor turns OFF, the second non-volatile memory cell transistor turns ON, the first switching element turns ON, the second switching element turns OFF and the output level becomes low when the write is made with respect to the first non-volatile memory cell transistor. On the other hand, the first non-volatile memory cell transistor turns ON, the second non-volatile memory cell transistor turns OFF, the first switching element turns OFF, the second switching element turns ON and the output level becomes high when the write is made with respect to the second non-volatile memory cell transistor. Hence, a path for a current to flow from the high voltage side power supply to the low voltage side power supply does not exist, and a current will not flow regularly. Therefore, it is possible to reduce the power consumption of the semiconductor memory device.

Still another object of the present invention is to provide a semiconductor memory device comprising means for receiving an address signal, a plurality of main cell arrays storing data, a plurality of cell arrays storing parity data, and an output correction circuit, where the output correction circuit comprises an output data generating circuit generating a data to be output in place of an output data having a doubtful data value based on output data output from the main cell arrays and excluding the output data having the doubtful data value and the parity data output from the parity cell arrays when an address indicated by the address signal matches a redundant address, and an output data switching circuit outputting as data to be output to the outside the output data output from the main cell arrays and excluding the output data having the doubtful data value and the output data generated by the output data generating circuit. According to the semiconductor memory device of the present invention, it is possible to output normal output data to the outside even when the output data having the doubtful data value is a defective data that is not fixed to the high or low level.

In this case, the semiconductor memory device may further comprise a first redundant address storage circuit storing the redundant address which is used in a normal state, and a second redundant address storage circuit capable of storing a redundant address for testing purposes during a test process. In this case, it is possible in the wafer state of the semiconductor memory device to make a test to check whether or not the normal data is output for the redundant address by using the second redundant address storage circuit. For this reason, after the write is made with respect to the first redundant address storage circuit, there is no need to make a test again to check whether or not the normal data is output for the redundant address, and the test process is simplified.

A further object of the present invention is to provide a semiconductor memory device comprising a plurality of memory cell arrays having a plurality of memory cells and having common word lines, a plurality of word line selection circuits selecting the word lines, a plurality of memory regions being formed by each of the word line selection circuits and the memory cell arrays, each of the memory cell arrays forming the memory regions having word lines having same address and bit lines having same address, and means for decoding an address signal and selecting one of the memory regions during a read, and for activating one of the word line selection circuits corresponding to a selected one of the memory regions, so as to output data from selected memory cells of the memory cell arrays forming the memory region which is selected by the address signal. According to the semiconductor memory device of the present invention, only the word line selection circuit of the memory cell region which is selected by the address signal which selects one of the memory cell region during the read, and only the word line connected to this word line driving circuit is driven. The word lines of the memory regions that are non-selected will not be driven. As a result, it is possible to reduce the power consumption of the semiconductor memory device.

Another object of the present invention is to provide a semiconductor memory device comprising a memory cell part including a plurality of main cell arrays and a plurality of parity cell arrays, a row decoder, including a plurality of row decoder circuits, decoding a row address of an input address and outputting from the memory cell part data and parity data specified by the row address, a column, decoder, including a plurality of column decoder circuits, decoding a column address of the input address and outputting data and parity data specified by the column address out of the data and the parity data output from the memory cell part, a defective output storage circuit storing an address region including a defective main cell and outputting data indicating a defective bit, and a redundant circuit correcting and outputting the output data of the main cell array including the defect out of the data output from the column decoder, based on the parity data and the output data of the defective output storage circuit, where each word line driven by the row decoder circuit do not traverse a plurality of main cell arrays. According to the semiconductor memory device of the present invention, one row decoder circuit only drives the word line of two main cell arrays. For this reason, even if a word line defect is generated, the output of only one of the two main cell arrays will become defective and only one main cell array produces the defective output, thereby enabling the defect to be remedied by use of the parity data stored in the parity cell arrays. Hence, it is possible to remedy the defect in the word line direction and the column direction, and accordingly stabilize the yield.

Still another object of the present invention is to provide a semiconductor memory device comprising a memory cell part including a plurality of main cell arrays and a plurality of parity cell arrays which are provided in units of blocks, each of the blocks being made up of a number of cell arrays which is a multiple of 3, a row decoder, including a plurality of row decoder circuits, decoding a row address of an input address and outputting from the memory cell part data and parity data specified by the row address, a column decoder, including a plurality of column decoder circuits, decoding a column address of the input address and outputting data and parity data specified by the column address out of the data and the parity data output from the memory cell part, a defective output storage circuit storing an address region including a defective main cell and outputting data indicating a defective bit, and a redundant circuit correcting and outputting the output data of the main cell array including the defect out of the data output from the column decoder, based on the parity data and the output data of the defective output storage circuit, where each word line driven by the row decoder circuit drives only the cell arrays which are mutually independent of parity data generation. According to the semiconductor memory device of the present invention, even if the outputs of a plurality of main cell arrays within one block are defective out of the main cell arrays, it is possible to remedy the defects using the redundant data stored in the corresponding parity cell arrays unless the outputs of the other main cell arrays are all defective. In other words, the output defects of a plurality of main cell arrays within the block are effectively remedied, and it is possible to remedy the defects in the word line direction and the column direction. Therefore, it is possible to stabilize the yield.

A further object of the present invention is to provide a semiconductor memory device comprising a memory cell part including a plurality of main cell arrays storing data and a plurality of parity cell arrays storing parity data for use in remedying a defective memory cell, first means for outputting first output data indicating a defective output bit based on prestored redundant information indicating a main cell array which includes a defect, independently of an input address, second means for detecting whether or not the defective output bit is to be remedied from second output data and parity data read from the main and parity cell arrays of the memory cell part specified by the input address, and third means for correcting and outputting the defective bit based on the first output data from the first means when the second means detects that the defective output bit is to be remedied. According to the semiconductor memory device of the present invention, it is possible to simplify the construction of the redundant circuit, and reduce the area occupied by the redundant circuit and the related wirings so that the integration density of the semiconductor memory device can be improved. In addition, it is possible to prevent the length of the word line at a part of the memory cell part including the parity cell arrays from becoming longer than that at other parts, and accordingly, prevent the operation speed from becoming different or slower among various parts of the memory cell part.

Another object of the present invention is to provide a semiconductor memory device comprising a memory cell part storing data and parity data for use in remedying a defective memory cell, sense amplifier means for amplifying output data read from the memory cell part in an active state and for outputting output data having a fixed first logic level in an inactive state, match detection means for outputting a match detection signal when an input address matches a prestored defective address, defective output selection means for outputting defective output selection data indicating prestored defective output in response to the match detection signal, data switching means for receiving the output data from the sense amplifier means and the defective output selection data from the defective output selection means, and logic circuit means for supplying to the sense amplifier means a first signal for putting the sense amplifier means into the active state based on a mode signal which indicates a signature read mode in which the defective output is read, and for supplying to the data switching means a second signal which indicates a parity check result based on the mode signal and the output data and the parity data read from the memory cell part, where the logic circuit means supplies to the data switching means a second signal having a second logic level opposite to the first logic level when the mode signal is received, and the data switching means output the second signal from the logic circuit means in place of the output data from the sense amplifier means for a defective bit which is indicated by the defective output selection data from the defective output selection means. According to the semiconductor memory device of the present invention, the data switching means outputs the second signal from the logic circuit means in place of the output data of the sense amplifier means for the defective bit which is indicated by the defective output selection data from the defective output selection means. For this reason, it is possible to know the contents of the defective address and the defective output from the input address and the output data of the data switching means. Thus, there is no need to provide the switching circuit and the related wirings which are necessary in the case of the conceivable example of the mask ROM, and the area occupied by the redundant circuit and the related wirings can be reduced. Therefore, the integration density of the semiconductor memory device can be improved.

Other objects and further features of the present invention will be apparent from the following detailed description when read in conjunction with the accompanying drawings.

BRIEF DESCRIPTION OF THE DRAWINGS

FIG. 12 is a circuit diagram showing the construction of an ATD signal generating circuit shown in FIG. 11;

FIG. 13 is a timing chart, showing timings (A) through (C), for explaining the operation of the ATD signal generating circuit shown in FIG. 12;

FIG. 25 is a circuit diagram showing a first construction of an address pulse signal through control signal generating circuit;

FIG. 26 is a timing chart, showing timings (A) through (C), for explaining the operation of the address pulse signal through control signal generating circuit shown in FIG. 25;

FIG. 82 is a diagram showing an important part of a sixth embodiment of the semiconductor memory device according to the present invention;

FIG. 102 is a plan view generally showing the layout of a ninth embodiment of the semiconductor memory device according to the present invention;

FIG. 104 is a diagram for explaining redundant information used in the ninth embodiment;

FIG. 105 is a diagram for explaining the relationship of output bits of the redundant information and the numbers of the main cell arrays which are remedied;

DESCRIPTION OF THE PREFERRED EMBODIMENTS

[1] First Embodiment

A description will be given of a first embodiment of a semiconductor memory device according to the present invention, by referring to FIGS. 24 through 31. In this embodiment and the embodiments which follow, the present invention is applied to a mask ROM.

Figure 24:
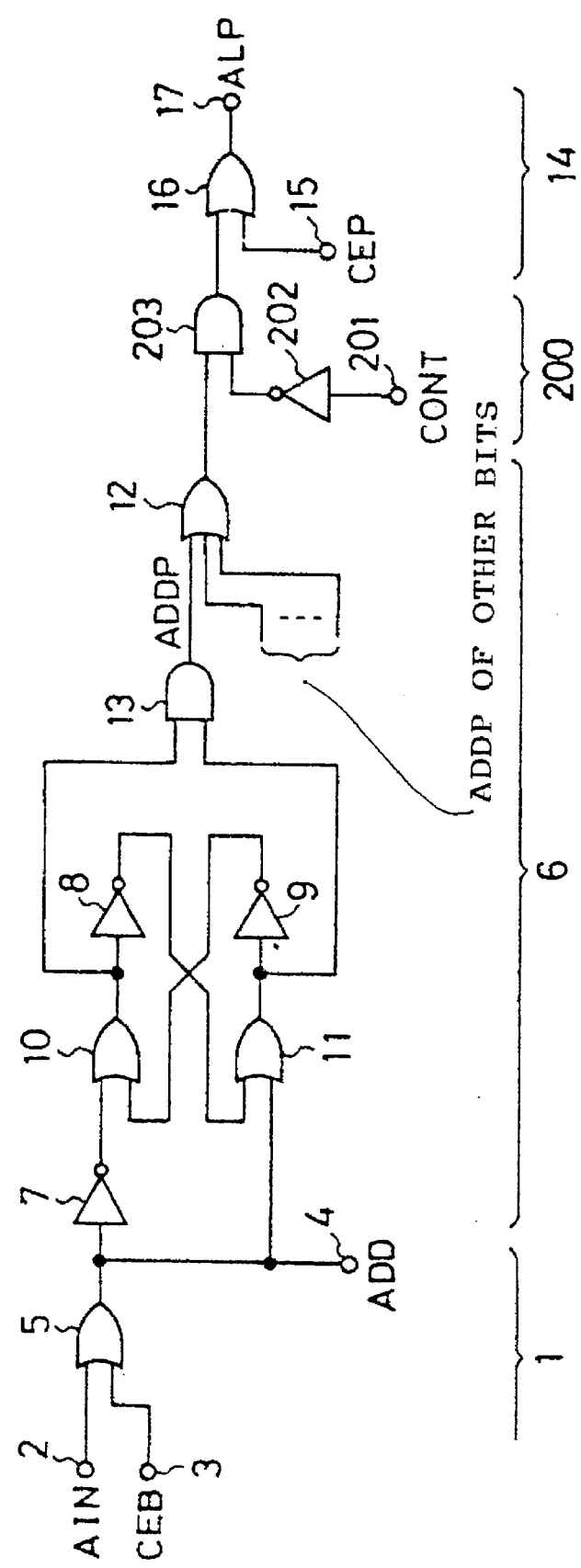
FIG. 24 is a circuit diagram showing an important part of a first embodiment of a semiconductor memory device according to the present invention.

FIG. 24 is a circuit diagram of an important part of the first embodiment, and shows a circuit necessary for generating the output control pulse ALP.

Figure 1:
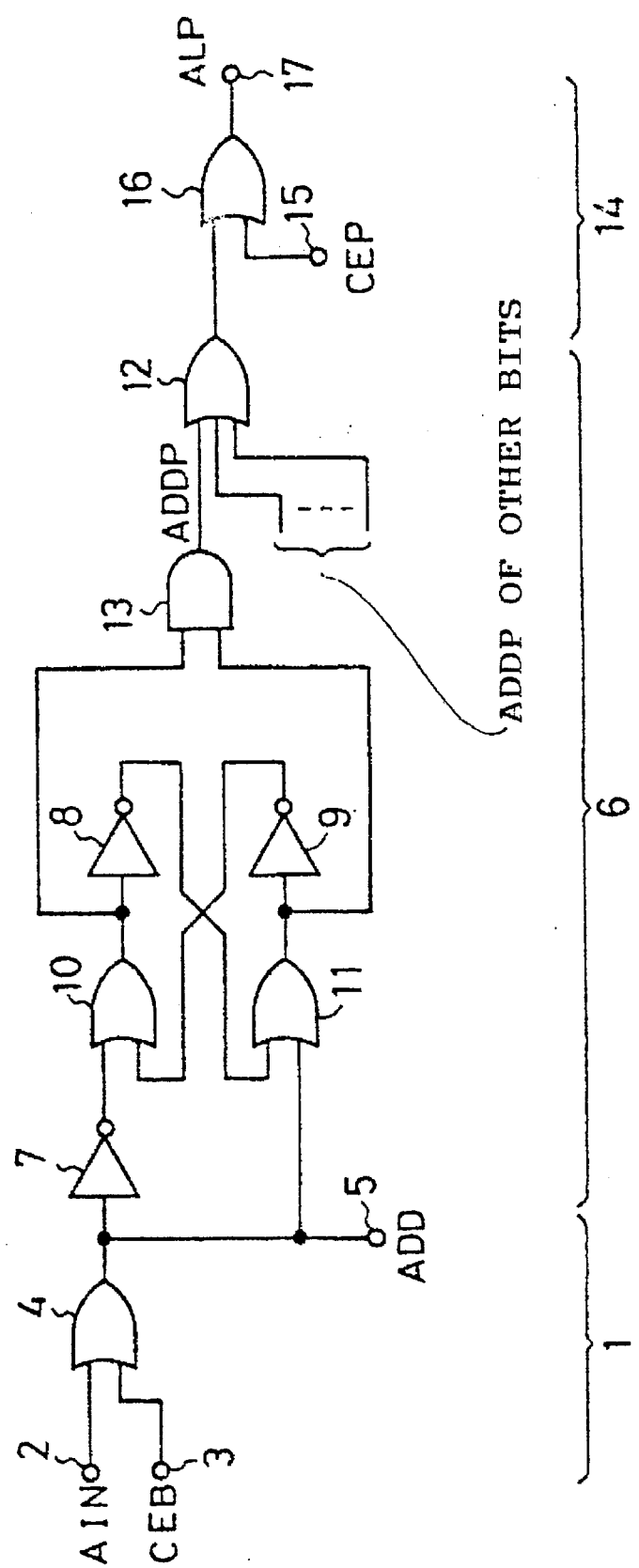
FIG. 1 is a circuit diagram showing an important part of a first conceivable example of a mask ROM.
Figure 2:
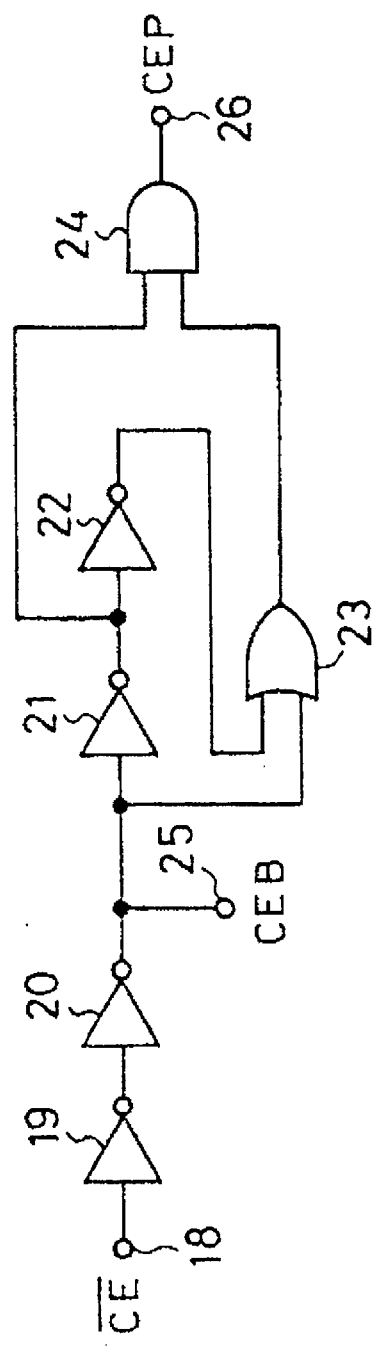
FIG. 2 is a circuit diagram showing a CEB and CEP signal generating circuit of the first conceivable example of the mask ROM.
Figure 3:
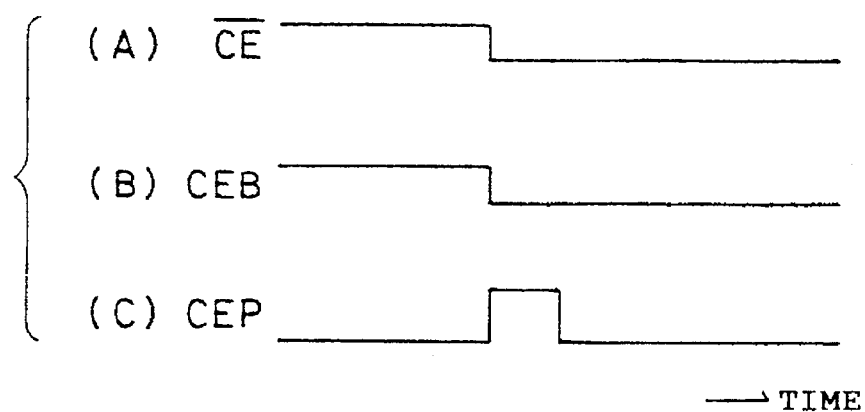
FIG. 3 is a timing chart, showing timings (A) through (C), for explaining the operation of the CEB and CEP signal generating circuit shown in FIG. 2.
Figure 4:
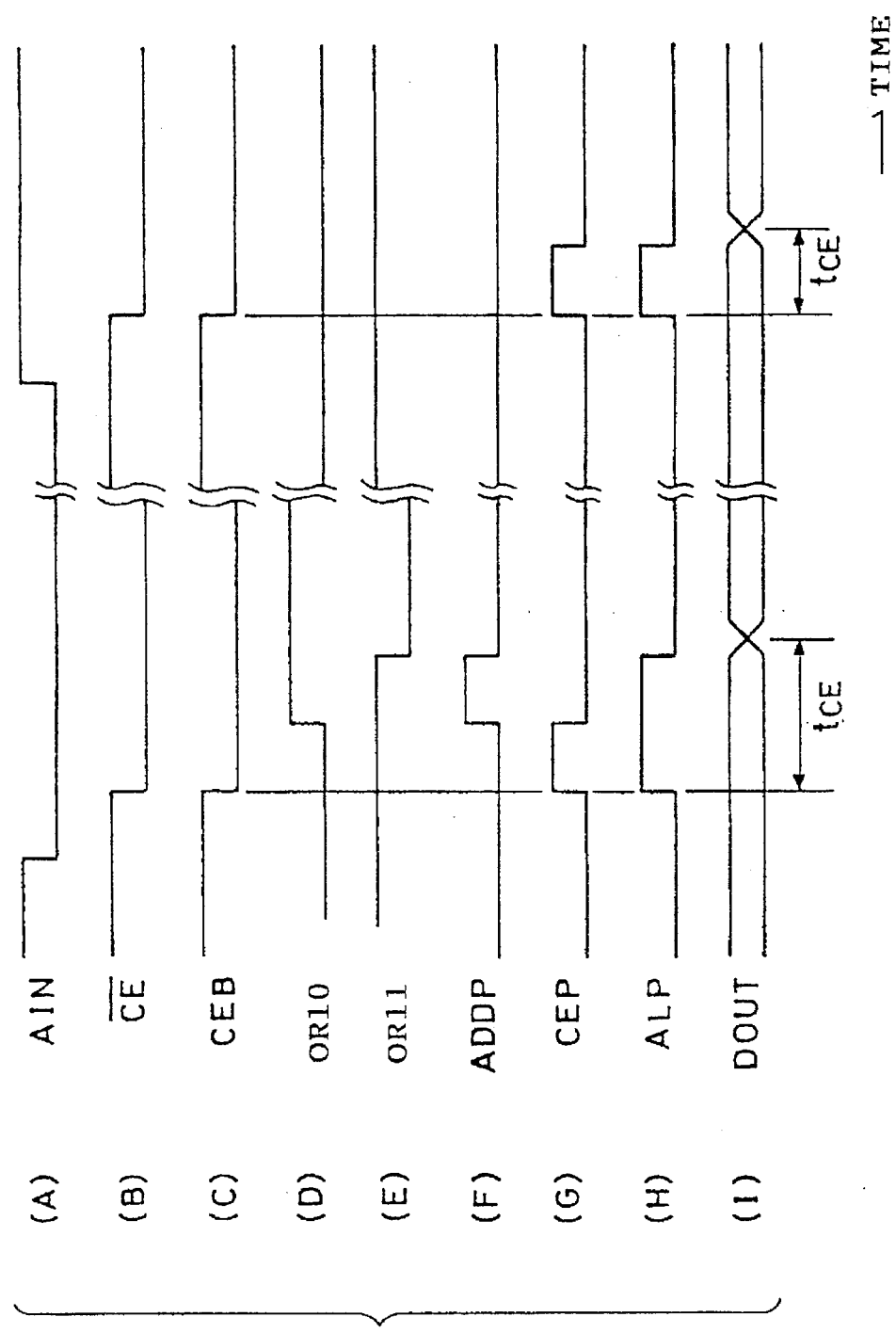
FIG. 4 is a timing chart, showing timings (A) through (I), for explaining the operation of the first conceivable example of the mask ROM shown in FIG. 1.

The circuit shown in FIG. 24 is an improvement of the circuit shown in FIG. 1. In FIG. 24, an address pulse signal through control circuit 200 is provided between the address pulse generating circuit 6 and the output control pulse signal generating circuit 14. Otherwise, the construction of the circuit shown in FIG. 24 is basically the same as that shown in FIG. 1. In FIG. 24, those parts which are the same as those corresponding parts in FIG. 1 are designated by the same reference numerals, and a description by the same reference numerals, and a description thereof will be omitted.

The address pulse signal through control circuit 200 blocks the address pulse signal ADDP which is generated responsive to the transition of the chip enable signal /CE from the high level (inactive level) to the low level (active level) when the address signal AIN has the low level. On the other hand, the address pulse signal through control circuit 200 passes the address pulse signal ADDP which is generated responsive to the transition of the chip enable signal /CE from the high level to the low level when the address signal AIN has the high level. This address pulse signal through control circuit 200 includes an address pulse signal through control signal input terminal 210 to which an address pulse signal through control signal CONT is input, an inverter 202, and an AND circuit 203.

The address pulse signal through control circuit 200 controls whether or not to pass the address pulse signal which is output from the OR circuit 12 depending on the address pulse signal through control signal CONT which is input to the input terminal 201 and is inverted by the inverter 202 before being supplied to one input of the AND circuit 203. Hence, if the address pulse signal ADDP is generated responsive to the transition of the chip enable signal /CE from the high level to the low level when the address signal AIN has the low level, the address pulse signal through control signal CONT must have the high level at least during this time.

The above address pulse signal through control signal CONT can be generated by an address pulse signal through control signal generating circuit having a first construction shown in FIG. 25, for example.

In FIG. 25, the address pulse signal through control signal generating circuit includes an internal chip enable signal input terminal 204 to which the internal chip enable signal CEB having the same phase relationship to the chip enable signal /CE is input, inverters 205 through 208 which form a delay circuit, an OR circuit 209, and an address pulse signal through control signal output terminal 210 from which the address pulse signal through control signal CONT is output.

In this case, the delay time of the inverters 205 through 208 is set so that the timing of the falling edge of the address pulse signal through control signal CONT is the same as or slightly lagging the timing of the falling edge of the address pulse signal ADDP which is generated responsive to the transition of the chip enable signal /CE from the high level to the low level when the address signal AIN has the low level.

FIG. 26 is a timing chart for explaining the operation of the address pulse signal through control signal generating circuit shown in FIG. 25. In FIG. 26, (A) shows the voltage waveform of the internal chip enable signal CEB, (B) shows the output voltage waveform of the inverter 208, and (C) shows the voltage waveform of the address pulse signal through control signal CONT.

Figure 27:
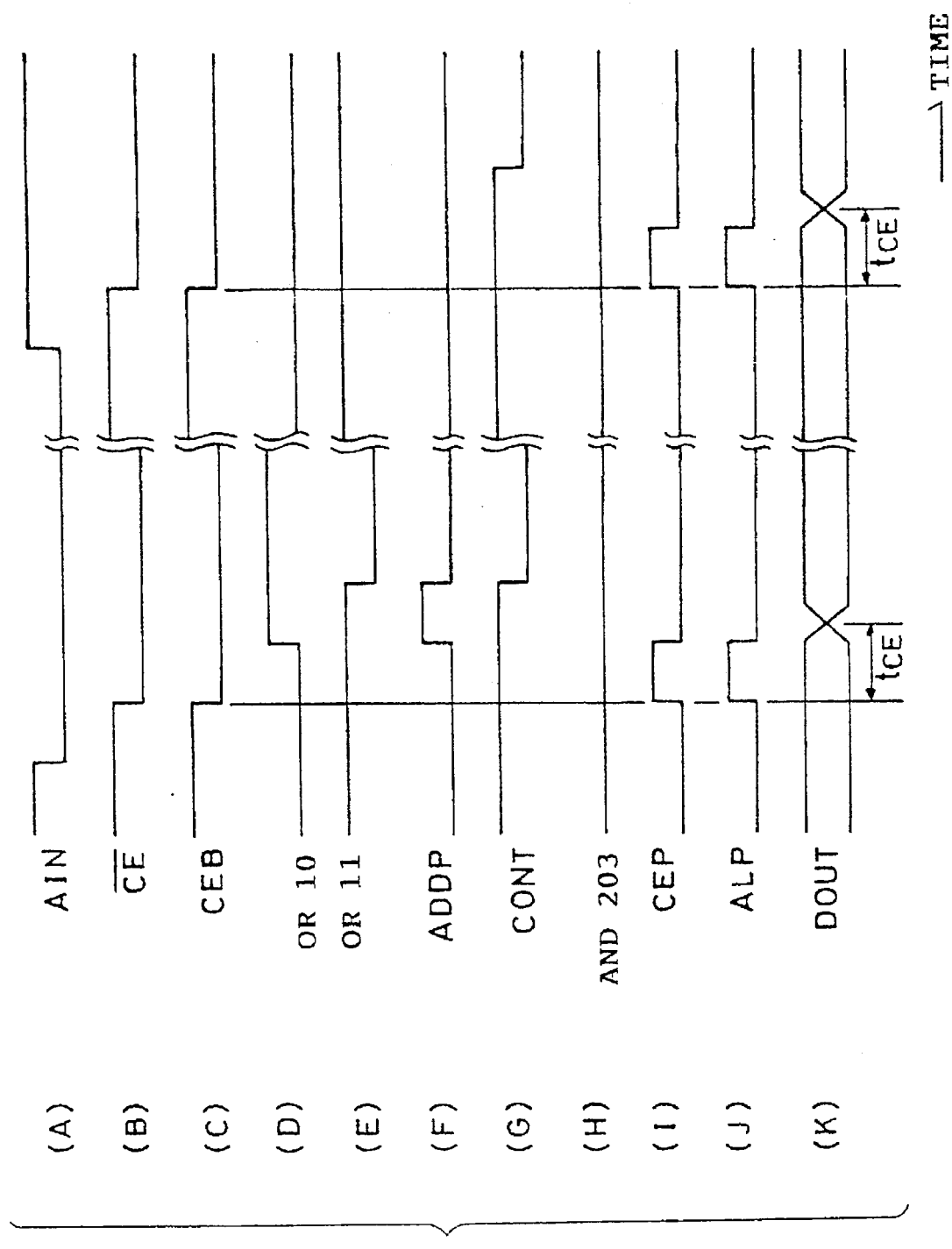
FIG. 27 is a timing chart, showing timings (A) through (K), for explaining the operation of the first embodiment when the address pulse signal through control signal generating circuit shown in FIG. 25 is used.

Accordingly, the signal waveforms at various parts of the circuit shown in FIG. 24 become as shown in FIG. 27 when the address pulse signal through control signal generating circuit shown in FIG. 25 is provided and the address pulse signal through control signal CONT output from this address pulse signal through control signal generating circuit is input to the address pulse signal through control signal input terminal 201 of the address pulse signal through control circuit 200 shown in FIG. 24.

In FIG. 27, (A) shows the voltage waveform of the address signal AIN, (N) shows the voltage waveform of the chip enable signal /CE, and (C) shows the voltage waveform of the internal chip enable signal CEB. In addition, in FIG. 27, (D) shows the output voltage waveform of the OR circuit 10, (E) shows the output voltage waveform of the OR circuit 11, (F) shows the voltage waveform of the address pulse signal ADDP, and (G) shows the voltage waveform of the address pulse signal through control signal CONT. Further, in FIG. 27, (H) shows the output voltage waveform of the AND circuit 203, (I) shows the voltage waveform of the chip enable pulse signal CEP, (J) shows the voltage waveform of the output control pulse signal ALP, and (K) shows the change in the output data DOUT.

Therefore, when the address pulse signal through control signal generating circuit shown in FIG. 25 is provided and the address pulse signal through control signal CONT output from this address pulse signal through control signal through control signal input terminal 201 of the address pulse signal through control circuit 200 shown in FIG. 24, it is possible to block the address pulse signal ADDP which is generated responsive to the transition of the chip enable signal /CE from the high level to the low level when the address signal AIN has the low level from being supplied to the OR circuit 16.

Accordingly, in this case, it is possible to generate the output control pulse signal ALP which has the same pulse width as the chip enable pulse signal CEP because this chip enable pulse signal CEP is input to the OR circuit 16.

In other words, it is possible to obtain the output control pulse signal ALP which does not have a shift in the timing of the falling edge regardless of whether the chip enable signal /CE undergoes the transition from the high level to the low level when the address signal /CE undergoes the transition from the high level to the low level when the address signal AIN has the high level.

Figure 28:
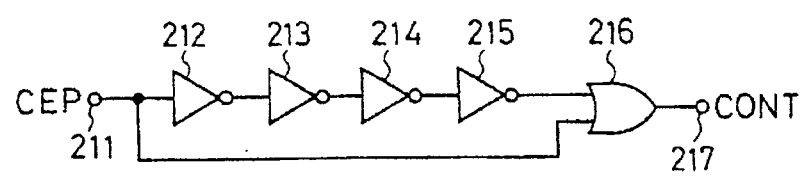
FIG. 28 is a circuit diagram showing a second construction of the address pulse signal through control signal generating circuit.

In addition, the above address pulse signal through control signal CONT can also be generated by the address pulse signal through control signal generating circuit having a second construction shown in FIG. 28, for example.

In FIG. 28, the address pulse signal through control signal generating circuit includes a chip enable pulse signal input terminal 211 to which the chip enable pulse signal CEP is input, inverters 212 through 215 which form a delay circuit, an OR circuit 216, and an address pulse signal through control signal output terminal 217 from which the address pulse signal through control signal CONT is output.

In this case, the delay time of the inverters 212 through 215 is set so that the timing of the falling edge of the address pulse signal through control signal CONT is the same as or slightly lagging and timing of the falling edge of the address pulse signal ADDP which is generated responsive to the transition of the chip enable signal /CE from the high level to the low level when the address signal AIN has the low level.

Figure 29:
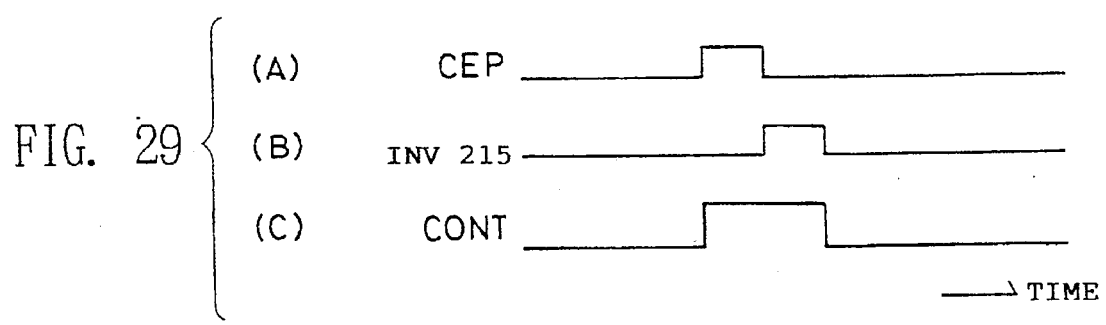
FIG. 29 is a timing chart, showing timings (A) through (C), for explaining the operation of the address pulse signal through control signal generating circuit shown in FIG. 28.

FIG. 29 is a timing chart for explaining the operation of the address pulse signal through control signal generating circuit shown in FIG. 28. In FIG. 29, (A) shows the voltage waveform of the chip enable pulse signal CEP, (B) shows the output voltage waveform of the inverter 215, and (C) shows the voltage waveform of the address pulse signal through control signal CONT.

Figure 30:
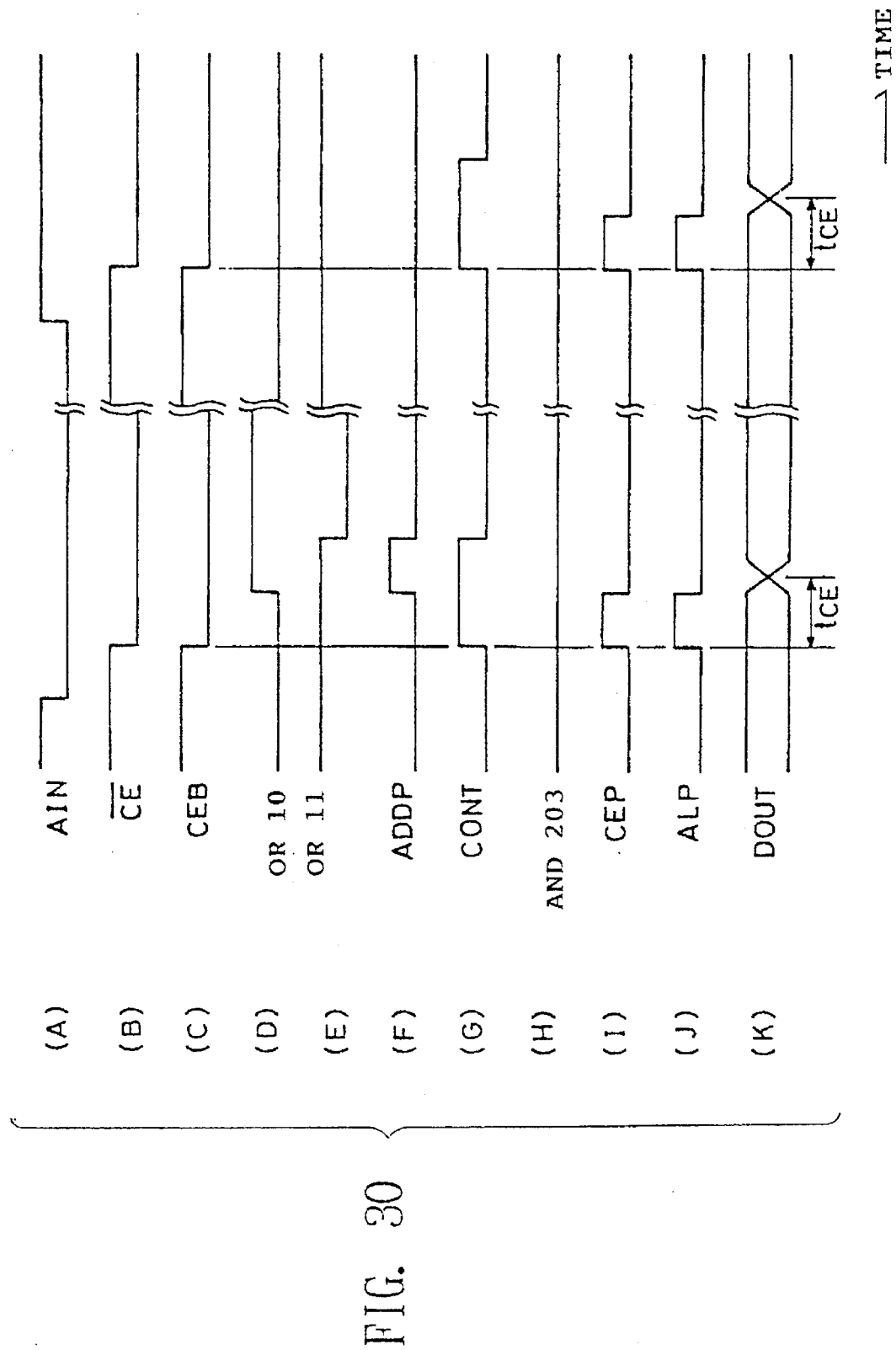
FIG. 30 is a timing chart, showing timings (A) through (K), for explaining the operation of the first embodiment when the address pulse signal through control signal generating circuit shown in FIG. 28 is used.

Accordingly, the signal waveforms at various parts of the circuit shown in FIG. 24 become as shown in FIG. 30 when the address pulse signal through control signal generating circuit shown in FIG. 28 is provided and the address pulse signal through control signal CONT output from this address pulse signal through control signal generating circuit is input to the address pulse signal through control signal input terminal 201 of the address pulse signal through control circuit 200 shown in FIG. 24.

In FIG. 30, (A) shows the voltage waveform of the address signal AIN, (N) shows the voltage waveform of the chip enable signal /CE, and (C) shows the voltage waveform of the internal chip enable signal CEB. In addition, in FIG. 30, (D) shows the output voltage waveform of the OR circuit 10, (E) shows the output voltage waveform of the OR circuit 11, (F) shows the voltage waveform of the address pulse signal ADDP, and (G) shows the voltage waveform of the address pulse signal through control signal CONT. Further, in FIG. 30, (H) shows the output voltage waveform of the AND circuit 203, (I) shows the voltage waveform of the chip enable pulse signal CEP, (J) shows the voltage waveform of the output control pulse signal ALP, and (K) shows the change in the output data DOUT.

Therefore, when the address pulse signal through control signal generating circuit shown in FIG. 28 is provided and the address pulse signal through control signal CONT output from this address pulse signal through control signal generating circuit is input to the address pulse signal through control signal input terminal 201 of the address pulse signal through control circuit 200 shown in FIG. 24, it is possible to block the address pulse signal ADDP which is generated responsive to the transition of the chip enable signal /CE from the high level to the low level when the address signal AIN has the low level from being supplied to the OR circuit 16.

Accordingly, in this case, it is also possible to generate the output control pulse signal ALP which has the same pulse width as the chip enable pulse signal CEP because this chip enable pulse signal CEP is input to the OR circuit 16.

In other words, it is possible to obtain the output control pulse signal ALP which does not have a shift in the timing of the falling edge regardless of whether the chip enable signal /CE undergoes the transition from the high level to the lower level when the address signal AIN has the low level or the chip enable signal /CE undergoes the transition from the high level to the lower level when the address signal AIN has the high level.

Figure 31:
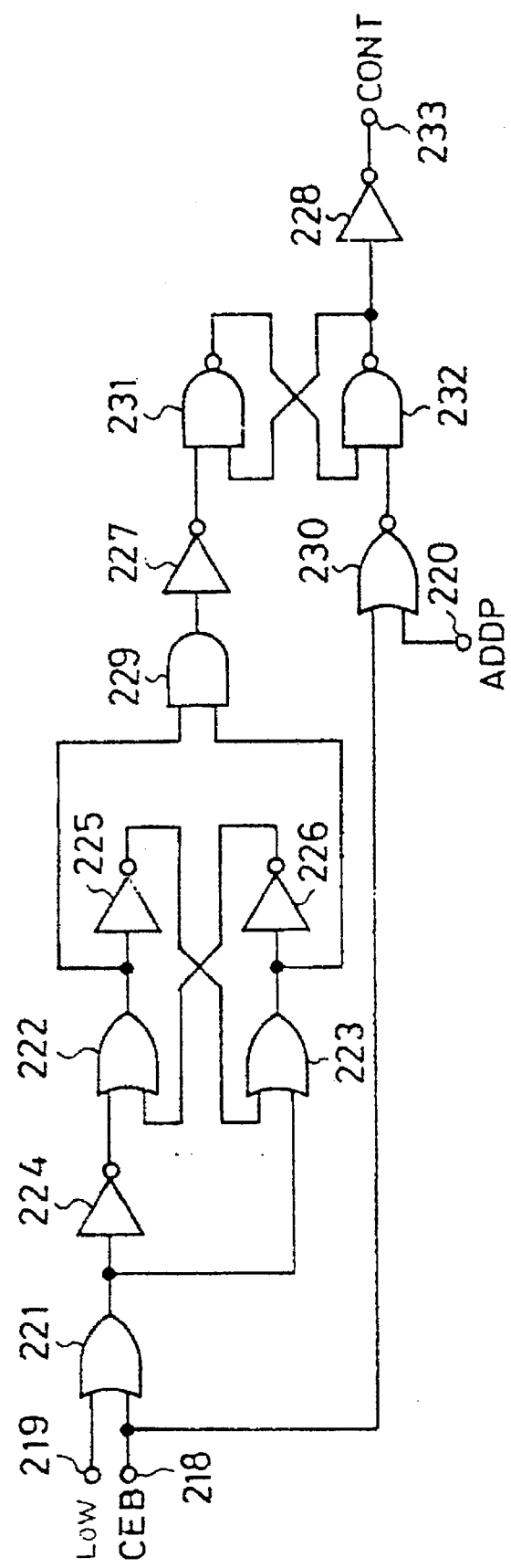
FIG. 31 is a circuit diagram showing a third construction of the address pulse signal through control signal generating circuit.

Furthermore, the above address pulse signal through control signal CONT can also be generated by the address pulse signal through control signal generating circuit having a third construction shown in FIG. 31, for example.

In FIG. 31, the address pulse signal through control signal generating circuit includes an internal chip enable signal input terminal 218 to which the internal chip enable signal CEB is input, a terminal 219 which is fixed to the low level, an address pulse signal input terminal 220 to which the address pulse signal ADDP is input, OR circuits 221 through 223, inverters 224 through 228, and AND circuit 229, a NOR circuit 230, NAND circuits 231 and 232, and an address pulse signal through control signal output terminal 233 from which the address pulse signal through control signal CONT is output.

In this case, it is possible to obtain the address pulse signal through control signal CONT shown in FIG. 29 (C) by providing the address pulse signal through control signal generating circuit shown in FIG. 31. As a result, the signal waveforms at various parts of the circuit shown in FIG. 24 become the same as those shown in FIG. 30.

Accordingly, in this case, it is also possible to generate the output control pulse signal ALP which has the same pulse width as the chip enable pulse signal CEP because this chip enable pulse signal CEP is input to the OR circuit 16.

In other words, it is possible to obtain the output control pulse signal ALP which does not have a shift in the timing of the falling edge regardless of whether the chip enable signal /CE undergoes the transition from the high level to the low level when the address signal AIN has the low level or the chip enable signal /CE undergoes the transition from the high level to the lower level when the address signal AIN has the high level.

According to the first embodiment, it is possible to make the chip enable access time $t_{CE}$ at the time when the address signal AIN has the low level and the chip enable access time $t_{CE}$ at the time when the address signal AIN has the high level the same, and stabilize the chip enable access time $t_{CE}$. Thus, it is possible to realize a high-speed read operation.

[2] Second embodiment:

Next, a description will be given of a second embodiment of the semiconductor memory device according to the present invention, by referring to FIGS. 32 and 33.

Figure 32:
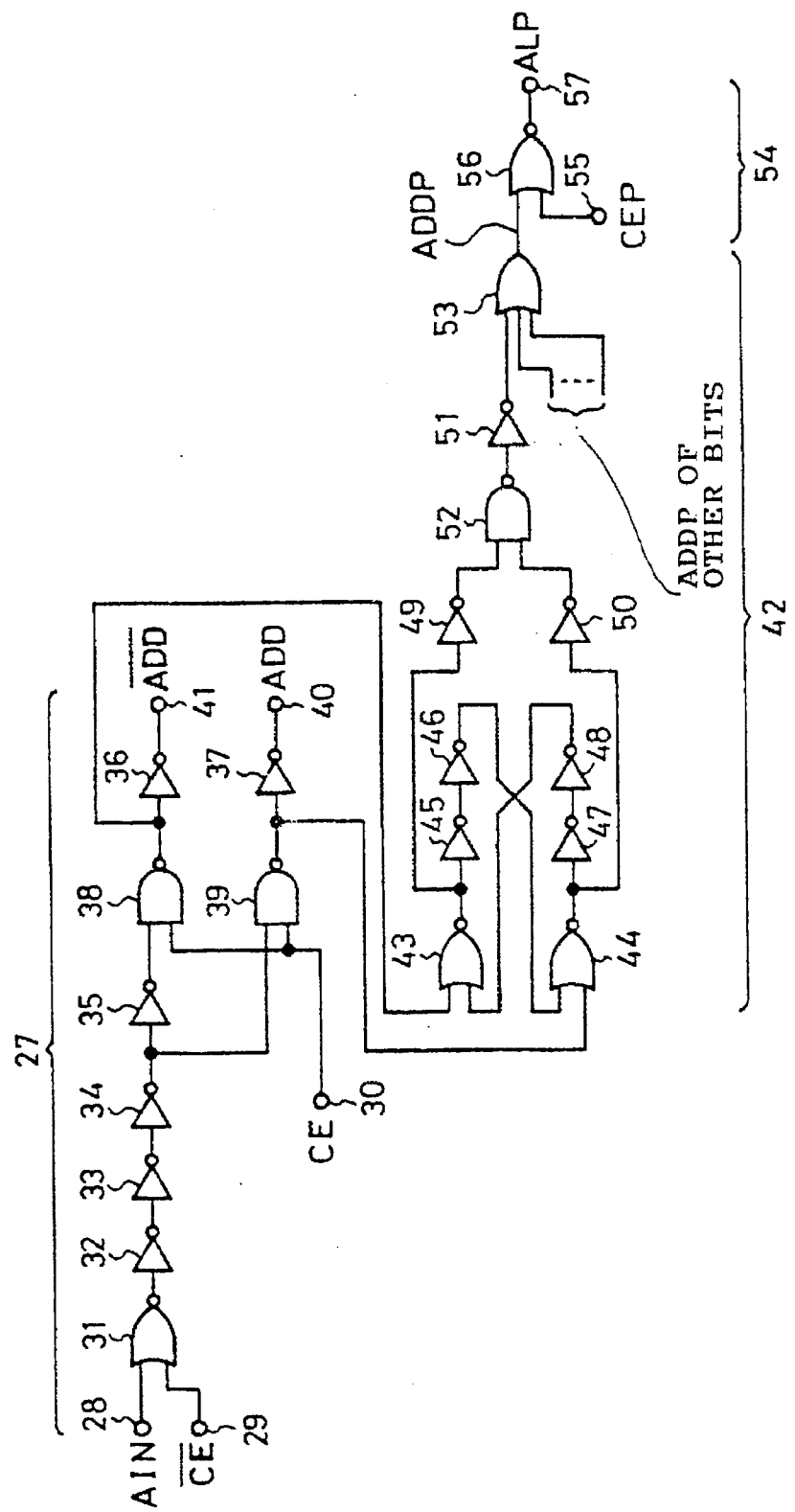
FIG. 32 is a circuit diagram showing an important part of a second embodiment of the semiconductor memory device according to the present invention.

FIG. 32 is a circuit diagram of an important part of the second embodiment, and shows a circuit necessary for generating the output control pulse ALP. In FIG. 32, those parts which are the same as those corresponding parts in FIG. 5 are designated by the same reference numerals, and a description thereof will be omitted.

Figure 5:
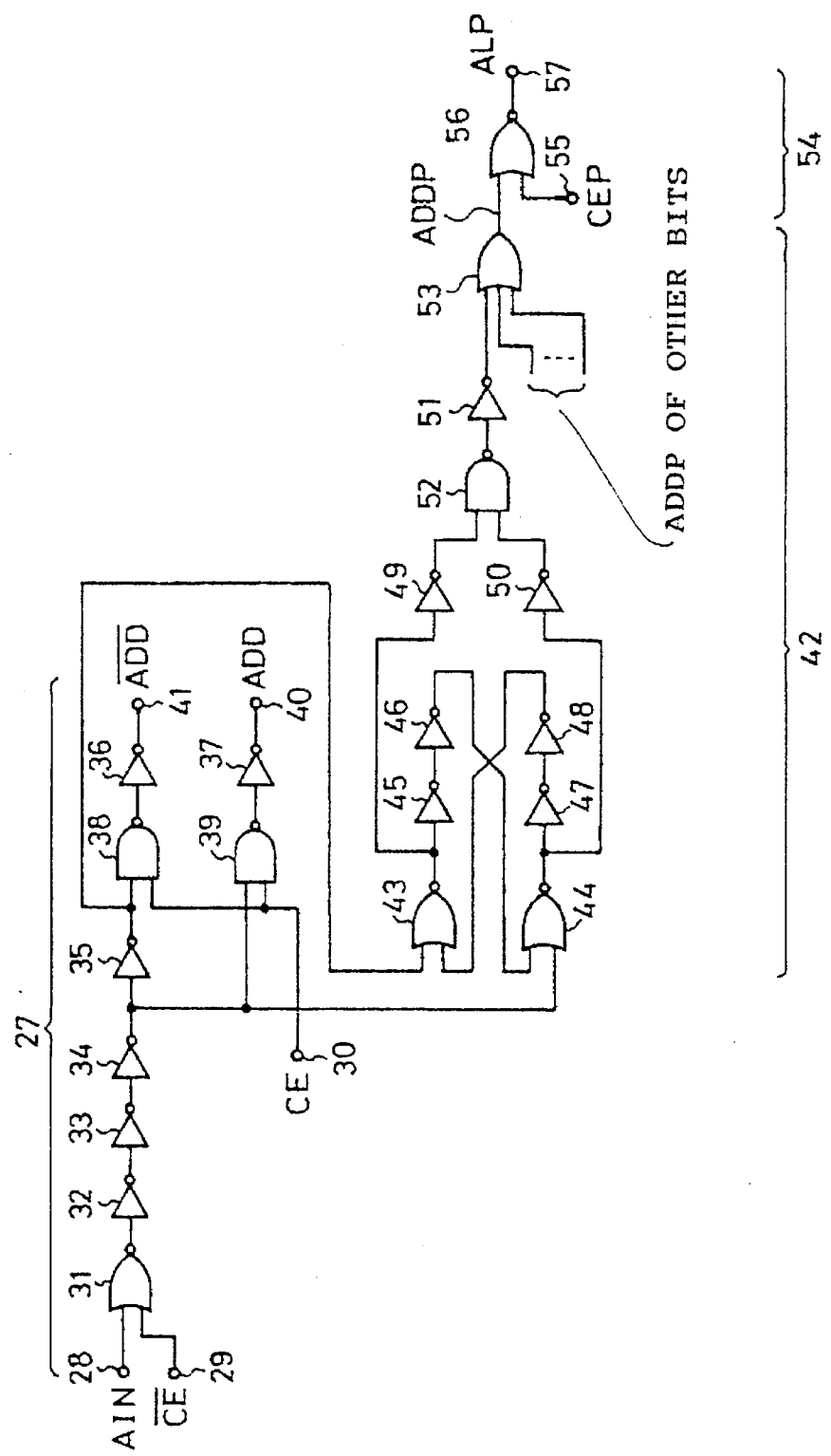
FIG. 5 is a circuit diagram showing an important part of a second conceivable example of the mask ROM.
Figure 6:
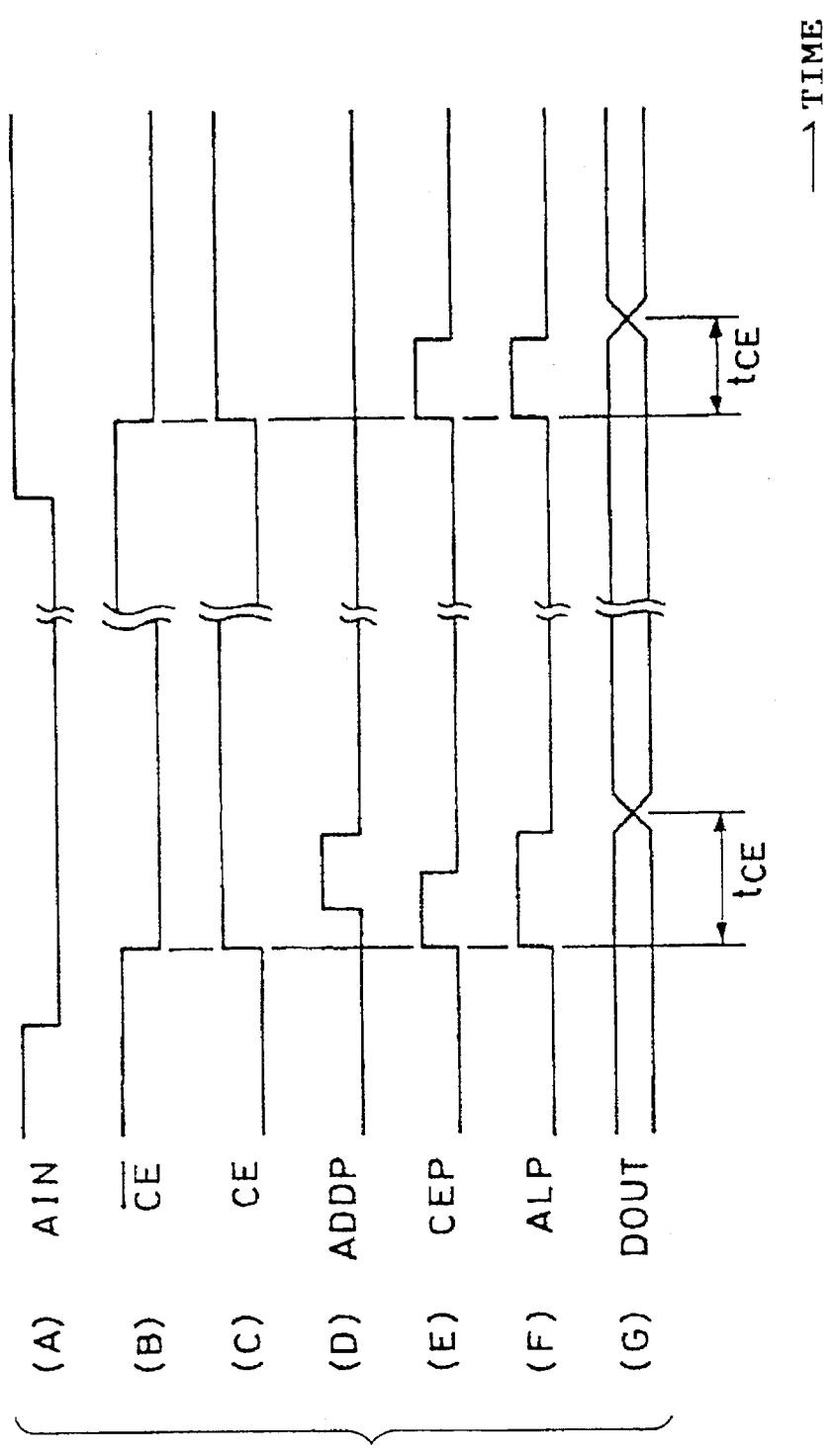
FIG. 6 is a timing chart, showing timings (A) through (G), for explaining the operation of the second conceivable example of the mask ROM shown in FIG. 5.

The circuit shown in FIG. 32 is an improvement of the circuit shown in FIG. 5. In the circuit shown in FIG. 5, the output terminal of the inverter 34 is connected to one input terminal of the NOR circuit 44. However, in the circuit shown in FIG. 32, the output terminal of the NAND circuit 38 is connected to one input terminal of the NOR circuit 43, and the output terminal of the NAND circuit 39 is connected to one input terminal of the NOR circuit 44. Otherwise, the circuit shown in FIG. 32 is basically the same as that shown in FIG. 5.

In this second embodiment, the internal chip enable signal CE must be delayed with respect to the chip enable signal /CE so that the internal chip enable signal CE undergoes a transition from the low level to the high level after the output levels of the inverters 34 and 35 settle and are ascertained in the case where the output levels of the inverters 34 and 35 change.

Figure 33:
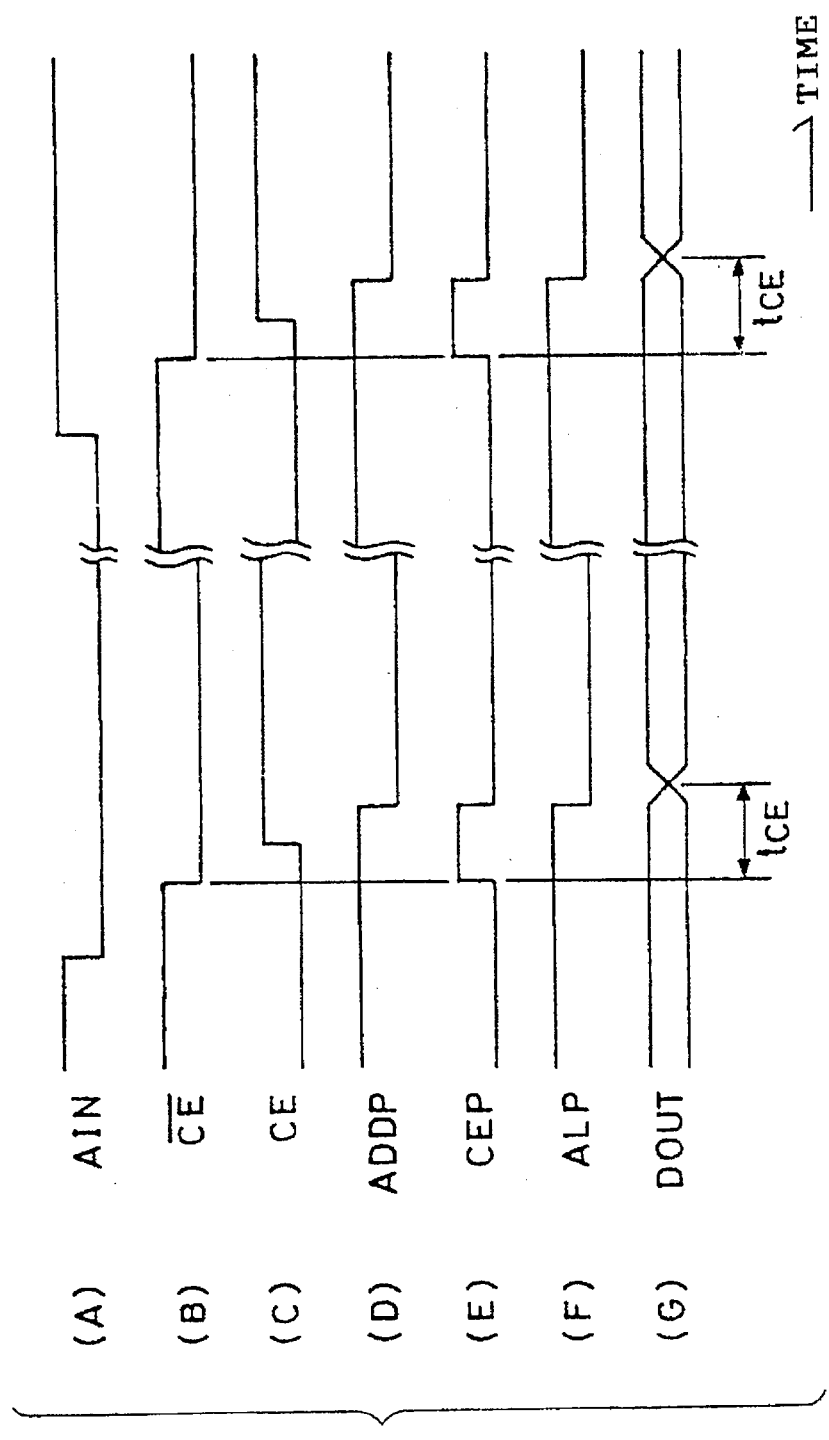
FIG. 33 is a timing chart, showing timings (A) through (G), for explaining the operation of the second embodiment.

As a result, the signal waveforms at various parts of the circuit shown in FIG. 32 become as shown in FIG. 33. In FIG. 33, (A) shows the voltage waveform of the address signal AIN, (B) shows the voltage waveform of the chip enable signal /CE, and (C) shows the voltage waveform of the chip enable signal CE. In addition, in FIG. 33, (D) shows the voltage waveform of the address pulse signal ADDP, (E) shows the voltage waveform of the chip enable pulse signal CEP, (F) shows the voltage waveform of the output control pulse signal ALP, and (G) shows the change in the output data DOUT.

According to this second embodiment, the chip enable signal CE is delayed with respect to the chip enable signal /CE so that the chip enable signal CE undergoes the transition from the low level to the high level after the output levels of the inverters 34 and 35 are ascertained. In addition, the address pulse signal ADDP is generated by processing the outputs of the NAND circuits 38 and 39.

As a result, it is possible to obtain the output control pulse signal ALP which does not have a shift in the timing of the falling edge regardless of whether the chip enable signal /CE undergoes the transition from the high level to the low level when the address signal AIN has the low level or the chip enable signal /CE undergoes the transition from the high level to the low level when the address signal AIN has the high level.

Hence, according to this second embodiment, it is possible to make the chip enable access time $t_{CE}$ at the time when the address signal AIN has the low level and the chip enable access time $t_{CE}$ at the time when the address signal AIN has the high level the same, and stabilize the chip enable access time $t_{CE}$. Thus, it is possible to realize a high-speed read operation.

[3] Third Embodiment

Next, a description will be given of a third embodiment of the semiconductor memory device according to the present invention, by referring to FIGS. 34 through 40.

Figure 34:
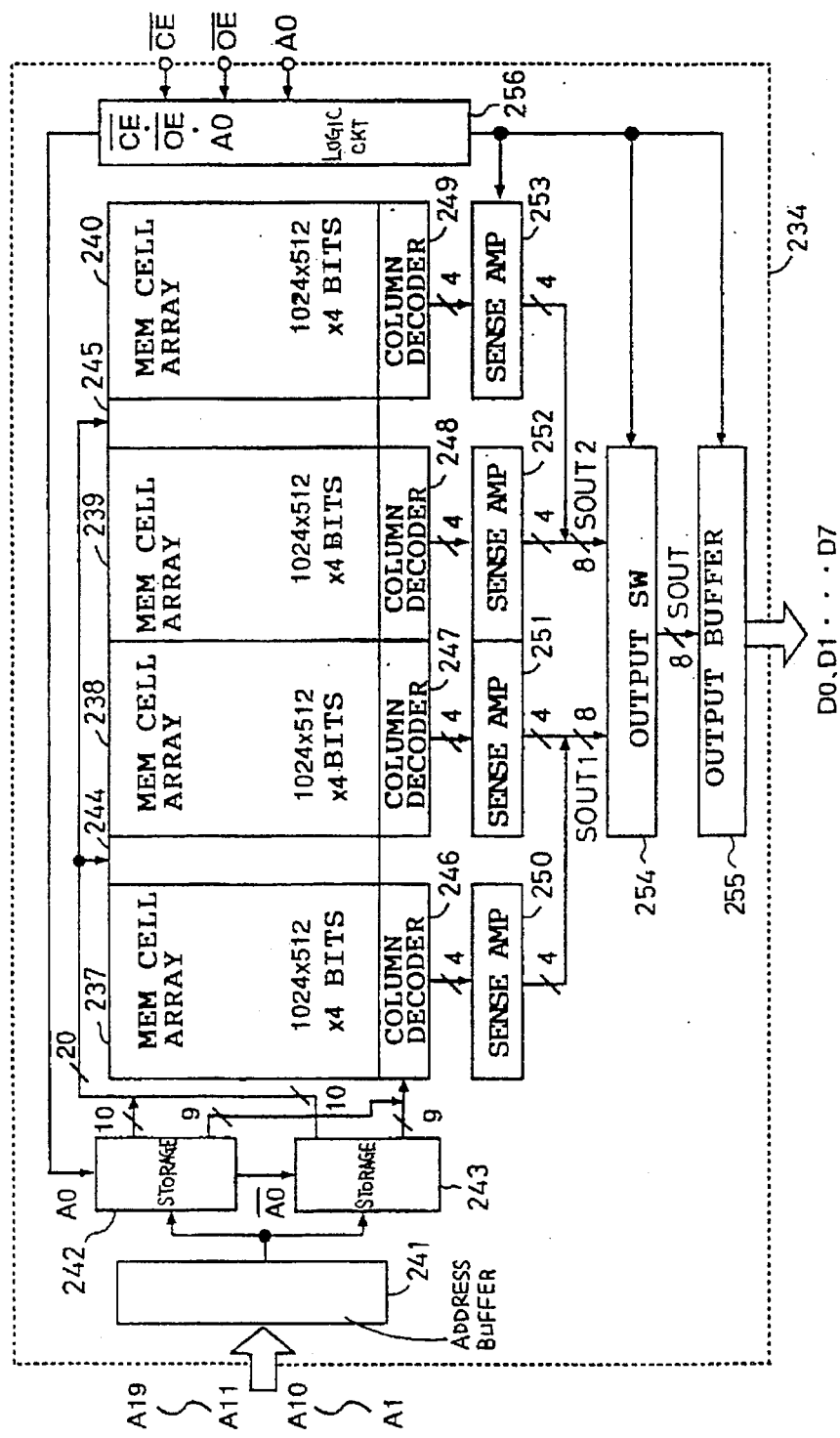
FIG. 34 is a system block diagram showing an important part of a third embodiment of the semiconductor memory device according to the present invention.

FIG. 34 is a system block diagram showing an important part of the third embodiment.

A chip body 234 of a mask ROM shown in FIG. 34 includes a memory cell arrays 237 through 240 having a 1024×512×4 bit construction, an address buffer 241, address storage circuits 242 and 243, row decoders 244 and 245, column decoders 246 through 249, sense amplifiers 250 through 253, an output switching circuit 254, an output buffer 255, and a logic circuit 256.

Out of address signals A0 through A19, the address signal A0 is used as a control signal for selecting the memory cell array or the like, the row address signals A1 through A10 are used to select the block selection line and the word line of the memory cell array, and the column address signals A11 through A19 are used to select the column of the memory cell array.

The address buffer 241 inputs to the inside the address signals A1 through A19 which are supplied from the outside. The address storage circuits 242 and 243 alternately store the address signals A1 through A19 which are successively output from the address buffer 241.

The row decoder 244 decodes the row address signals A1 through A10 out of the address signals A1 through A19 stored in the address storage circuit 242, and selects the block selection line and the word line of the memory cell arrays 237 and 238. The row decoder 245 decoders the row address signals A1 through A10 out of the address signals A1 through A19 stored in the address storage circuit 242, and selects the block selection line and the word line of the memory cell arrays 239 and 240.

The column decoders 246 through 249 decode the column address signals A11 through A19 out of the address signals A1 through A19 stored in the address storage circuits 242 and 243, and output column selection signals which are required to select the columns of the memory cell arrays 237 through 240.

In FIG. 34, the illustration of a column gate circuit for selecting the columns of the memory cell arrays 237 through 240 based on the column selection signals output from the column decoders 237 through 240 is omitted.

The sense amplifiers 250 through 253 amplify and detect the data read from the respective memory cell arrays 237 through 240. The output switching circuit 254 selectively outputs a sense amplifier output SOUT 1 output from the sense amplifiers 250 and 251 and a sense amplifier output SOUT2 output from the sense amplifiers 252 and 253. The output buffer 255 outputs a sense amplifier output SOUT (SOUT1 or SOUT2) which is output from the output switching circuit 254 to the outside.

The logic circuit 256 inputs the address signal A0, the output enable signal /OE and the chip enable signal /CE supplied from the outside, and outputs controls signals for controlling operations of the address buffer 241, the address storage circuits 242 and 243, the sense amplifiers 250 and 253, the output buffer 255 and the like.

Figure 35:
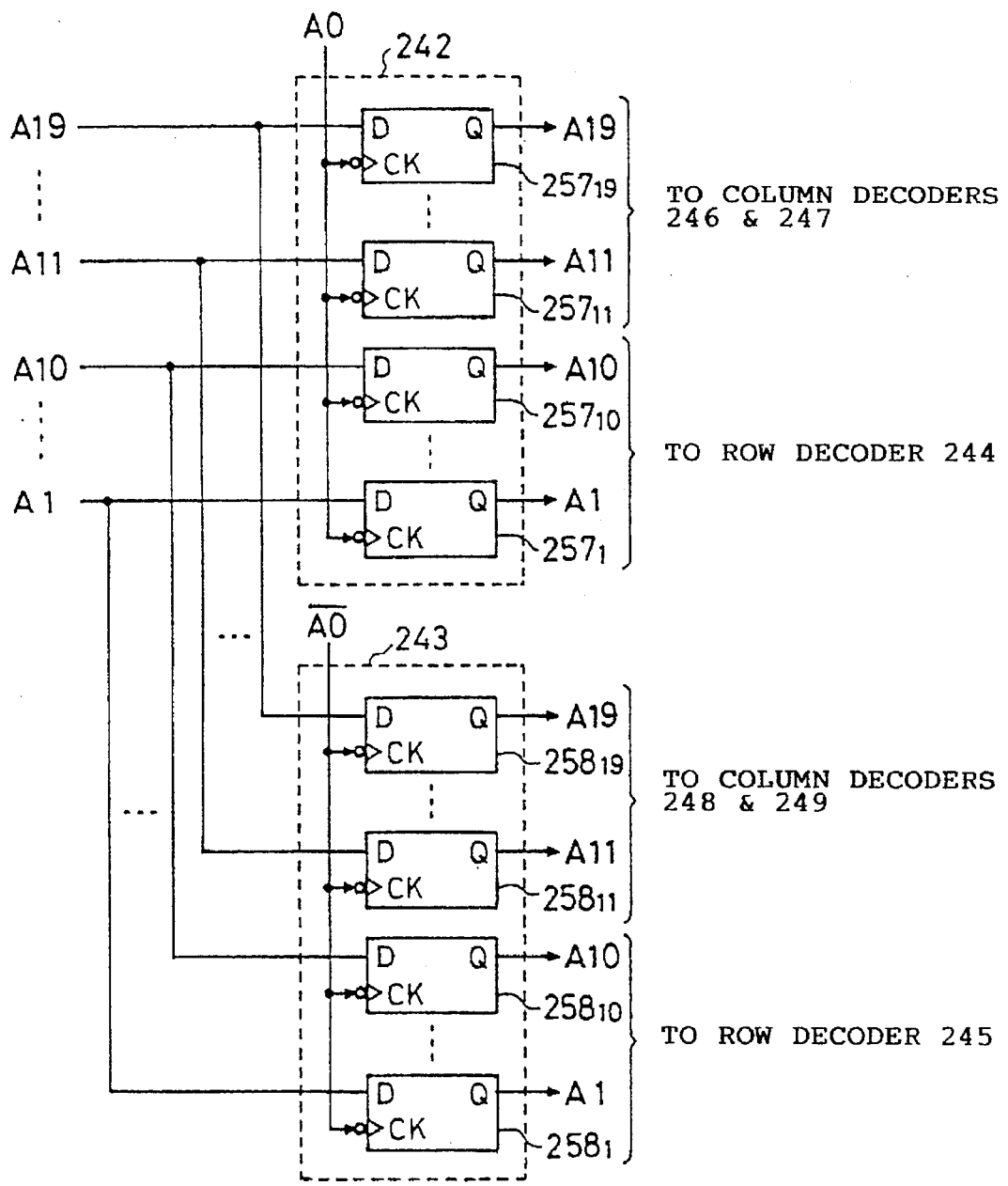
FIG. 35 is a circuit diagram showing address storage circuits of the third embodiment.

The address storage circuits 242 and 243 have the construction shown in FIG. 35, for example. In FIG. 35, the address storage circuit 242 is made up of negative edge type D flip-flops $257_1$ through $257_{19}$, and the address storage circuit 243 is made up of negative edge type D flip-flops $258_1$ through $258_{19}$.

The D flip-flops $257_1$ through $257_{19}$ latch the address signals A0 through A19 in synchronism with the falling edge of the address signal A0. On the other hand, the D flip-flops $258_1$ through $258_{19}$ latch the address signals A0 through A19 in synchronism with the falling edge of to address signal /A0 which has the inverted relationship to the address signal A0. The address signals A0 and /A0 are generated by a circuit such as that shown in FIG. 36 which is provided within the logic circuit 256.

Figure 36:
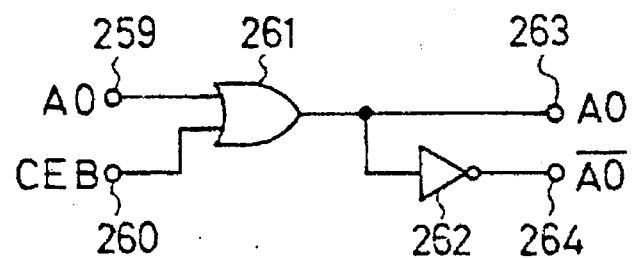
FIG. 36 is a circuit diagram showing a part of a logic circuit of the third embodiment.

In FIG. 36, the circuit within the logic circuit 256 includes an address signal input terminal 259 to which the address signal A0 is input from the outside, an internal chip enable signal input terminal 260 to which the internal chip enable signal CEB is input, an OR circuit 261, an inverter 262, an address signal output terminal 263 from which the address signal A0 is output, and an address signal output terminal 264 from which the address signal /A0 is output.

Figure 7:
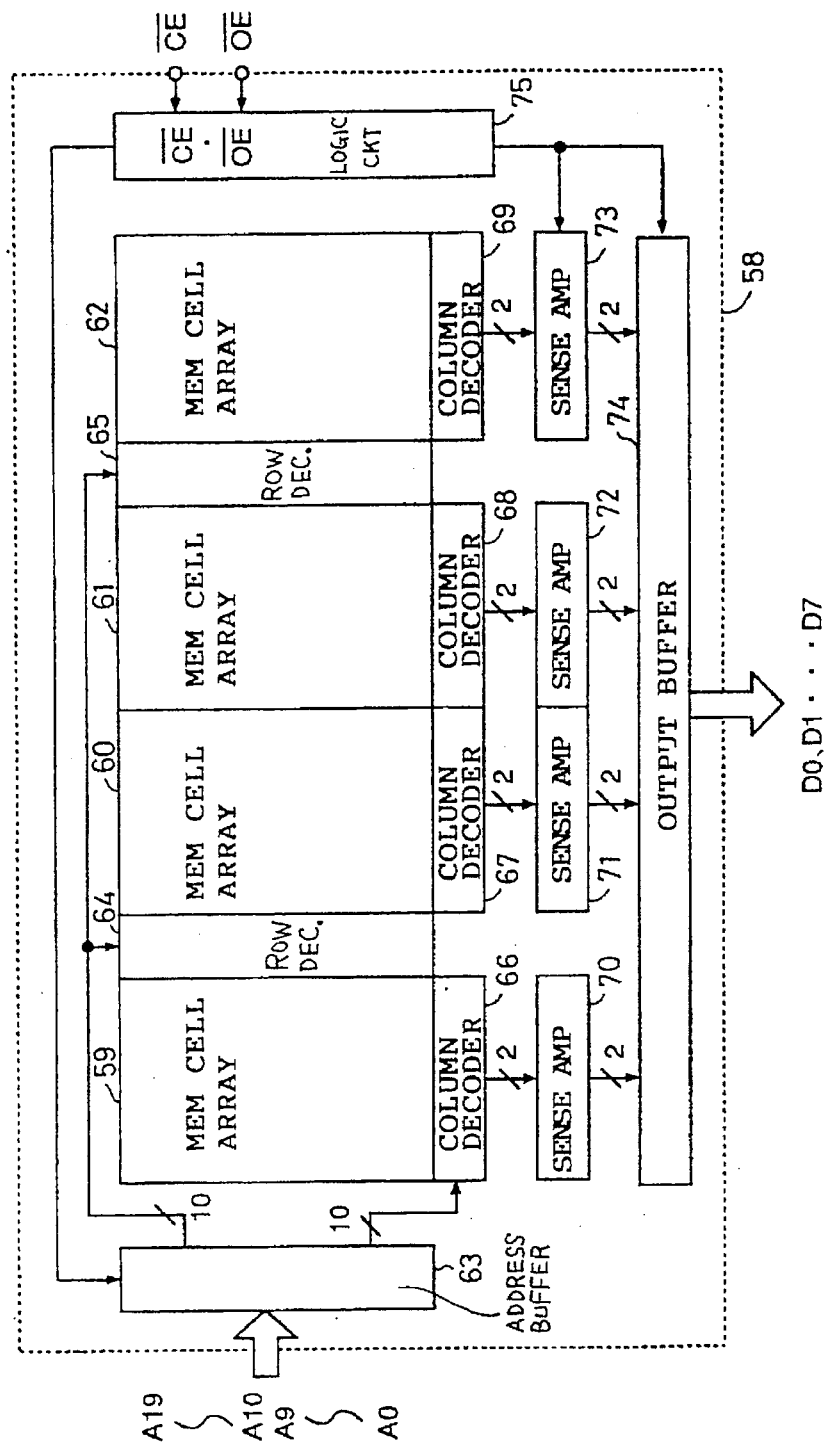
FIG. 7 is a system block diagram showing an important part of a third conceivable example of the mask ROM.
Figure 8:
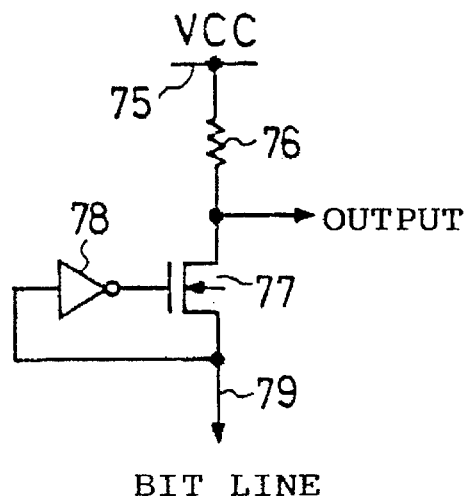
FIG. 8 is a circuit diagram showing the construction of a sense amplifier shown in FIG. 7 for 1 bit.

The sense amplifiers 250 through 253 may have a construction similar to that of the sense amplifiers 70 through 73 of the third conceivable example shown in FIG. 7. Hence, the construction of each of the sense amplifiers 250 through 253 for 1 bit may be the same as that shown in FIG. 8.

Figure 37:
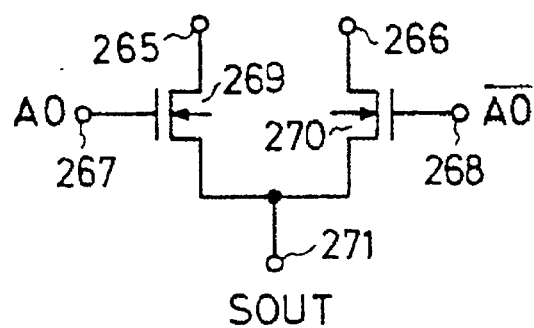
FIG. 37 is a circuit diagram showing an output switching circuit of the third embodiment.

The output switching circuit 254 has the construction shown in FIG. 37 for 1 bit, for example. In FIG. 37, the output switching circuit 254 includes a sense amplifier output input terminal 265 to which 1-bit portion of the sense amplifier output SOUT1 of the sense amplifiers 250 and 251 is input, a sense amplifier output input terminal 266 to which 1-bit portion of the sense amplifier output SOUT2 of the sense amplifiers 252 and 253 is input, an address signal input terminal 267 to which the address signal A0 is input, an address signal input terminal 268 to which the address signal /A0 is input, nMOS transistors 269 and 270, and an output terminal 271. The 1-bit portion of the sense amplifier output SOUT1 or the 1-bit portion of the sense amplifier output SOUT2 is output from the output terminal 271 as the 1-bit portion of the sense amplifier output SOUT.

In this output switching circuit 254, the nMOS transistor 269 turns ON and the nMOS transistor 270 turns OFF when the address signal A0 has the high level and the address signal /A0 has the low level, and in this case, the sense amplifier output SOUT1 is output as the sense amplifier output SOUT.

On the other hand, the nMOS transistor 269 turns OFF and the nMOS transistor 270 turns ON when the address signal A0 has the low level and the address signal /A0 has the high level, and in this case, the sense amplifier output SOUT 2 is output as the sense amplifier output SOUT.

Figure 9:
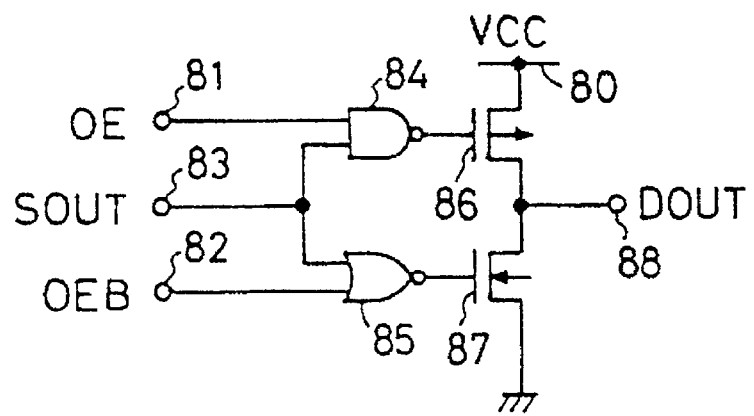
FIG. 9 is a circuit diagram showing the construction of an output buffer shown in FIG. 7 for 1 bit.
Figure 10:
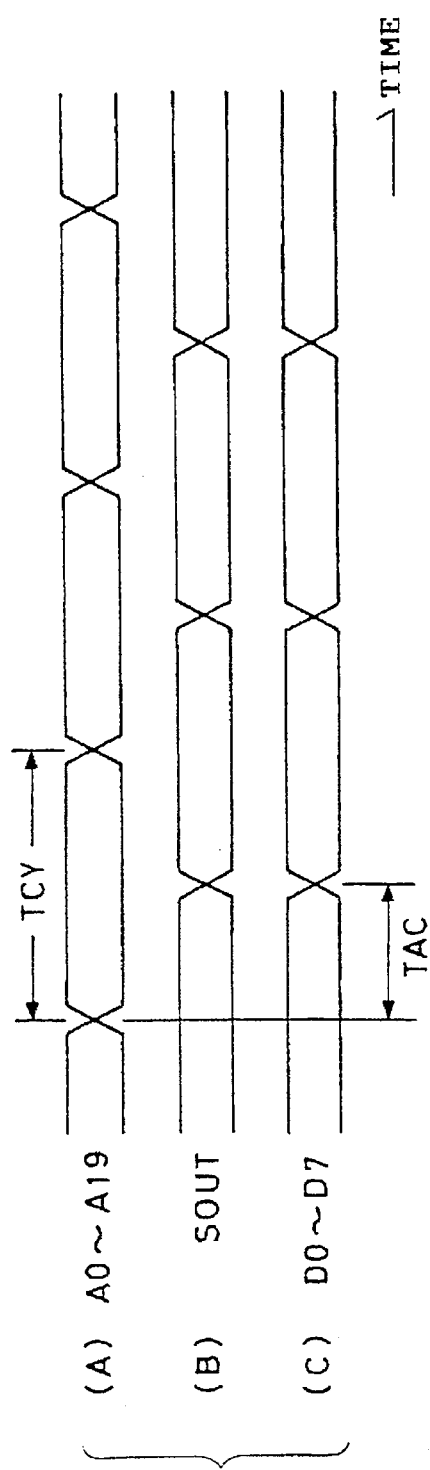
FIG. 10 is a timing chart, showing timings (A) through (C), for explaining the operation of the third conceivable example of the mask ROM shown in FIG. 7.

The output buffer 255 may have a construction similar to that of the output buffer 74 of the third conceivable example shown in FIG. 7. Hence, the construction of the output buffer 255 for 1 bit may be the same as that shown in FIG. 9.

Figure 38:
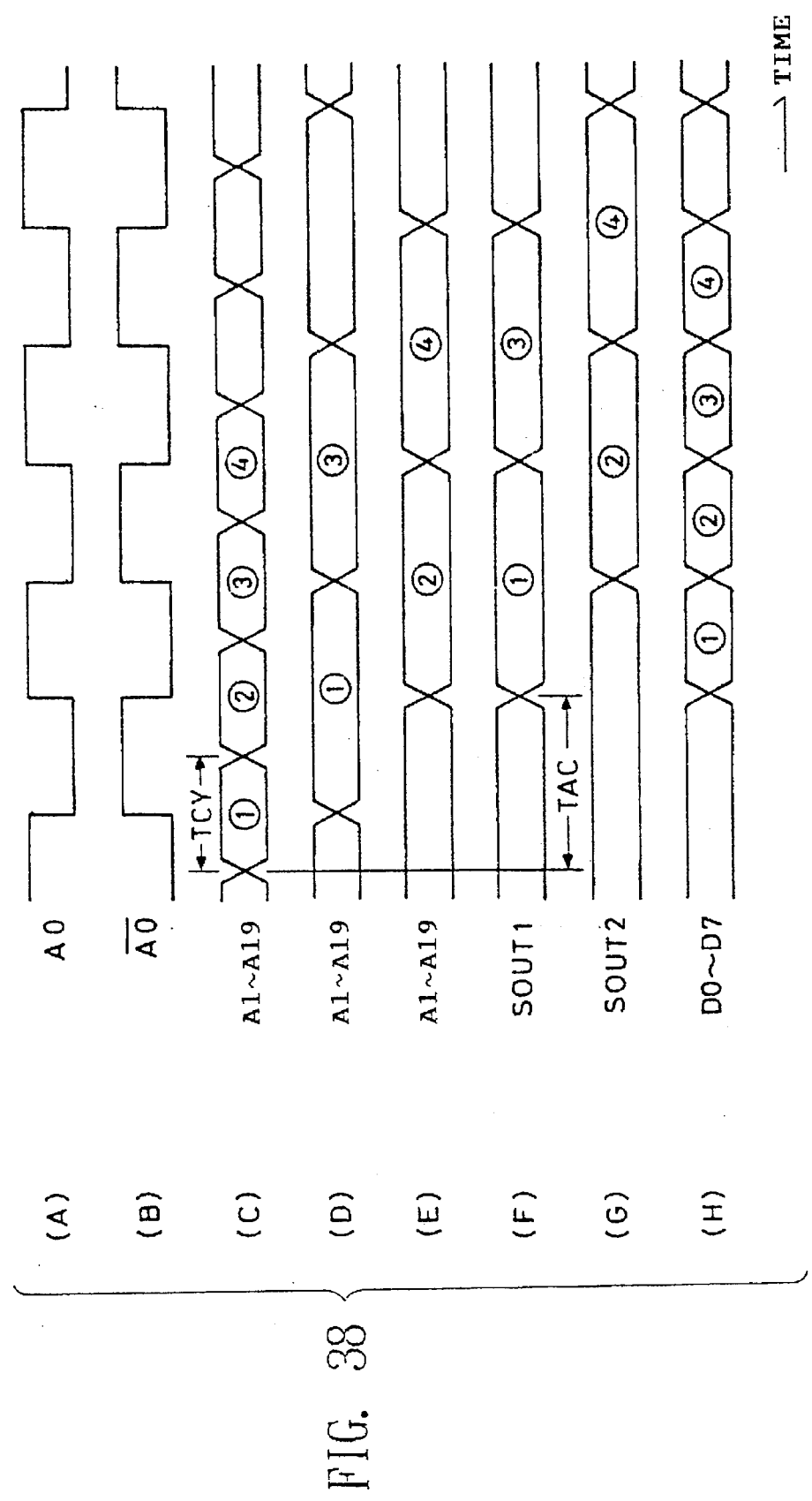
FIG. 38 is a timing chart, showing timings (A) through (H), or explaining the operation of the third embodiment.

According to this third embodiment having the construction described above, the mask ROM can be operated so that the signal waveforms at various parts of the circuit shown in FIG. 34 become as shown in FIG. 38.

In FIG. 38, (A) shows the voltage waveform of the address signal A0, (B) shows the voltage waveform of the address signal /A0, and (C) shows the voltage waveform of the row address signals A1 through A10 and the column address signals A11 through A19 which are input. In FIG. 38, (D) shows the voltage waveform of the row address signals A1 through A10 and the column address signals A11 through A19 which are output from the address storage circuit 242, and (E) shows the voltage waveform of the row address signals A1 through A10 and the column address signals A11 through A19 which are output from the address storage circuit 243.

In addition, in FIG. 38, (F) shows the voltage waveform of the sense amplifier output SOUT1 output from the sense amplifiers 250 and 251, (G) shows the voltage waveform of the sense amplifier output SOUT2 output from the sense amplifiers 252 and 253, and (H) shows the voltage waveform of the output data A0 through D7.

According to this third embodiment, it is possible to make the cycle access time TCY ½ that of the third conceivable example described above, even if the address access time TAC is set the same as the third conceivable example. For this reason, it is possible to increase the amount of data read per unit time, and accordingly, realize a high-speed read operation.

In this third embodiment, the address signal A0 is used as the control signal for restricting the address access time TAC. However, it is of course possible to use instead a clock signal or the like supplied from the outside for the purpose of restricting the address access time TAC.

Figure 39:
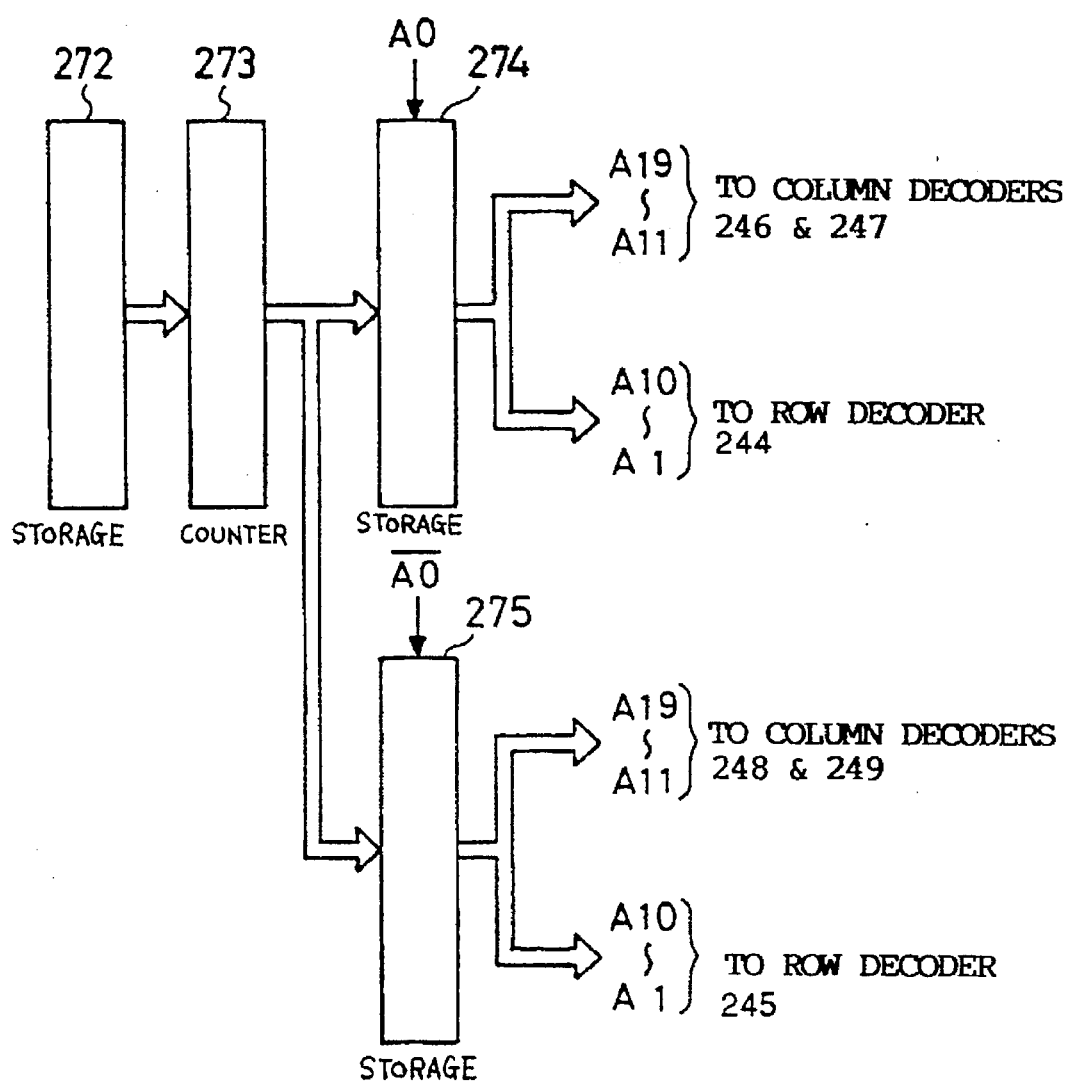
FIG. 39 is a system block diagram showing an address counter circuit of the third embodiment.

When providing an address counter circuit shown in FIG. 39 and making a serial real, an output of this address counter circuit is supplied to the row decoders 244 and 245.

In FIG. 39, the address counter circuit includes an address storage circuit 272, a counter 273, and address storage circuits 274 and 275. The address storage circuit 272 stores the address signals A1 through A19 output from the address buffer 241. The counter 273 uses the address stored in the address storage circuit 273 as the initial value outputs the address signals A1 through A19 by successively incrementing the address from the initial value. The address storage circuit 274 stores and output the address signals A1 through A19 output from the counter 273 in synchronism with the falling edge of the address signal A0. The address storage circuit 275 stores and outputs the address signals A1 through A19 output from the counter 173 in synchronism with the falling edge of the address signal /AO.

These address storage circuits 274 and 275 may be provided independently of the address storage circuits 242 and 243 shown in FIG. 34 or, the address storage circuits 242 and 243 may be used as these address storage circuits 274 and 275.

Figure 40:
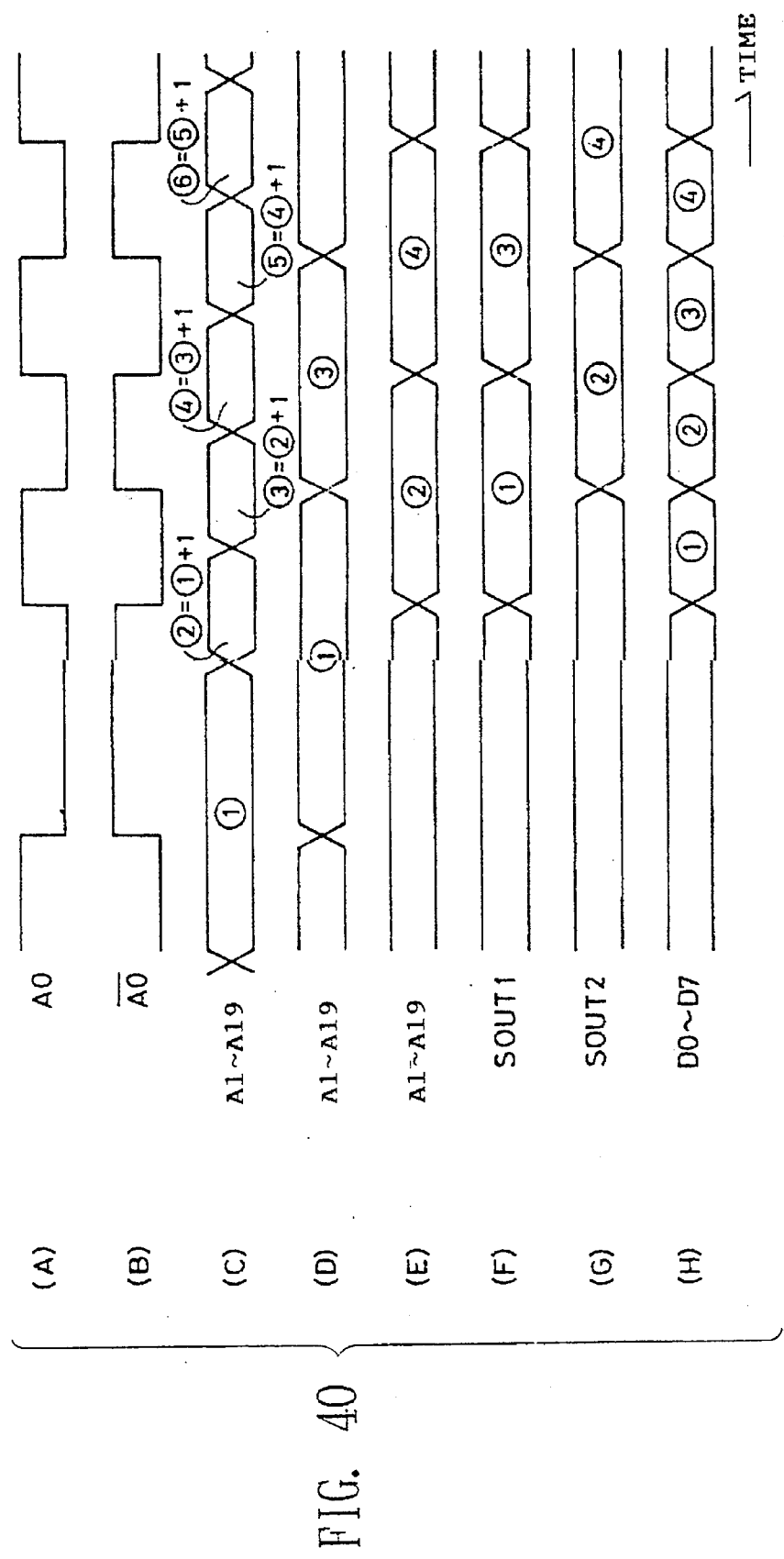
FIG. 40 is a timing chart, showing timings (A) through (H), for explaining the operation of the third embodiment when the address counter circuit shown in FIG. 39 is used.

When making the read using the address counter circuit shown in FIG. 39, the mask ROM can be operated so that the signal waveforms at various parts of the circuit shown in FIG. 34 become as shown in FIG. 40.

In FIG. 40, (A) shows the voltage waveform of the address signal A0, (B) shows the voltage waveform of the address signal /A0, and (C) shows the voltage waveform of the row address signals A1 through A10 and the column address signals A11 through A19 which are output from the counter 273. In FIG. 40, (D) shows the voltage waveform of the row address signals A1 through A10 and the column address signals A11 through A19 which are output from the address storage circuit 274, and (E) shows the voltage waveform of the row address signals A1 through A10 and the column address signals A11 through A19 which are output from the address storage circuit 275.

In addition, in FIG. 40, (F) shows the voltage waveform of the sense amplifier output SOUT1 output from the sense amplifiers 250 and 251, (G) shows the voltage waveform of the sense amplifier output SOUT2 output from the sense amplifiers 252 and 253, and (H) shows the voltage waveform of the output data A0 through D7.

Hence, when the address counter circuit shown in FIG. 39 is provided in this third embodiment, it is possible to make the cycle access time TCY ½ that of the third conceivable example described above, even if the address access time TAC is set the same as the third conceivable example, excluding the case of the starting address. For this reason, it is possible to increase the amount of data read per unit time, and accordingly, realize a high-speed read operation.

[4] Fourth Embodiment

Next, a description will be given of a fourth embodiment of the semiconductor memory device according to the present invention, by referring to FIGS. 41 through 47.

Figure 41:
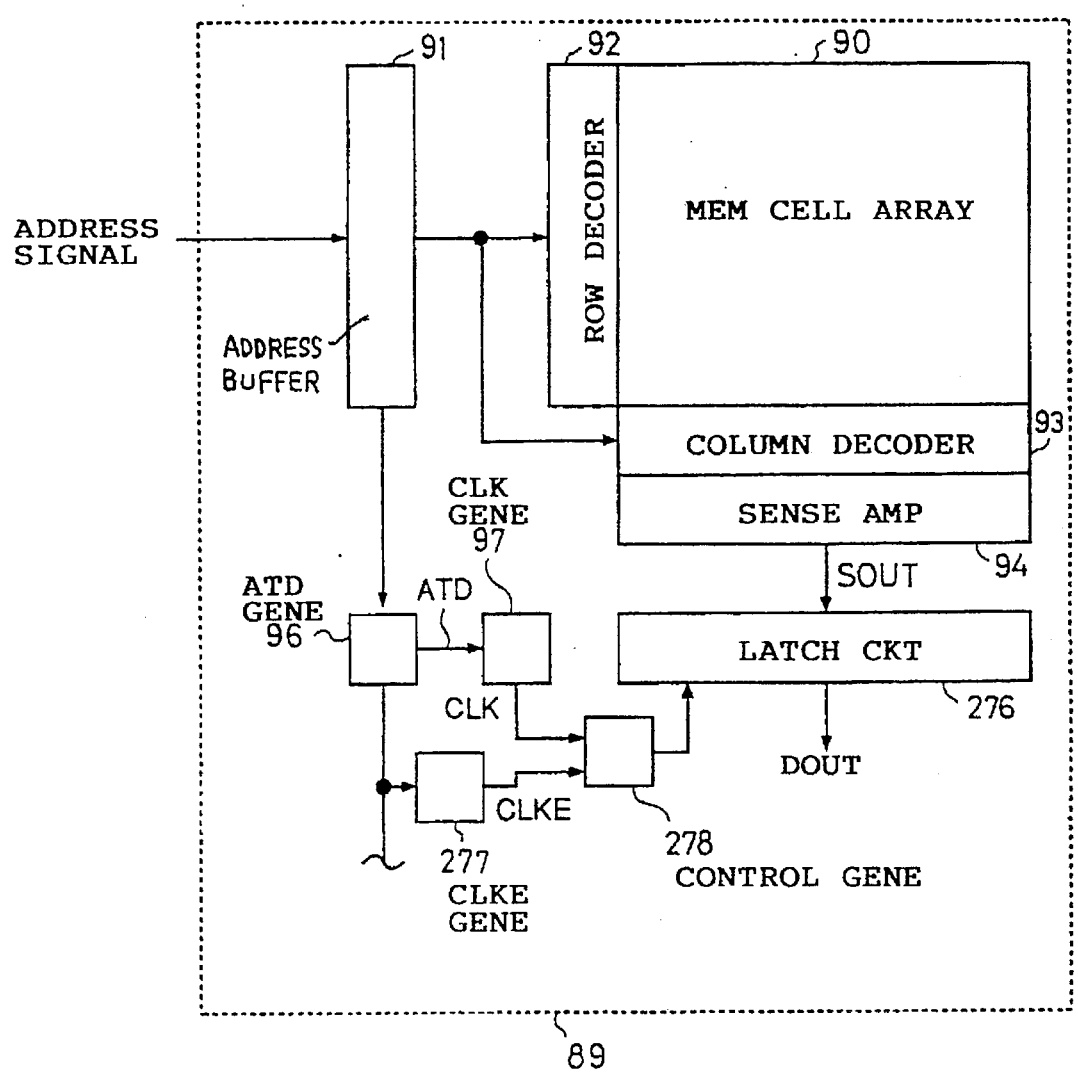
FIG. 41 is a system block diagram showing an important part of a fourth embodiment of the semiconductor memory device according to the present invention.

FIG. 41 is a system block diagram showing an important part of the fourth embodiment. In this embodiment, a sense amplifier output latch circuit 276 has a circuit construction different from that of the sense amplifier output latch circuit 95 of the fourth conceivable example of the mask ROM shown in FIG. 11.

In addition, this fourth embodiment is provided with a latch release signal generating circuit 277 and a control signal generating circuit 278. The latch release signal generating circuit 277 generates a latch release signal CLKE for releasing the latch operation stage of the sense amplifier output latch circuit 276 based on the ATD signal. The control signal generating circuit 278 generates a control signal for controlling the operation of the sense amplifier output latch circuit 276 based on the block signal CLK output from the clock generating circuit 97 and the latch release signal CLKE output from the latch release signal generating circuit 277.

Figure 11:
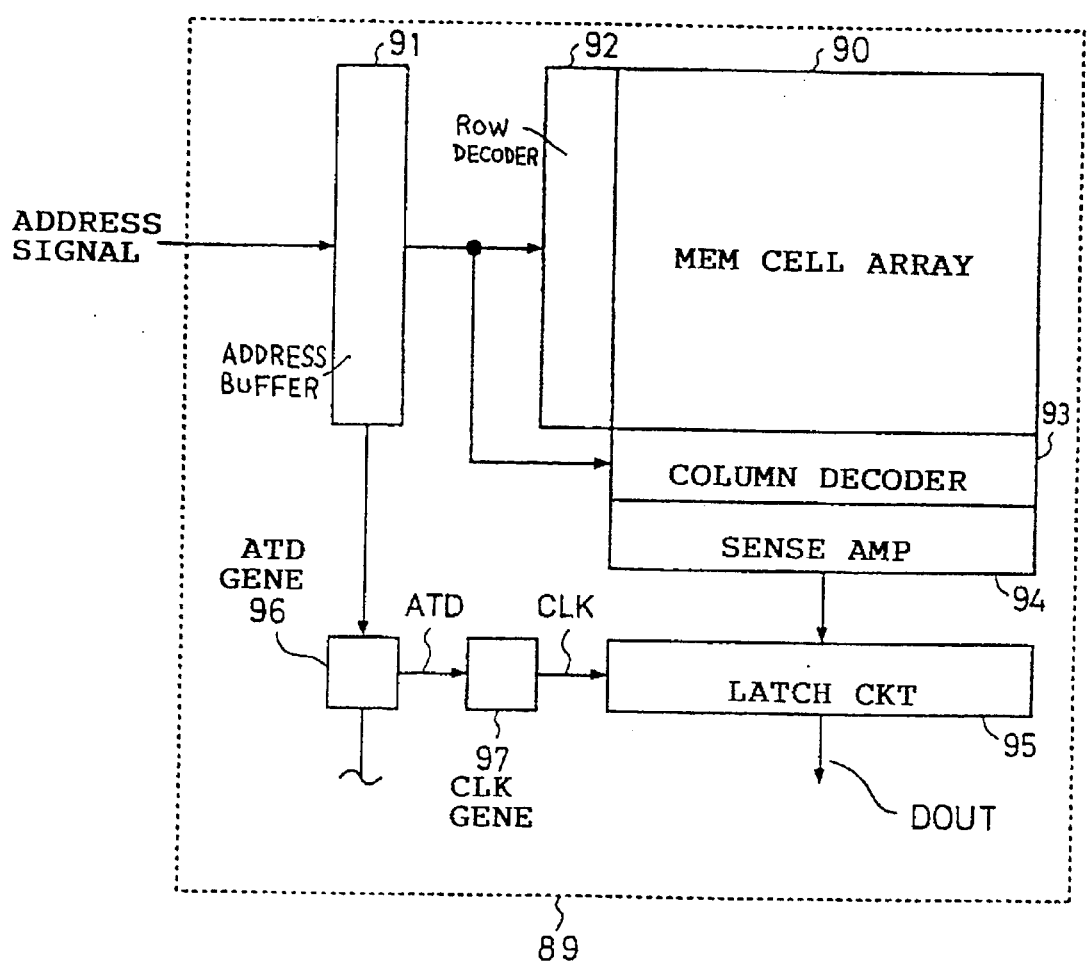
FIG. 11 is a system block diagram showing an important part of a fourth conceivable example of the mask ROM.

Otherwise, the construction of this fourth embodiment is basically the same as that of the fourth conceivable example of the mask ROM shown in FIG. 11. Hence, in FIG. 41, those parts which are basically the same as those corresponding parts in FIG. 11 are designated by the same reference numerals, and a description thereof will be omitted.

Figure 42:
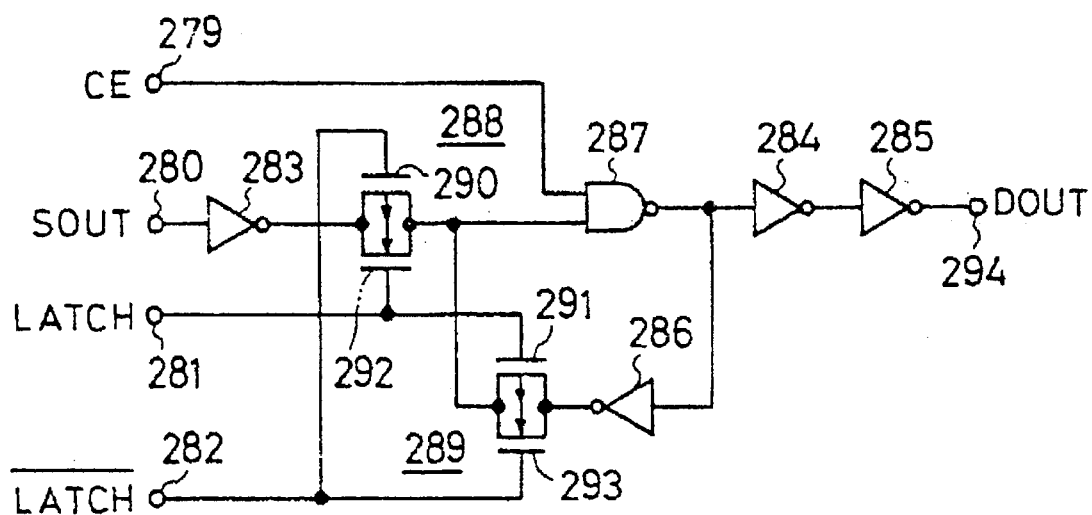
FIG. 42 is a circuit diagram showing a latch circuit of the fourth embodiment.

The sense amplifier output latch circuit 276 may have a circuit construction shown in FIG. 42, for example.

In FIG. 42, the internal chip enable signal CE is input to a chip enable signal input terminal 279. The sense amplifier output SOUT from the sense amplifier 94 is input to a sense amplifier output input terminal 280. A latch signal LATCH which is generated as will be described later is input to a latch signal input terminal 281. A latch signal /LATCH which has the inverted relationship to the latch signal LATCH is input to a latch signal input terminal 282.

The sense amplifier output latch circuit 276 includes inverters 283 through 286, a NAND circuit 287, transmission gates 288 and 289, pMOS transistors 290 and 291, and nMOS transistors 292 and 293. The output data DOUT is output from a data output terminal 294.

In this sense amplifier output latch circuit 276, the NAND circuit 287 is put into the active state when the internal chip enable signal CE has the high level, and the entire circuit is put into the active state. On the other hand, the NAND circuit 287 is put into the inactive state when the chip enable signal CE has the low level, and the entire circuit is put into the inactive state.

In the state where the internal chip enable signal CE has the high level and the NAND circuit 287 is put into the active state, the transmission gate 288 turns ON and the transmission gate 289 turns OFF when the latch signal LATCH has the high level and the latch signal /LATCH has the low level. Hence, in this case, a read operation of the sense amplifier output SOUT is made.

On the other and, in the state where the internal chip enable signal CE has the high level and the NAND circuit 287 is put into the active state, the transmission gate 288 turns OFF and the transmission gate 289 turns ON when the latch signal LATCH has the low level and the latch signal /LATCH has the high level. Hence, in this case, a latch operation of the sense amplifier output SOUT is made.

Figure 14:
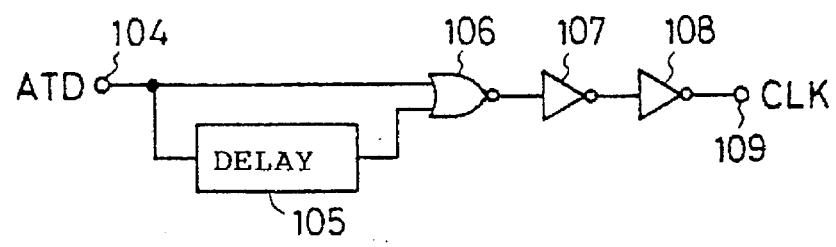
FIG. 14 is a circuit diagram showing the construction of a clock signal generating circuit shown in FIG. 11.
Figure 15:
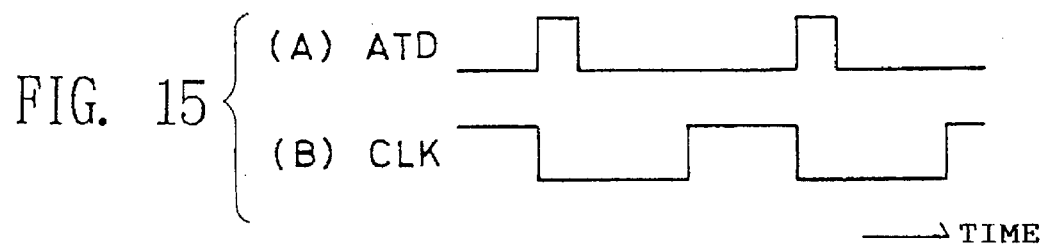
FIG. 15 is a timing chart, showing timings (A) and (B), for explaining the operation of the clock signal generating circuit shown in FIG. 14.
Figure 16:
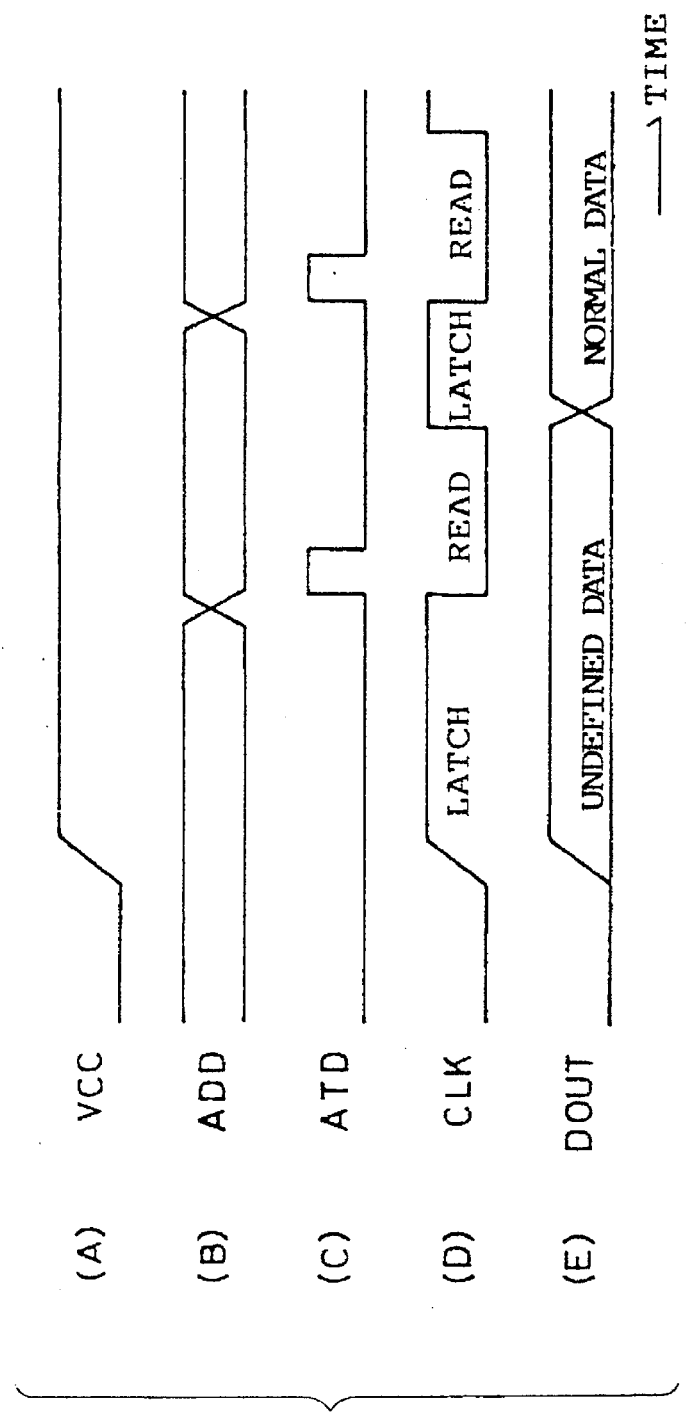
FIG. 16 is a timing chart, showing timings (A) through (E), for explaining the operation of the fourth conceivable example of the mask ROM shown in FIG. 11.
Figure 17:
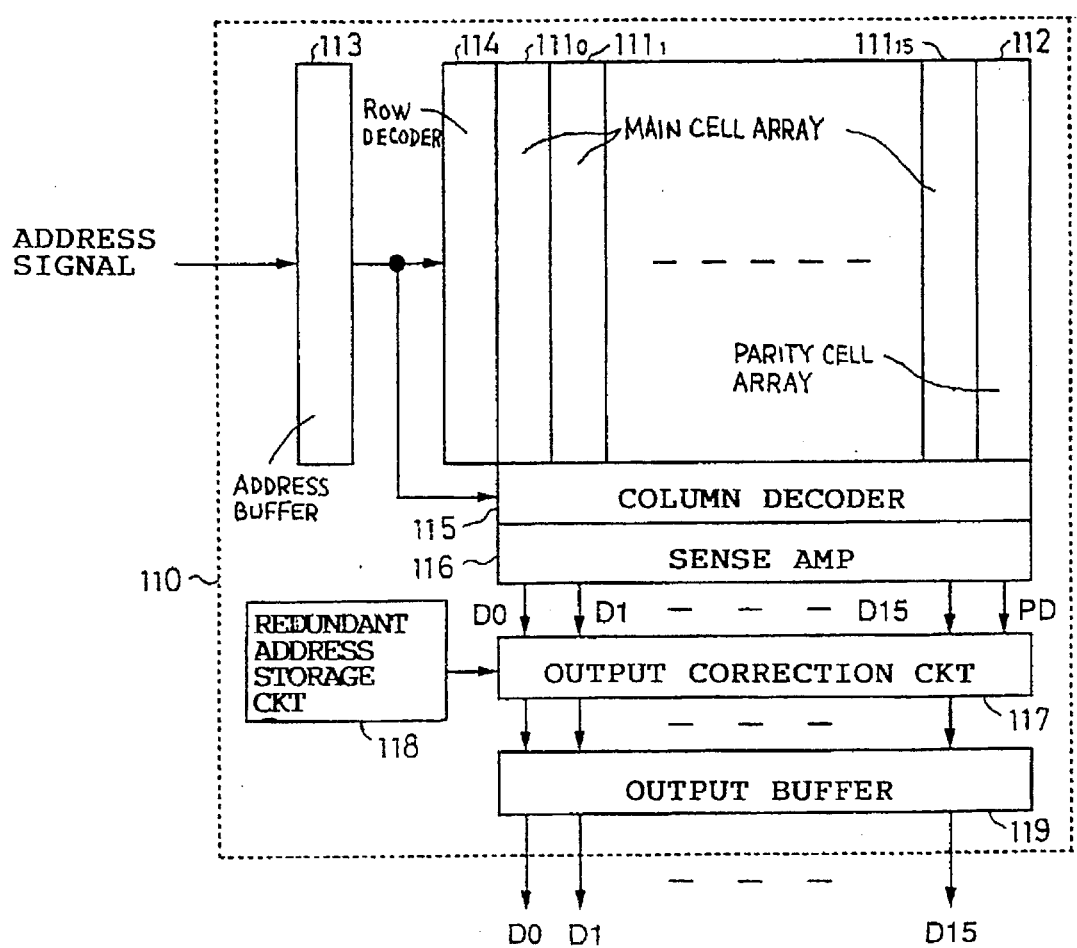
FIG. 17 is a system block diagram showing a fifth conceivable example of the mask ROM.
Figure 18:
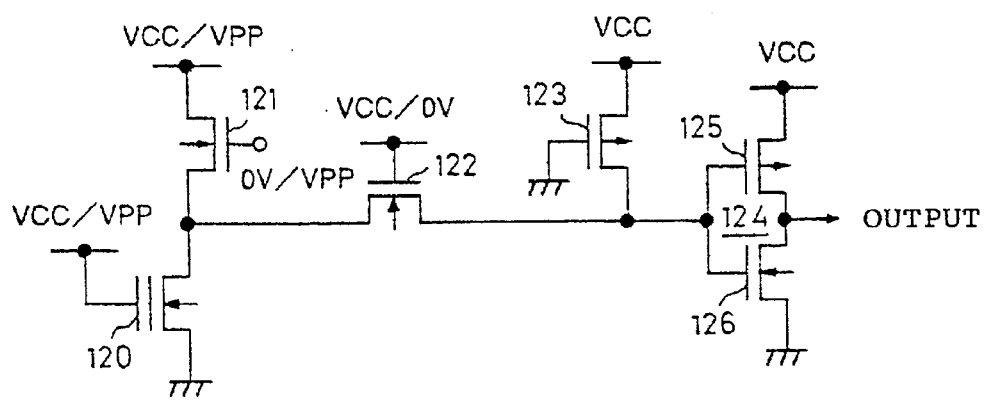
FIG. 18 is a circuit diagram showing a 1-bit storage circuit of a redundant address storage circuit shown in FIG. 17.
Figure 19:
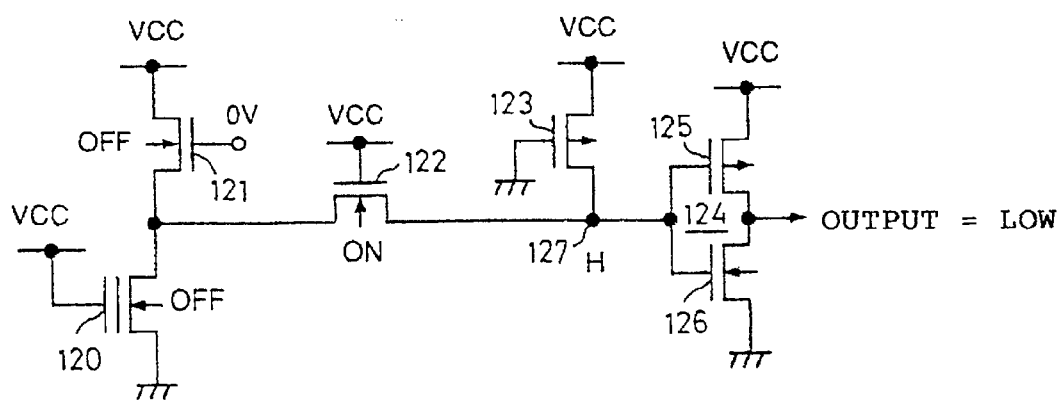
FIG. 19 is a circuit diagram for explaining a read operation of the 1-bit storage circuit shown in FIG. 18.
Figure 20:
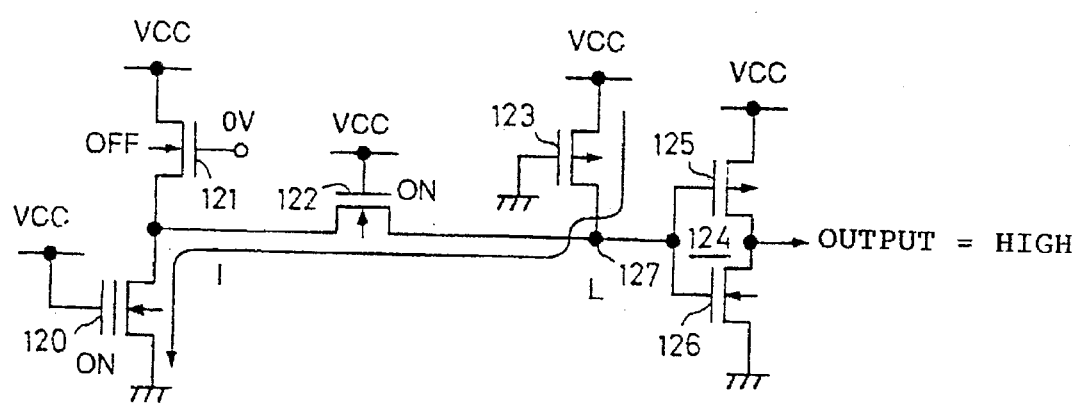
FIG. 20 is a circuit diagram for explaining the read operation of the 1-bit storage circuit shown in FIG. 18.
Figure 21:
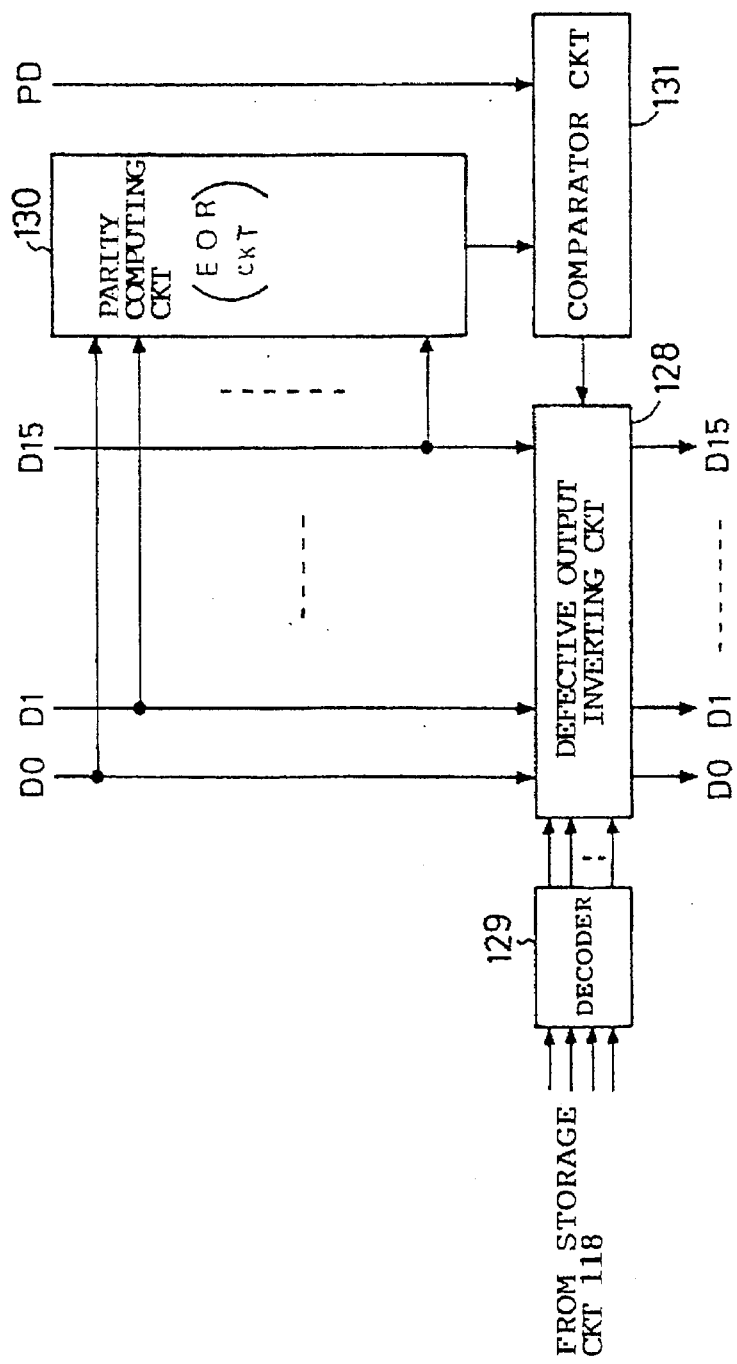
FIG. 21 is a system block diagram showing the construction of an output correction circuit shown in FIG. 17.
Figure 43:
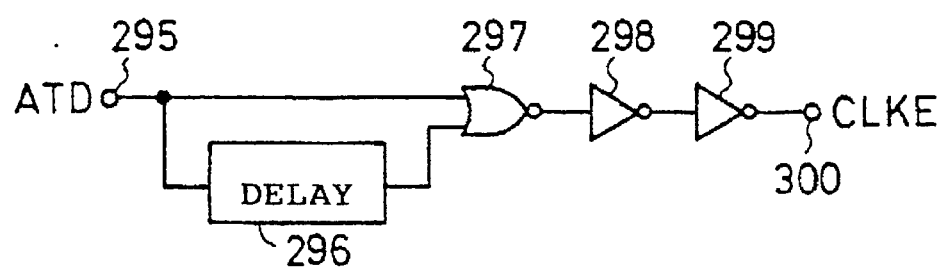
FIG. 43 is a circuit diagram showing a latch release signal generating circuit of the fourth embodiment.

The latch release signal generating circuit 277 may have a circuit construction shown in FIG. 43, for example. In FIG. 43, the ATD signal is input to an ATD signal input terminal 295. The latch release signal generating circuit 277 includes a delay circuit 296, a NOR circuit 297, and inverters 298 and 299. The delay circuit 296 provides a delay time longer than that of the delay circuit 105 provided in the clock signal generating circuit 97 shown in FIG. 14. The latch release signal CLKE is output from a latch release signal output terminal 300.

Figure 44:
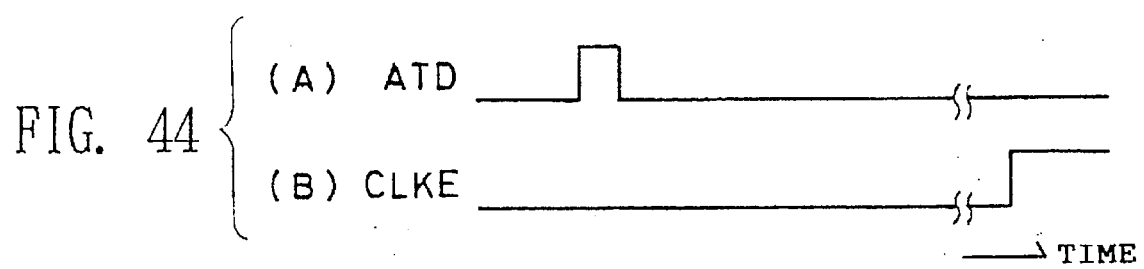
FIG. 44 is a timing chart, showing timings (A) and (B), for explaining the operation of the latch release signal generating circuit shown in FIG. 43.

FIG. 44 is a timing chart for explaining the operation of the latch release signal generating circuit 277 shown in FIG. 43. In FIG. 44, (A) shows the voltage waveform of the ATD signal, and (B) shows the voltage waveform of the latch release signal CLKE.

In other words, this latch release signal generating circuit 277 outputs the latch release signal CLKE when the address signal does not change and the wait or standby is made for a sufficiently long time.

Figure 45:
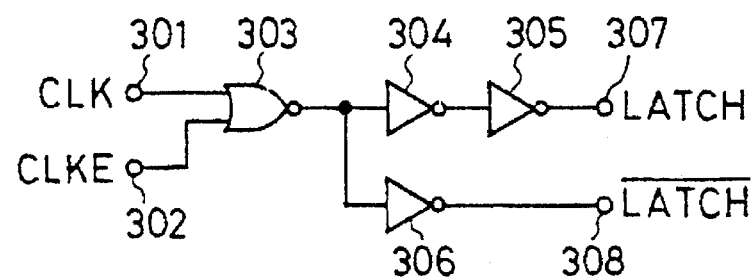
FIG. 45 is a circuit diagram showing a control signal generating circuit of the fourth embodiment.

In addition, the control signal generating circuit 278 may have a circuit construction shown in FIG. 45, for example. In FIG. 45, the clock signal CLK is input to a clock signal input terminal 301, and the latch release signal CLKE is input to a latch release signal input terminal 302. The control signal generating circuit 278 includes a NOR circuit 303, and inverters 304 through 306. The latch signal LATCH is output from a latch signal output terminal 307, and the latch signal /LATCH is output from a latch signal output terminal 308.

Figure 46:
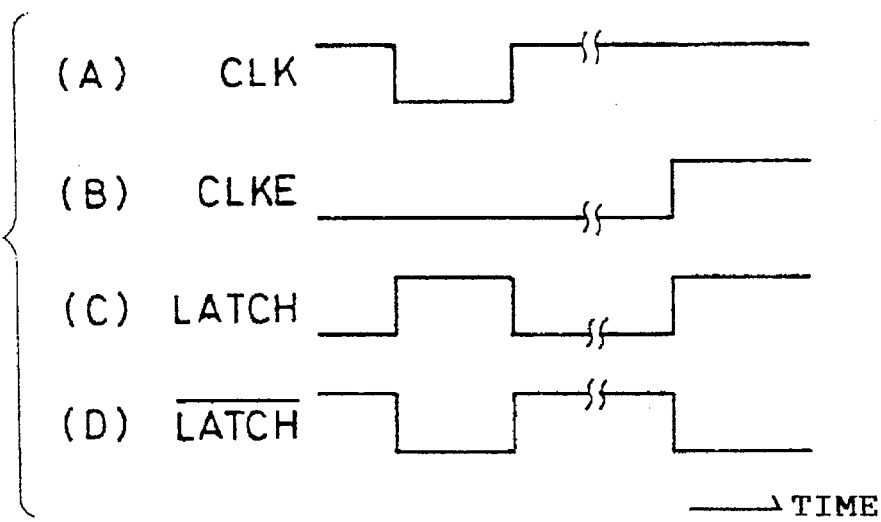
FIG. 46 is a timing chart, showing timings (A) through (D), for explaining the operation of the control signal generating circuit shown in FIG. 45.

FIG. 46 is a timing chart for explaining the operation of the control signal generating circuit 278 shown in FIG. 45. In FIG. 46, (A) shows the voltage waveform of the clock signal CLK, (B) shows the voltage waveform of the latch release signal CLKE, (C) shows the voltage waveform of the latch signal LATCH, and (D) shows the voltage waveform of the latch signal /LATCH.

Figure 47:
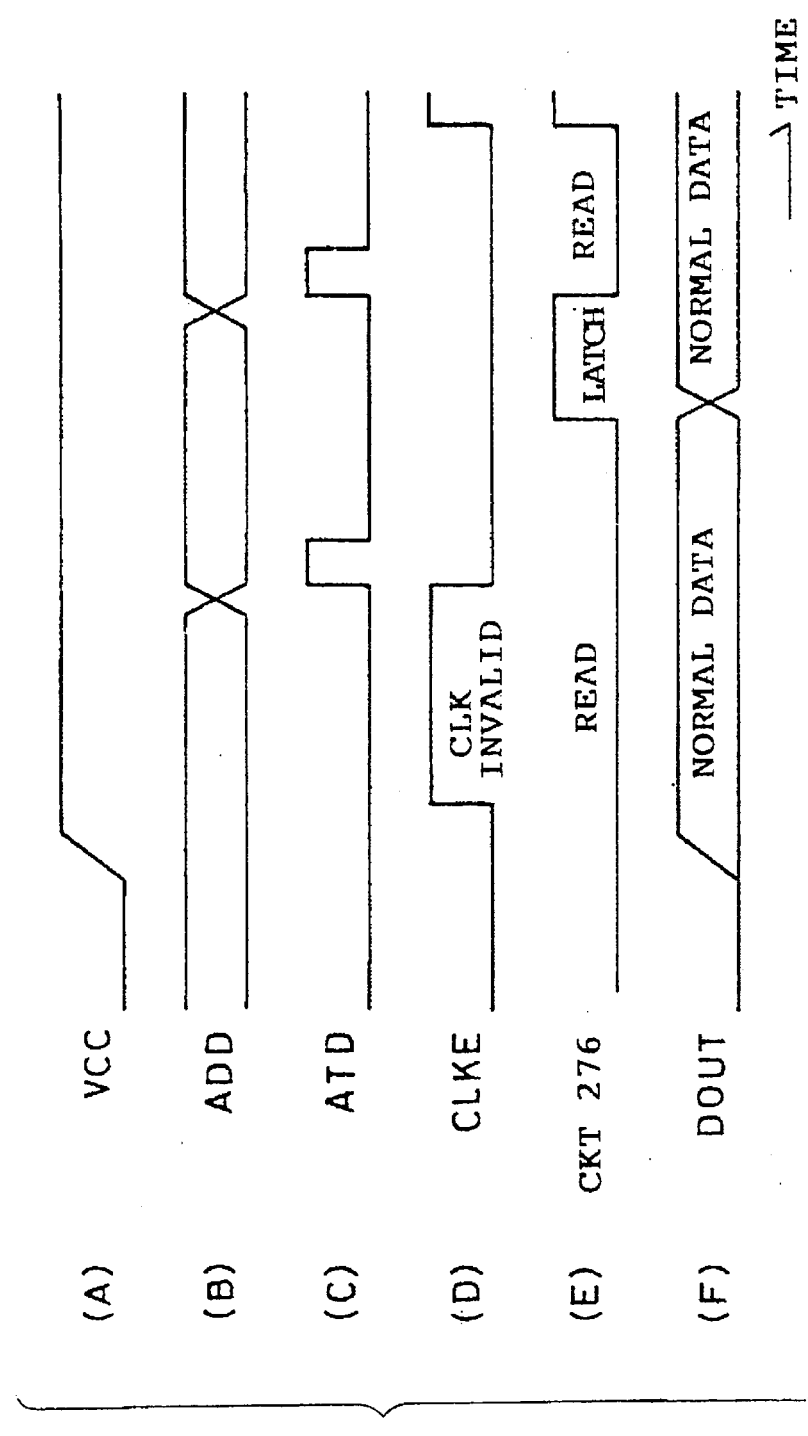
FIG. 47 is a timing chart, showing timings (A) through (F), for explaining the operation of the fourth embodiment.

Therefore, the signal waveforms at various parts of the fourth embodiment shown in FIG. 41 become as shown in FIG. 47. In FIG. 47, (A) shows the voltage waveform of the power supply voltage VCC, and (B) shows the voltage waveform of the address signal ADD. In addition, in FIG. 47, (C) shows the voltage waveform of the ATD signal, (D) shows the voltage waveform of the latch release signal CLKE, (E) shows the operation of the sense amplifier output latch circuit 276, and (F) shows the output data DOUT.

According to this fourth embodiment, the latch release signal CLKE is output when the address signal does not change and the wait or standby is made for a sufficiently lone time. For this reason, when the power supply VCC is turned ON, and ATD signal will not be output but the latch release signal CLKE will be output.

As a result, when the power supply VCC is turned ON in the fourth embodiment, the sense amplifier output latch circuit 276 starts the read operation, and it is possible to output the data corresponding to the address signal which is supplied from the outside when the power supply VCC is turned ON. Consequently, it is possible to realize a high-speed data read.

[5] Fifth Embodiment

Next, a description will be given of a fifth embodiment of the semiconductor memory device according to the present invention, by referring to FIGS. 48 through 81.

Figure 48:
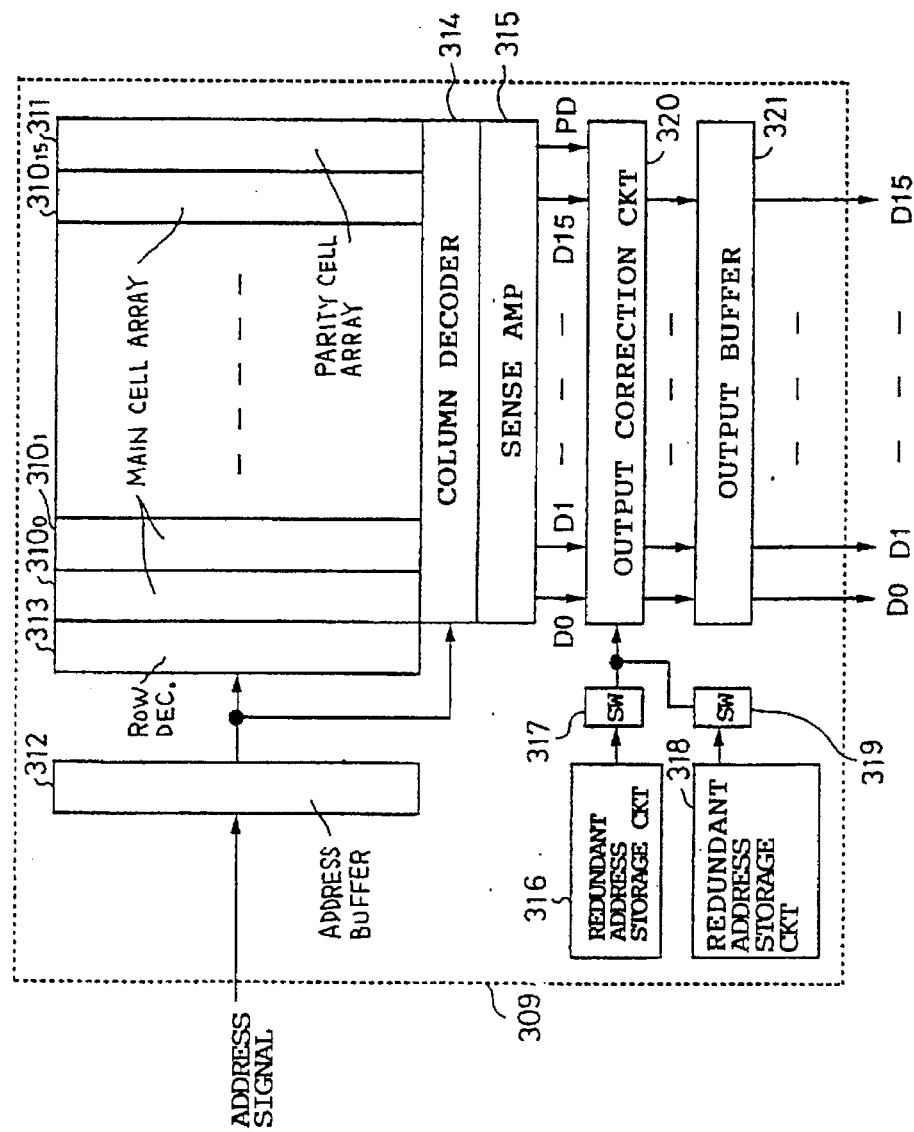
FIG. 48 is a system block diagram showing an important part of a fifth embodiment of the semiconductor memory device according to the present invention.

FIG. 48 is a system block diagram showing and important part of the fifth embodiment.

In FIG. 48, a chip body 309 includes main cell arrays $310_0$ through $310_{15}$, a parity cell array 311, an address buffer 312, a row decoder 313, a column decoder 314, a sense amplifier 315, a redundant address storage circuit 316, a switching circuit 317, a redundant address storage circuit 318 for testing, a switching circuit 319, an output correction circuit 320, and an output buffer 321.

The main cell arrays $310_0$ through $310_{15}$ store the regular data, and the parity cell array 311 stores the parity data. The address signal is input to the address buffer 312, and the row decoder 313 decodes the row address signal of the address signal so as to select the block selection line and the word line. The column decoder 314 decodes the column address signal of the address signal and outputs a column selection signal for selecting a column. The sense amplifier 315 amplifies the data read from the memory cell arrays $310_0$ through $310_{15}$.

In FIG. 48, the illustration of a column gate for selecting the column of the main cell arrays $310_0$ through $310_{15}$ and the parity cell array 311 based no the column selection signal output from the column decoder 314 is omitted.

In addition, D0, D1, ..., D15 denote the data output from the main cell arrays $310_0$ through $310_{15}$, and PD denotes the parity data read from the parity cell array 311.

The redundant address storage circuit 316 stores the column address of the output data having the doubtful data value out of the output data D0 through D15 when the address indicated by the address signal supplied from the outside matches the redundant address signal. That is, the redundant address storage circuit 316 stores the column address of the output data having the doubtful data value and indicating the bit position of this output data out of the output data D0 through D15. Storage elements of the redundant address storage circuit 316 are formed by non-volatile memory cells. The switching circuit 317 controls whether or not the column address signal of the output data having the doubtful data value and output from the redundant address storage circuit 316 is to be passed and supplied to the output correction circuit 320.

The redundant address storage circuit 318 for testing is used at the time of a test. The construction of the redundant address storage circuit 318 is the same as that of the redundant address storage circuit 316 except that static random access memory (SRAM) cells are used as the storage elements of the redundant address storage circuit 318. The switching circuit 319 controls whether or not the column address signal of the output data having the doubtful data value and output from the redundant address storage circuit 318 is to be passed and supplied to the output correction circuit 320.

The output correction circuit 320 selects and outputs the output data D0 through D15 which are output from the memory arrays $310_0$ through $310_{15}$ when no column address signal of the output data having the doubtful data value is supplied from the redundant address storage circuit 316 for testing. On the other hand, when the column address signal of the output data having the doubtful data value is supplied from the redundant address storage circuit 316 or the redundant address storage circuit 318 for testing, the output correction circuit 320 outputs a normal data which is obtained by carrying out a predetermined operation which will be described later based on the parity data PD output from the parity cell array 311, in place of the output data specified by the column address signal of the output data having the doubtful data value out of the output data D0 through D15 output from the main cell arrays $310_0$ through $310_{15}$.

Figure 49:
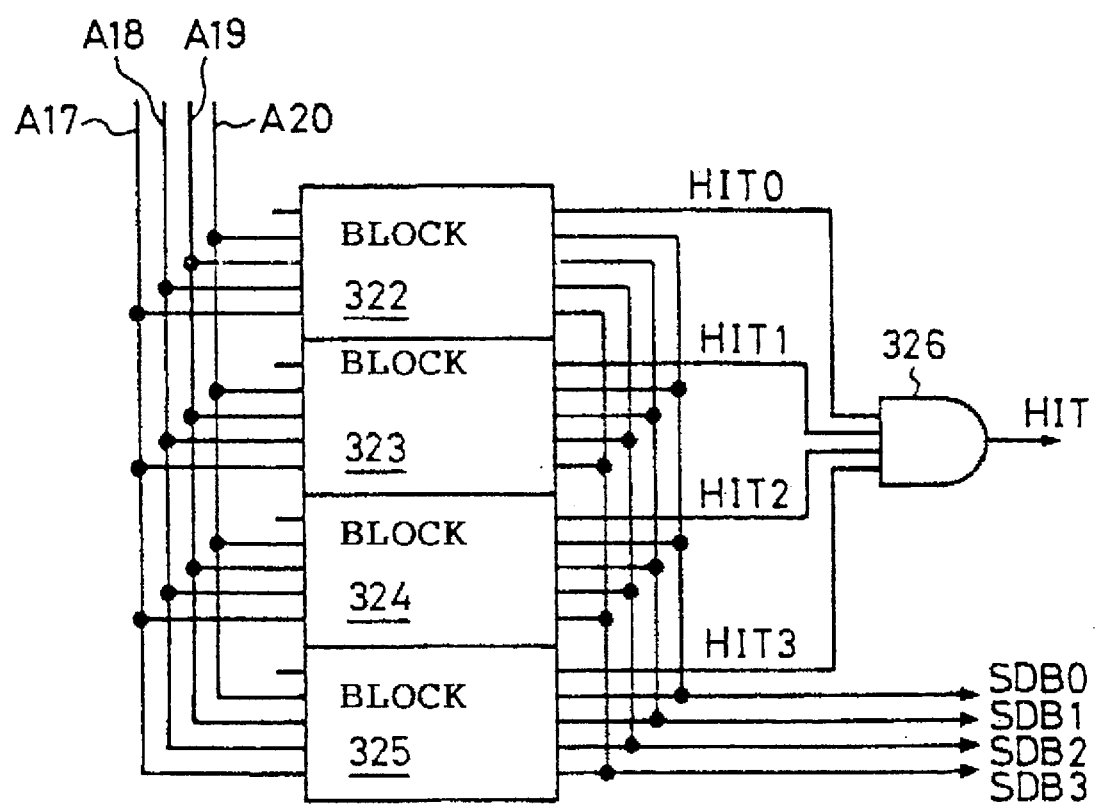
FIG. 49 is a circuit diagram showing a redundant address storage circuit of the fifth embodiment.

In FIG. 49, A17 through A20 denote the address signals of the upper 4bits of the address signals which are supplied from the outside, and HIT0 through HIT3 denote match detection signals which are output from the respective blocks 322 through 325 when the address signals A17 through A20 match (hit) the redundant address. The AND circuit 326 outputs a match detection signal HIT with respect to a predetermined internal circuit when one of the match detection signals HIT0 through HIT3 is output from the blocks 322 through 325. In FIG. 49, SDB0 through SDB3 denote the column address signals of the output data having the doubtful data value.

Figure 50:
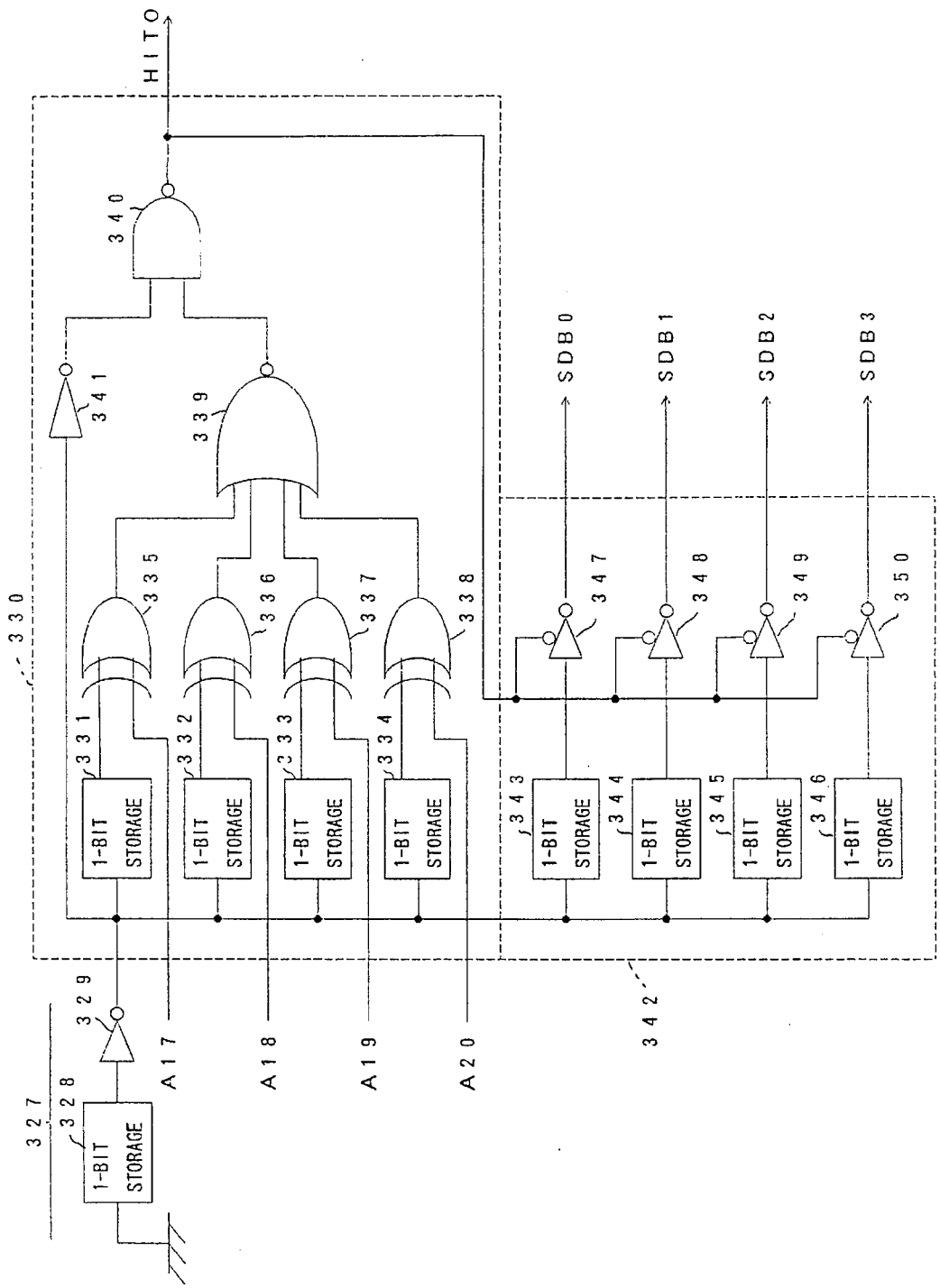
FIG. 50 is a circuit diagram showing a block forming the redundant address storage circuit shown in FIG. 49.

The blocks 322 through 325 have the same circuit construction, and the block 322, for example, may have the circuit construction shown in FIG. 50. The block 322 shown in FIG. 50 includes a state setting circuit 327, a match detection circuit 330, and a column address storage circuit 342.

The state setting circuit 327 sets whether the block 322 is to be put into a used state or an unused state. The state setting circuit 327 includes a 1-bit storage circuit 328 and an inverter 329. When the 1-bit storage circuit 328 stores a low level and the output of the inverter 329 has a high level, the block 322 is put into the unused state. On the other hand, the block 322 is put into the used state when the 1-bit storage circuit 328 stores a high level and the output of the inverter 329 has a low level.

The match detection circuit 330 stores upper 4 bit portions RA17 through RA20 of the redundant address, and compares the stored redundant addresses RA17 through RA20 and the upper 4 bit addresses A17 through A20 of the address which is supplied from the outside, so as to detect whether the compared 4 bits match. The match detection circuit 330 includes 1-bit storage circuits 331 through 334, exclusive-OR circuits 335 through 338, a NOR circuit 339, a NAND circuit 340, and an inverter 341.

The 1-bit storage circuits 331 through 334 respectively store 1 bit of the redundant addresses RA17 through DA20. The exclusive-OR circuits 335 through 338 form a comparator circuit. The NOR circuit 339 detects whether or not the redundant addresses RA17 through RA20 and the addresses A17 through A20 supplied from the outside match. The NAND circuit 340 outputs the match detection signal HIT0 based on the output of the NOR circuit 339. The inverter 341 controls whether the NAND circuit 340 is to be made active or inactive.

When the 1-bit storage circuit 328 stores the low level and the output level of the inverter 329 is high, that is, when this block 322 is put into the unused state, the output level of the inverter 341 becomes low and the NAND circuit 340 is made inactive, and the output of the NAND circuit 340 is fixed to the high level.

On the other hand, when the 1-bit storage circuit 328 stores the high level and the output level of the inverter 329 is low, that is, when this block 322 is put into the used state, the output level of the inverter 341 becomes high and the NAND circuit 340 is made active, and the output of the NAND circuit 340 becomes an inverted value of the output of the NOR circuit 339.

For example, the exclusive-OR circuit 335 outputs a low level when the redundant address RA17 stored in the 1-bit storage circuit 331 and the address A17 supplied from the outside match. The other exclusive-OR circuits 336 through 338 operate similarly to the exclusive-OR circuit 335. As a result, the NOR circuit 339 outputs the high level only when the redundant addresses RA17 through RA20 stored in the 1-bit storage circuits 335 through 338 and the addresses A17 through A20 supplied from the outside match, and otherwise outputs the low level.

When the output level of the NOR circuit 339 is high, the output level of the NAND circuit 340, that is, the level of the match detection signal HIT0 becomes low and the match detection is indicated. On the other hand, when the output level of the NOR circuit 339 is low, the output level of the NAND circuit 340, that is, the level of the match detection signal HIT0 becomes high and the non-match is indicated.

The column address storage circuit 342 stores the column address of the output data having the doubtful data value. This column address storage circuit 342 includes 1-bit storage circuits 343 through storage circuits 343 through 346 respectively store 1 bit of the column address of the output data having the doubtful data value. The tristate buffers 347 through 350 are turned ON and output address signals SDB0 through SDB3 of the output data having the doubtful data value when the match is detected and the match detection signal HIT0 has the low level. On the other hand, when no match is detected and the match detection signal HIT0 has the high level, the tristate buffers 347 through 350 are turned OFF. When the tristate buffers 347 through 350 are turned OFF, the address signal SDB0 through SDB3 of the output data having the doubtful data value are not output from these tristate buffers 347 through 350, and the outputs of the tristate buffers 347 through 350 assume the high impedance state.

Figure 51:
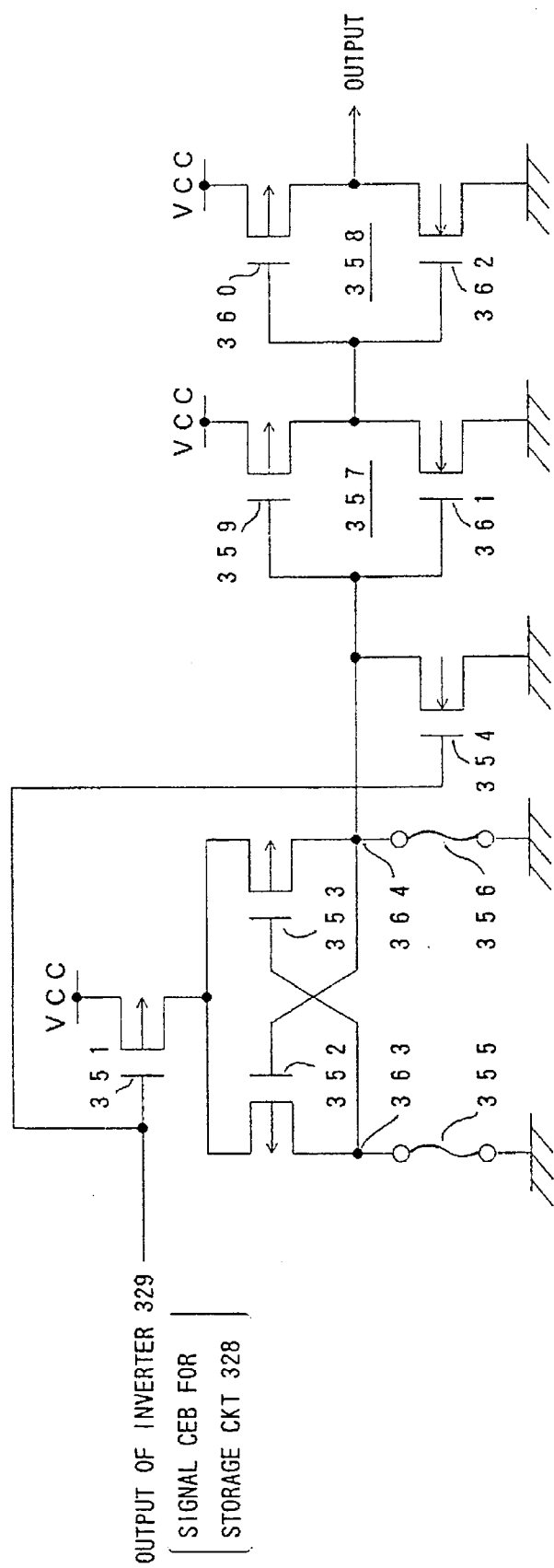
FIG. 51 is a circuit diagram showing a 1-bit storage circuit which forms the redundant address storage circuit shown in FIG. 49.

The 1-bit storage circuits 328, 331 through 334 and 343 through 346 may have the construction shown in FIG. 51, for example. In FIG. 51, the 1-bit storage circuit includes pMOS transistors 351 through 353, a nMOS transistor 354, fuses 355 and 356, inverters 357 and 358, pMOS transistors 359 and 360, and nMOS transistors 361 and 362.

When the 1-bit storage circuit shown in FIG. 51 is used as the 1-bit storage circuit 328, the internal chip enable signal CEB is supplied to the gate of the pMOS transistor 351. When the 1-bit storage circuit shown in FIG. 51 is used as one of the 1-bit storage circuits 331 through 334 and 343 through 346, the output of the inverter 329 is supplied to the gate of the pMOS transistor 351.

When the block 322 is put into the unused state, the output level of the inverter 329 is high as described above, and thus, the gate voltage of the pMOS transistor 351 becomes high. In this case, the pMOS transistor 351 turns OFF, the nMOS transistor 354 turns ON, and the output is fixed to the low level.

On the other hand, when the block 322 is put into the used state, the output level of the inverter 329 is low as described above, and thus, the gate voltage of the pMOS transistor 351 becomes low. In this case, the pMOS transistor 351 turns ON, the nMOS transistor 354 turns OFF, and the logic of a node 364 is output. Hence, the fuse 355 or 356 is cut.

Figure 52:
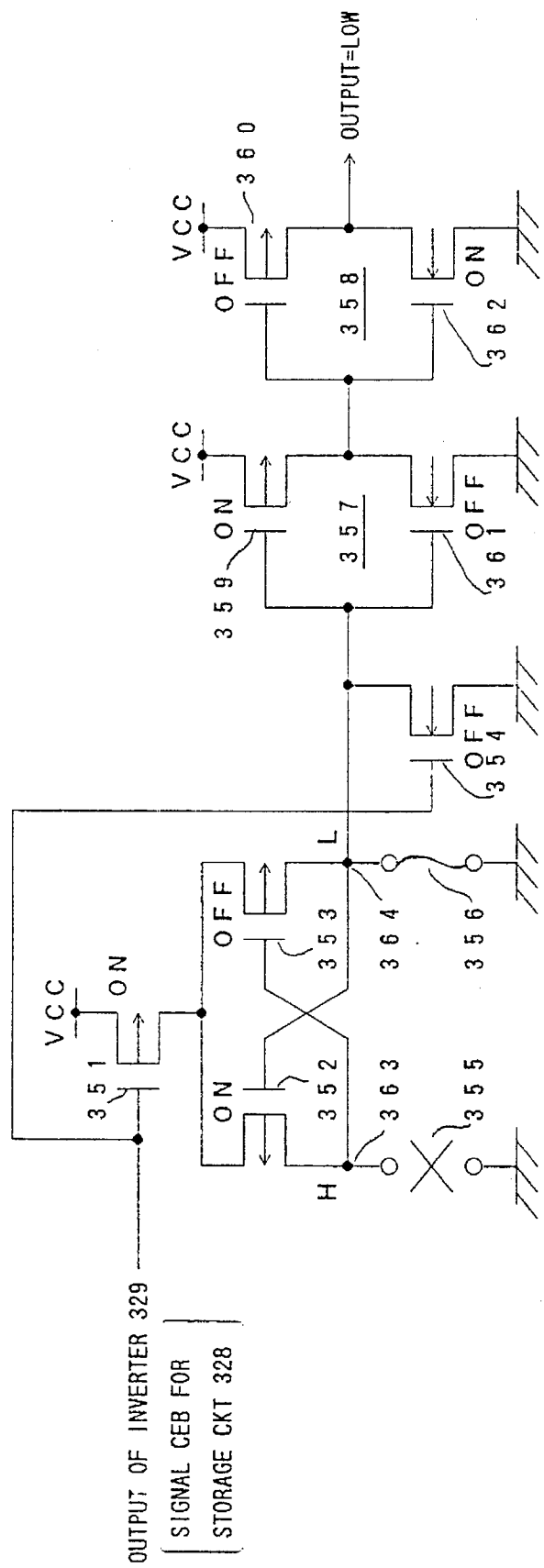
FIG. 52 is a circuit diagram for explaining a read operation of the 1-bit storage circuit shown in FIG. 51.

When storing the low level, the fuse 355 is cut and the fuse 356 is not cut, as shown in FIG. 52. In this case, a node 363 has the high level and the node 364 has the high level because the pMOS transistor 352 turns ON and the pMOS transistor 353 turns OFF, and the output has the low level.

Figure 53:
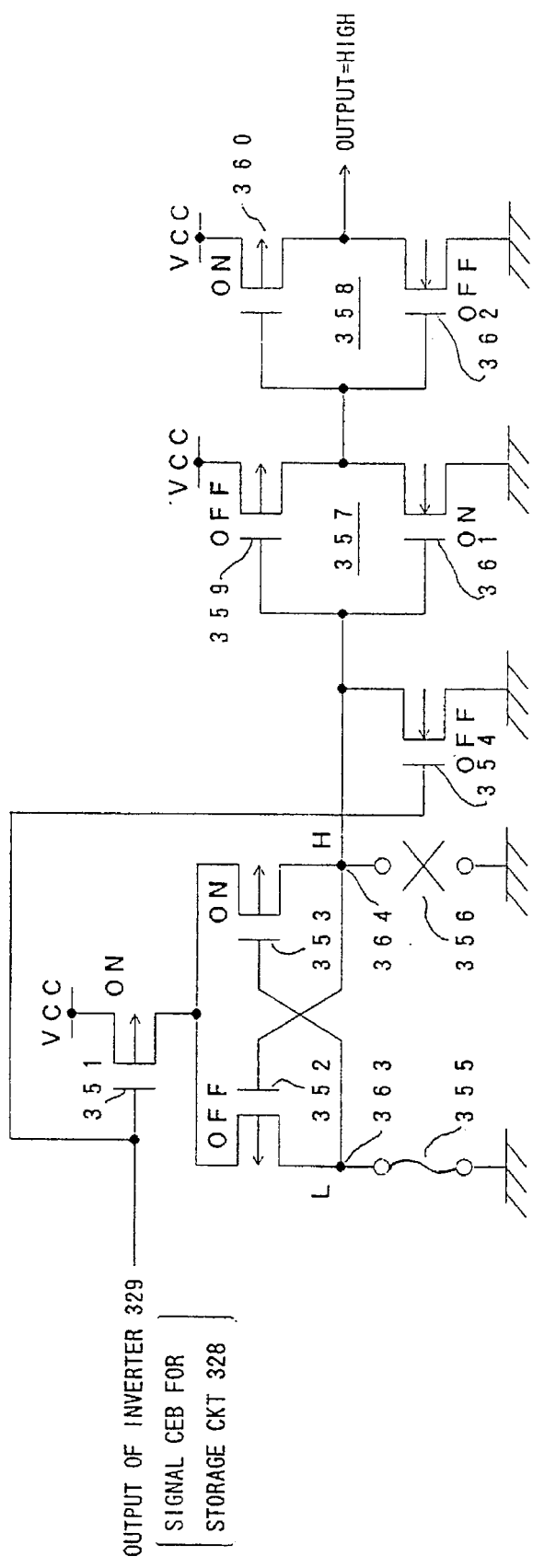
FIG. 53 is a circuit diagram for explaining a read operation of the 1-bit storage circuit shown in FIG. 51.

But when storing the high level, the fuse 355 is not cut and the fuse 356 is cut, as shown in FIG. 53. In this case, the node 363 has the low level and the node 364 has the low level because the pMOS transistor 352 turns OFF and the pMOS transistor 353 turns ON, and the output has the high level.

Figure 54:
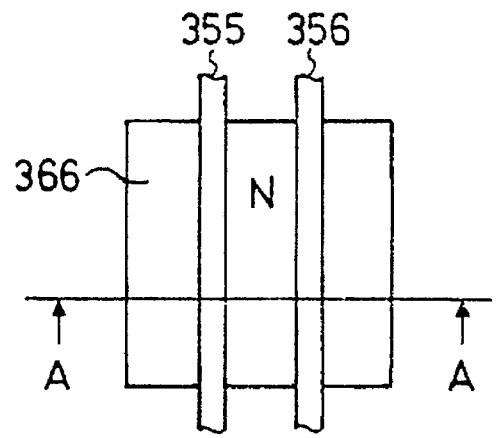
FIG. 54 is a plan view generally showing the construction of fuses forming the 1-bit storage circuit shown in FIG. 49.
Figure 55:
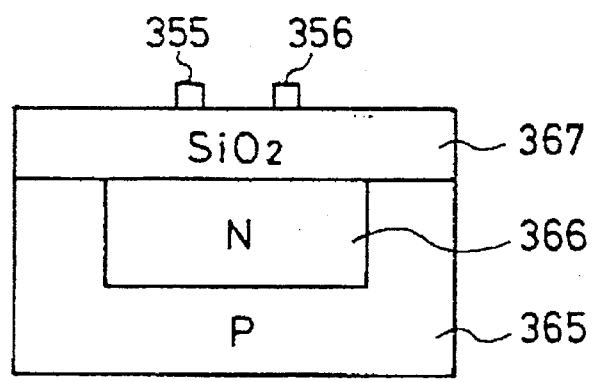
FIG. 55 is a general cross sectional view taken along a line A—A in FIG. 54.

The fuse 355 and 356 may have the construction shown in FIGS. 54 and 55. FIG. 54 generally shows the plan view of the fuses 355 and 356, and FIG. 55 shows a general cross section along a line A—A in FIG. 54. In FIGS. 54 and 55, there are provided a P-type silicon substrate 365, and N-type well 366, and a field oxide ($SiO_2$) layer 377. The N-type well 366 prevents the fuse 355 or 356 and the P-type silicon substrate 365 from being short-circuited when the fuse 355 or 356 is cut by a laser.

Figure 56:
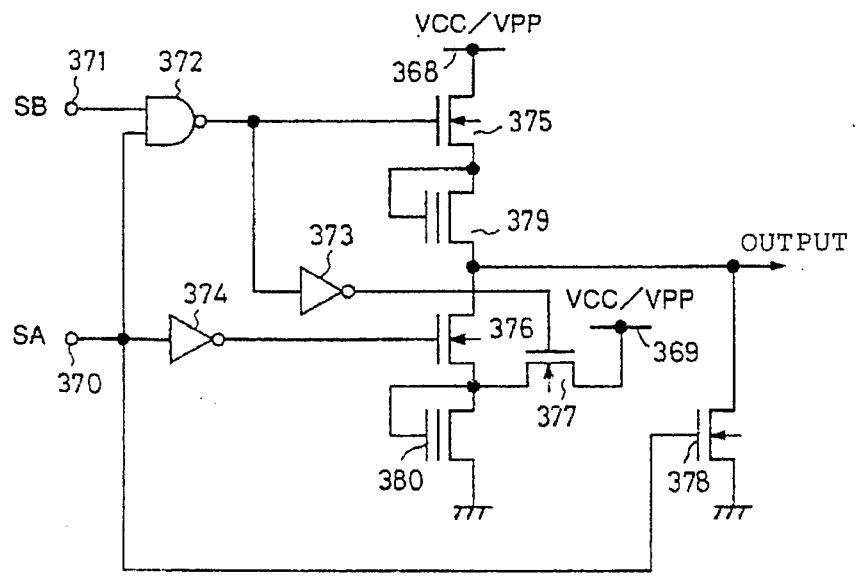
FIG. 56 is a circuit diagram showing a 1-bit storage circuit which forms the redundant address storage circuit shown in FIG. 49.

The redundant address storage circuit 316 may also be formed using a 1-bit storage circuit shown in FIG. 56.

The 1-bit storage circuit shown in FIG. 56 includes voltage lines 368 and 369 for supplying a high voltage VPP or a power supply voltage VCC, a control signal input terminal 370 to which a control signal SA is input, a control signal input terminal to which a control signal SB is input, a NAND circuit 372, inverters 373 and 374, nMOS transistors 375 through 378, and EPROM cell transistors 379 and 380 which form storage elements.

Figure 57:
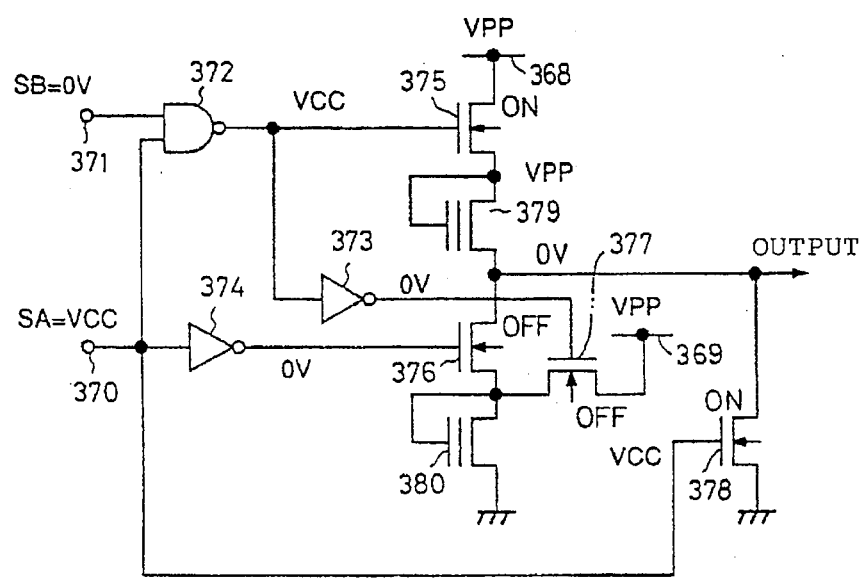
FIG. 57 is a circuit diagram for explaining a write operation with respect to the 1-bit storage circuit shown in FIG. 56.
Figure 58:
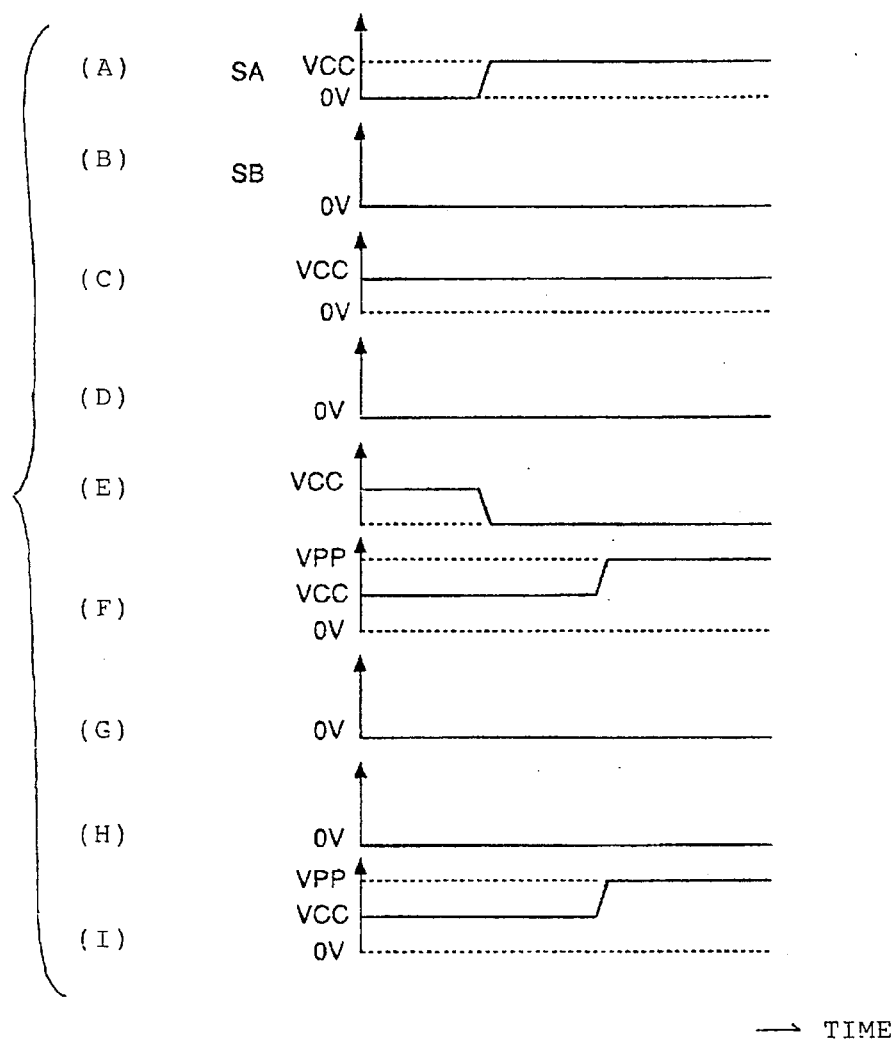
FIG. 58 is a timing diagram, showing timings (A) through (I), for explaining the write operation with respect to the 1-bit storage circuit shown in FIG. 56.

FIG. 57 is a circuit diagram for explaining the write operation which respect to the 1-bit storage circuit shown in FIG. 56. FIG. 58 is a timing diagram for explaining the write operation with respect to the 1-bit storage circuit shown in FIG. 56. In FIG. 58, (A) shows the control signal SA, (B) shows the control signal SB, (C) shows the output of the NAND circuit 372, (D) shows the output of the inverter 373, (E) shows the output of the inverter 374, (F) shows the voltage of the drain and the control gate of the EPROM cell transistor 379, (G) shows the voltage at the source of the EPROM cell transistor 379, (H) shows the voltage at the drain and the control gate of the EPROM cell transistor 380, and (I) shows the voltage at the power supply lines 368 and 369.

When writing the low level, a write is made with respect to the EPROM cell transistor 379. In this case, the voltage lines 368 and 369 are set to the high voltage VPP, the control signal SA is set to the power supply voltage VCC, and the control signal SB is set to 0 V, as shown in FIGS. 57 and 58.

As a result, the output voltage of the NAND circuit 372 becomes VCC, the nMOS transistor 375 turns ON, and the drain and the control gate of the EPROM cell transistor 379 become VPP. In addition, the output of the inverter 373 becomes 0 V and the nMOS transistor 377 turns OFF. Further, since the control signal SA is VCC, the output of the inverter 374 becomes 0 V, the nMOS transistor 376 turns OFF, and the nMOS transistor 378 turns ON.

Accordingly, in this case, the drain, the control gate and the source of the EPROM cell transistor 379 are respectively set to VPP, VPP and 0 V, and the drain, the control gate and the source of the EPROM cell transistor 380 are respectively released, released and set to 0 V. Therefore, the write with respect to the EPROM cell transistor 379 is made.

Figure 59:
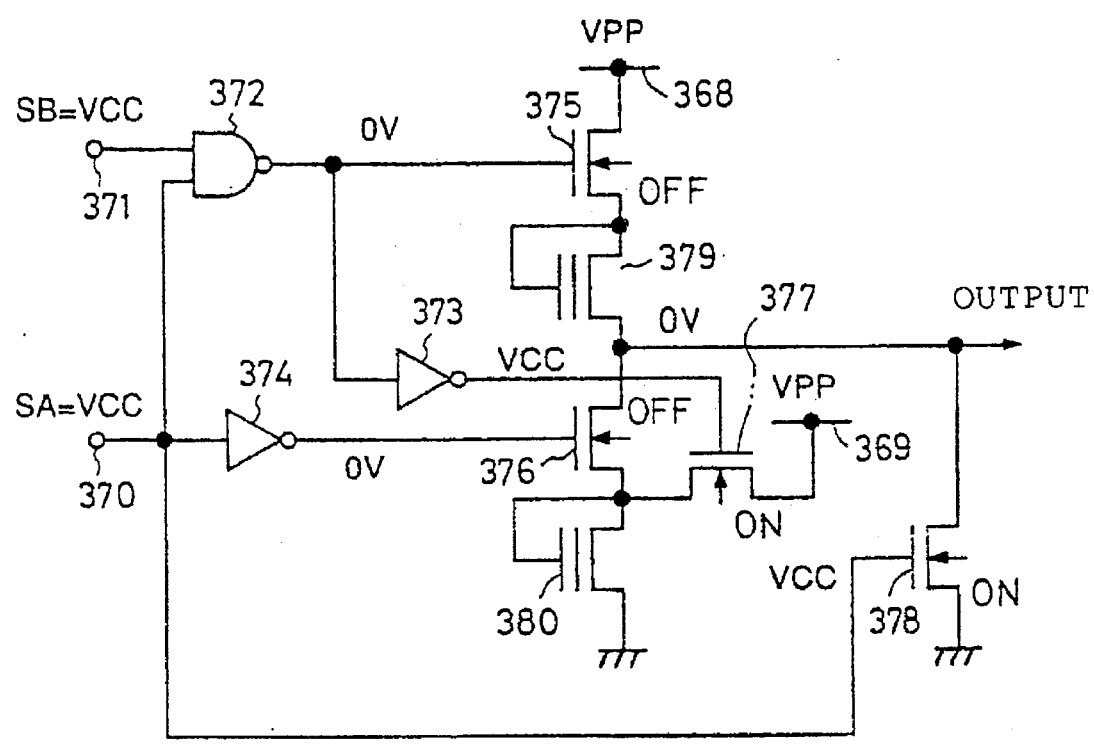
FIG. 59 is a circuit diagram for explaining a write operation with respect to the 1-bit storage circuit shown in FIG. 56.
Figure 60:
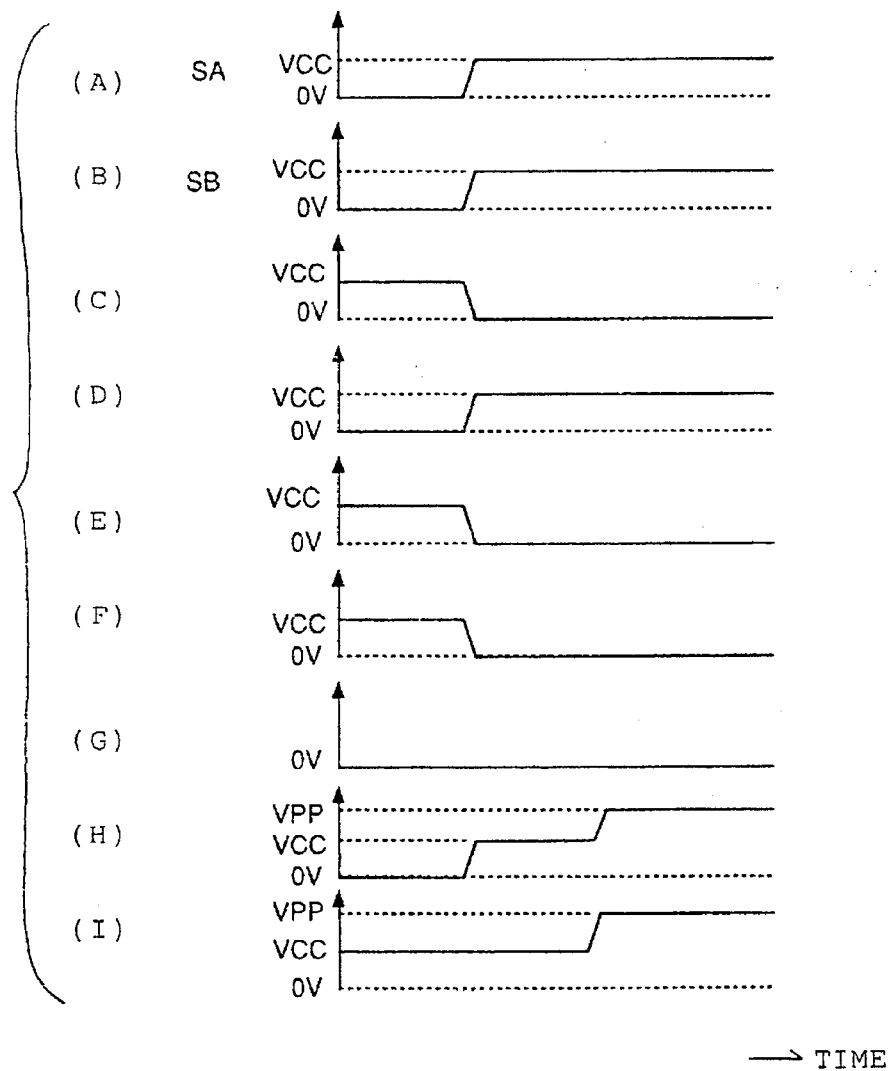
FIG. 60 is a timing diagram, showing timings (A) through (I), for explaining the write operation with respect to the 1-bit storage circuit shown in FIG. 56.

On the other hand, FIG. 59 is a circuit diagram for explaining the write operation with respect to the 1-bit storage circuit shown in FIG. 56. FIG. 60 is a timing diagram for explaining the write operation with respect to the 1-bit storage circuit shown in FIG. 56. In FIG. 60, (A) shows the control signal SA, (B) shows the control signal SB, (C) shows the output of the NAND circuit 372, (D) shows the output of the inverter 373, (E) shows the output of the inverter 374, (F) shows the voltage at the drain and the control gate of the EPROM cell transistor 379, (G) shows the voltage at the source of the EPROM cell transistor 379, (H) shows the voltage at the drain and the control gate of the EPROM cell transistor 380, and (I) shows the voltage at the power supply lines 368 and 369.

When writing the high level, a write is made with respect to the EPROM cell transistor 380. In this case, the voltage supply lines 368 and 369 are set to VPP, the control signal SA is set to VCC and the control signal SB is set to VCC, as shown in FIGS. 59 and 60.

As a result, the output of the NAND circuit 372 becomes 0 V, the nMOS transistor 375 turns OFF, and the drain and the control gates of the EPROM cell transistor 379 are released. In addition, the output of the inverter 373 becomes VCC, and the nMOS transistor 377 turns ON. Further, since the control signal SA is VCC, the output of the inverter 374 becomes 0 V, the nMOS transistor 376 turns OFF, and the nMOS transistor 378 turns ON.

Accordingly, in this case, the drain, the control gate and the source of the EPROM cell transistor 379 respectively are released, released and set to 0 V, and the drain, the control gate and the source of the EPROM cell transistor 380 are respectively set to 0 V, VPP and 0V. Therefore, write with respect to the EPROM cell transistor 380 is made.

Figure 61:
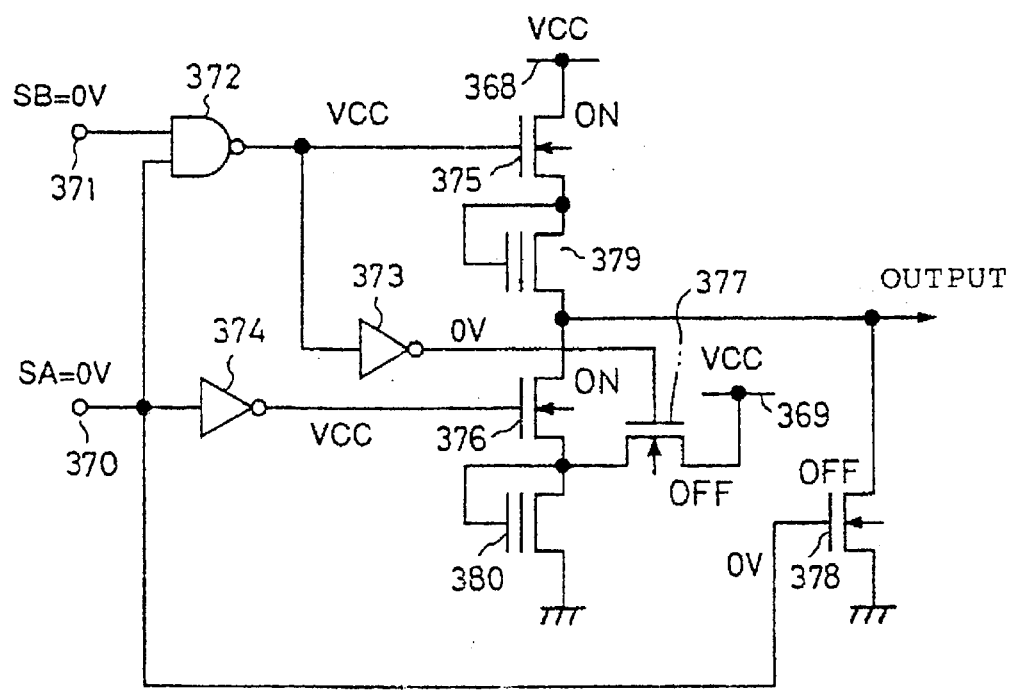
FIG. 61 is a circuit diagram for explaining a read operation of the 1-bit storage circuit shown in FIG. 56.

When making a read, the voltage lines 368 and 369 are set to VCC, the control signals SA is set to 0 V, and the control signal SB is set to 0 V, as shown in FIG. 61.

As a result, the output of the NAND circuit 372 becomes VCC, the nMOS transistor 375 turns ON, and the drain and the control gate of the EPROM cell transistor 379 are set to VCC-Vth, where Vth denotes the threshold voltage of the nMOS transistor. In addition, the output of the inverter 373 is set to 0 V, and the nMOS transistor 377 turns off. Furthermore, because the control signal SA is 0 V, the output of the inverter 374 becomes VCC, the nMOS transistor 376 turns ON, and the nMOS transistor 378 turns OFF.

Figure 62:
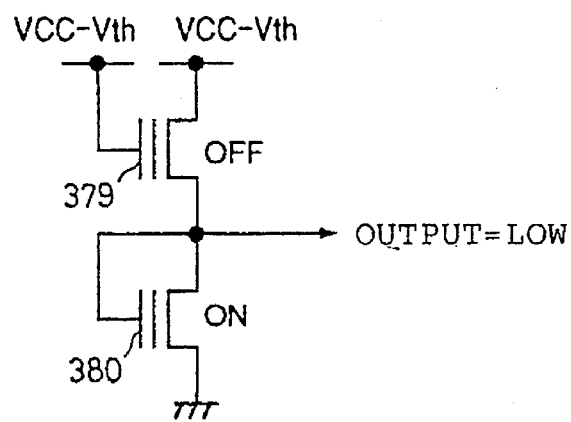
FIG. 62 is a circuit diagram showing an equivalent circuit of the 1-bit storage circuit shown in FIG. 56 at the time of the read.

Accordingly, when the write has been made with respect to the EPROM cell transistor 379, the 1-bit storage circuit shown in FIG. 61 can be described by an equivalent circuit shown in FIG. 62, and the level of the output becomes low.

Figure 63:
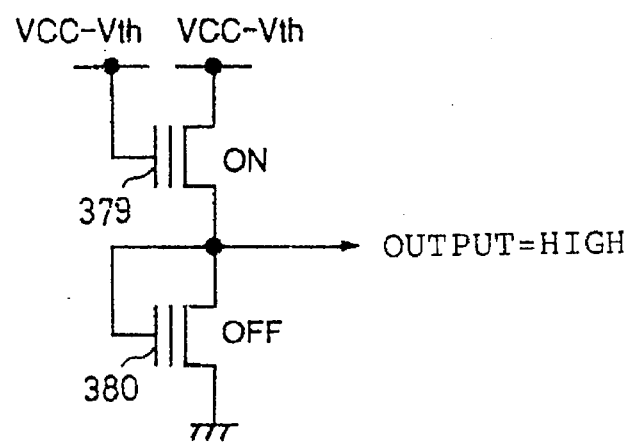
FIG. 63 is a circuit diagram showing an equivalent circuit of the 1-bit storage circuit shown in FIG. 56 at the time of the read.

On the other hand, when the write has been made with respect to the EPROM cell transistor 380, the 1-bit storage circuit shown in FIG. 61 can be described by an equivalent circuit shown in FIG. 63, and the level of the output becomes high.

Figure 64:
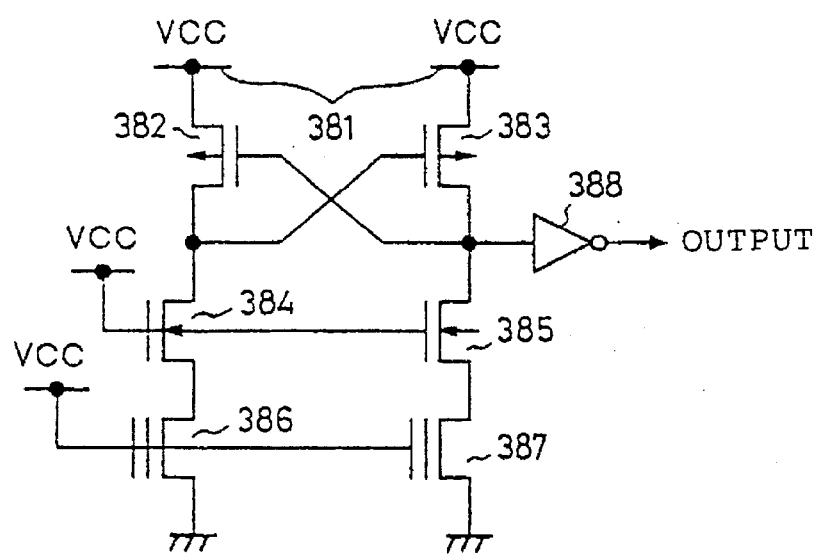
FIG. 64 is a circuit digram showing a 1-bit storage circuit which forms the redundant address storage circuit shown in FIG. 49.

It is also possible to use a 1-bit storage circuit shown in FIG. 64 as the redundant address storage circuit 316. In FIG. 64, the 1-bit storage circuit includes a power supply line 381 for supplying the power supply voltage VCC, pMOS transistors 382 and 383, nMOS transistors 384 and 385, EPROM cell transistors 386 and 387, and an inverter 388.

A write is made with respect to the EPROM cell transistor 387 when writing the low level into this 1-bit storage circuit shown in FIG. 64. In addition, a write is made with respect to the EPROM cell transistor 388 when writing the high level into this 1-bit storage circuit.

Figure 65:
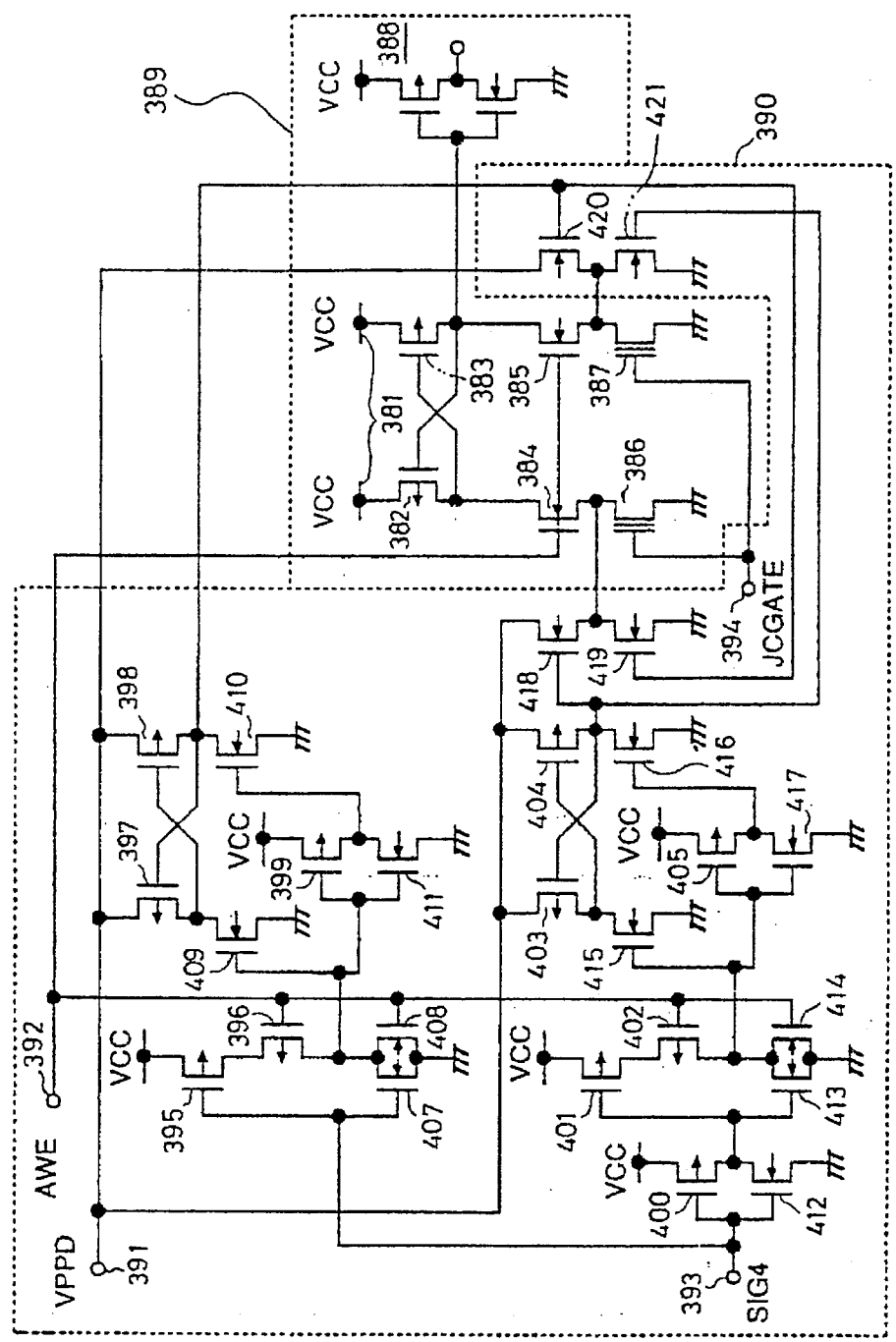
FIG. 65 is a circuit diagram showing the 1-bit storage circuit shown in FIG. 64 and a write circuit.

FIG. 65 is a circuit diagram showing the 1-bit storage circuit shown in FIG. 64 together with a write circuit. In other words, FIG. 65 shows a 1-bit storage circuit 389 and a write circuit 390.

In the write circuit 390, a voltage VPPD is input to a VPPD input terminal 391, a voltage AWE is input to an AWE input terminal 392, a voltage SIG4 is input to a SIG4 input terminal 393, and a control voltage JCGATE is input to a JCGATE input terminal 394. The write circuit 390 includes pMOS transistors 395 through 405, and nMOS transistors 407 through 421.

Figure 66:
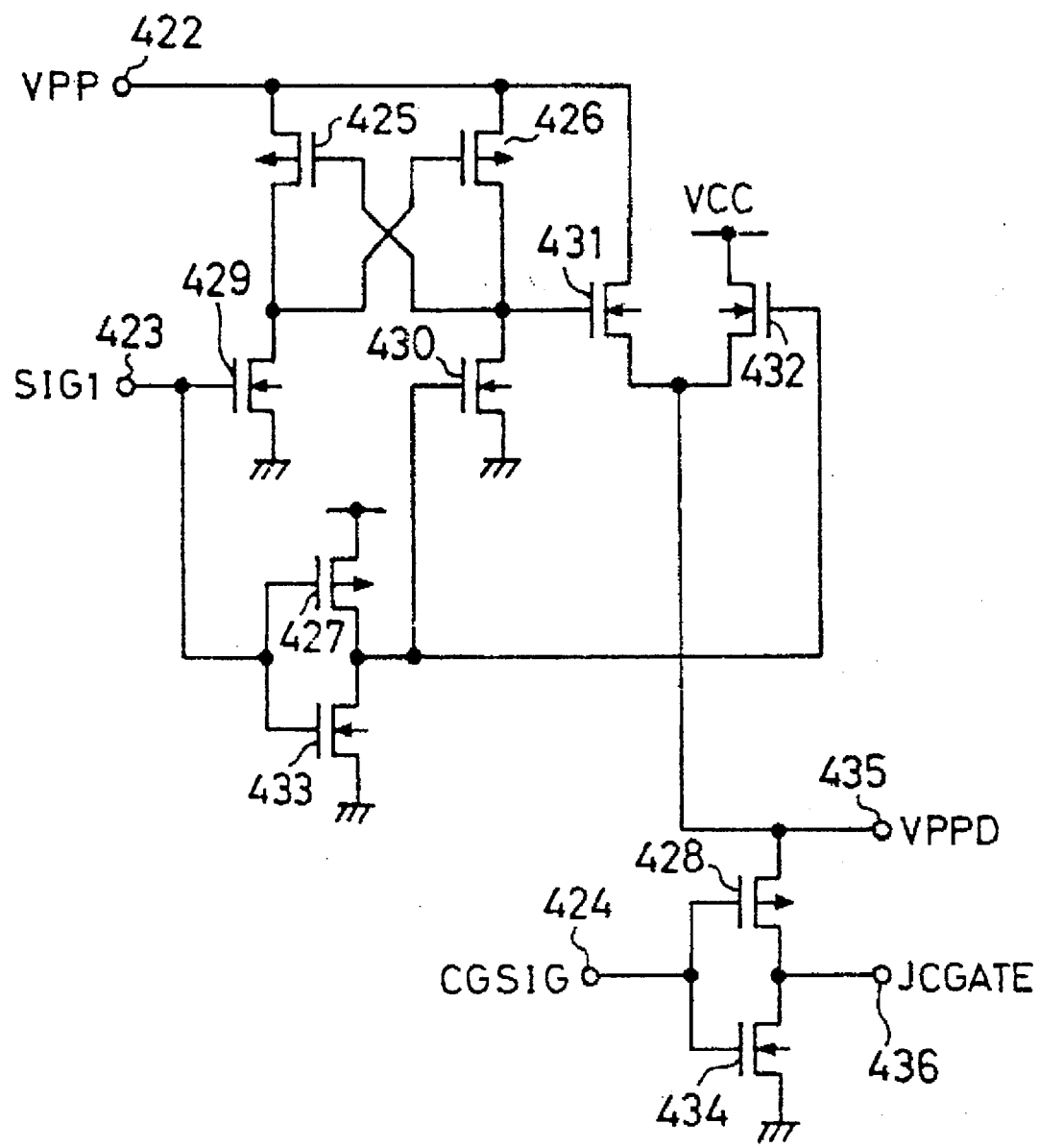
FIG. 66 is a circuit diagram showing a write control circuit which controls the write circuit shown in FIG. 65.

FIG. 66 is a circuit diagram showing a write control circuit which controls the write circuit 390 shown in FIG. 65. In FIG. 66, the voltage VPP of 12 V, for example, is input to a VPP input terminal 422, a control signal SIG1 is input to a SIG1 input terminal 423, and a control signal CGSIG is input to a CGSIG input terminal 424. The write control circuit includes pMOS transistors 425 through 428, and nMOS transistors 429 through 434. The voltage VPPD is output from a VPPD output terminal 435, and the control voltage JCGATE is output from a JCGATE output terminal 436.

Figure 67:
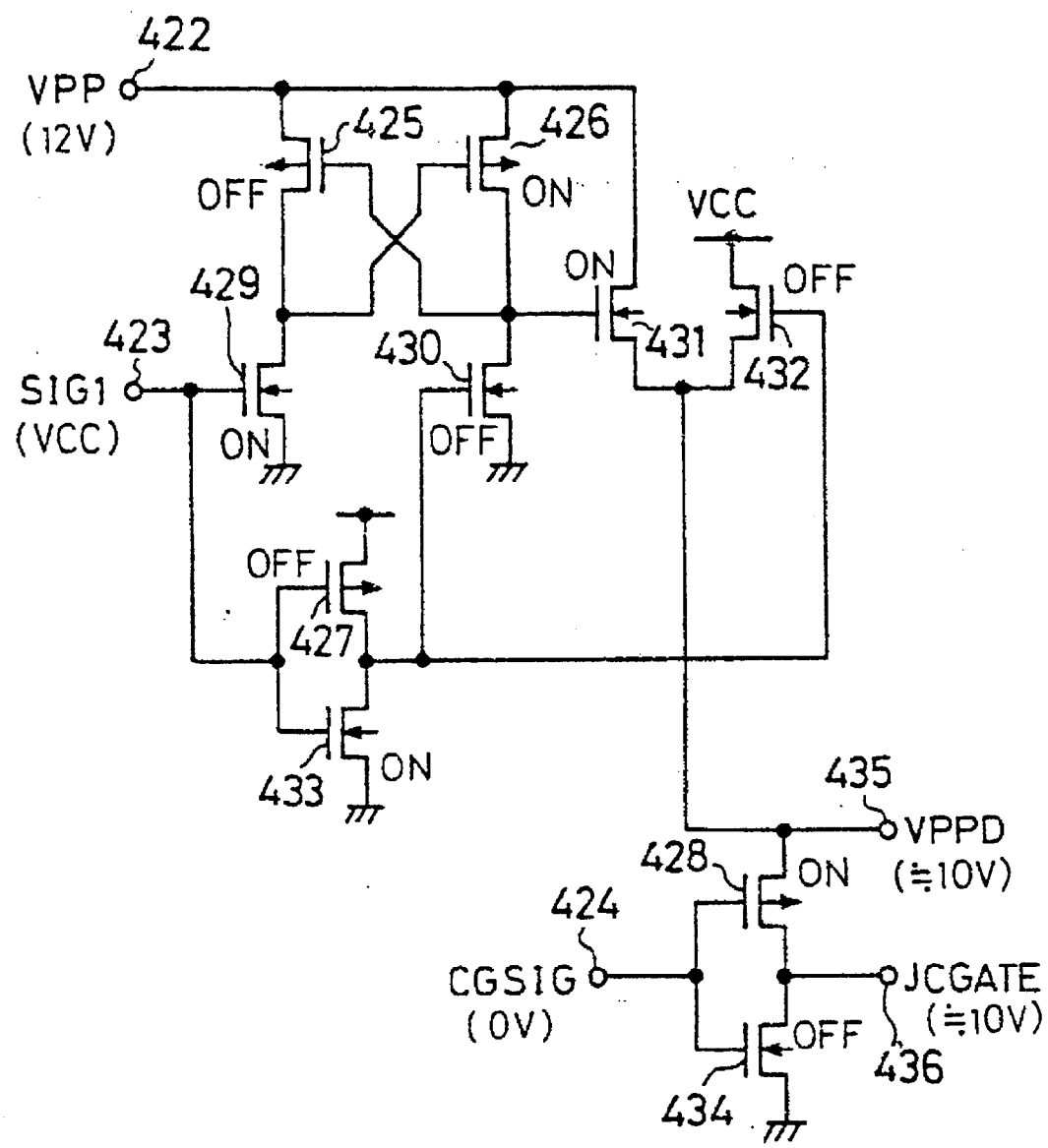
FIG. 67 is a circuit diagram for explaining a write operation of the write control circuit shown in FIG. 66.

In this write control circuit shown in FIG. 66, the high voltage VPP is set to 12 V, the control signal SIG1 is set to VCC, and the control signal CGSIG is set to 0 V, as shown in FIG. 67, when making a write. As a result, the pMOS transistors 425 and 427 turn OFF, the pMOS transistors 426 and 428 turn ON, the nMOS transistors 429, 431 and 433 turn ON, the nMOS transistors 430 and 434 turn ON, the control voltage VPPD becomes approximately 10 V, and the control voltage JCGATE becomes approximately 10 V.

Figure 68:
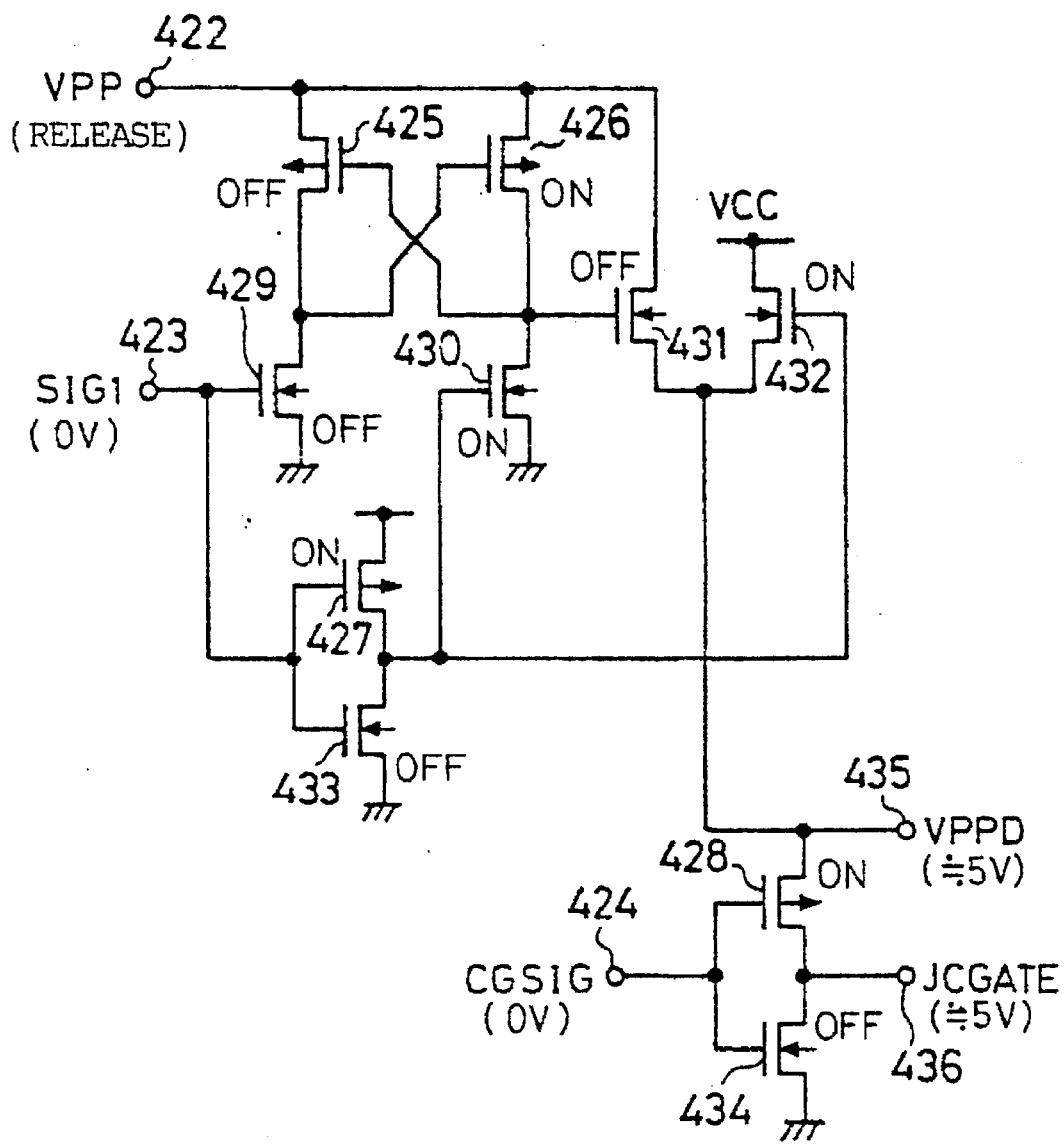
FIG. 68 is a circuit diagram for explaining a read operation of the write control circuit shown in FIG. 66.

On the other hand, the VPP input terminal 422 is released, the control signal SIG1 becomes 0 V, and the control signal CGSIG becomes 0 V, as shown in FIG. 68, when making a read. As a result, the pMOS transistor 425 turns OFF, the pMOS transistors 426, 427 and 428 turn ON, the nMOS transistors 429, 431 and 433 turn ON, the nMOS transistors 430 and 434 turn OFF, the control voltage VPPD becomes approximately VCC, and the control voltage JCGATE becomes approximately VCC.

Figure 69:
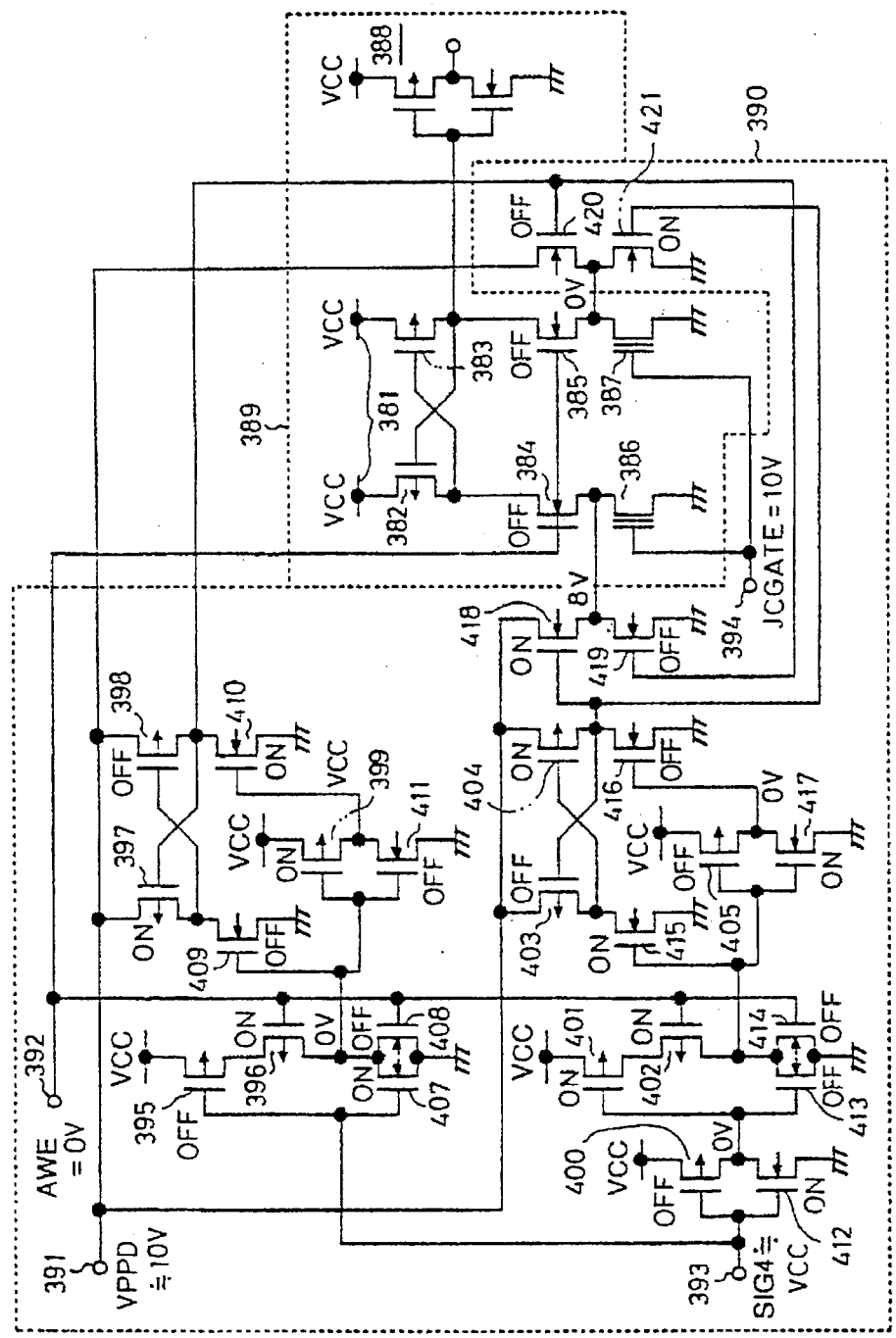
FIG. 69 is a circuit diagram for explaining a write operation of the write circuit shown in FIG. 65.

When writing the high level into the 1-bit storage circuit 389 when making the write, in other words, when the write is made with respect to the EPROM cell transistor 386, the control voltage VPPD becomes approximately 10 V, the control voltage JCGATE becomes approximately 10 V, the control voltage AWE becomes 0 V, and the control signal SIG4 becomes VCC in the write circuit 390, as shown in FIG. 69. As a result, the pMOS transistors 395, 398, 400, 403 and 405 turn OFF, and the pMOS transistor 396, 397, 401, 402 and 404 turn ON. On the other hand, the nMOS transistors 407, 410, 412, 415, 417, 418 and 421 turn ON, and the nMOS transistors 408, 409, 411, 413, 414, 419 and 420 turn OFF.

As a result, the drain and the control gate of the EPROM cell transistor 386 respectively become approximately 8 V and approximately 10 V, and the drain and the control gate of the EPROM cell transistor 387 respectively become 0 V and approximately 10 V, thereby making the write with respect to the EPROM cell transistor 386.

Figure 70:
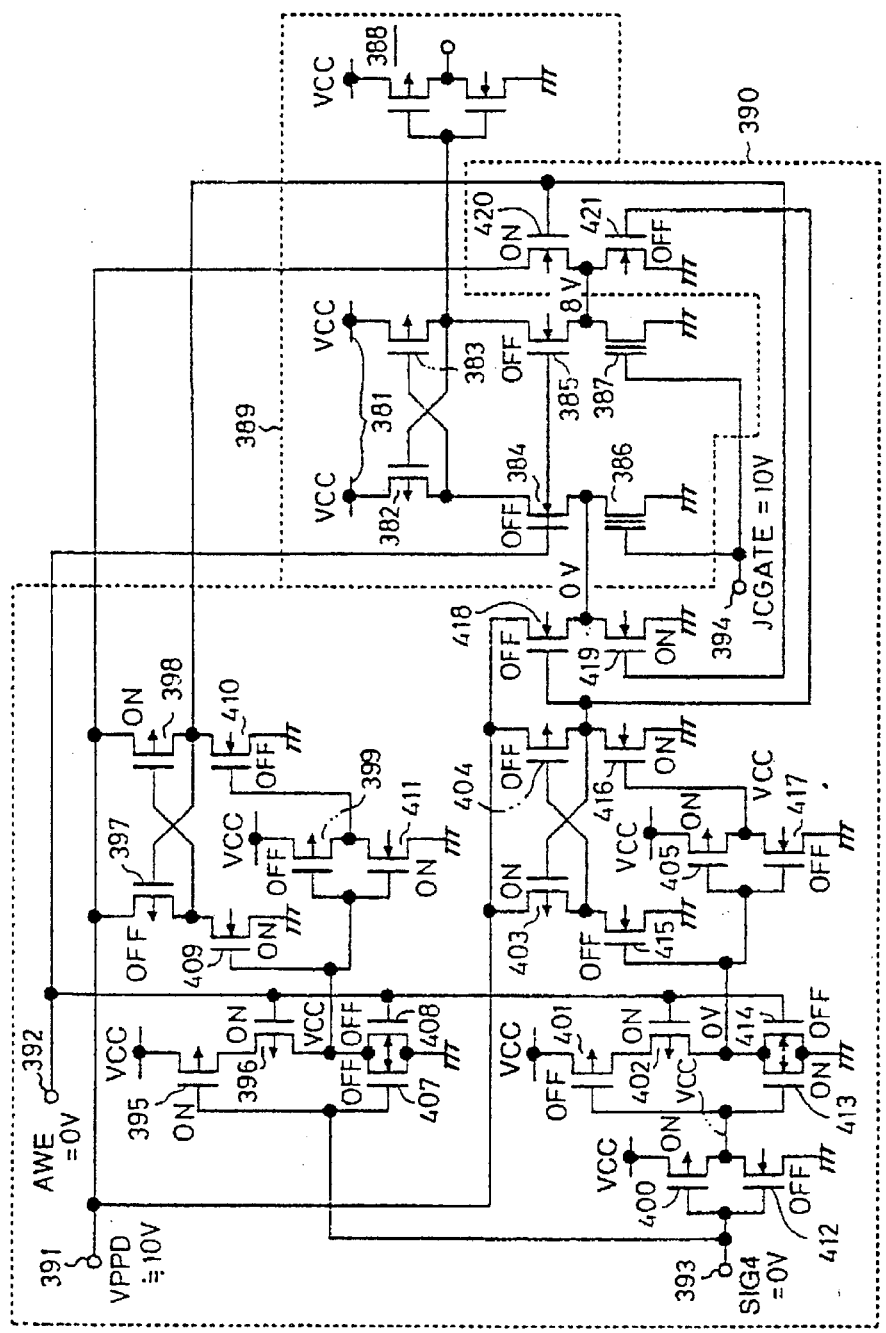
FIG. 70 is a circuit diagram for explaining the write operation of the write circuit shown in FIG. 65.

On the other hand, when writing the low level into the 1-bit storage circuit 389, that is, when the write is made with respect to the EPROM cell transistor 387, the control voltage VPPD becomes approximately 10 V, the control voltage JCGATE becomes approximately 10 V, the control voltage AWE becomes 0 V, and the control signal SIG4 becomes approximately 0 V in the write circuit 390, as shown in FIG. 70. As a result, the pMOS transistors 395, 396, 398, 400, 402, 403 and 405 turn ON, and the pMOS transistors 397, 401 and 404 turn OFF. In addition, the nMOS transistors 407, 408, 410, 412, transistors 409, 411, 413, 419 and 420 turn ON.

As a result, the drain and the control gate of the EPROM cell transistor 386 respectively become 0 V and approximately 10 V, and the drain and the control gate of the EPROM cell transistor 387 respectively become approximately 8 V and approximately 10 V, thereby making the write with respect to the EPROM cell transistor 387.

Figure 71:
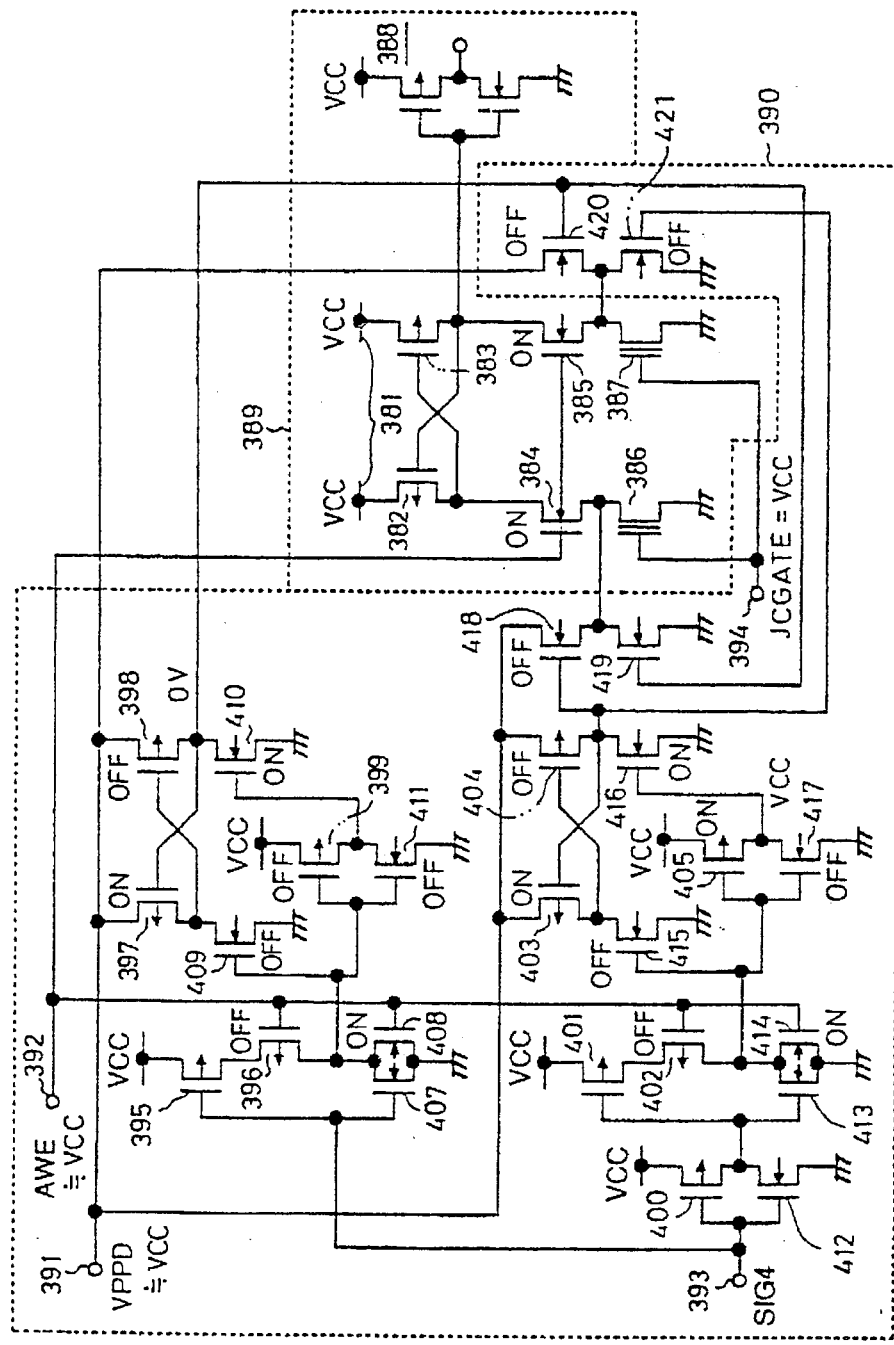
FIG. 71 is a circuit diagram for explaining a read operation of the write circuit shown in FIG. 65.

On the other hand, when making the read, the control voltage VPPD becomes approximately VCC, the control voltage JCGATE becomes approximately VCC, the control voltage AWE becomes approximately VCC, and the control signal SIG4 is in the released state in the write circuit 390, as shown in FIG. 71. As a result, the pMOS transistors 396, 398, 402 and 404 turn OFF, the pMOS transistors 397, 399, 403 and 405 turn ON, the nMOS transistors 408, 410, 414 and 416 turn ON, and the nMOS transistors 409, 411, 415 and 417 through 421 turn OFF.

Figure 72:
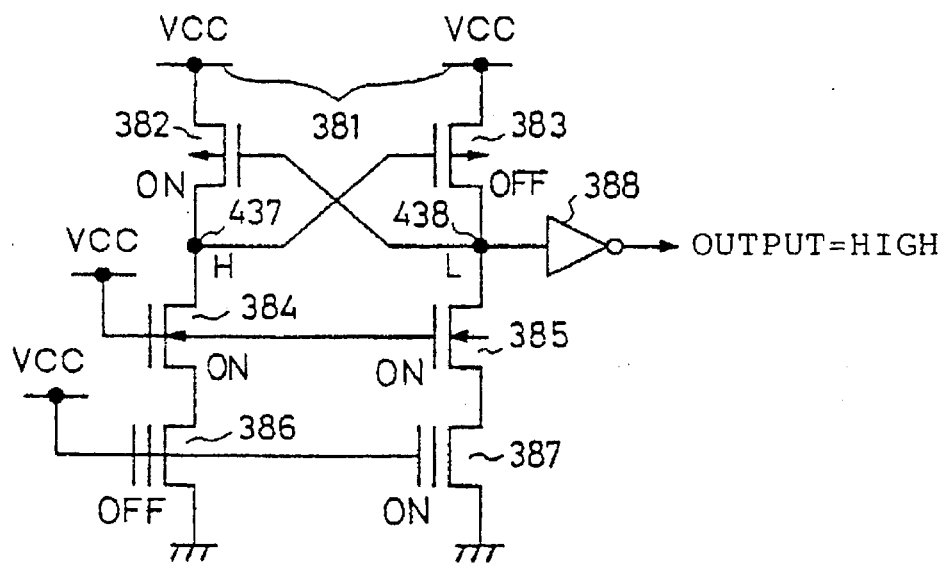
FIG. 72 is a circuit diagram for explaining a read operation of the 1-bit storage circuit shown in FIG. 64.

Accordingly, when the high level is written into the 1-bit storage circuit 389, that is, when the write has been made with respect to the EPROM cell transistor 386, the level at a node 437 becomes high, the level at a node 438 becomes low, and the level of the output becomes high as shown in FIG. 72.

Figure 73:
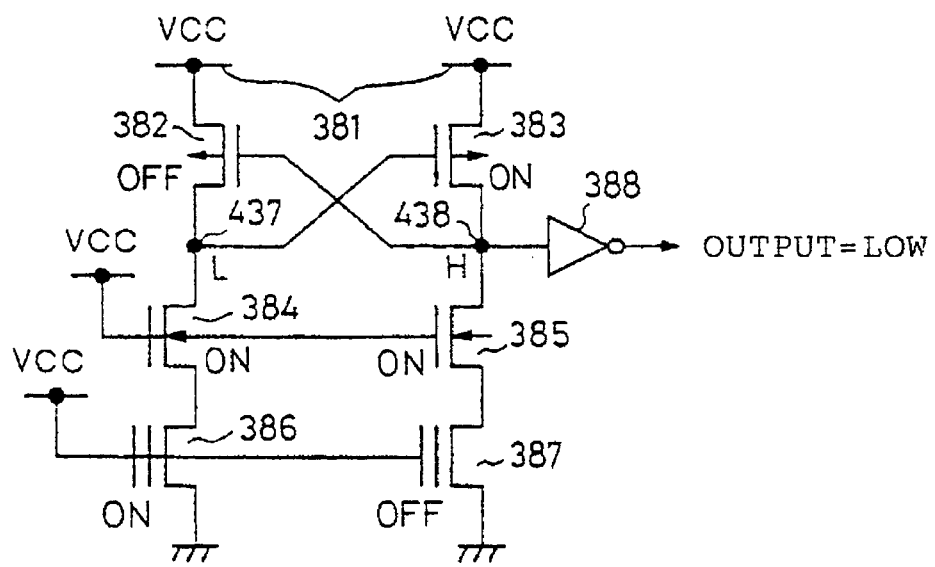
FIG. 73 is a circuit diagram for explaining the read operation of the 1-bit storage circuit shown in FIG. 64.

On the other hand, when the low level is written into the 1-bit storage circuit 389, that is, when the write has been made with respect to the EPROM cell transistor 387, the level at the node 437 becomes low, the level at the node 438 becomes high, and the level of the output becomes low, as shown in FIG. 73.

Figure 74:
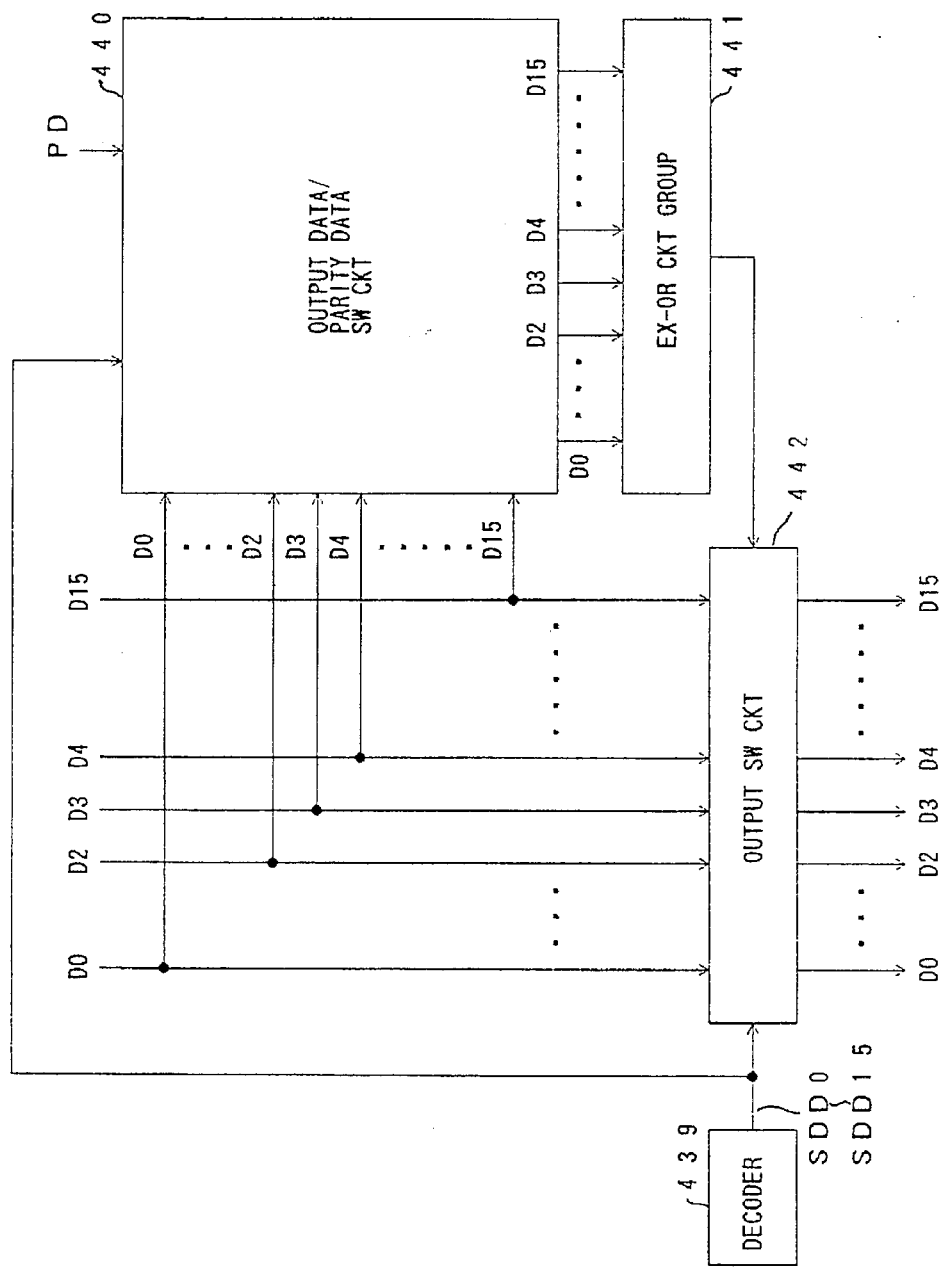
FIG. 74 is a system block diagram showing an output correction circuit of the fifth embodiment.

The output correction circuit 320 shown in FIG. 48 may have the construction shown in FIG. 74, for example. The output correction circuit 320 shown in FIG. 74 includes a decoder 439, an output data/parity data switching circuit 440, an exclusive-OR circuit group 441, and an output switching circuit 442.

The decoder 439 decodes the column address signals SDB0 through SDB3 of the output data having the doubtful data value and output from the redundant address storage circuit 316. The output data/parity data switching circuit 440 switches the output data having the doubtful data value and having the column address specified by the decoded signal supplied from the decoder 439 with the parity data PD output from the parity cell array 311 when the decoded signal is supplied from the decoder 439, out of output data D0 through D15 output from the main cell arrays $310_0$ through $310_{15}$.

The exclusive-OR circuit group 441 generates the correct data from the data output from the output data/parity data switching circuit 440. In the data output from the output data/parity data switching circuit 440, the output data having the doubtful data value is switched with the parity data PD.

When the decoded signal is supplied from the decoder 539, the output switching circuit 442 selects and outputs the data output from the exclusive-OR circuit group 441 for the output data having the doubtful data value and specified by the decoded signal from the decoder 439, out of the data D0 through D15 output from the main cell arrays $310_0$ through $310_{15}$, and selects and outputs the data from the main cell arrays $310_0$ through $310_{15}$ for the other data.

Figure 75:
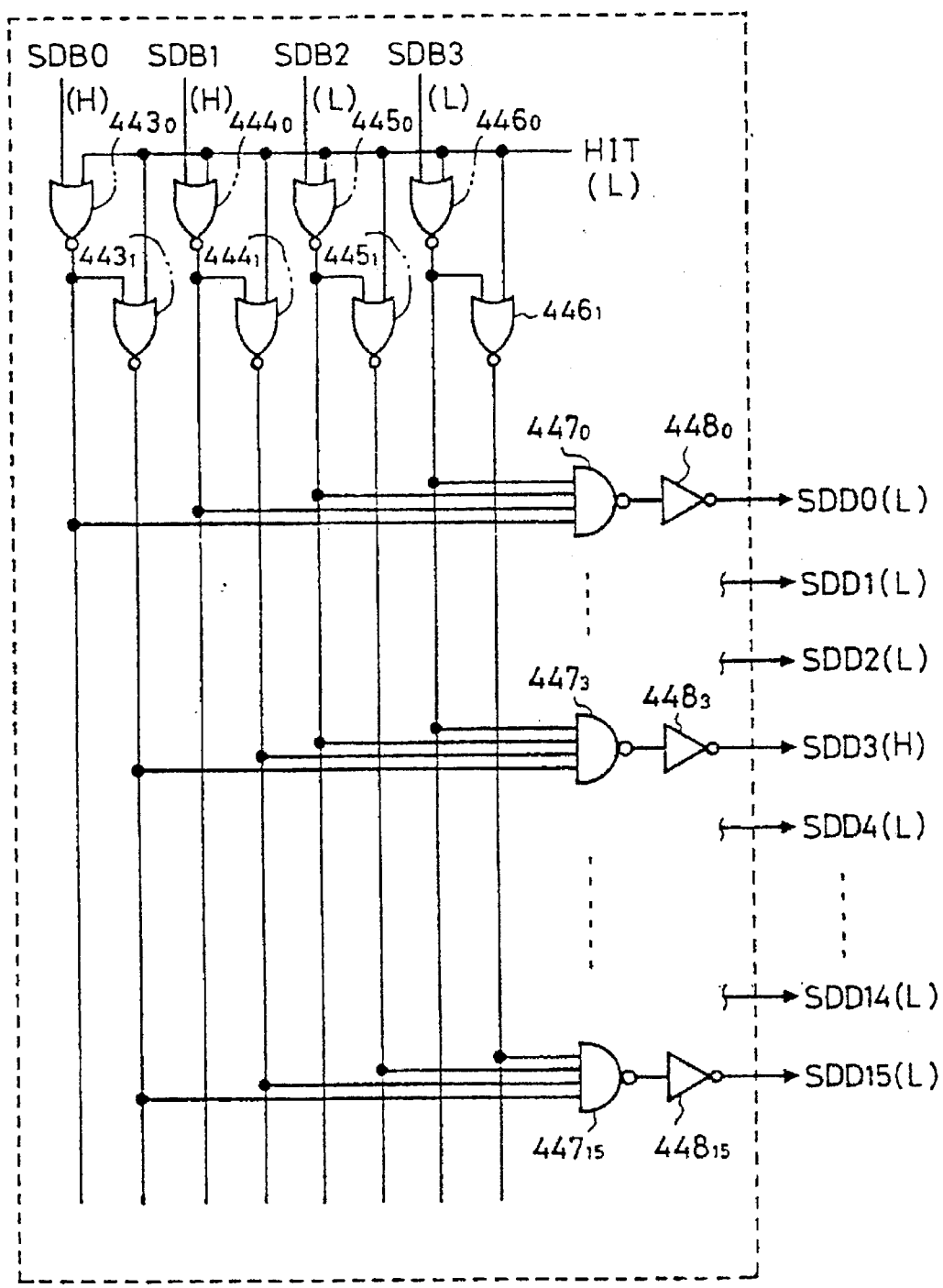
FIG. 75 is a circuit diagram showing a decoder which forms the output correction circuit shown in FIG. 74.

The decoder 439 may have the construction shown in FIG. 75, for example. In FIG. 75, not all of the elements are shown, and the elements of the decoder 439 shown include NOR circuits $443_0$ through $446_0$ and $443_1$ through $446_1$, NAND circuits $447_0$, $447_3$ and $447_{15}$, and inverters $448_0$, $448_3$ and $448_{15}$. SDD0 through SDD15 denote the decoded signals of the column address of the output data having the doubtful data value.

For example, when the addresses A17 through A20 supplied from the outside and the redundant addresses match and D3 is the output data having the doubtful data value, a high-level signal SDB0, a high level signal SDB1, a low-level signal SDB2 and a low-level signal SDB3 are supplied from the redundant address storage circuit 316 as the column address signals. In addition, the signal HIT has a low level in this state.

As a result, the column address decoded signal SDD3 becomes high, and the column address decoded signals SDD0 through SDD2 and SDD4 through SDD15 become low.

Figure 76:
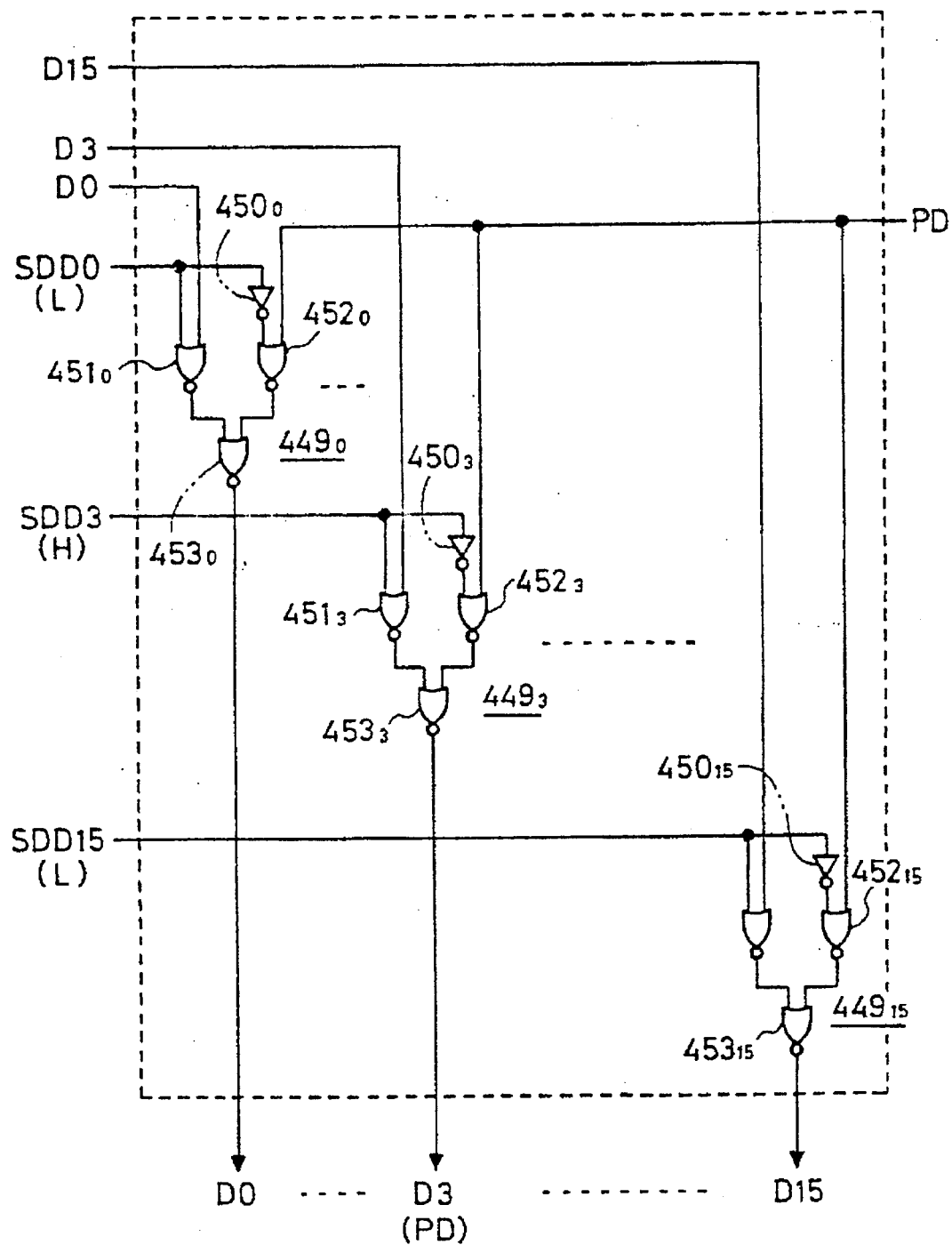
FIG. 76 is a circuit diagram showing an output data/parity data switching circuit which forms the output correction circuit shown in FIG. 74.

On the other hand, the output data/parity data switching circuit 440 may have the construction shown in FIG. 76, for example. In FIG. 76, not all of the elements are shown, and the elements of the output data/parity data switching circuit 440 shown include switching circuits $449_0$, $449_3$ and $449_{15}$. The switching circuit $449_0$ includes an inverter $450_0$, and NOR circuits $451_0$, $452_0$ and $453_0$. The switching circuit $449_3$ includes an inverter $450_3$, and NOR circuits $451_3$, $452_3$ and $453_{30}$. In addition, the switching circuit $449_{15}$ includes an inverter $450_{15}$, and NOR circuits $451_{15}$, $452_{15}$ and $453_{15}$. The switching operations of the switching circuits $449_0$, $449_3$ and $449_{15}$ are respectively controlled by the column address decoded signals SDD0, SDD3 and SDD15 output from the decoder 439.

When D3 is the output data having the doubtful data value as described above, the signal SDD3 becomes high, and the signals SDD0 through SDD2 and SDD4 through SDD15 become low. Hence, in the output data/parity data switching circuit 440, only the switching circuit $449_3$ selects and passes the parity data PD, and the other switching circuits such as the switching circuits $449_0$ and $449_{15}$ select and pass the output data D0 through D2 and D4 through D15.

Accordingly, in this case, the output data D3 is switched with the parity data PD, and the data D0 through D2, the parity data PD and the data D4 through D15 are transferred to the exclusive-OR circuit group 441.

Figure 77:
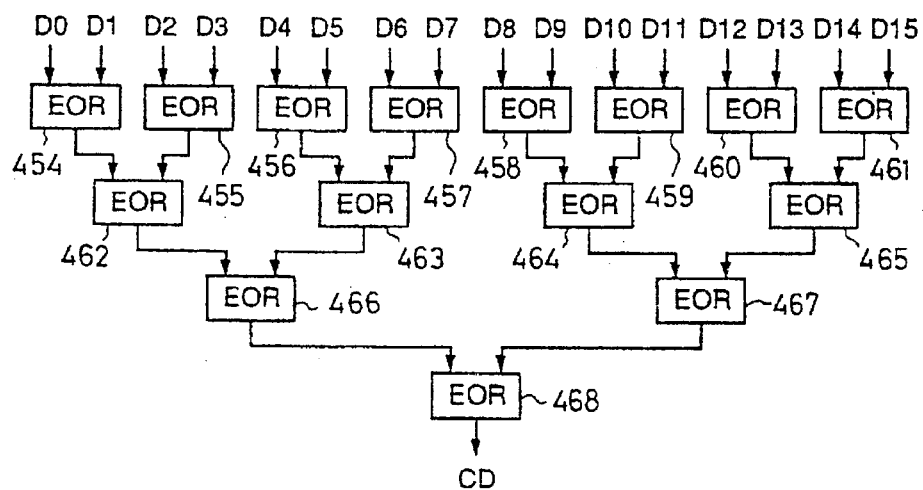
FIG. 77 is a circuit diagram showing an exclusive-OR circuit group which forms the output correction circuit shown in FIG. 74.

The exclusive-OR circuit group 441 may have the construction shown in FIG. 77, for example. In FIG. 77, the exclusive-OR circuit group 441 includes exclusive-OR circuits 454 through 468. CD denotes the output of the exclusive-OR circuit 468, that is, the output of the exclusive-OR circuit group 441.

Figure 78:
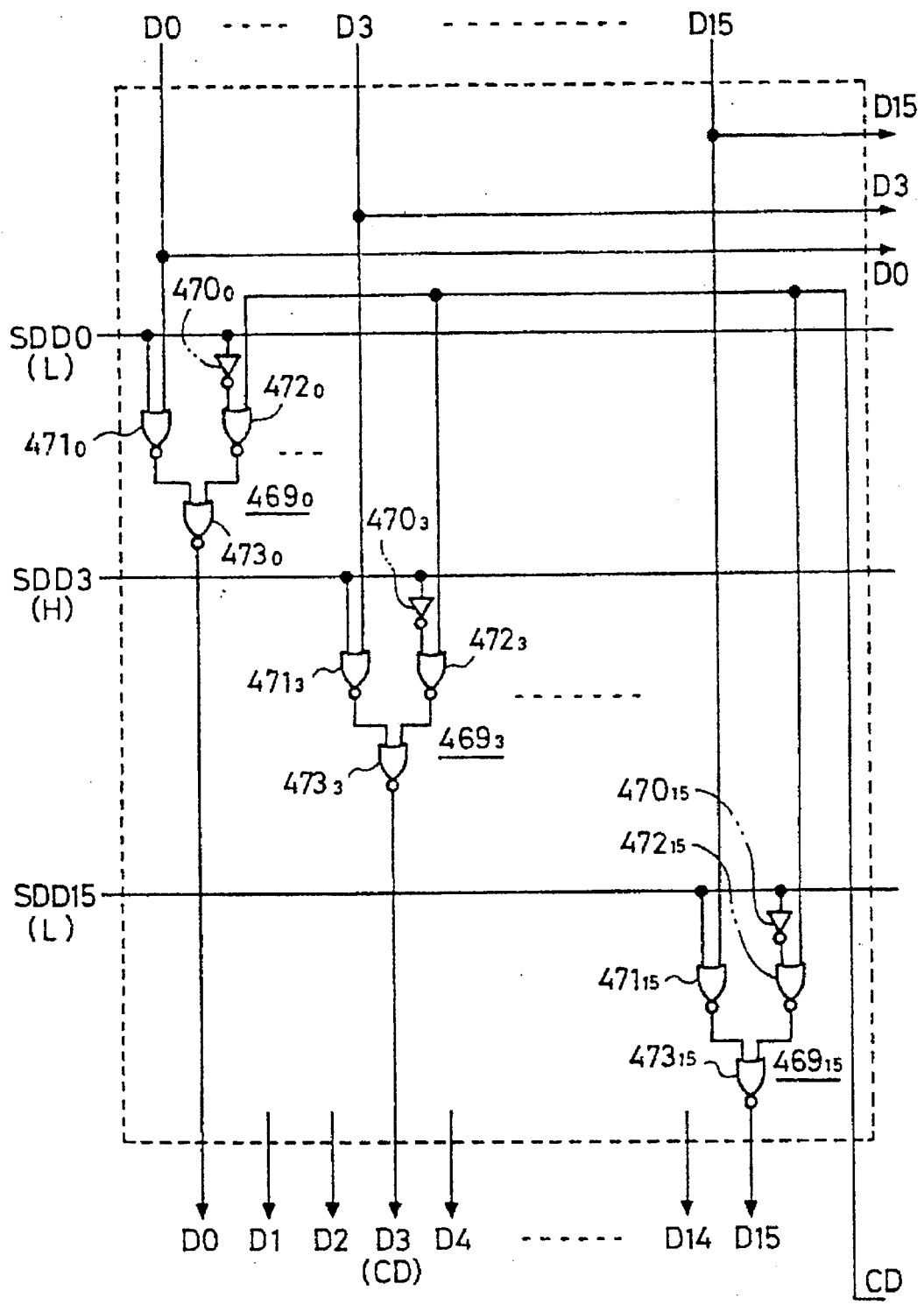
FIG. 78 is a circuit diagram showing an output switching circuit which forms the output correction circuit shown in FIG. 74.

The output switching circuit 442 may have the construction shown in FIG. 78, for example. In FIG. 78, not all of the elements are shown, and the elements of the output switching circuit 442 shown include switching circuits $469_0$, $469_3$ and $469_{15}$. The switching circuit $469_0$ includes an inverter $470_0$, and NOR circuits $471_0$, $472_0$ and $473_0$. The switching circuit $469_3$ includes an inverter $470_3$, and NOR circuits $471_3$, $472_3$ and $473_3$. In addition, the switching circuit $469_{15}$ includes an inverter $470_{15}$, and NOR circuits $471_{15}$, $472_{15}$ and $473_{15}$. The switching operations of the switching circuits $469_0$, $469_3$ and $469_{15}$ are respectively controlled by the decoded signals SDD0, SDD3 and SDD15 output from the decoder 439.

When D3 is the output data having the doubtful data value, the signal SDD3 becomes high, and the signals SDD0 through SDD2 and SDD4 through SDD15 become low. For this reason, in the output switching circuit 440, only the switching circuit $469_0$ selects and passes the correct data CD output from the exclusive-OR circuit group 441, and the other switching circuits such as the switching circuits $469_0$ and $469_{15}$ select and pass the output data D0 through D2 and D4 through D15.

Accordingly, in this case, the output data D3 is switched with the correct data CD, and the output data D0 through D2, the correct data CD and the output data D4 through D15 are transferred to the output buffer 321.

Figure 79:
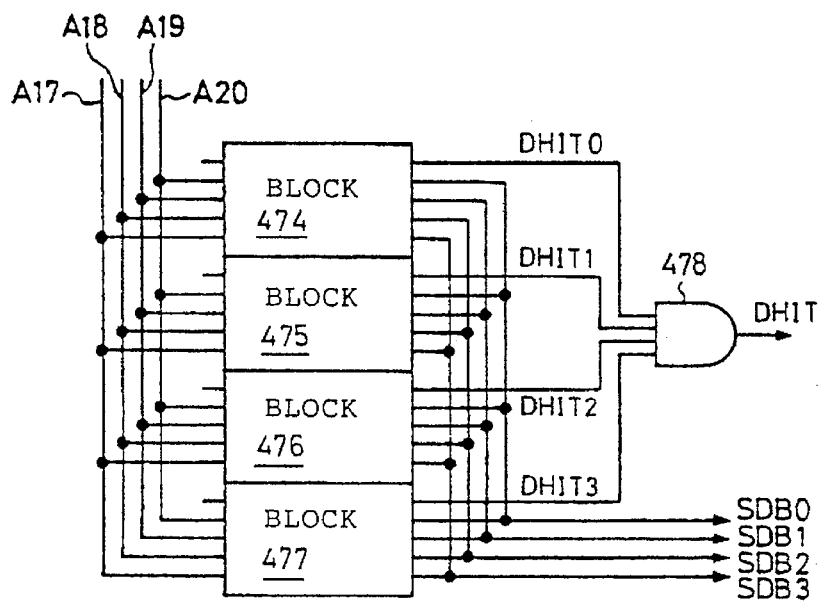
FIG. 79 is a circuit diagram showing a redundant address storage circuit for testing provided in the fifth embodiment.

The redundant address storage circuit 318 for testing shown in FIG. 48 uses SRAM cells as the storage elements for storing the redundant address. For example, the redundant address storage circuit 318 may have the construction shown in FIG. 79. In FIG. 79, the redundant address storage circuit 318 includes blocks 474 through 477, and an AND circuit 478.

The blocks 474 through 477 respectively store 1 redundant address and an address of the output data having the doubtful data value and corresponding to this 1 redundant address. The block 474 through 477 output match detection signals DHIT0 through DHIT3 when the redundant addresses stored therein match the corresponding addresses A17 through A20 supplied from the outside. The AND circuit 478 outputs a match detection signal DHIT when one of the match detection signals DHIT0 through DHIT3 is output from the blocks 474 through 477. In FIG. 79, DSDB0 through DSDB3 denote addresses of the output data to be corrected.

Figure 80:
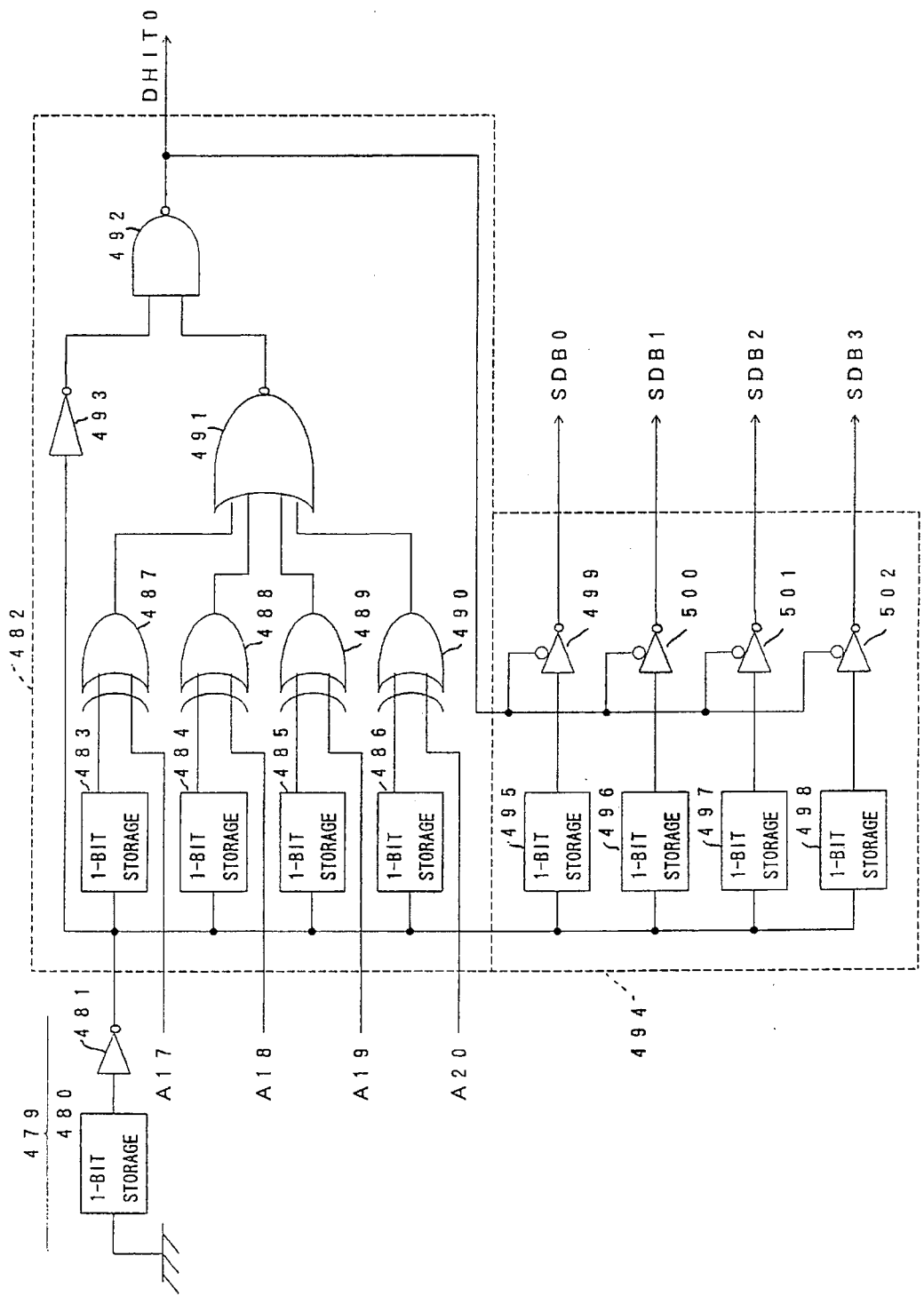
FIG. 80 is a circuit diagram showing 1 block which forms the redundant address storage circuit for testing shown in FIG. 79.

The blocks 474 through 477 have the same circuit construction, and for example, the block 474 has the circuit construction shown in FIG. 80. In FIG. 80, the block 474 includes a state setting circuit 479, a match detection circuit 482, and a column address storage circuit 494.

The state setting circuit 479 sets whether the block 474 is to be put into a used state or an unused state. The state setting circuit 479 includes a 1-bit storage circuit 480 and an inverter 481. When the 1-bit storage circuit 480 stores a low level and the output of the inverter 481 has a high level, the block 474 is put into the unused state. On the other hand, the block 474 is put into the used state when the 1-bit storage circuit 480 stores a high level and the output of the inverter 481 has a low level.

The match detection circuit 482 stores upper 4 bit portions RA17 through RA20 of the redundant address, and compares the stored redundant addresses RA17 through RA20 and the upper 4 bit addresses A17 through A20 of the address which is supplied from the outside, so as to detect whether the compared 4 bits match. The match detection circuit 482 includes 1-bit storage circuits 483 through 486, exclusive-OR circuits 487 through 490, a NOR circuit 491, a NAND circuit 492, and an inverter 493.

The 1-bit storage circuits 483 through 486 respectively store 1 bit of the redundant addresses RA17 through RA20. The exclusive-OR circuits 487 through 490 form a comparator circuit. The NOR circuit 491 detects whether or not the redundant addresses RA17 through RA20 and the addresses A17 through A20 supplied from the outside match. The NAND circuit 492 outputs the match detection signal DHIT0 based on the output of the NOR circuit 491. The inverter 493 controls whether the NAND circuit 492 is to be made active or inactive.

When the 1-bit storage circuit 480 stores the low level and the output level of the inverter 481 is high, that is, when this block 474 is put into the unused state, the output level of the inverter 493 becomes low and the NAND circuit 492 is made inactive, and the output of the NAND circuit 492 is fixed to the high level.

On the other hand, when the 1-bit storage circuit 480 stores the high level and the output level of the inverter 481 is low, that is, when this block 474 is put into the used state, the output level of the inverter 493 becomes high and the NAND circuit 492 is made active, and the output of the NAND circuit 492 becomes an inverted value of the output of the NOR circuit 491.

For example, the exclusive-OR circuit 487 outputs a low level when the redundant address RA17 stored in the 1-bit storage circuit 483 and the address A17 supplied for the outside match. The other exclusive-OR circuits 488 through 490 operate similarly to the exclusive-OR circuit 487. As a result, the NOR circuit 491 outputs the high level only when the redundant addresses RA17 through RA20 stored in the 1-bit storage circuits 483 through 486 and the addresses A17 through A20 supplied from the outside match, and otherwise outputs the low level.

When the output level of the NOR circuit 491 is high, the output level of the NAND circuit 492, that is, the level of the match detection signal DHIT0 becomes low and the match detection is indicated. On the other hand, when the output level of the NOR circuit 491 is low, the output level of the NAND circuit 492, that is, the level of the match detection signal DHIT0 becomes high and the non-match is indicated.

The column address storage circuit 494 stores the column address of the output data having the doubtful data value. This column address storage circuit 494 includes 1-bit storage circuits 495 through 498, and tristate buffers 499 through 502. The 1-bit storage circuits 495 through 498 respectively store 1 bit of the column address of the output data having the doubtful data value. The tristate buffers 499 through 502 are turned ON and output address signals SDB0 through SDB3 of the output data having the doubtful data value when the match is detected and the match detection signal DHIT0 has the low level. On the other hand, when no match is detected and the match detection signal DHIT0 has the high level, the tristate buffers 499 through 502 are turned OFF. When the tristate buffers 347 through 350 are turned OFF, the address signals SDB0 through SDB3 of the output data having the doubtful data value are not output from these tristate buffers 499 through 502, and the outputs of the tristate buffers 499 through 502 assume the high impedance state.

Figure 81:
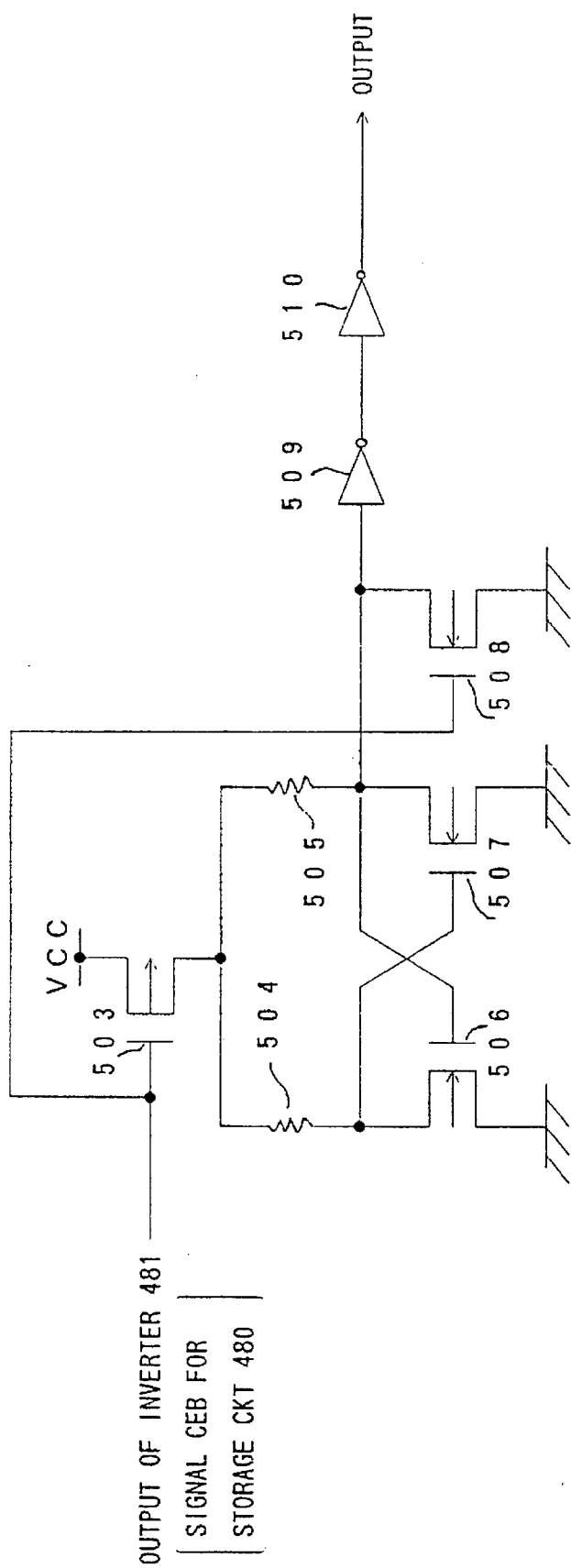
FIG. 81 is a circuit diagram showing a 1-bit storage circuit which forms the redundant address storage circuit for testing shown in FIG. 79.

For example, the 1-bit storage circuits 480, 483 through 486 and 495 through 498 may have the construction shown in FIG. 81. In FIG. 81, the 1-bit storage circuit includes a pMOS transistor 503, high resistances 504 and 505 forming loads, nMOS transistors 506 through 508, and inverters 509 and 510.

Therefore, the redundant address storage circuit 318 for testing has basically the same circuit construction as the redundant address storage circuit 316 except for the construction of the 1-bit storage circuits. Hence, the redundant address storage circuit 318 for testing can be operated similarly to the redundant address storage circuit 316.

In other words, when making the test, the switching circuit 317 is turned OFF and the switching circuit 319 is turned ON, so that the output correction test can be made using the redundant address storage circuit 318 for testing. During normal use, the switching circuit 317 is turned ON and the switching circuit 319 is turned OFF, so that the redundant address storage circuit 316 is used.

In the 1-bit storage circuit shown in FIG. 51, the fuse 355 or 356 is cut when used. At the time of the read, no path exists for a current to regularly flow for the power supply VCC to the ground because the pMOS transistor 351 turns ON and the nMOS transistor 354 turns OFF, as described above in conjunction with FIGS. 52 and 53.

In addition, when not in use, the pMOS transistor 351 turns OFF and the nMOS transistor 354 turns ON. Hence, in this case also, no path exists for a current to regularly flow from the power supply VCC to the ground.

Therefore, according to this fifth embodiment, it is possible to reduce the power consumption when the 1-bit storage circuit shown in FIG. 51 is used to form the redundant address storage circuit 316. In addition, since the fuses 355 and 356 can be cut by the laser, no write circuit is required. As a result, it is possible to reduce the area occupied by the redundant address storage circuit 316, and consequently reduce the chip area.

Moreover, no path exists for a current to regularly flow from the power supply VCC to the ground also in the case of the 1-bit storage circuit shown in FIG. 56 and the 1-bit storage circuit shown in FIG. 64, as described above in conjunction with FIGS. 62, 63, 72 and 73. For this reason, it is possible to reduce the power consumption when the 1-bit storage circuit shown in FIG. 56 or the 1-bit storage circuit shown in FIG. 64 is used to form the redundant address storage circuit 316.

In addition, in this fifth embodiment, in the block 322 shown in FIG. 50 which forms the redundant address storage circuit 316, the output (the outputs of the tristate buffers 347 through 350) of the column address storage circuit 342 is put into the high impedance state when the address signals A17 through A20 supplied from the outside do not match the redundant addresses. As a result, even when a plurality of blocks having the same construction as the block 322 are provided in the redundant address storage circuit 316, that is, even when the 4 blocks 322 through 325 are provided, for example, it is possible to use common signal lines to supply the column address signals SDB0 through SDB3 of the output data having the doubtful data value to the decoder 439 shown in FIG. 74 of the output correction circuit 320 shown in FIG. 48, thereby making it possible to reduce the chip area.

Furthermore, in this fifth embodiment, when the address indicated by the address signals A17 through A20 matches the redundant address signals in the output correction circuit 320, the data D0 through D15 output from the main cell arrays $310_0$ through $310_{15}$, excluding the output data having the doubtful data value, and the data output from the exclusive-OR circuit group 441 are output to the outside. Accordingly, even if the output data having the doubtful data value is a defective data which is not fixed to the high or low level, the fifth embodiment can output the normal data to the outside.

Moreover, this fifth embodiment is provided with the redundant address storage circuit 318 for testing which uses SRAM cells as the address storage elements. Hence, it is possible to store the redundant address by a testing equipment during a test process when the semiconductor memory device still assumes the wafer state. In other words, it is possible to test whether or not the normal data is output for the redundant address during the test process is the wafer state of the semiconductor memory device. Accordingly, after the write with respect to the regular redundant address storage circuit is made, it is unnecessary to make a test for the second time to determine whether or not the normal data is output for the redundant address by taking into consideration a case where the parity data is defective. Therefore, it is possible to simplify the testing process.

Next, a description will be given of a sixth embodiment of the semiconductor memory device according to the present invention, by referring to FIGS. 82 through 85.

Figure 22:
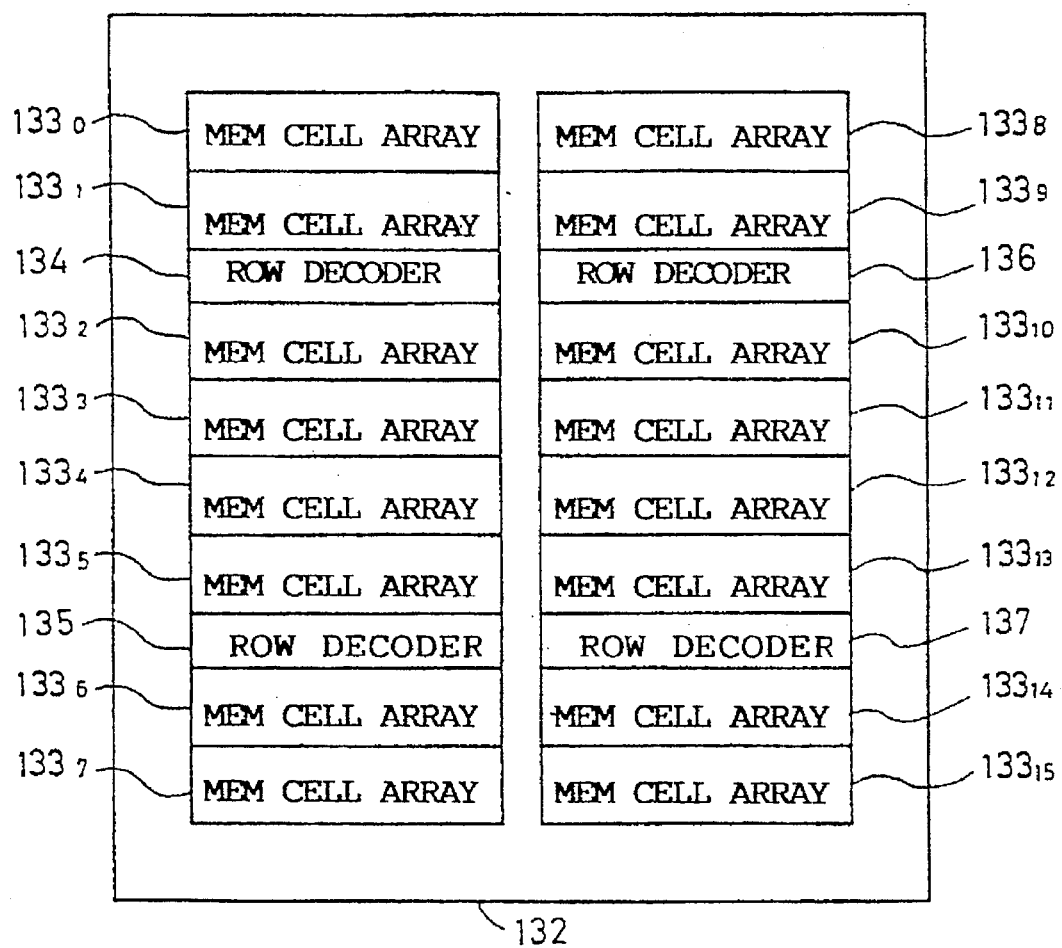
FIG. 22 is a diagram showing an important part of a sixth conceivable example of the mask ROM.
Figure 23:
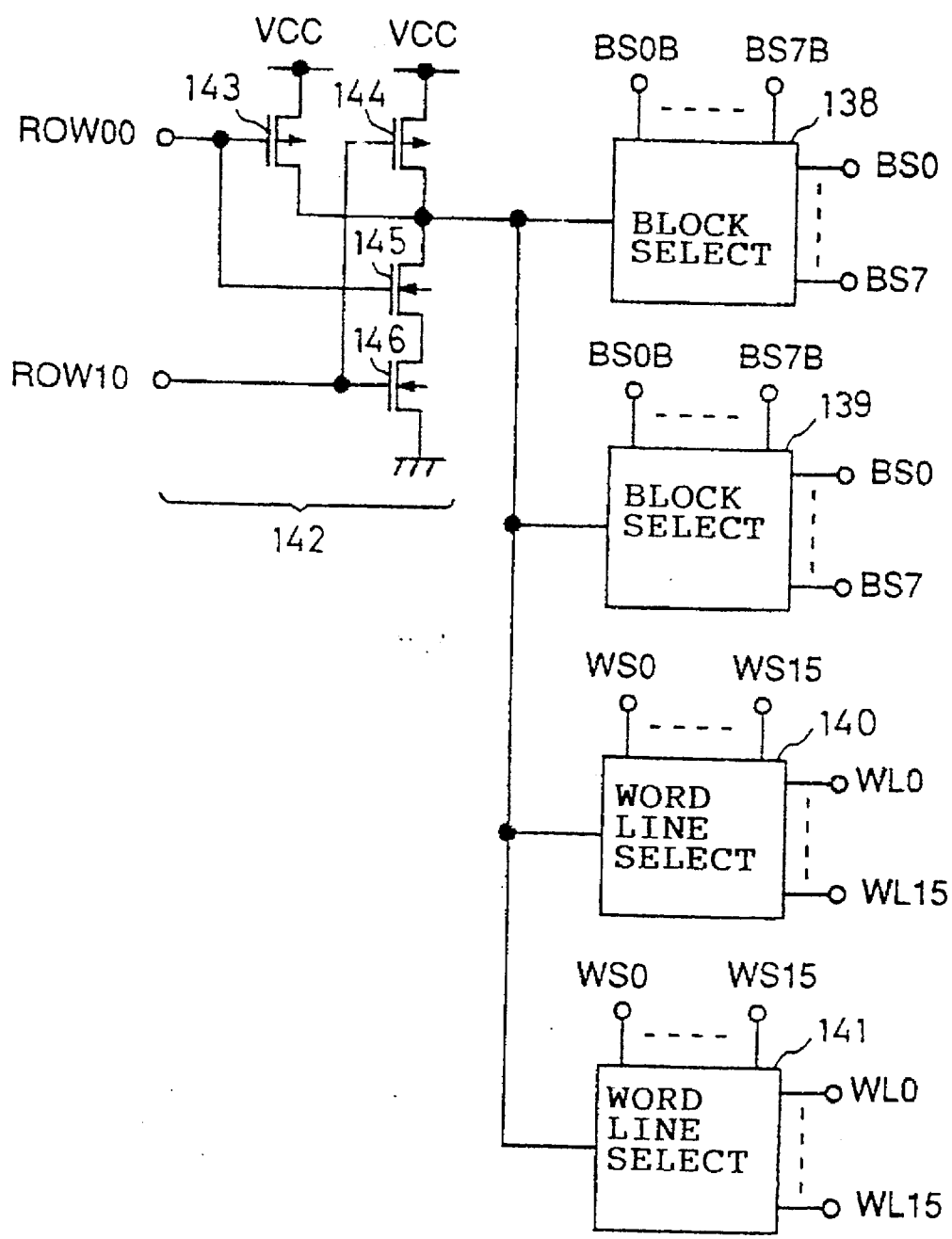
FIG. 23 is a circuit diagram showing the construction of a row decoder shown in FIG. 22.

FIG. 82 is a general plan view showing an important part of the sixth embodiment. In this sixth embodiment, the mask ROM produces a 16-bit output by arranging NAND type cells including 16 nMOS transistors connected in series. At the time of the read, the selected word line is set to the low level, and the non-selected work line is set to the high level. In other words, this sixth embodiment is an improvement of the sixth conceivable example of the mask ROM shown in FIG. 22.

In FIG. 82, a chip body 511 of the mask ROM includes memory cell arrays $512A_0$ through $512A_{15}$ and $512B_0$ through $512B_{15}$, and row decoders 513 through 516. In other words, the memory cell arrays $512A_i$ and $512B_i$ are obtained by dividing the columns of the memory cell arrays $133_0$ through $133_{15}$ shown in FIG. 22 into 2, where i=0, ..., 15. Hence, the selection of the column (bit line) for each of the memory cell arrays $512A_0$ through $512A_{15}$ and $512B_0$ through $512B_{15}$ is made by the column address signal, but the number of bits becomes ½ that of the sixth conceivable example of the mask ROM.

The row decoder 513 selects the block selection line and the word line of the memory cell arrays $512A_0$ through $512A_7$, and the row decoder 514 selects the block selection line and the word line of the memory cell arrays $512A_8$ through $512A_{15}$. In addition, the row decoder 515 selects the block selection line and the word line of the memory cell arrays $512B_0$ through $512B_7$, and the row decoder 516 selects the block selection line and the word line of the memory cell arrays $512B_8$ through $512B_{15}$.

FIG. 82 shows the circuit construction of the row decoder 513. The row decoder 514 may have the same construction as this row decoder 513.

Figure 83:
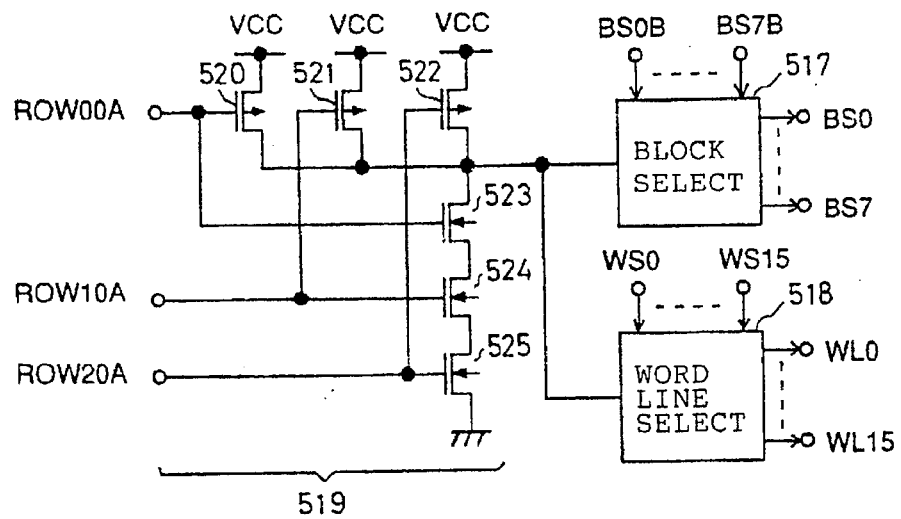
FIG. 83 is a circuit diagram showing a row decoder of the sixth embodiment.

The row decoder 513 shown in FIG. 83 includes a block selection line selecting circuit 517, a word line selecting circuit 518, and a NAND circuit 519.

The block selection line selecting circuit 517 selects one of the block selection lines BS0 through BS7 of the memory cell arrays $512A_0$ through $512A_7$ based on the block selection line selecting signals BS0B through BS7B. The word line selecting circuit 518 selects one of the word lines WL0 through WL15 of the memory cell arrays $512A_0$ through $512A_7$ based on the word line selecting signals WS0 through SW15.

In FIG. 83, ROW00A, ROW10A and ROW20A denote signals for controlling activation of the row decoder 5613, that is, for controlling the activation of the block selection line selecting circuit 517 and the word line selecting circuit 518. The NAND circuit 519 controls the activation of the block selection line selecting circuit 517 and the word line selecting circuit 518.

The NAND circuit 519 includes pMOS transistors 520 through 522, and nMOS transistors 523 through 525.

When the signal ROW00A has the high level, the signal ROW10A has the high level and the signal ROW20A has the high level, the output level of the NAND circuit 519 becomes low, and the block selection line selecting circuit 517 and the word line selecting circuit 518 are activated.

Figure 84:
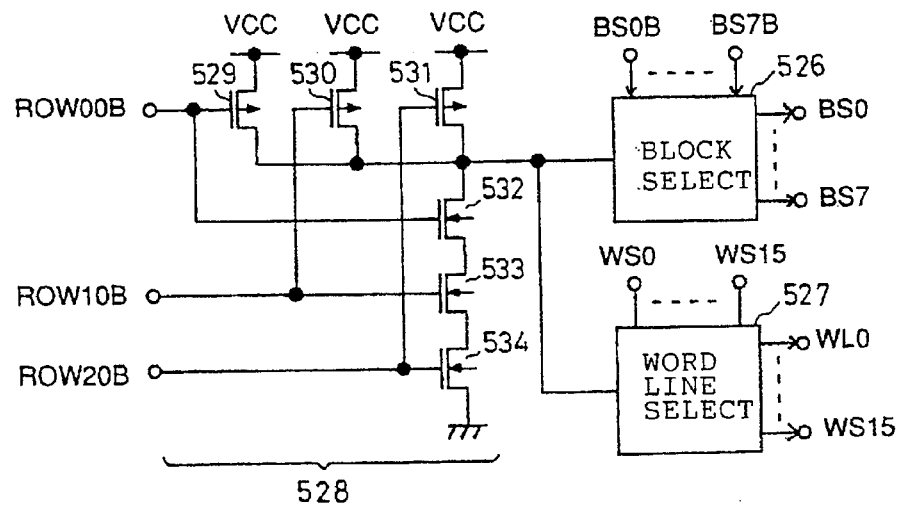
FIG. 84 is a circuit diagram showing a row decoder of the sixth embodiment.

FIG. 84 shows the circuit construction of the row decoder 515. The row decoder 516 may have the same construction as this row decoder 515.

The row decoder 515 shown in FIG. 84 includes a block selection line selecting circuit 526, a word line selecting circuit 527, and a NAND circuit 528.

The block selection line selecting circuit 526 selects one of the block selection lines BS0 through BS7 of the memory cell arrays $512B_0$ through $512B_7$ based on the block selection line selecting signals BS0B through BS7B. The word line selecting circuit 527 selects one of the word lines WL0 through WL15 of the memory cell arrays $512B_0$ through $512B_7$ based on the word line selecting signals WS0 through SW15.

In FIG. 84, ROW00B, ROW10B and ROW20B denote signals for controlling activation of the row decoder 515, that is, for controlling the activation of the block selection line selecting circuit 526 and the word line selecting circuit 527. The NAND circuit 528 controls the activation of the block selection line selecting circuit 526 and the word line selecting circuit 527.

The NAND circuit 528 includes pMOS transistors 529 through 531, and nNMOS transistors 532 through 534.

When the signal ROW00B has the high level, the signal ROW10B has the high level and the signal ROW20B has the high level, the output level of the NAND circuit 528 becomes low, and the block selection line selecting circuit 526 and the word line selecting circuit 527 are activated.

Figure 85:
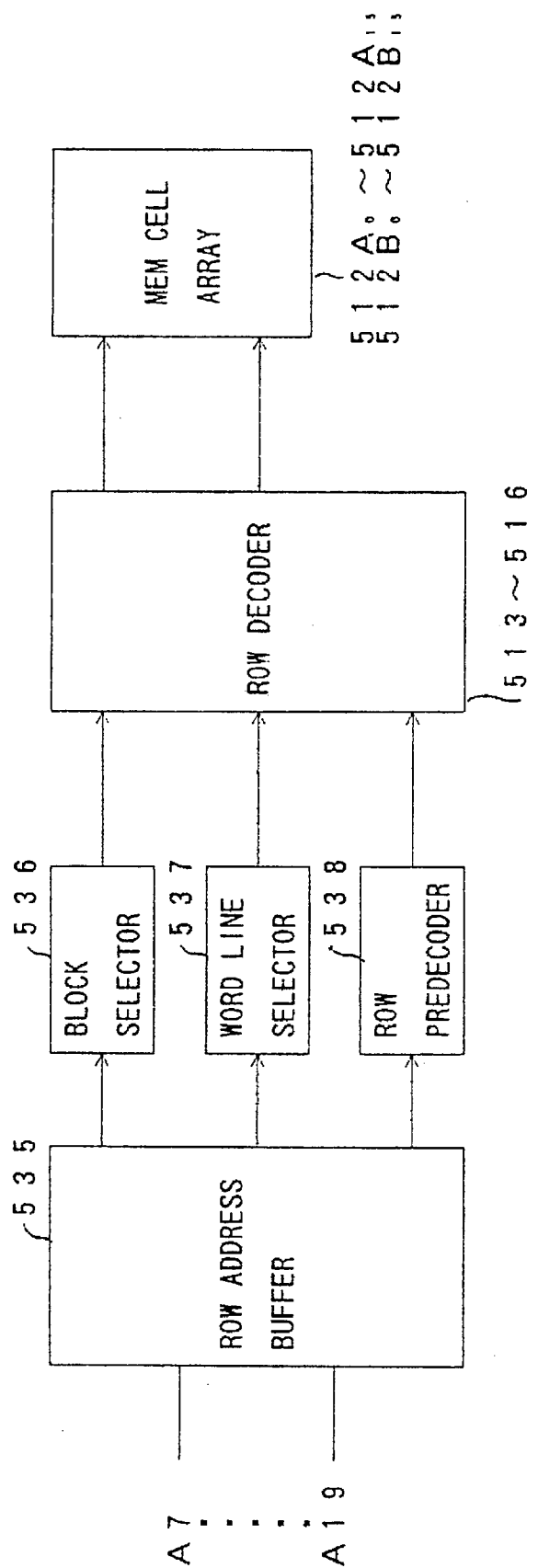
FIG. 85 is a system block diagram showing the circuit construction of a row address system of the sixth embodiment.

FIG. 85 is a system block diagram showing the circuit construction of a row address system of the sixth embodiment. In FIG. 85, A7 through A19 denote the row address signals for controlling the row address system.

The row address system shown in FIG. 85 includes a row address buffer 535, a block selector 536, and word line selector 537, a row predecoder 538, row decoders 513 through 516, and memory cell arrays $512A_0$ through $512A_{15}$ and $512B_0$ through $512B_{15}$.

The row address buffer 525 inputs the row address signals A7 through A19 supplied from the outside. The block selector 536 decodes the row address signals A7, A12 and A13, and outputs the block selection line selecting signals BS0 through BS7. The word line selector 537 decodes the row address signals A8 through A11, and outputs the word line selecting signals WS0 through WS15. The row predecoder 538 decodes the row address signals A14 through A19, and outputs signals ROW00A, ROW10A, ROW20A, ROW00B, ROW10B and ROW20B.

In the sixth conceivable example of the mask ROM, the row address signal A19 is used as the column address signal.

According to this sixth embodiment, the row decoders 513 and 514 or the row decoders 515 and 516 are activated.

The word line of the memory cell arrays $512A_0$ through $512A_{15}$ or the word line of the memory cell arrays $512B_0$ through $512B_{15}$ is driven, and the word line of the memory cell arrays $512A_0$ through $512A_{15}$ and the word line of the memory cell arrays $512B_0$ through $512B_{15}$ will not be driven simultaneously Therefore, it is possible to reduce the power consumption.

Next, a seventh conceivable example of the mask ROM will be described with reference to FIG. 86, so as to facilitate the understanding of a seventh embodiment of the semiconductor memory device according to the present invention which will be described later.

Figure 86:
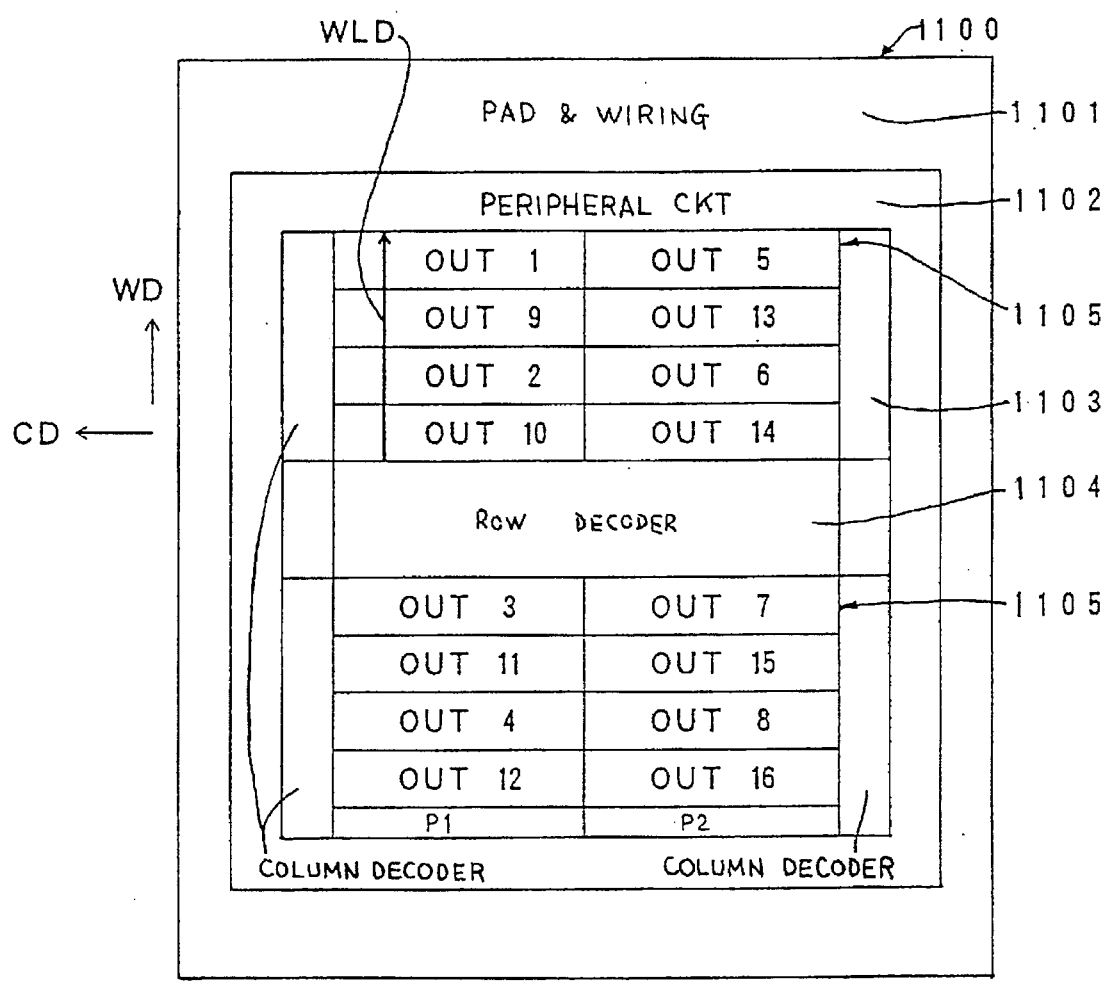
FIG. 86 is a plan view generally showing the layout of a seventh conceivable example of the mask ROM.

FIG. 86 generally shows the layout of the seventh conceivable example of the mask ROM. A mask ROM 1100 shown in FIG. 86 includes a pad and wiring part 1101, a peripheral circuit 1102, 4 column decoders 1103, a row decoder 1104, and a memory cell part 1105. The memory cell part 1105 includes main cell arrays OUT1 through OUT16, and redundant parity cell arrays P1 and P2. In FIG. 86, CD indicates a column direction and WD indicates a word line direction.

The mask ROM 100 employs a 16-bit parity redundant system. 1 bit is obtained from each of the main cell arrays OUT1 through OUT16 to form an output having a total of 16 bits, and calculation result of the exclusive-OR of the 16-bit output is stored in the parity cell arrays P1 and P2 for each address. Hence, even if the output of one main cell array OUT1 out of the main cell arrays OUT1 through OUT16 is defective, for example, it is possible to remedy the defect using the redundant data stored in the corresponding parity cell arrays P1 and P2 as long as all of the outputs of the remaining main cell arrays OUT2 through OUT16 are not defective. In other words, this seventh conceivable example of the mask ROM can remedy the output defect of a single main cell array, and is suited for remedying the defect in the single bit line or the column direction CD.

However, the layout of the memory cell array in FIG. 86 is such that 1 row decoder 104 drives the word line which traverses a plurality of main cell arrays on both sides of the row decoder 104. For this reason, if a word line defect is generated, for example, it is difficult to remedy this defect because the word line traverses a plurality of main cell arrays.

In other words, if the word line defect is generated in a word line WLD which traverses the main cell arrays OUT1, OUT9, OUT2 and OUT10 in FIG. 86, for example, there is a possibility that 2 or more main cell arrays out of these 4 main cell arrays will become defective. In such a case, it is difficult to remedy all of the defective main cell arrays even by use of the corresponding parity cell arrays P1 and P2, and there is a problem in that the remedying effect is poor with respect to the defect.

Accordingly, a description will now be given of a seventh embodiment of the semiconductor memory device according to the present invention, which can eliminate the problem of the seventh conceivable example of the mask ROM.

Figure 87:
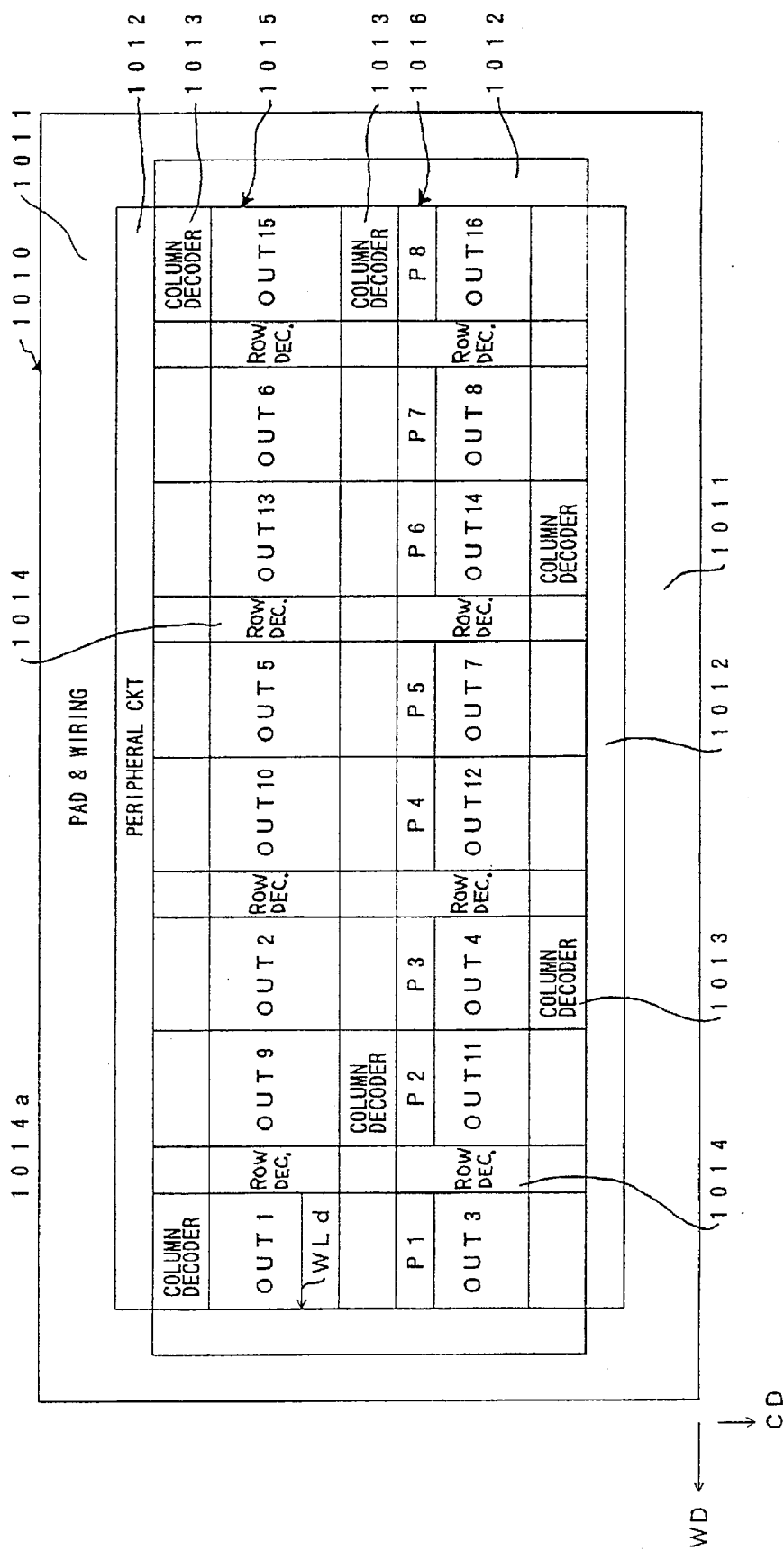
FIG. 87 is a plan view generally showing the layout of a seventh embodiment of the semiconductor memory device according to the present invention.

FIG. 87 generally shows the layout of the seventh embodiment. In this seventh embodiment, the present invention is applied to the mask ROM.

A mask ROM 1010 shown in FIG. 87 includes a pad and wiring part 1011, a peripheral circuit 1012, a column decoder 1013, a row decoder 1014, a main cell part 1015, and a parity cell part 1016. The main cell part 1015 includes main cell arrays OUT1 through OUT16, and the column decoder 1013 includes a plurality of column decoder circuits having an arrangement corresponding to the main cell arrays OUT1 through OUT16. In addition, the row decoder 1014 includes a plurality of row decoder circuits which are arranged to respectively drive a word line of 2 adjacent main cell arrays. The parity cell part 1016 includes redundant parity cell arrays P1 through P8. The parity cell array P1 is provided at a position corresponding to the main cell arrays OUT1 and OUT3. Similarly, the parity cell arrays P2, P3, P4, P5, P6, P7 and P8 are respectively provided at positions corresponding to the main cell arrays OUT9 and OUT11, OUT2 and OUT4, OUT10 and OUT12, OUT5 and OUT7, OUT13 and OUT14, OUT6 and OUT8, and OUT5 and OUT16.

This seventh embodiment employs the 16-bit parity redundant system. 1 bit is obtained from each of the main cell arrays OUT1 through OUT16 to form an output having a total of 16 bits, and a calculation result of the exclusive-OR of the 16-bit output is stored in the parity cell arrays P1 through P8 for each address. Hence, even if the output of one main cell array OUT1 out of the main cell arrays OUT1 through OUT16 is defective, for example, it is possible to remedy the defect using the redundant data stored in the corresponding parity cell arrays P1 through P8 as long as all of the output of the remaining main cell arrays OUT2 through OUT16 are not defective. In other words, this seventh embodiment can effectively remedy the output defect of the main cell array, and is suited for remedying the defect in the word line direction WD and the column direction CD.

In addition, 1 row decoder circuit only drives the word line of 2 main cell arrays. For example, 1 row decoder circuit 1014a only drives the word line of the 2 main cell arrays OUT1 and OUT9. Accordingly, even if a word line defect is generated in a word line WLd of the main cell array OUT1 shown in FIG. 87, for example, the other of the 2 main cell arrays, namely, the main cell array OUT9 normally does not become defective. For this reason, such a word line defect can be remedied using the corresponding parity cell arrays P1 through P8. In other words, in this seventh embodiment, only the output of one of the 2 main cell arrays will become defective when the word line defect is generated because 1 row decoder circuit only drives the word line of 2 main cell arrays, and the remedy using the parity cell arrays is possible because the output of only 1 main cell array will become defective.

Figure 88:
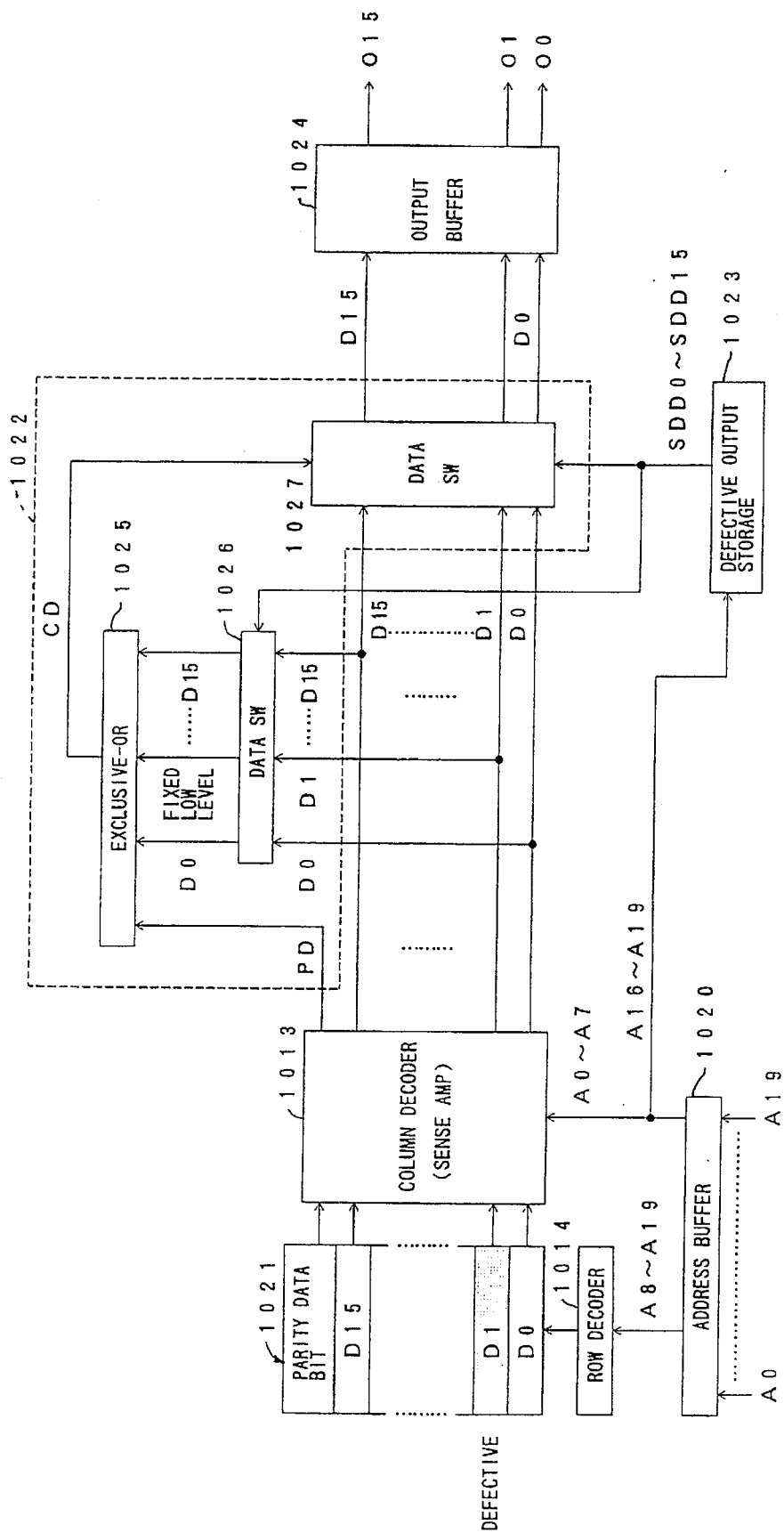
FIG. 88 is a system block diagram showing an important part of the seventh embodiment.

FIG. 88 is a system block diagram showing an important part of the seventh embodiment. For the sake of convenience, FIG. 88 shows each of the column decoder 1013 and the row decoder 1014 by 1 block, however, the actual layout is as shown in FIG. 87. In addition, for the sake of convenience, the main cell arrays OUT1 through OUT16 and the parity cell arrays P1 through P8 are also shown as 1 block which will hereinafter be referred to as a memory cell part 1021.

In FIG. 88, the mask ROM 1010 includes an address buffer 1020, the memory cell part 1021, the column decoder 1013, the row decoder 1014, a redundant circuit 1022, a defective output storage circuit 1023, and an output buffer 1024. The redundant circuit 1022 includes an exclusive-OR circuit 1025, and data switching circuits 1026 and 1027. The redundant circuit 1022, the defective output storage circuit 1023, the output buffer 1024 and the like are provided within the peripheral circuit 1012 shown in FIG. 87.

The column decoder 1013 and the row decoder 1014 respectively decode the column address bits A0 through A7 and the row address bits A8 through A19 out of the input address bits A0 through A19. The column decoder 1013 decodes the column address bits A0 through A7, and selects the column of the memory cell part 1021. The row decoder 104 decodes the row address bits A8 through A19, and selects the row, that is, selects the word line. A sense amplifier (not shown) is provided within the column decoder 1013.

The parity data and the data of the row which is specified by decoding the row address bits A8 through A19 in the row decoder 1014 are output from the memory cell part 1021. The column decoder 1013 selects and outputs the parity data bit PD and the data bits D0 through D15 amounting to 1 address which is specified by decoding the column address bits A0 through A7, out of the parity data and data output from the memory cell part 1021. The parity data bit PD is supplied to the exclusive-OR circuit 1025 within the redundant circuit 1022, and the data bits D0 through D15 are supplied to the data switching circuits 1026 and 1027 within the redundant circuit 1022. The column decoder 1013 and the row decoder 1014 may have a known construction, and the illustration and description related to the construction of the column decoder 1013 and the row decoder 1014 will be omitted in this specification.

Out of the input address bits A0 through A19, at least the upper bits of the row address bits A8 through A19 are also supplied to the defective output storage circuit 1023. This defective output storage circuit 1023 generates and outputs defective output select data SDD0 through SDD15 which indicate which one of the 16 bits is in error, that is, which 1 bit is defective, when the upper bits of the row address and a prestored defective address (redundant address) match. In other words, the defective output storage circuit 1023 generates and outputs the defective output select data SDD0 through SDD15 which has a value "1" (high level) for only 1 defective bit out of the 16 bits and has a value "0" (low level) for the other 15 bits.

The defective address which is compared with the upper bits of the row address is prestored depending on the result of the test which is made after production of the mask ROM. A 4-bit binary number (row address) indicates which 1 bit out of the 16 bits is defective. This 4-bit tow address is also prestored in the defective output storage circuit 1023 depending on the result of the test which is made after the production of the mask ROM. The row address of the main cell which does not have a defective output is not stored in the defective output storage circuit 1023. The test of the mask ROM can be made by a known method.

Figure 89:
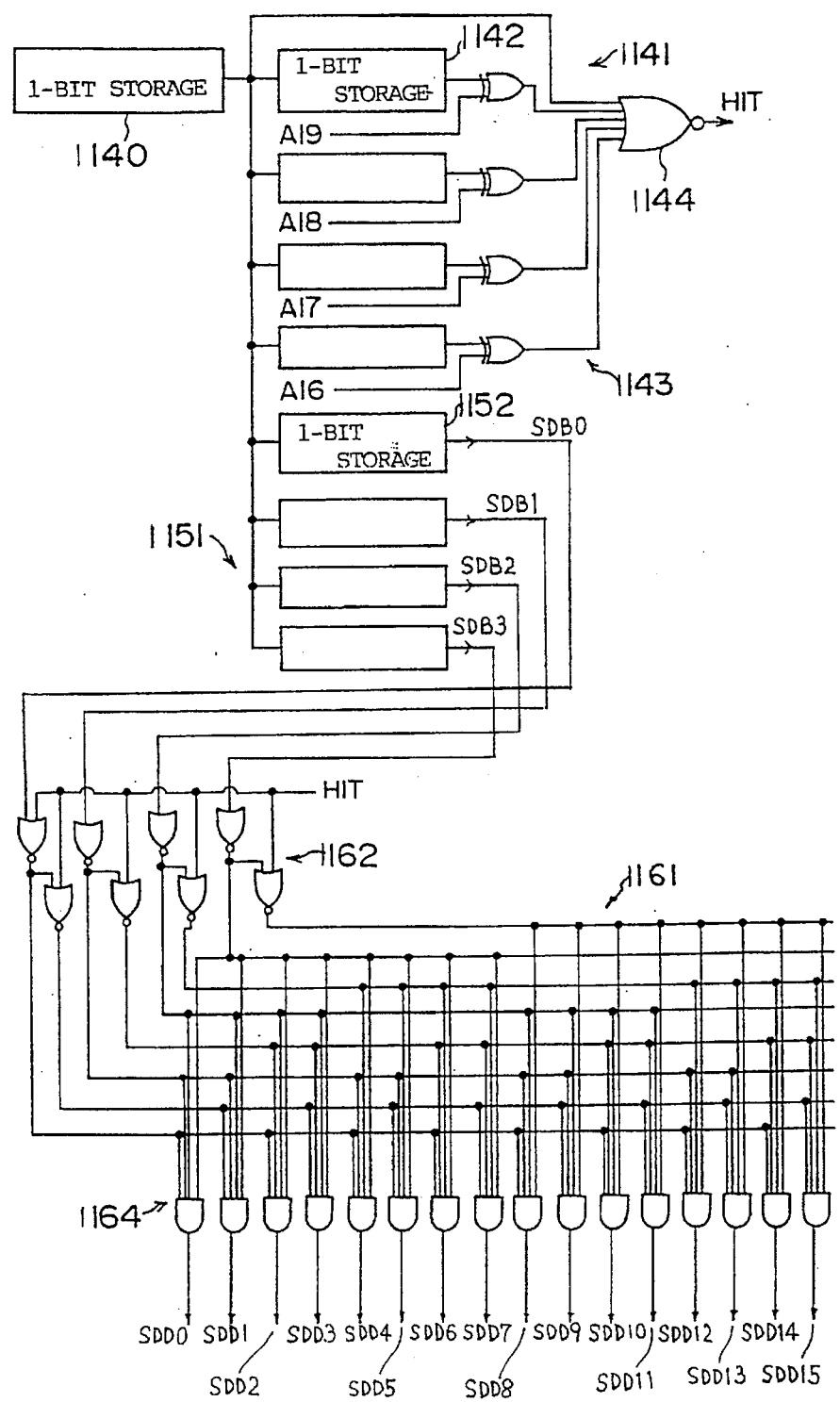
FIG. 89 is a circuit diagram showing an important part of a defective output storage circuit of the seventh embodiment.

In this embodiment, the defective output storage circuit 1023 has the construction shown in FIG. 89. As shown in FIG. 89, the defective output storage circuit 1023 includes a circuit part 1141 for storing the defective address which is to be remedied, a circuit part 1151 for storing the 4-bit binary number indicating the number of the defective output of the main cell which is to be remedied, and a circuit part 1161 for specifying the defective data bit. In FIG. 89, the construction of only the important part of each circuit part is shown for the sake of convenience.

The circuit part 1141 includes a storage element group 1142 made up of PROM elements such as laser fuses, an exclusive-OR circuit group 1143, and a NOR circuit 1144. The PROM elements of the storage element group 1142 respectively are 1-bit storage circuits which store the defective address, and the output of each PROM element is supplied to a corresponding exclusive-OR circuit of the exclusive-OR circuit group 1143. Each exclusive-OR circuit is also supplied with a corresponding 1 bit of the row address bits A16 through A19. Hence, when the upper bits of the row address and the prestored defective address match, a signal HIT having a high level is output from the NOR circuit 1144. In other words, the defective address is stored by 4 bits. The signal HIT is supplied to the circuit part 1161. A PROM element (1-bit storage circuit) 1140 stores a flag indicating whether or not the operation mode uses the redundant circuit 1022. Accordingly, the output signal HIT of the NOR circuit 1144 has the high level only in the operation mode which uses the redundant circuit 1022 depending on the output of the PROM element 1140.

The circuit part 1151 includes a storage element group 1152 made up of PROM elements. The PROM elements of the storage element group 1152 respectively are 1-bit storage circuits which store each digit of the 4 bits indicating the defective output number of the main cell. The output signals SDB0 through SDB3 of the PROM elements forming the storage element group 1152 are supplied to the circuit part 1161. In other words, the defective output number is stored by 4 bits.

The circuit part 1161 includes a NOR circuit group 1162 and an AND circuit group 1164 which are connected as shown in FIG. 89. The signal HIT from the circuit part 1141 and the signals SDB0 through SDB3 from the circuit part 1151 are supplied to the NOR circuit group 1162. Each AND circuit of the AND circuit group 1164 is supplied with the output of the corresponding NOR circuit of the NOR circuit group 1162. The AND circuit group 1164 outputs the defective output select data SDD0 through SDD15 based on the output of the NOR circuit group 1162. The defective output select data SDD0 through SDD15 are supplied to the data switching circuits 1026 and 1027 within the redundant circuit 1022.

Figure 90:
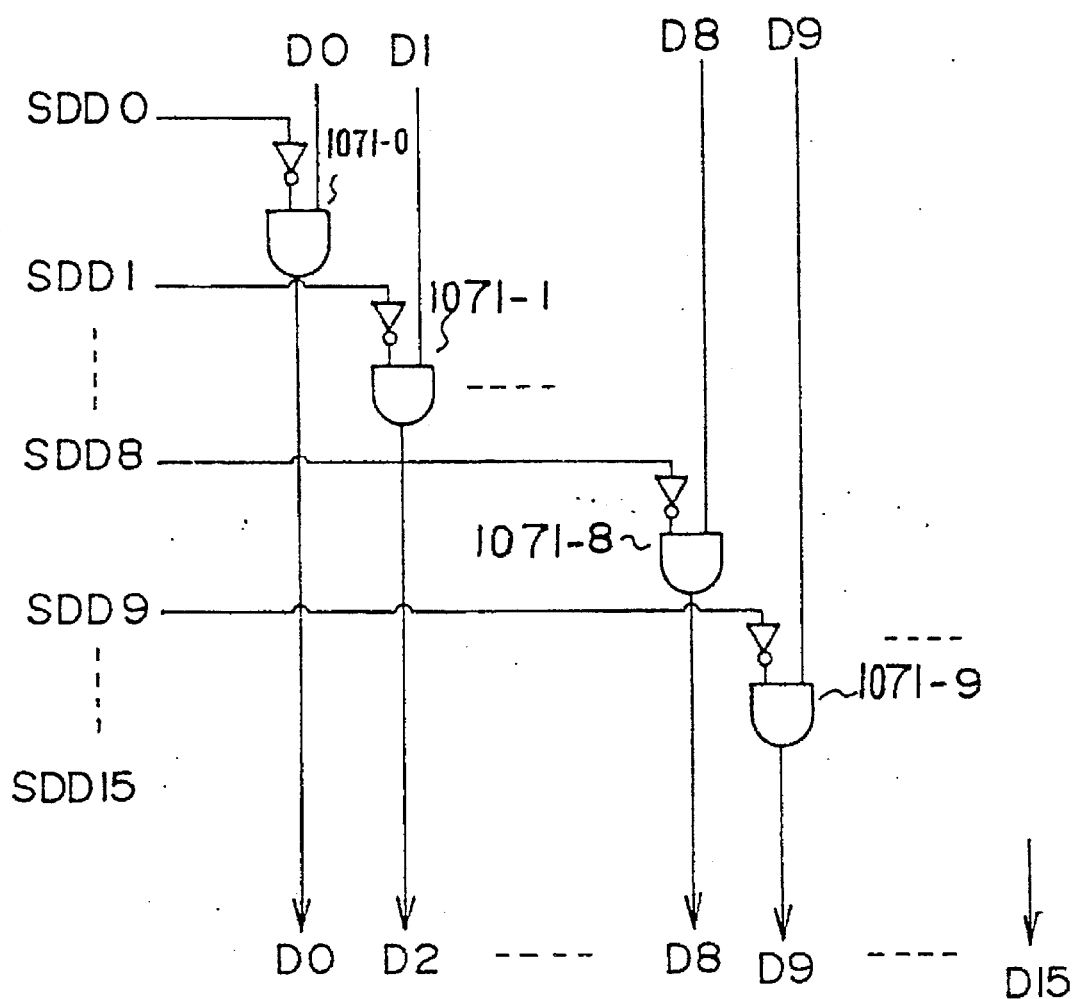
FIG. 90 is a circuit diagram showing an important part of one data switching circuit of the seventh embodiment.

FIG. 90 shows the construction of an important part of the data switching circuit 1026. The data switching circuit 1026 includes gate circuit groups 1071-0 through 1071-15 which are connected as shown in FIG. 90. Each gate circuit group 1071-i includes an inverter supplied with a corresponding signal bit SDDi of the defective output select data SDD0 through SDD15 from the defective output storage circuit 1023, and an AND circuit supplied with the output of this inverter and the corresponding data bit Di, where i=0, ..., 15. Accordingly, the data bits D0 through D15 are supplied as they are to the exclusive-OR circuit 1025 except for a defective output bit Dd, where D=0, ..., 15. The defective output bit Dd is supplied to the exclusive-OR circuit 1025 within the redundant circuit 1022 in a state fixed to the low level because the level of the corresponding signal bit SDDd becomes high.

Figure 91:
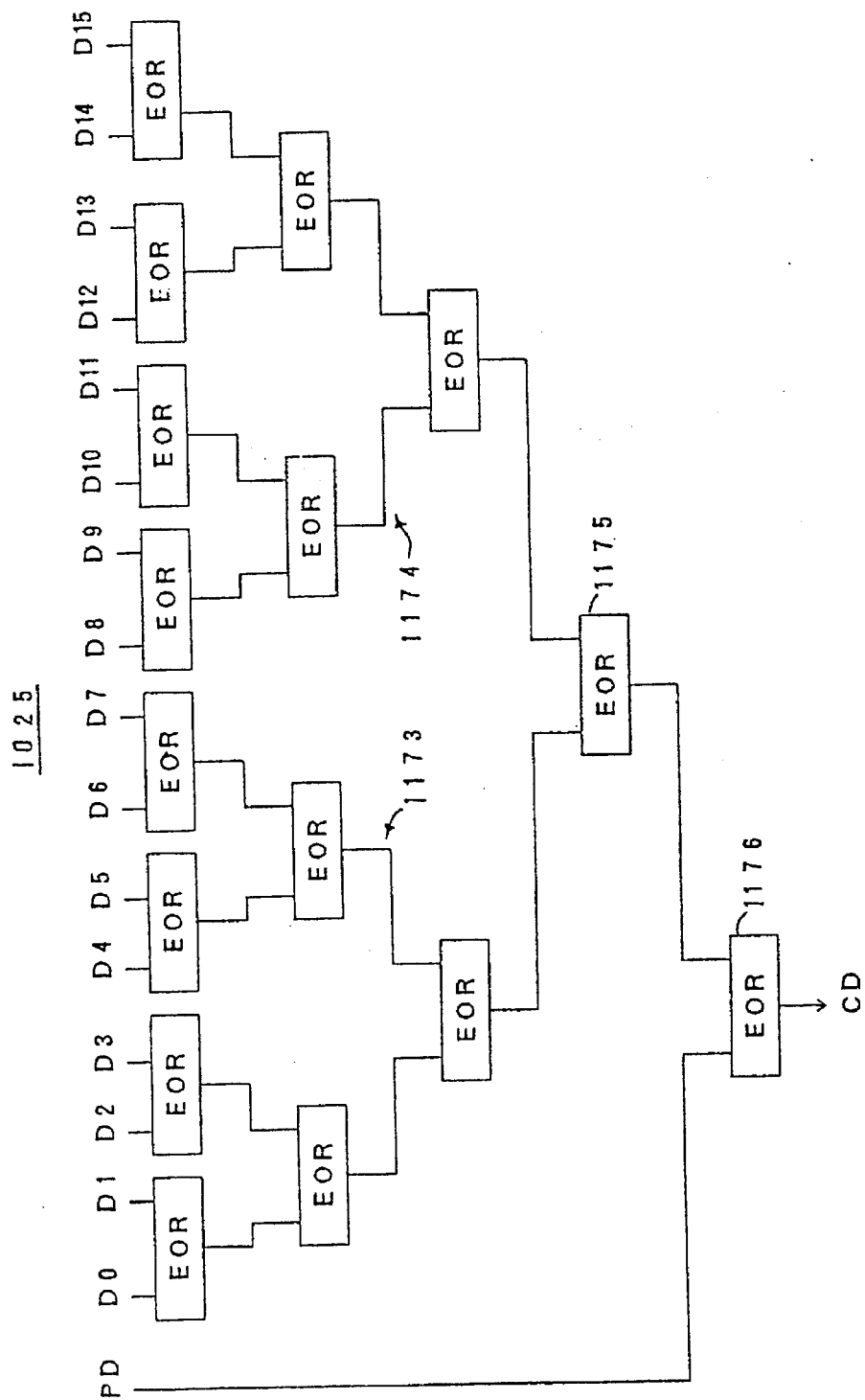
FIG. 91 is a circuit diagram showing an important part of an exclusive-OR circuit of the seventh embodiment.

FIG. 91 shows the construction of the exclusive-OR circuit 1025 of this embodiment. Out of the data bits D0 through D15 obtained from the data switching circuit 1026, the data bits D0 through D7 are supplied to an exclusive-OR circuit group 1173 and the data bits D8 through D15 are supplied to an exclusive-OR circuit group 1174. The exclusive-OR circuit groups 173 and 174 are respectively made up of a plurality of exclusive-OR circuits which are connected as shown in FIG. 91, and an exclusive-OR circuit 1175 obtains the exclusive-OR of the output of the exclusive-OR circuit groups 1173 and 1174. In addition, an exclusive-OR circuit 1176 obtains the exclusive-OR of the parity data bit PD from the column decoder 1013 and the output of the exclusive-OR circuit 1175. An output signal CD of the exclusive-OR circuit 1176 is supplied to the data switching circuit 1027 within the redundant circuit 1022.

Figure 92:
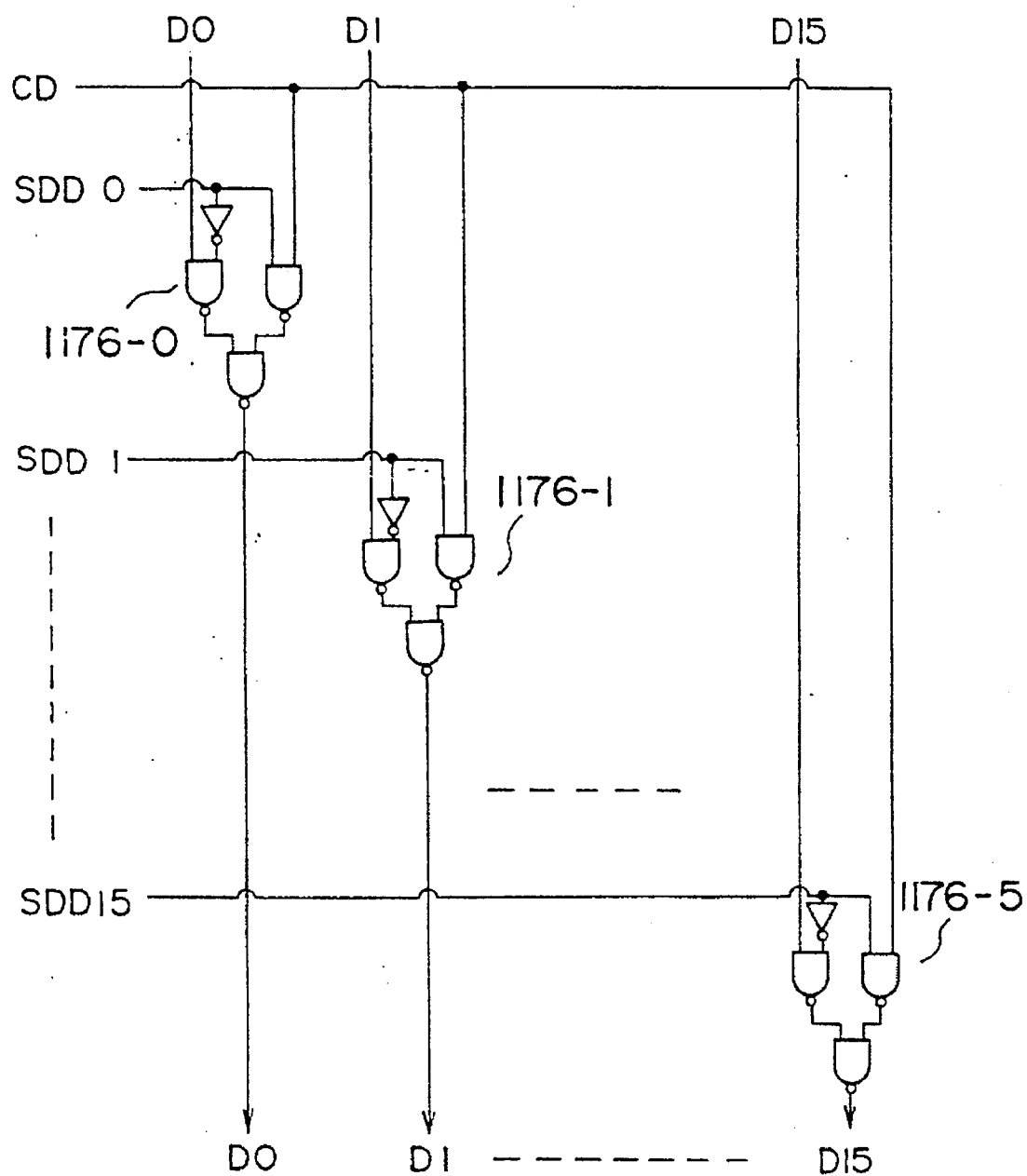
FIG. 92 is a circuit diagram showing an important part of another data switching circuit of the seventh embodiment.

FIG. 92 shows the construction of an important part of the data switching circuit 1027 of this embodiment. The data switching circuit 1027 includes gate circuit groups 1176-0 through 1176-15 which are connected as shown in FIG. 92. Each gate circuit group 1176-j includes an inverter supplied with a corresponding signal bit SDDj out of the defective output select data SDD0 through SDD15 from the defective output storage circuit 1023, a first NAND circuit supplied with the signal bit SDDj and the signal CD from the exclusive-OR circuit 1025, a second NAND circuit supplied with the corresponding data bit Dj and the output of the inverter, and a third NAND circuit supplied with the outputs of the first and second NAND circuits, where j=0, ..., 15. The third NAND circuit supplies the said bit Dj to the output buffer 1024 shown in FIG. 88. As a result, only the defective output bit Dd is corrected in the data switching circuit 1027 and is supplied to the output buffer 1024 together with the other data bits.

According to this seventh embodiment, 1 main cell array is driven by 1 word line. However, it is conceivable to drive 2 or more main cell arrays by 1 word line.

Figure 93:
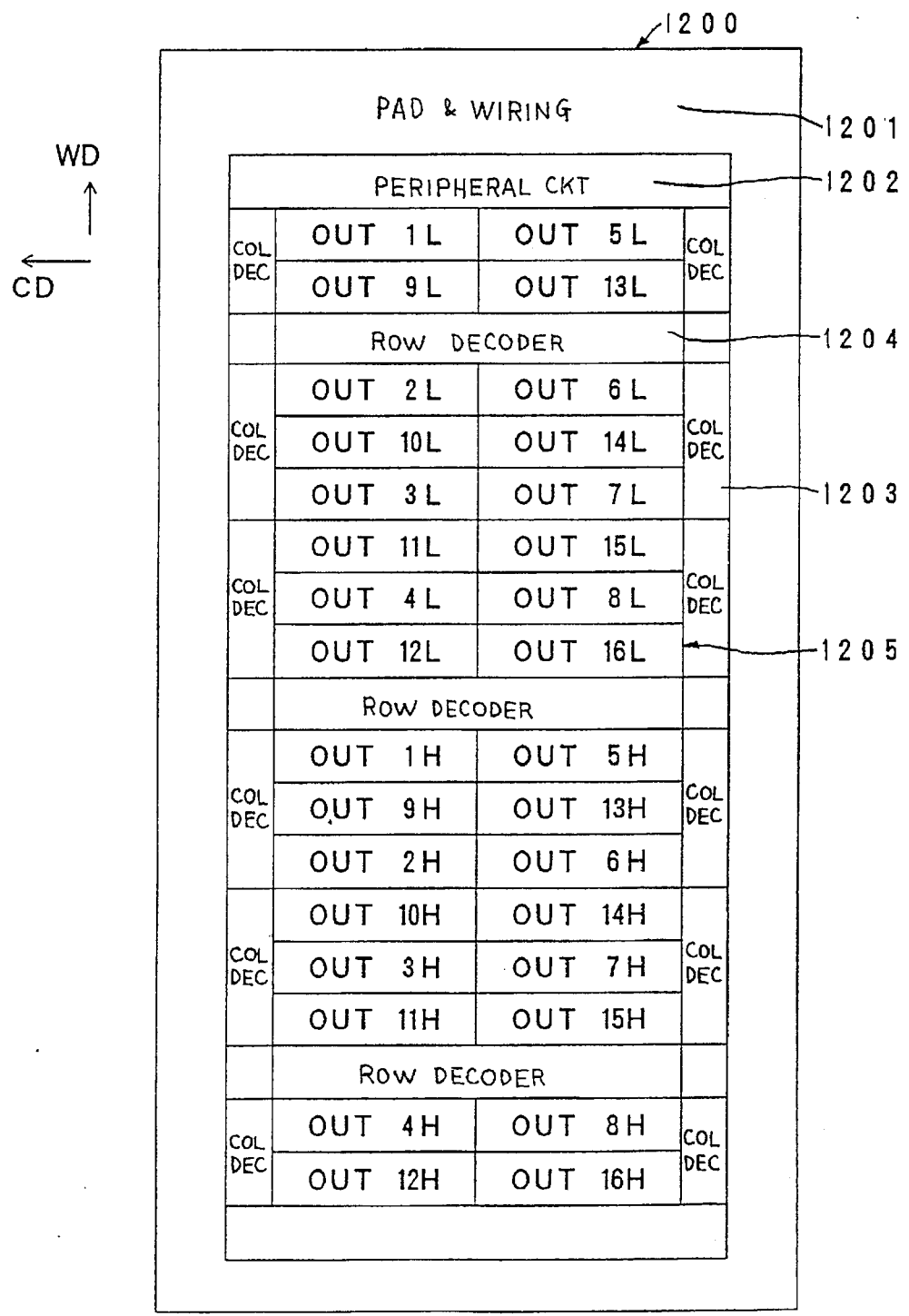
FIG. 93 is a plan view generally showing the layout of an eighth conceivable example of the mask ROM.

FIG. 93 generally shows the layout of an eighth example of the conceivable mask ROM. A mask ROM 1200 shown in FIG. 93 includes a pad and wiring part 1201, a peripheral circuit 1202, 12 column decoders 1203, 3 row decoders 1204, and a memory cell part 1205. The memory cell part 1205 includes main cell arrays OUT1L through OUT16L and OUT1H through OUT16H. For the sake of convenience, the illustration of the redundant parity cell array will be omitted. In FIG. 93, CD denotes the column direction, and WD denotes the word line direction.

According to the layout shown in FIG. 93, however, there are parts where 2 main cell arrays are driven by 1 word line and parts where 3 main cell arrays are driven by 1 word line. For this reason, the output characteristic differs depending on the main cell array. In other words, since the word line at the part where 3 main cell arrays are driven is longer than at the part where 2 main cell arrays are driven, the operation speed of the mask ROM 1200 will be determined by the output side of the 3 main cell arrays which are driven by the 1 word line.

Next, a description will be given of an embodiment which can maintain the output characteristic constant regardless of the main cell array when driving 2 or more main cell arrays by 1 word line, and can remedy the defective output with an improved efficiency when compared to the seventh embodiment described above.

Figure 94:
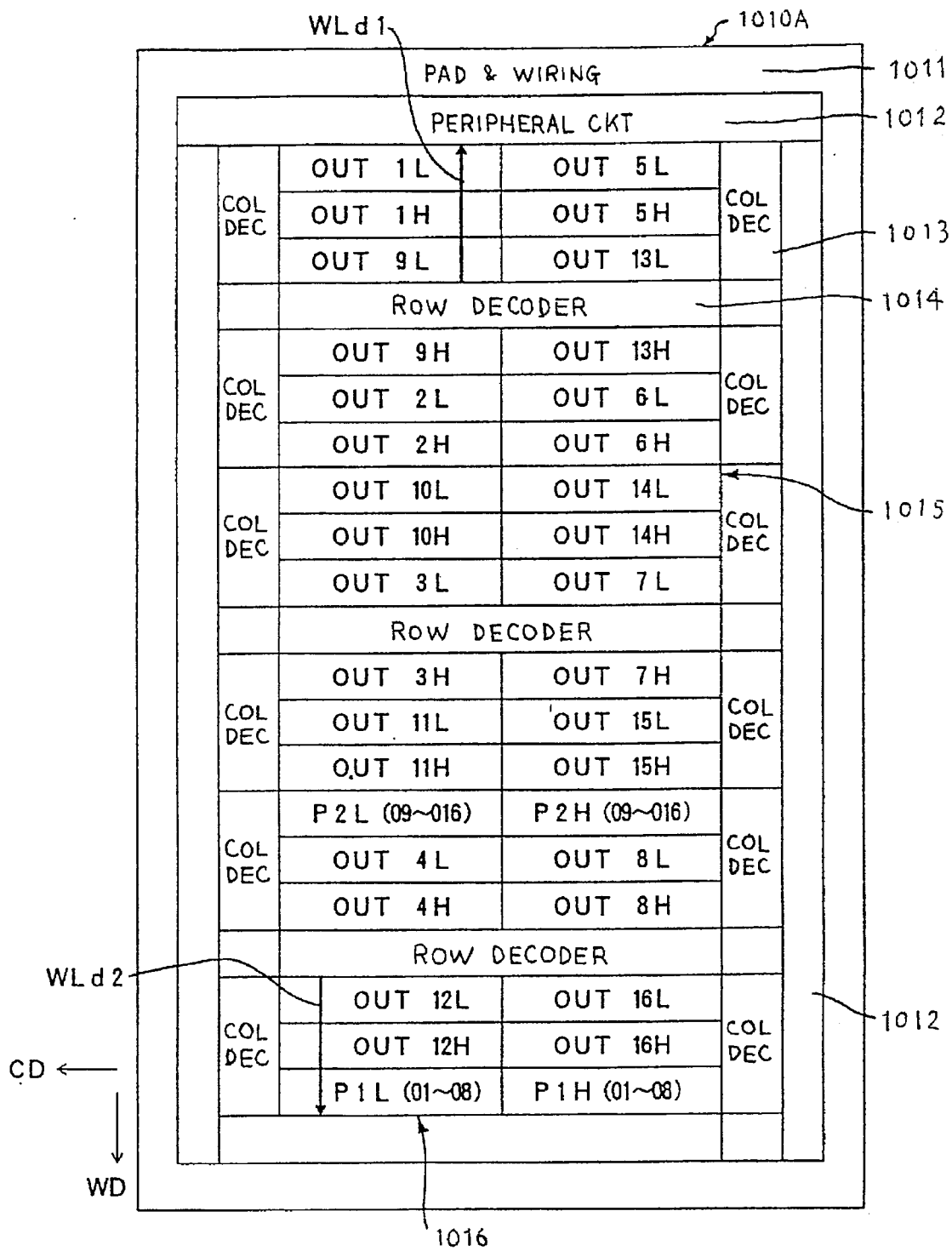
FIG. 94 is a plan view generally showing the layout of an eighth embodiment of the semiconductor memory device according to the present invention.

FIG. 94 generally shows the layout of an eighth embodiment of the semiconductor memory device according to the present invention. In this eighth embodiment, the present invention is applied to the mask ROM.

In FIG. 94, a mask ROM 1010A includes a pad and wiring part 1011, a peripheral circuit 1012, a column decoder 1013, a row decoder 1014, a main cell part 1015, and a parity cell part 1016. The main cell part 1015 includes main cell arrays OUT1L through OUT16L and OUT1H through OUT16H, and the column decoder 1013 includes a plurality of column decoder circuits having an arrangement corresponding to the main cell arrays OUT1L through OUT16L and OUT1H through OUT16H. In addition, the row decoder 1014 includes a plurality of row decoder circuits having an arrangement so that each row decoder circuit drives 3 adjacent cell arrays.

The parity cell part 1016 includes redundant parity cell arrays P1L, P1H, P2L and P2H. The parity cell arrays P1L is provided with respect to the main cell arrays OUT1L through OUT8L, and the parity cell array P2L is provided with respect to the main cell arrays OUT9L through OUT16L. Similarly, the parity cell array P1H is provided with respect to the main cell arrays OUT1H through OUT8H, and the parity cell array P2H is provided with respect to the main cell arrays OUT9H through OUT16H. For example, the main cell arrays OUT1L through OUT16L on the low (L) side are selected by a low-level column address bit A19, and the main cell arrays OUT1H through OUT16H on the high (H) side are selected by a high-level column address bit A19.

In this embodiment, the 8-bit parity redundant system is employed. 1 bit is obtained from each of the main cell arrays OUT1L through OUT8L to form an output having a total of 8 bits, and a calculation result of the exclusive-OR of the 8-bit output is stored in the parity cell P1L for each address. 1 bit is obtained from each of the main cell arrays OUT9L through OUT16L to form an output having a total of 8 bits, and a calculation result of the exclusive-OR of the 8-bit output is stored in the parity cell array P2L for each address. Similarly, 1 bit is obtained from each of the main cell arrays OUT1H through OUT8H to form an output having a total of 8 bits, and a calculation result the exclusive-OR of the 8-bit output is stored in the parity cell array P1H for each address. 1 bit is obtained from each of the main cell arrays OUT9H through OUT16H to form an output having a total of 8 bits, and a calculation result of the exclusive-OR of the 8-bit output is stored in the parity cell array P2H for each address. Accordingly, 1-bit parity data is provided with respect to the 8-bit output, and the parity cell part 1016 amounting to 2 Mbit is provided with respect to a 16 Mbit main cell part 1015, for example.

Hence, even if the output of one main cell array OUT1L out of the main cell arrays OUT1L through OUT16L is defective, for example, it is possible to remedy the defect using the redundant data stored in the corresponding parity cell array P1L as long as all of the outputs of the remaining main cell arrays OUT2L through OUT16L are not defective. In other words, this eighth embodiment can effectively remedy the output defect of the main cell array, and is suited for remedying the defect in the word line direction WD or the column direction CD.

In this case, a single word line WLd1 drives the main cell arrays OUT1L, OUT1H and OUT9L, for example. For this reason, when a defect exists in the word line WLd1, this defect cannot be remedied by the conceivable 16-bit parity redundant system because the parity data bit will be stored in the same parity cell array.

But according to this eighth embodiment, the 8-bit parity redundant system is employed, and the parity cell arrays are divided into the low side and the high side. Thus, it is possible to remedy the above described defect in the word line WLd1 using the parity cell arrays P1L and P2L and the parity cell arrays P1H and P2H are provided independently for the low (L) side and the high (H) side.

Furthermore, when a defect exists in a word line WLd2, the parity data corresponding to the main cell arrays OUT12L and OUT12H, for example, are stored at the position of the parity cell array P1L when the conceivable 16-bit parity redundant system is employed, and it is impossible to remedy the defect in this case because the main cell arrays OUT12L and OUT12H and the parity cell array will be defective.

But according to this eighth embodiment, the parity cell array P1L does not store the parity data with respect to the main cell arrays OUT12L and OUT12H. Instead, the parity data with respect to the main cell arrays OUT12L and OUT12H are stored in the parity cell arrays P2L and P2H.

For this reason, it is possible to remedy the defect in the main cell arrays OUT12L and OUT12H unless the parity cell arrays P2L and P2H are defective.

In addition, when the conceivable 16-bit parity redundant system is employed, it is impossible to remedy the defect in the main cell arrays if the parity cell array is defective.

However, according to this eighth embodiment, even if the parity cell array P1L is defective, unless there is a defect in the corresponding main cell arrays OUT1L through OUT8L, it is possible to remedy the defect in the other main cell arrays.

On the other hand, as may be seen by comparing the layout of the eighth conceivable example of the mask ROM shown in FIG. 93 and the layout of this eight embodiment shown in FIG. 94, the parity cell arrays are arranged together with the main cell arrays in FIG. 94. For this reason, 1 word line drives 3 cell arrays at all parts within the layout. In this case, the 3 cell arrays may be made up of 3 main cell arrays or, made up of 2 main cell arrays and 1 parity cell array. Accordingly, the length of the word line becomes the same at all parts within the layout, and the output characteristic of each main cell array becomes the same. In other words, there is no deterioration in the operation speed of the mask ROM due to the provision of the parity cell arrays.

The system block diagram of the important part of this eighth embodiment is basically the same as that shown in FIG. 88. But in this eighth embodiment, the main cell arrays OUT1L through OUT16H and the parity cell arrays P1L through P2H will be indicated by 1 block as the memory cell part 1020 in FIG. 88 for the sake of convenience. In addition, out of the input address bits A0 through A19, A0 through A8 correspond to the row address bits and A0 through A7 and A19 correspond to the column address bits. Hence, the address bits A15 through A19 are supplied to the defective output storage circuit 1023.

Figure 95:
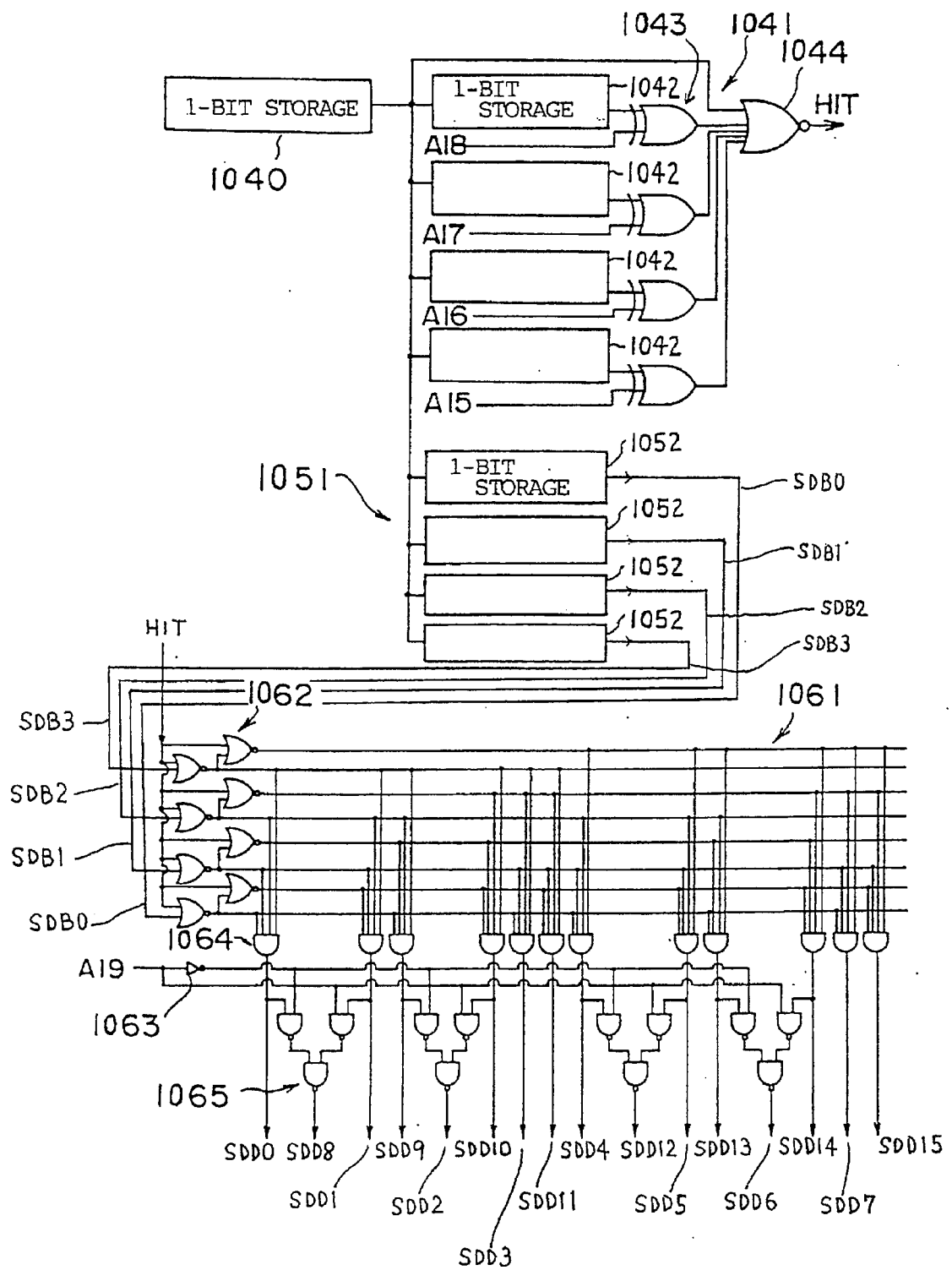
FIG. 95 is a circuit diagram showing an important part of a defective output storage circuit of the eight embodiment.

In this eighth embodiment, the defective output storage circuit 1023 includes circuit parts 1041, 1051 and 1061 as shown in FIG. 95, for example. The circuit part 1041 stores the defective address to be remedied. The circuit part 1051 stores a 4-bit binary number which indicates the block including the main cell to be remedied. The circuit part 1061 specifies the defective data bit. In FIG. 95, only the important part of the defective output storage circuit 1023 is shown for the sake of convenience.

The circuit 1041 includes a storage element group 1042 made up of PROM elements such as laser fuses, an exclusive-OR circuit group 1043, and a NOR circuit 1044. Each PROM element of the storage element group 1042 is formed by a 1-bit storage circuit which stores 1 bit of the defective address, and the output of the PROM element is supplied to a corresponding exclusive-OR circuit of the exclusive-OR circuit group 1043. Each exclusive-OR circuit is also supplied with a corresponding 1 bit of the row address bits A15 through A18. Hence, when the row address bits A15 through A18 and the stored defective address bits match, a high-level signal HIT is output from the NOR circuit 1044. The circuit part 1041 stores the 4-bit defective address as described above. The signal HIT is supplied to the circuit part 1061. A PROM element 1040 stores a flag which indicates whether or not the operation mode uses the redundant circuit 1022. Hence, the level of the output signal HIT of the NOR circuit 1044 becomes high in response to the output of the PROM element 1040 only during the operation mode which uses the redundant circuit 1022.

The circuit part 1051 includes a memory element group 1052 made up of PROM elements. Each PROM element of the memory element group 1052 is formed by a 1-bit storage circuit which stores a corresponding 1 bit of the 4 bits which indicate the block including the defective main cell. The output signals SDB0 through SDB3 of the PROM elements of the memory element group 1052 are supplied to the circuit part 1061. In other words, the circuit part 1051 stores the number of the defective block in 4 bits.

The circuit part 1061 includes a NOR circuit group 1062, an inverter 1063, and AND circuit group 1064, and a NAND circuit group 1065 which are connected as shown in FIG. 95. The signal HIT from the circuit part 1041 and the signals SDB0 through SDB3 from the circuit part 1051 are supplied to the NOR circuit group 1062. The column address bit A19 is supplied to the inverter 1063. Each AND circuit of the AND circuit group 1064 is supplied with the output of the corresponding NOR circuit of the NOR circuit group 1062. The NAND circuit group 1065 outputs the defective output select data bits SDD0 through SDD15 based on the output of the inverter 1063 and the AND circuit group 1064 and the column address bit A19. The defective output select data bits SDD0 through SDD15 are supplied to the data switching circuits 1026 and 1027 within the redundant circuit 1022.

The construction of the important part of the data switching circuit 1026 may be the same as that shown in FIG. 90.

Figure 96:
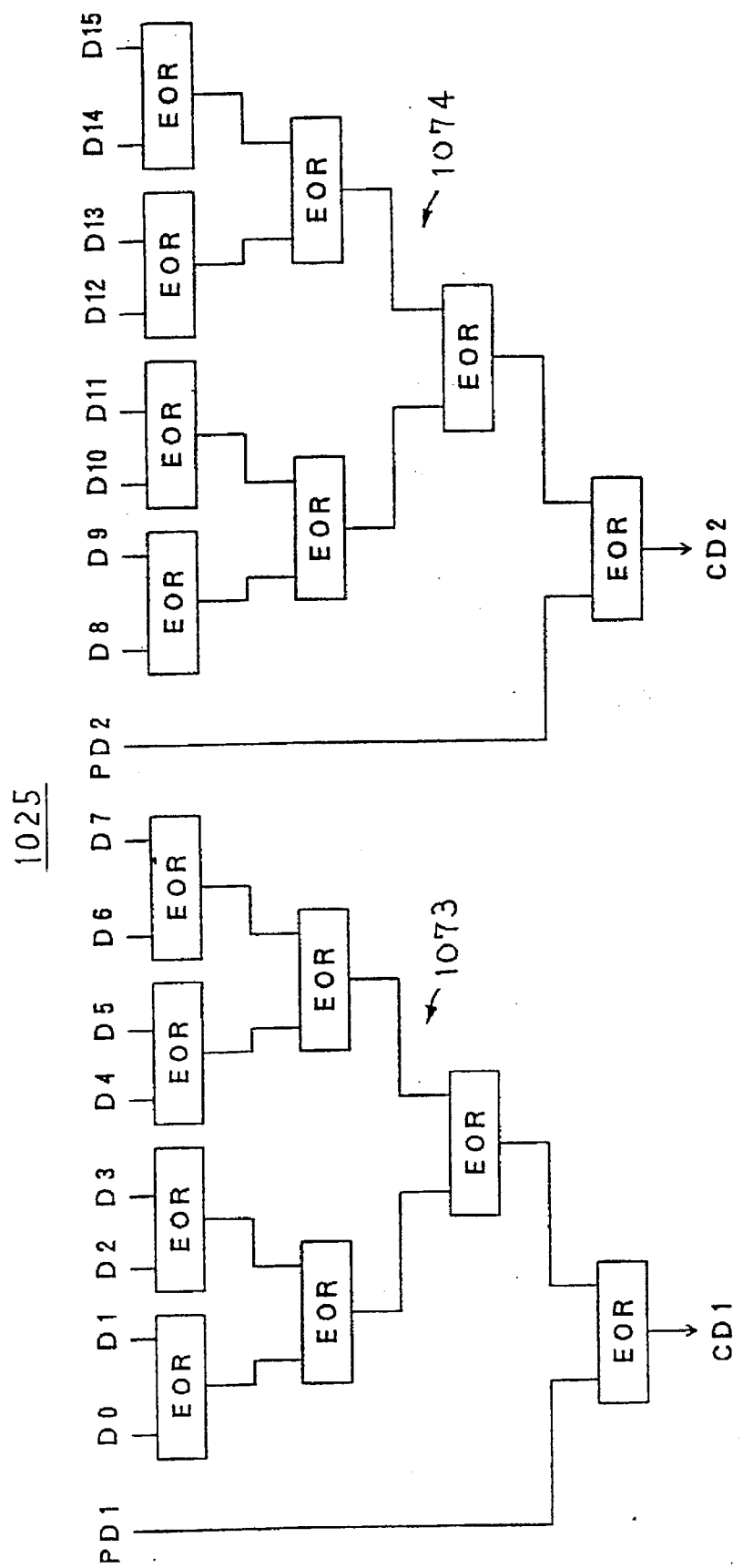
FIG. 96 is a circuit diagram showing an important part of an exclusive-OR circuit of the eighth embodiment.

FIG. 96 shows the construction of the exclusive-OR circuit 1025. Out of the data bits D0 through D15 from the data switching circuit 1026, the data bits D0 through D7 are supplied to an exclusive-OR circuit group 1073 together with the parity data bit PD1, and the data bits D8 through D15 are supplied to an exclusive-OR circuit group 1074 together with the parity data bit PD2. The exclusive-OR circuit groups 1073 and 1074 are made up of exclusive-OR circuits which are connected as shown in FIG. 96. A signal CD1 is output from the exclusive-OR circuit group 1073, and a signal CD2 is output from the exclusive-OR circuit group 1074. These signals CD1 and CD2 are supplied to the data switching circuit 1027 within the redundant circuit 1022.

Figure 97:
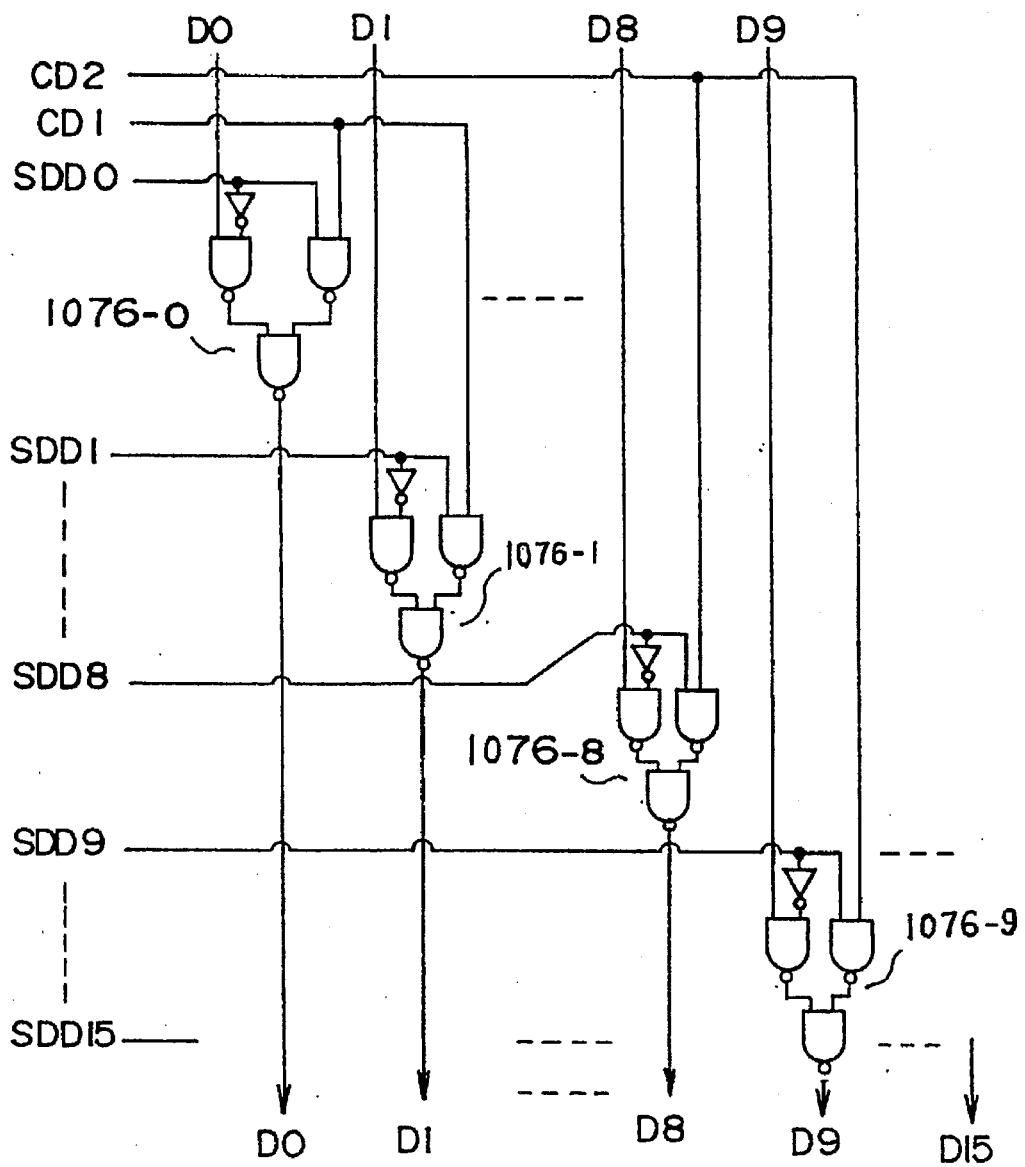
FIG. 97 is a circuit diagram showing an important part of the other data switching circuit of the eighth embodiment.

FIG. 97 shows the construction of an important part of the data switching circuit 1027. The data switching circuit 1027 includes gate circuit groups 1076-0 through 1076-15 which are connected as shown in FIG. 97. Each gate circuit group 1076-j includes an inverter which is supplied with a corresponding signal bit SDDj out of the defective output select data bits SDD0 through SDD15 from the defective output storage circuit 1023, a first NAND circuit which is supplied with the corresponding signal bit SDDj and the signal CD1 from the exclusive-OR circuit 1025, a second NAND circuit which is supplied with a corresponding data bit Dj and the output of the inverter, and a third NAND circuit which is supplied with the output of the first and second NAND circuits and supplies the data bit Dj to the output buffer 1024 shown in FIG. 88, where j=0, . . . , 7. In addition, each gate circuit group 1076-k includes an inverter which is supplied with a corresponding signal bit SDDk out of the defective output select data bits DD0 through SDD15 from the defective output storage circuit 1023, a first NAND circuit which is supplied with the corresponding signal bit SDDk and the signal CD2 for the exclusive-OR circuit 1025, a second NAND circuit which is supplied with a corresponding data bit Dk and the output of the inverter, and a third NAND circuit which is supplied with the outputs of the first and second NAND circuits and supplies the data bit Dk to the output buffer 1024 shown in FIG. 88, where k=8, . . . , 15. Accordingly, only the defective output bit Dd is corrected by the data switching circuit 1027 and supplied to the output buffer 1024 together with the other data bits.

As described above, according to this eighth embodiment, 1-bit of the parity data is provided with respect to the output having a total of 8 bits which are made up of 1 bit obtained from each of the main cell arrays, for every 8 main cell arrays. For this reason, the layout is not limited to that shown in FIG. 94, and any layout may be used as long as the word line can be divided by a multiple of 3. Hence, the word line may be divided in units of cell arrays (blocks) which are multiples of 3. In addition, the information written in the PROM elements for specifying the block of the defective cell may be information related to the blocks which are selected in common by a single word line.

Next, in order to facilitate the understanding of a ninth embodiment of the semiconductor memory device according to the present invention, a description will be given of a ninth conceivable example of the mask ROM, by referring to FIGS. 98 through 101.

Figure 98:
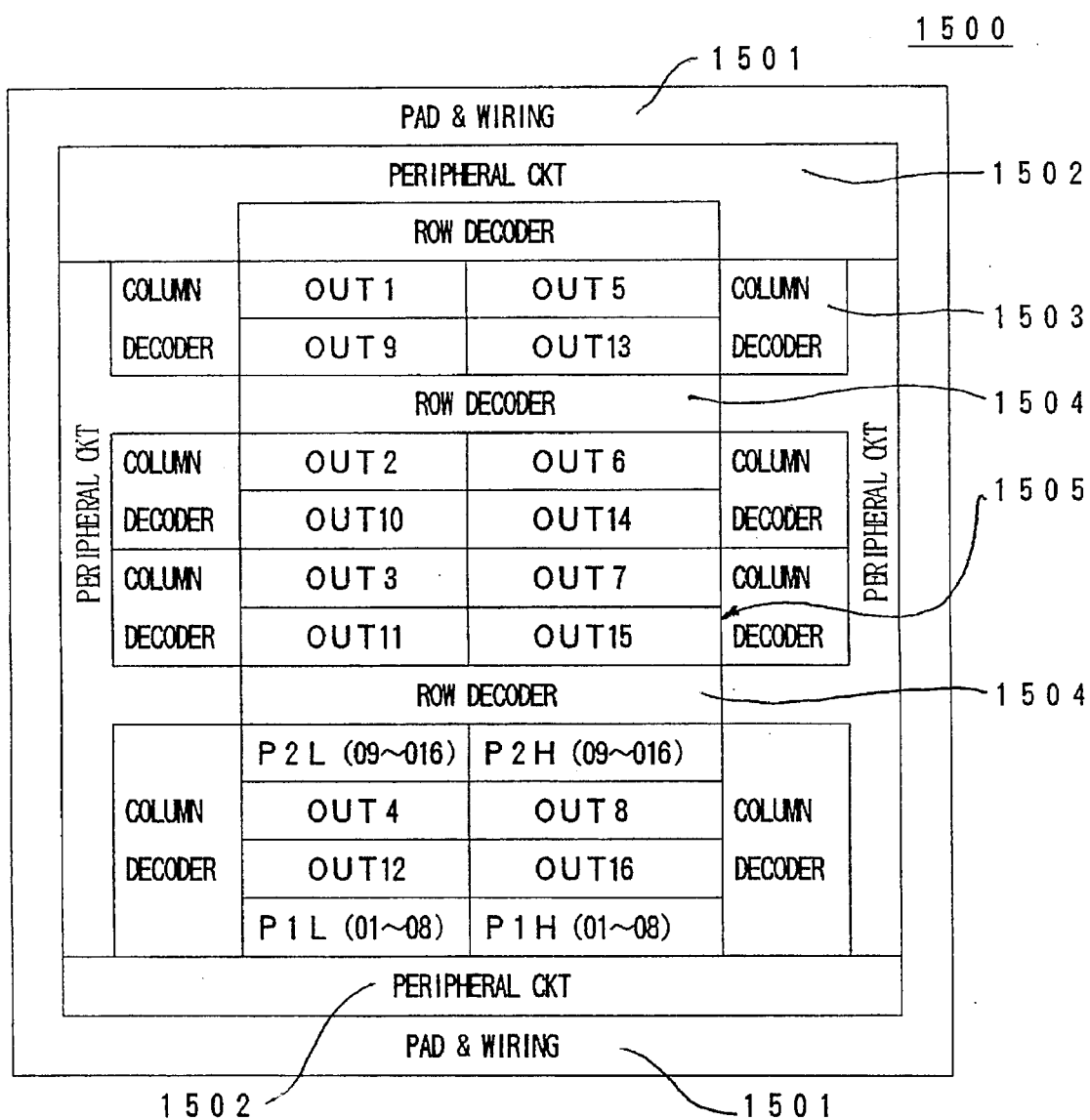
FIG. 98 is a plan view generally showing the layout of a ninth conceivable example of the mask ROM.

FIG. 98 shows the layout of the ninth conceivable example of the mask ROM. A mask ROM 1500 shown in FIG. 98 includes a pad and wiring part 1501, a peripheral circuit part 1502, a column decoder 1503, a row decoder 1504, and a memory cell part 1505. An address buffer, a sense amplifier, a redundant circuit, and output buffer and the like are provided within the peripheral circuit part 1502. The memory cell part 1505 includes main cell arrays OUT1 through OUT16, and redundant parity cell arrays P1L, P1H, P2L and P2H.

Figure 99:
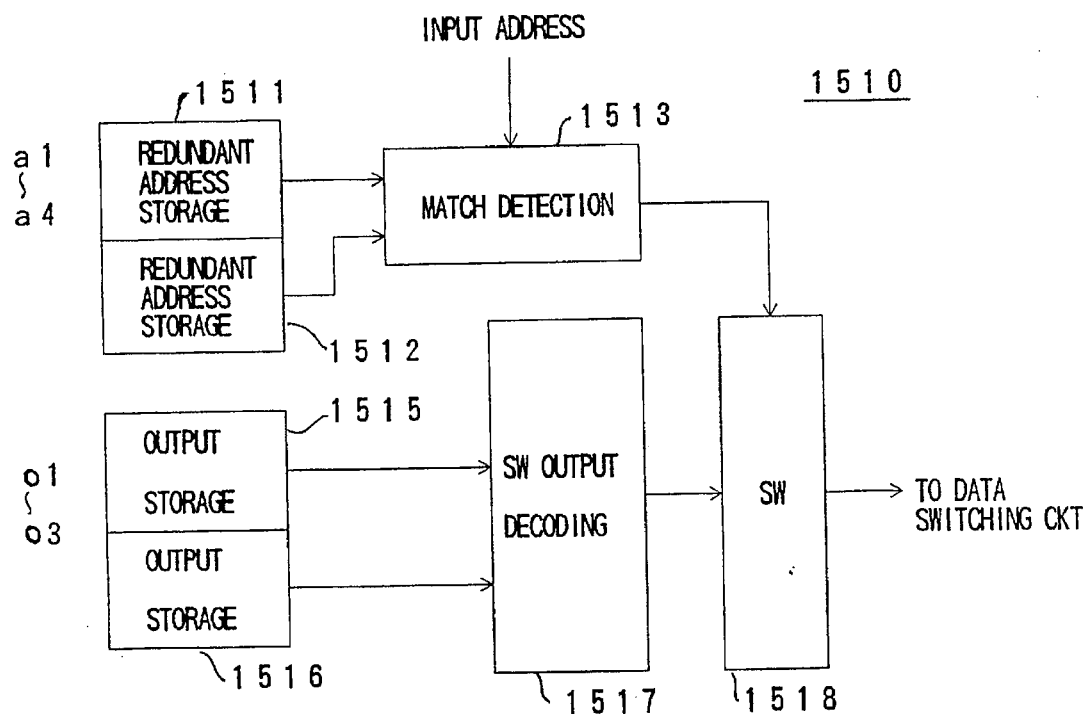
FIG. 99 is a system block diagram showing an important part of a redundant circuit of the mask ROM shown in FIG. 98.

FIG. 99 shows an important part of the redundant circuit of the mask ROM 1500. A redundant circuit 1510 shown in FIG. 99 includes a redundant address storage circuit 1511 for testing, a redundant address storage circuit 1512, a match detection circuit 1513, an output storage circuit 1515 for testing, an output storage circuit 1516, a switching output decoding circuit 1517, a switching circuit 1518 and the like. For example, the redundant address storage circuit 1511 for testing and the output storage circuit 1515 for testing are respectively made up of SRAMs. On the other hand, the redundant address storage circuit 1512 and the output storage circuit 1516 are respectively made up of programmable fuses. The redundant address storage circuit 1511 for testing and the output storage circuit 1515 for testing are provided for the purpose of checking the operation of the mask ROM 1500 by writing the same information before actually writing the redundant information into the redundant address storage circuit 1512 and the output storage circuit 1516.

For example, when the 16-bit parity redundant system is employed, 4-bit defective address information is stored in the redundant address storage circuit 1512. The match detection circuit 1513 compares a portion of the row address of the input address and the defective address information read from the redundant address storage circuit 1512, and supplies a match detection signal to the switching circuit 1518 when the two compared address information match. On the other hand, information indicating the number (cell plane) or the main cell array to be remedied and indicating the existence of the redundancy is stored in the output storage circuit 1516 in 4 bits, for example. The switching decoding circuit 1517 decodes the information read from the output storage circuit 1516, and supplies to the switching circuit 1518 data specifying the defective data bit. The switching circuit 1518 selects and outputs the data from the switching decoding circuit 1517 in response to the match detection signal.

In addition, the data and parity data of the row which is specified by decoding the row address of the input address by the row decoder 1504 are output from the memory cell part 1505. The column decoder 1503 selects and outputs the data bits and parity data bit amounting to 1 address which is specified by decoding the column address, out of the data and parity data output from the memory cell part 1505. The data bits and parity data bit are supplied to an exclusive-OR circuit (not shown), and an output of this exclusive-OR circuit is supplied to a data switching circuit (not shown). The data read from the memory cell part 1505 via the column decoder 1503 and the data from the switching circuit 1518 are also supplied to this data switching circuit. Hence, the data switching circuit selects and outputs the data from the switching circuit 1518 in place of the defective data bits in response to the output of the exclusive-OR circuit when the match detection circuit 1513 detects that the two address information match.

Figure 100:
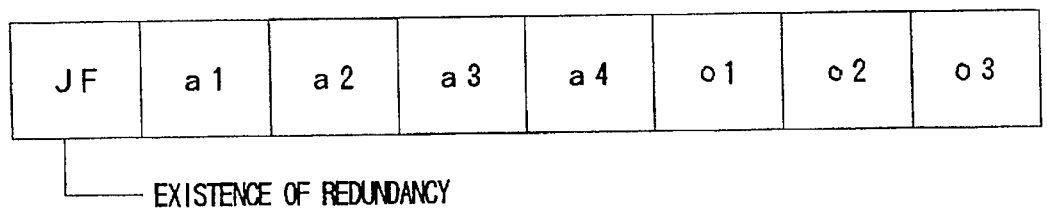
FIG. 100 is a diagram for explaining redundant information used in the ninth conceivable example of the mask ROM.

FIGS. 100 and 101 are diagrams for explaining the defect that may be remedied in the mask ROM 1500.

FIG. 100 shows the redundant information required in the redundant circuit 1510. In FIG. 100, address bit a1 through a4 are prestored in the redundant address storage circuit 1512, and indicate the address of the location within the memory cell part 1505 to be remedied. In addition, output bits o1 through o3 are prestored in the output storage circuit 1516 together with a flag JF which indicates the existence of the redundancy, and indicates the numbers of the pair of main cell arrays within the memory cell part 1505 to be remedied including the cell parts on the low (L) side and the high (H) side. The above redundant information is prestored in the redundant address storage circuit 1512 and the output storage circuit 1516 depending on the results of the test which is made after production of the mask ROM 1500.

Figure 101A:
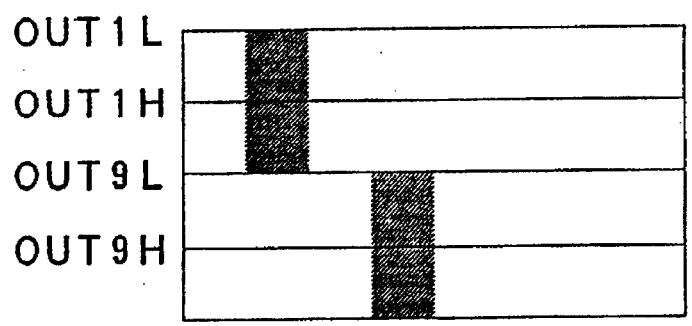
FIGS. 101A, 101B and 101C respectively are diagrams for explaining the defective outputs which are remedied in the mask ROM shown in FIG. 98.
Figure 101B:
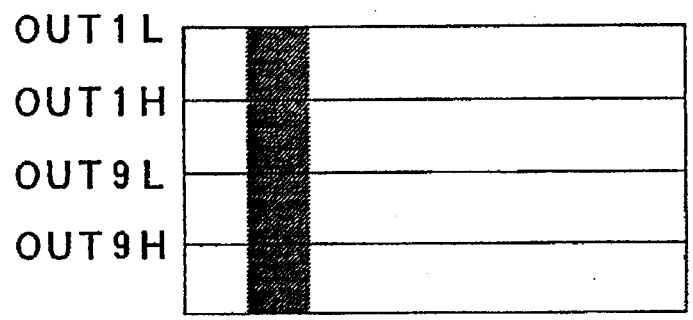
Figure 101C:
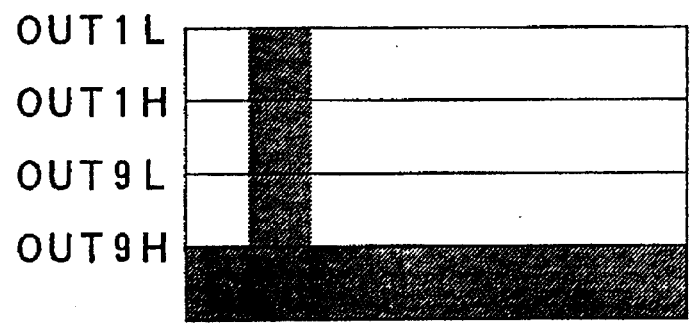

By using the redundant information shown in FIG. 100, it is possible to remedy the output detects or defects indicated by the hatching in FIGS. 101A through 101C. In FIGS. 101A through 101C, it is assumed for the sake of convenience that the defect exists in the main cell array OUT1 and/or the memory cell array OUT9 within the memory cell part 1505. In addition, "L" indicates the main cell array part which is selected by a low-level least significant bit (LSB) of the column address, and "H" indicates the main cell array part which is selected by a high-level LSB of the column address, for example. The "L" and "H" affixed to the parity cell arrays P1L, P1H, P2L and P2H shown in FIG. 98 indicate that these parity cell arrays are provided in correspondence with the main cell array parts having "L" and "H" affixed thereto.

FIG. 101A shows a case where the output defect is remedied in different row addresses of the main cell array OUT1 and the main cell array OUT9. FIG. 101B shows a case where the output defect is remedied in the same row address of the main cell array OUT1 and the main cell array OUT9. In addition, FIG. 101C shows a case where the output defect is remedied in 1 row and 1 column. Accordingly, it is possible to remedy the output defect in up to 3 rows on the row side, and to remedy the output detect in 1 row on the column side.

However, the redundant circuit 1510 includes the redundant address storage circuits 1511 and 1512, the match detection circuit 1513, the output storage circuits 1515 and 1516, the switching output decoding circuit 1517, the switching circuit 1518, the exclusive-OR circuit, the data switching circuit and the like, and the construction of the redundant circuit 1510 is complex. In addition, it is necessary to provide wirings to connect there circuit parts. As a result, it is difficult to reduce the area occupied by the redundant circuit 1510 and the wirings, and a further improvement in the integration density of the mask ROM 1500 cannot be expected.

Furthermore, the row decoder 1504 on the lower side drives the word line of the main cell arrays OUT3, OUT11, OUT7, OUT15, OUT4, OUT12, OUT8 and OUT16 and the parity cell arrays P1L, P1H, P2L and P2H of the memory cell part 1505. Fir this reason, the length of the word line at this part becomes longer than the word line which is driven by the row decoder 1504 on the upper side, and the operation speed at this part with the longer word line becomes slower than that at other parts.

Next, a description will be given of the ninth embodiment of the semiconductor memory device according to the present invention which can eliminate these problems of the ninth conceivable example of the mask ROM described above.

FIG. 102 generally shows the layout of the ninth embodiment. In FIG. 102, a mask ROM 2010 includes a pad and wiring part 2011, a peripheral circuit part 2012, a column decoder 2013, a row decoder 2014, and a memory cell part 2015. The peripheral circuit part 2012 includes an address buffer, a sense amplifier, a redundant circuit, an output buffer and the like which will be described later. The memory cell part 2015 includes main cell arrays OUT1 through OUT16, and redundant parity cell arrays P1 and P2.

The column decoder 2013 includes a plurality of column decoder circuits, and the row decoder 2014 includes a plurality of row decoder circuits. The column decoder circuit and the row decoder circuit provided with respect to the parity cell arrays P1 and P2 are independent of the column decoder circuits and row decoder circuits which are provided with respect to the main cell arrays OUT1 through OUT16. However, it is possible to provide with respect to the parity cell arrays P1 and P2 only the row decoder circuit which is independent of the row decoder circuits provided with respect to the main cell arrays OUT1 through OUT16. In this embodiment, it is assumed for the sake of convenience that the parity cell array P1 is provided with respect to the main cell arrays OUT1 through OUT8, and that the parity cell array P2 is provided with respect to the main cell arrays OUT9 through OUT16.

Figure 103:
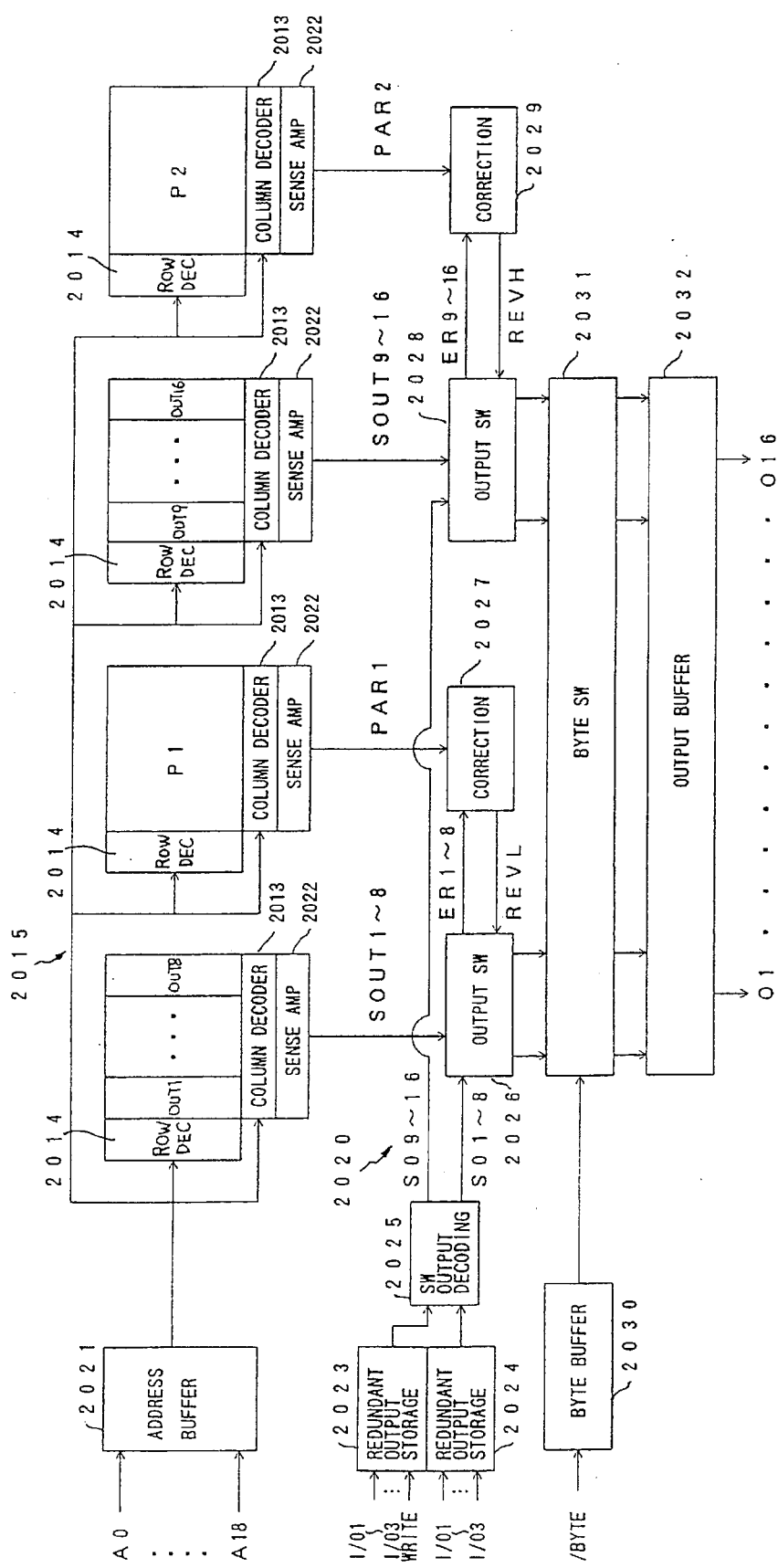
FIG. 103 is a system block diagram showing an important part of the ninth embodiment.

FIG. 103 shows an important part of the mask ROM 2010 shown in FIG. 102. The mask ROM 2010 shown in FIG. 103 includes a redundant circuit 2020, an address buffer 2021, the column decoder 2013 which is formed by the column decoder circuits, the row decoder 2014 which is formed by the row decoder circuits, the memory cell part 2015, a sense amplifier 22, a byte buffer 2030, a byte switching circuit 2031, and an output buffer 2032. For the sake of convenience, the memory cell part 2015, the column decoder 2013, the row decoder 2014 and the sense amplifier 2022 are respectively divided into 4 parts and shown in FIG. 103.

The redundant circuit 2020 includes a redundant output storage circuit 2023 for testing, a redundant output storage circuit 2024, a switching output coding circuit 2025, output switching circuits 2026 and 2028, and correction circuits 2027 and 2029. For example, the redundant output storage circuit 2023 for testing is made up of SRAMs, and the redundant output storage circuit 2024 is made up of programmable fuses. The redundant output storage circuit 2023 for testing is provided for the purpose of checking the operation of the mask ROM 2010 by writing the same information before actually writing the redundant information into the redundant output storage circuit 2024.

The address buffer 2021, the sense amplifier 2022, the redundant circuit 2020, the byte buffer 2030, the byte switching circuit 2031, the output buffer 2032 and the like are provided within the peripheral circuit 2012 shown in FIG. 102.

The data and parity data of the row which is specified by decoding the row address of the input address bits A0 through A18 by the row decoder 2014 are output from the memory cell part 2015. The column decoder 2013 selects and outputs the data bits and parity data bit amounting to 1 address which is specified by decoding the column address, out of the data and parity data output from the memory cell part 2015. The data bits and parity data bit output from the column decoder 2013 are supplied to the output switching circuits 2026 and 2028 and to the correction circuit 2027 and 2029, via the sense amplifier 2022. More particularly, data bits SOUT1 through SOUT8 are supplied to the output switching circuit 2026, and at bits SOUT9 through SOUT16 are supplied to the output switching circuit 2028. In addition, a parity data bit PAR1 is supplied to the correction circuit 2027, and a parity data bit PAR2 is supplied to the correction circuit 2029.

In this ninth embodiment, redundant information shown in FIG. 104 is prestored in the redundant output storage circuit 1024. The redundant information shown in FIG. 104 includes 4 bits, namely a flag JF which indicates the existence of the redundancy and output bits I/O1 through I/O3. As shown in FIG. 105, the output bits I/O1 through I/O3 specify the numbers of the main cell arrays to be remedied, that is, the cell planes to be remedied, depending on the value of each of the bits. For example, if all of the output bits I/O1 through I/O3 are "0", the pair of main cell arrays OUT1 and OUT9 is specified. The redundant information is prestored in the redundant output storage circuit 2024 depending on the results of the test which is made with respect to the mask ROM 2010.

Figure 106:
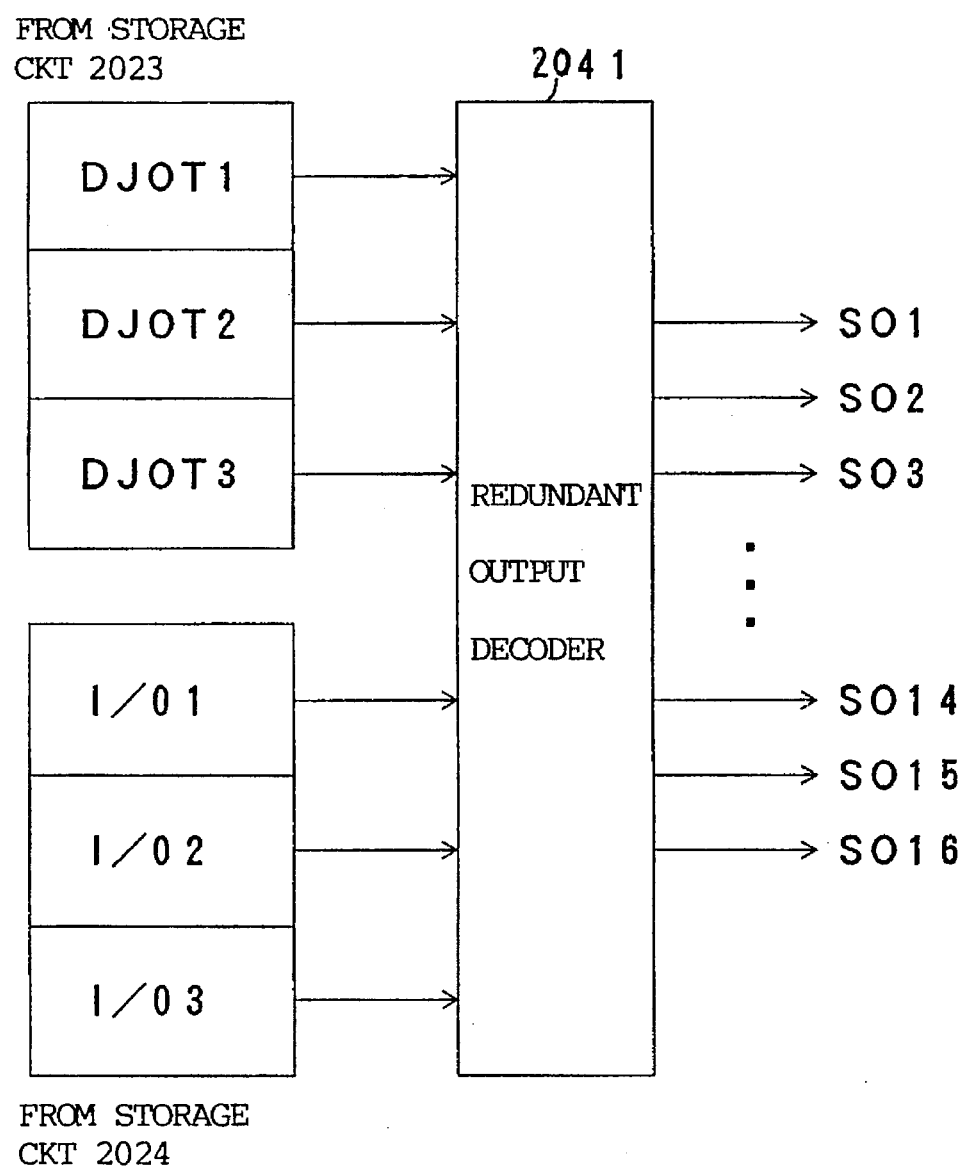
FIG. 106 is a system block diagram showing a switching output decoding circuit of the ninth embodiment.

FIG. 106 shows the construction of the switching output decoding circuit 2025. In FIG. 106, a redundant output decoder 2041 outputs the output data bits SO1 through SO16 regardless of the input address bits A0 through A18. Out of the output data bits SO1 through SO16, the output data bits SO1 through SO8 indicate the redundant output of one of the main cell arrays OUT1 through OUT8, and are supplied to the output switching circuit 2026. In addition, the output data bits SO9 through SO16 indicate the redundant output of one of the main cell arrays OUT9 through OUT16, and are supplied to the output switching output 2028. At the time of the testing, the redundant output decoder 2041 outputs the output data bits SO1 through SO16 based on output bits DJOT1 through DJOT3 from the redundant output storage circuit 2023 for testing.

Figure 107:
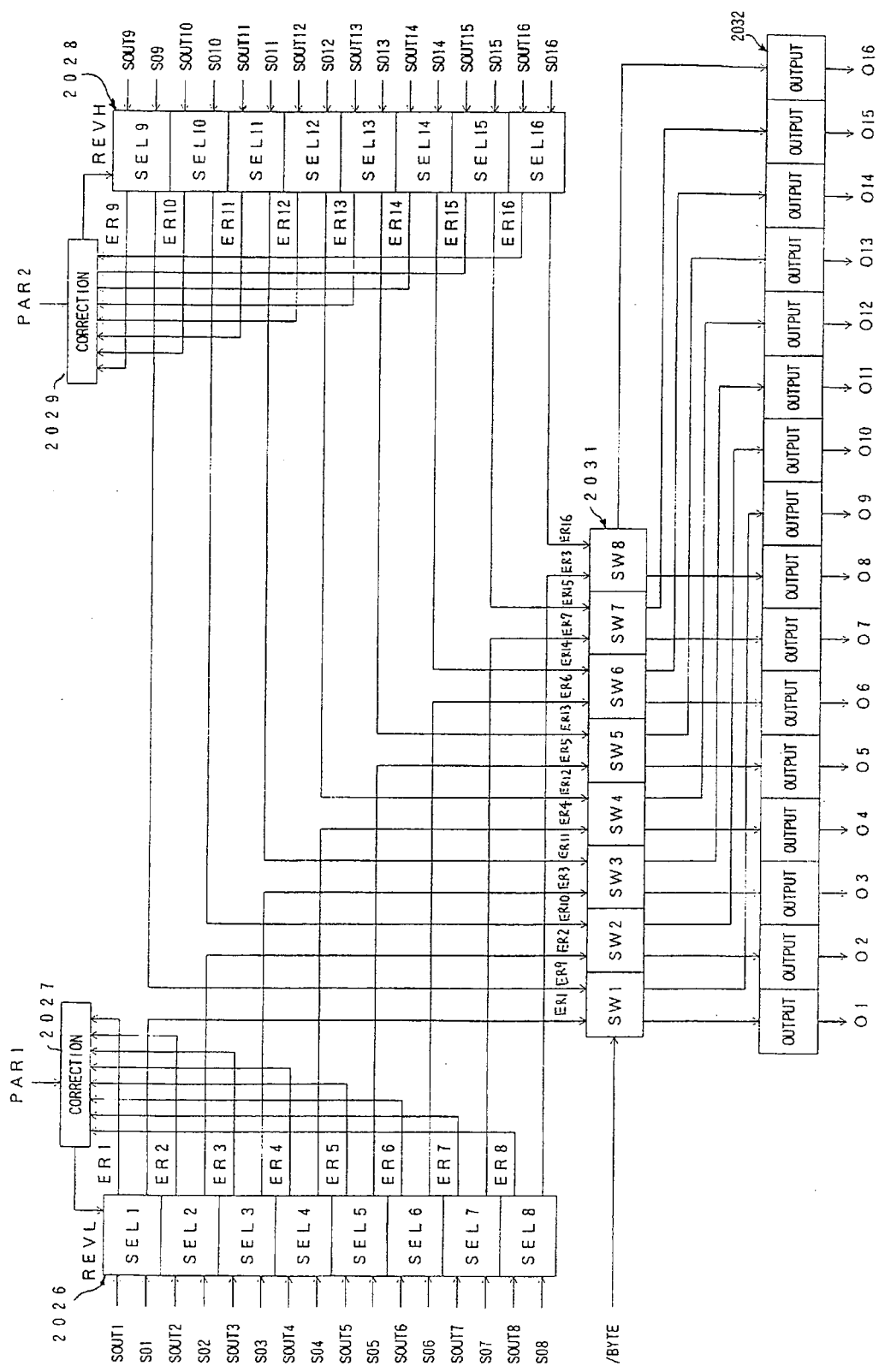
FIG. 107 is a circuit diagram showing an important part of a redundant circuit of the ninth embodiment.

FIG. 107 shows the construction of an important part of the redundant circuit 2020. The output switching circuit 2026 includes selectors SEL1 through SEL8. A selector SELi selects and outputs as an output bit ERi one of the output data bit SOi obtained from the switching output decoding circuit 2025 and the output data bit SOUTi which is read from the main cell array OUTi specified by the input address out of the main cell arrays OUT1 through OUT8 and obtained via the column decoder 2013 and the sense amplifier 2022, depending on a signal REVL from the correction circuit 2027 which will be described later, where i=1, ..., 8. The output bit ERi is supplied to the correction circuit 2027 and to the switching circuit 2031.

Similarly, the output switching circuit 2028 includes selectors SEL9 through SEL16. A selector SELj selects and outputs as an output bit ERj one of the output data bit SOj obtained from the switching output decoding circuit 2025 and the output data bit SOUTj which is read from the main cell array OUTj specified by the input address out of the main cell arrays OUT9 through OUT16 and obtained via the column decoder 2013 and the sense amplifier 2022, depending on a signal REVH from the correction circuit 2029 which will be described later, where j=9, . . . , 16. The output bit ERj is supplied to the correction circuit 2029 and to the switching circuit 2031.

The byte switching circuit 2031 includes switching circuits SW1 through SW8. The switching circuit SW1 receives the output data bits ER1 and ER9 of the selectors SEL1 and SEL9, and the switching circuit SW2 receives the output data bits ER2 and ER10 of the selectors SEL2 and SEL10. The switching circuit SW3 receives the output data bits ER3 and ER11 of the selectors SEL3 and SEL11, and the switching circuit SW4 receives the output data bits ER4 and ER12 of the selectors SEL4 and SEL12. The switching circuit SW5 receives the output data bits ER5 and ER13 of the selectors SEL5 and SEL13, and the switching circuit SW6 receives the output data bits ER6 and ER14 of the selectors SEL6 and SEL14. The switching circuit SW7 receives the output data bits ER7 and ER15 of the selectors SEL7 and SEL15, and the switching circuit SW8 receives the output data bits ER8 and ER16 of the selectors SEL8 and SEL16. Each of the switching circuits SW1 through SW8 have a mode in which only the output data bits ER1 through ER8 amounting to 1 byte are selected and output out of the output data bits ER1 through ER16, and a mode in which all of the output data bits ER1 through ER16 amounting to 2 bytes are output. The mode of the switching circuits SW1 through SW8 is selected by a signal /BYTE.

The output data bits ER1 through ER8 or ER1 through ER16 from the byte switching circuit 2031 are output after being buffered in the output buffer 2032.

Figure 108A:
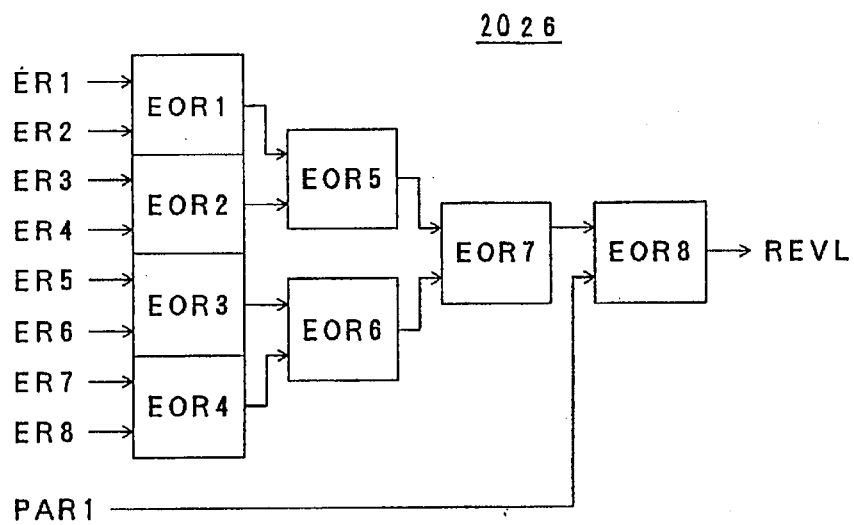
FIG. 108A and 108B respectively are circuit diagrams for explaining correction circuits shown in FIG. 108.

FIG. 108A shows the construction of the correction circuit 2027. The correction circuit 2027 includes exclusive-OR circuits EOR1 through EOR8 which are connected as shown in FIG. 108A. The exclusive-OR circuit EOR1 receives the output bits ER1 and ER2 output from the output switching circuit 2026, the exclusive-OR circuit EOR2 receives the output bits ER3 and ER4 output from the output switching circuit 2026, the exclusive-OR circuit EOR3 receives the output bits ER5 and ER6 output from the output switching circuit 2026, and the exclusive-OR circuit EOR4 receives the output bits ER7 and ER8 output from the output switching circuit 2026. Outputs of the exclusive-OR circuits EOR1 and EOR2 are supplied to an exclusive-OR circuit EOR5, and output of the exclusive-OR circuits EOR3 and EOR4 are supplied to an exclusive-OR circuit EOR6. Outputs of the exclusive-OR circus EOR5 and EOR6 are supplied to an exclusive-OR circuit EOR7. In addition, an output of the exclusive-OR circuit EOR7 and the parity data bit PAR1 which is read from the parity cell array P1 and obtained via the column decoder 2013 and the sense amplifier 2022 are supplied to an exclusive-OR circuit EOR8. The exclusive-OR circuit EOR8 outputs the signal REVL, and this signal REVL is supplied to the output switching circuit 2026.

Figure 108B:
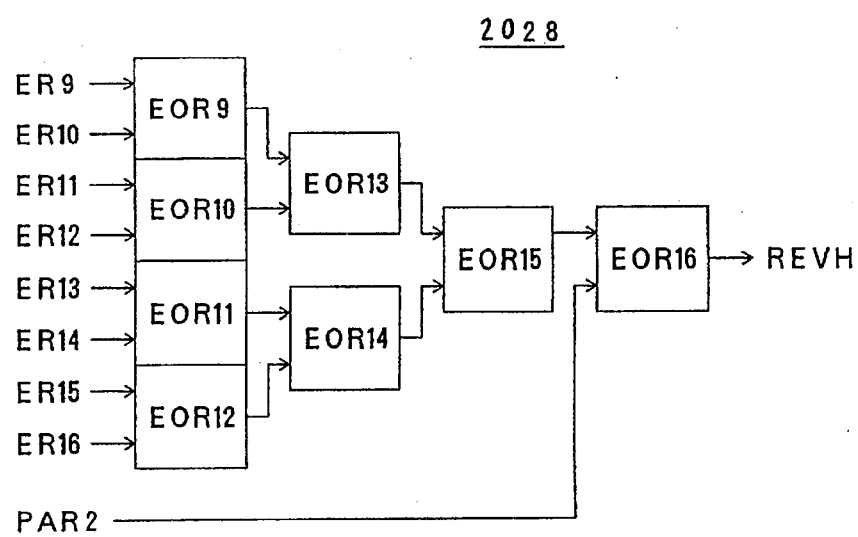

FIG. 108B shows the construction of the correction circuit 2029. The correction circuit 2029 includes exclusive-OR circuits EOR9 through EOR16 which are connected as shown in FIG. 108B. The exclusive-OR circuit EOR9 receives the output bits ER9 and ER10 output from the output switching circuit 2028, the exclusive-OR circuit EOR10 receives the output bits ER11 and ER12 output from the output switching circuit 2028, the exclusive-OR circuit EOR11 receives the output bits ER13 and ER14 output from the output switching circuit 2028, and the exclusive-OR circuit EOR12 receives the output bits ER15 and ER16 output from the output switching circuit 2028. Outputs of the exclusive-OR circuits EOR9 and EOR10 are supplied to an exclusive-OR circuit EOR13, and outputs of the exclusive-OR circuits EOR11 and EOR12 are supplied to an exclusive-OR circuit EOR14. Outputs of the exclusive-OR circuits EOR13 and EOR14 are supplied to an exclusive-OR circuit EOR15. In addition, an output of the exclusive-OR circuit EOR15 and the parity data bit PAR2 which is read form the parity cell array P2 and obtained via the column decoder 2013 and the sense amplifier 2022 are supplied to an exclusive-OR circuit EOR16. The exclusive-OR circuit EOR16 outputs the signal REVH, and this signal REVH is supplied to the output switching circuit 2028.

With regard to the output data bits SOUT1 through SOUT8, the output switching circuit 2026 supplies as the output data bits ER1 through ER8 to the correction circuit 2027 the output data bits SOUT1 through SOUT8 which are read from the main cell arrays OUT1 through OUT8 which are specified by the input address out of the main cell arrays OUT1 through OUT16 and are obtained via the column decoder 2013 and the sense amplifier 2022. In this case, the correction circuit 2027 obtains the exclusive-OR of the output data bits SOUT1 through SOUT8 and the parity data bit PAR1, and outputs the signal REVL which indicates whether or not a 1-bit defect exists. If the signal REVL indicates the 1-bit defect, the output switching circuit 2026 supplies as the output bit ERi to the byte switching circuit 2031 the output bit SOi of the switching output decoding circuit 2025 in place of the defective output bit SOUTi of the memory cell part 2015. As a result, the defective output bit SOUTi is corrected to the output bit SOi and output as the output bit ERi.

Similarly, with regard to the output data bits SOUT9 through SOUT16, the output switching circuit 2028 supplies as the output data bits ER9 through ER16 to the correction circuit 2029 the output data bits SOUT9 through SOUT16 which are read from the main cell arrays OUT9 through OUT16 which are specified by the input address out of the main cell arrays OUT1 through OUT16 and are obtained via the column decoder 2013 and the sense amplifier 2022. In this case, the correction circuit 2029 obtains the exclusive-OR of the output data bits SOUT9 through SOUT16 and the parity data bit PAR2, and outputs the signal REVH which indicates whether or not a 1-bit defect exists. If the signal REVH indicates the 1-bit defect, the output switching circuit 2028 supplies as the output bit ERj to the byte switching circuit 2031 the output bit SOj of the switching output decoding circuit 2025 in place of the defective output bit SOUTj of the memory cell part 2015. As a result, the defective output bit SOUTHj is corrected to the output bit SOj and output as the output bit ERj.

Figure 109:
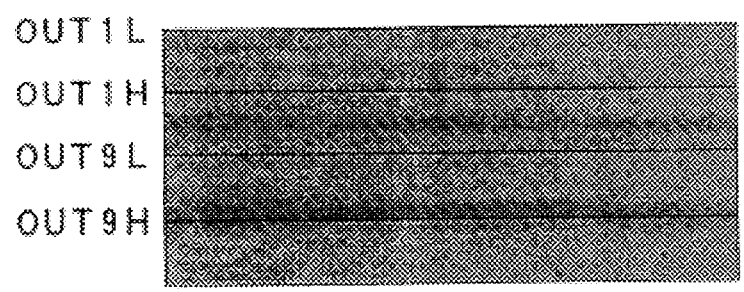
FIG. 109 is a diagram for explaining the defective outputs which are remedied in the ninth embodiment.

In this ninth embodiment, if it is assumed for the sake of convenience that the defect exists in the main cell array OUT1 and/or the main cell array OUT9 within the memory cell part 2015, the output of the memory cell arrays OUT1 and OUT9 including the defective bit, that is, the outputs of the 2 cell planes in their entirety, are replaced by the outputs of the parity cell arrays P1 and P2 and remedied, as indicated by the hatching in FIG. 109. In FIG. 109, "L" indicates the main cell array part which is selected b the low-level LSB of the column address, for example, and "H" indicates the main cell array part which is selected by the high-level LSB of the column address, for example.

In other words, as described above in conjunction with FIGS. 101A through 101C, the ninth conceivable example of the mask ROM requires the redundant information made up of the address bits a1 through a4, the flag JF and the output bits o1 through o3, even when 1 defect is to be remedied. However, although only 1 defect can be remedied according to this ninth embodiment, this ninth embodiment only requires the 4-bit redundant information made up of the flag JF and the output bits I/O1 through I/O3. As a result, this ninth embodiment does not require the redundant address storage circuit 1511 for testing, the redundant address storage circuit 1512, the match detection circuit 1513, the switching circuit 1518 and the wirings related thereto, although such elements are essential in the case of the ninth conceivable example of the mask ROM. Therefore, the construction of the redundant circuit 2020 according this ninth embodiment is simple compared to the construction of the redundant circuit 1510 according to the ninth conceivable example of the mask ROM.

Furthermore, in FIG. 102, the row decoder circuit provided on the upper side exclusively for the parity cell arrays P1 and P2 are independent of the 2 row decoder circuits provided on the lower side with respect to the main cell arrays OUT1 through OUT16. For this reason, the length of the word line which is driven by the row decoder circuit provided on the upper side exclusively for the parity cell arrays P1 and P2 will not become longer than the word lines which are driven by the 2 row decoder circuits provided on the lower side with respect to the main cell arrays OUT1 through OUT16. Consequently, the operation speed of the mask ROM 2010 will not differ greatly among the various parts of the memory cell part 2015.

Next, a description will be given of a tenth conceivable example of the mask ROM, so as to facilitate the understanding of a tenth embodiment of the semiconductor memory device according to the present invention.

Figure 110:
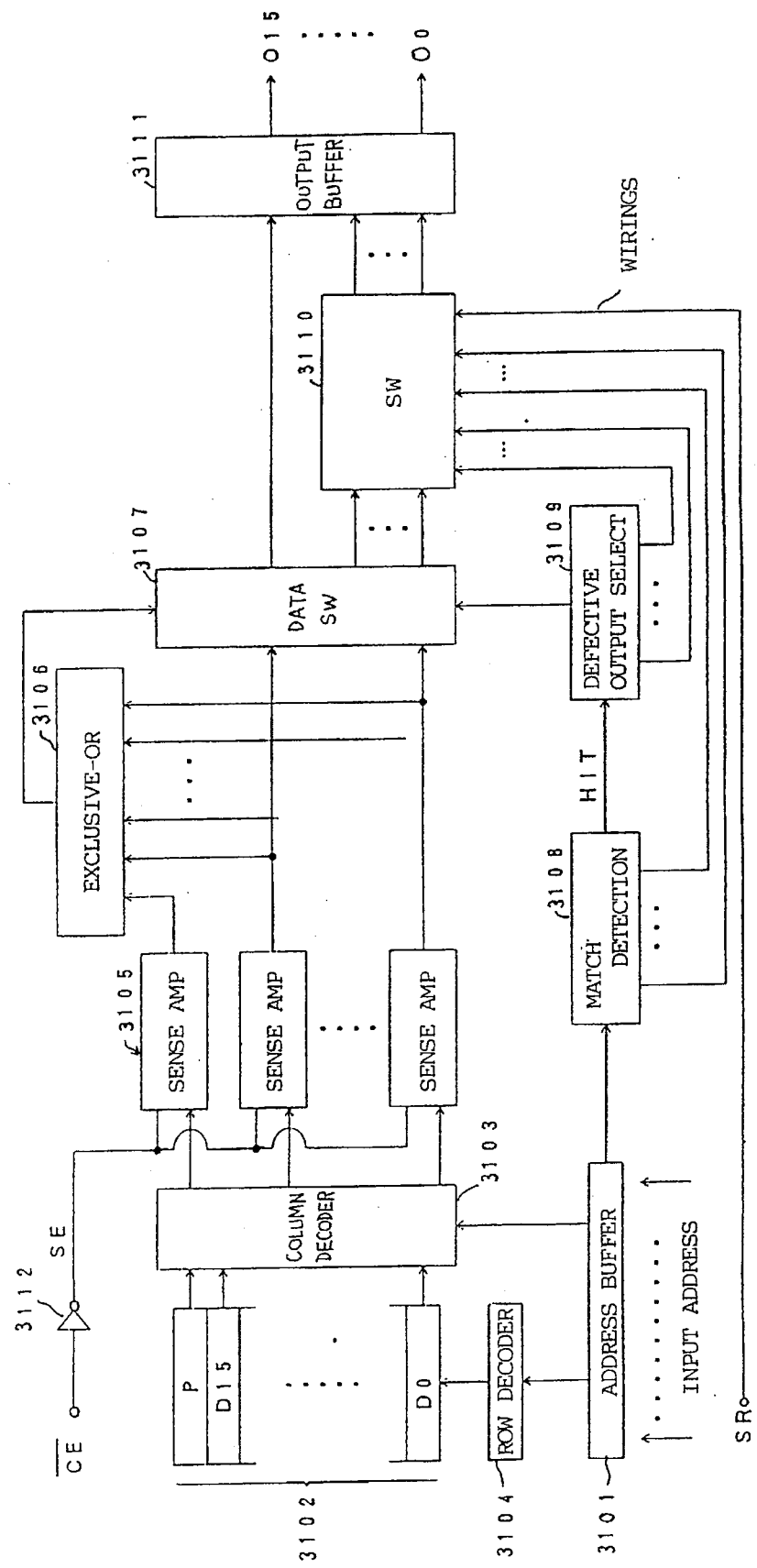
FIG. 110 is a system block diagram showing an important part of a tenth conceivable example of the mask ROM.

FIG. 110 shows an important part of the tenth conceivable example of the mask ROM. The mask ROM shown in FIG. 110 includes an address buffer 3101 to which the address is input, a memory cell part 3102, a column decoder 3103, a row decoder 3104, a sense amplifier part 3105, an exclusive-OR circuit 3106, a data switching circuit 3107, a match detection part 3108, a defective output selection part 3109, a switching circuit 3110, an output buffer 3111, and an inverter circuit 3112.

The column decoder 3103 and the row decoder 3104 respectively decode the column address and the row address of the input address. The column decoder 3103 decodes the column address and selects the column of the memory cell part 3102. The row decoder 3104 decodes the row address and selects the row, that is, the word line, of the memory cell part 3102.

The memory cell part 3102 includes memory cells for storing data and memory cells for storing parity data bits. The data and parity data of the row which is specified by the decoding of the row address in the row decoder 3014 are output from the memory cell part 3102. The column decoder 3103 selects and outputs the data bits D0 through D15 and the parity data bit P amounting to 1 address specified by the decoding of the column address, out of the data and parity data output from the memory cell part 3102. The parity data bit P is supplied to the exclusive-OR circuit 3106 via the sense amplifiers of the sense amplifier part 3105, and the data bits D0 through D15 are supplied to the exclusive-OR circuit 3106 and to the data switching circuit 3107 via the sense amplifiers of the sense amplifier part 3105.

Out of the input address, a part of the row address is also supplied to the match detection part 3018. This match detection part 3018 includes a match detection circuit (not shown) for supplying a high-level match detection signal HIT to the defective output selection part 3109 when the part of the row address matches a prestored defective address (redundant address). The defective address is prestored in a memory means (not shown) within the match detection part 3108 depending on the results of the test which is made after production of the mask ROM, and is supplied to the match detection circuit and to the switching circuit 3110.

The defective output selection part 3109 includes memory means (not shown) for prestoring a defective output number data related to the number of the defective output of the memory cell part 3102 depending on the results of the test which is made after production of the mask ROM, and a means (not shown) for supplying to the data which indicates the defective output, that is, the defective bit, based on the output signal of this memory means of the detective output selection part 3109. The defective output number data from the defective output selection part 3109 is supplied to the switching circuit 3110.

The data switching circuit 3107 corrects and outputs the data of the defective bit indicated by the defective output selection data from the defective output selection part 3109 depending on the parity check result output from the exclusive-OR circuit 3106.

The switching circuit 3110 supplies the data received for the data switching circuit 3107 to he output buffer 3111 as they are when a signal SR has a low level. On the other hand, when the signal SR has a high level, the switching circuit 3110 outputs the defective address data supplied from the match detection part 3108 and the defective output number data supplied from the defective output selection part 3109 to the output buffer 3111, regardless of the data supplied from the data switching circuit 3107.

The signal SR indicates a signature read mode. The signature read mode is an operation mode in which the stored defective address and the defective output number are read.

Each of the sense amplifiers forming the sense amplifier part 3103 become active only during a high-level period of a sense amplifier enable signal SE. This sense amplifier enable signal SE is obtained by inverting a chip enable signal /CE input to the mask ROM by the inverter circuit 3112. The chip enable single /CE enables operation of the mask ROM. When the sense amplifier enable signal SE has the low level, each sense amplifier enters a standby mode and the output of each sense amplifier is fixed to the high level.

The output buffer 3111 buffers the data bits D0 through D15 output from the data switching circuit 3107 and the switching circuit 3110.

However, according to the tenth conceivable example of the mask ROM, there is a problem in that wirings must be provided exclusively for the defective address and the defective output number data, because of the need to supply the defective address and the defective output number data from the match detection part 3108 and the defective output selection part 3109 to the switching circuit 3110. As a result, it is difficult to reduce the area occupied by the redundant circuit and the wirings, and a further improvement in the integration density of the mask ROM cannot be expected.

The tenth embodiment of the semiconductor memory device according to the present invention solves these problems of the tenth conceivable example of the mask ROM.

First, a description will be given of the operating principle of the tenth embodiment, by referring to FIG. 111.

Figure 111:
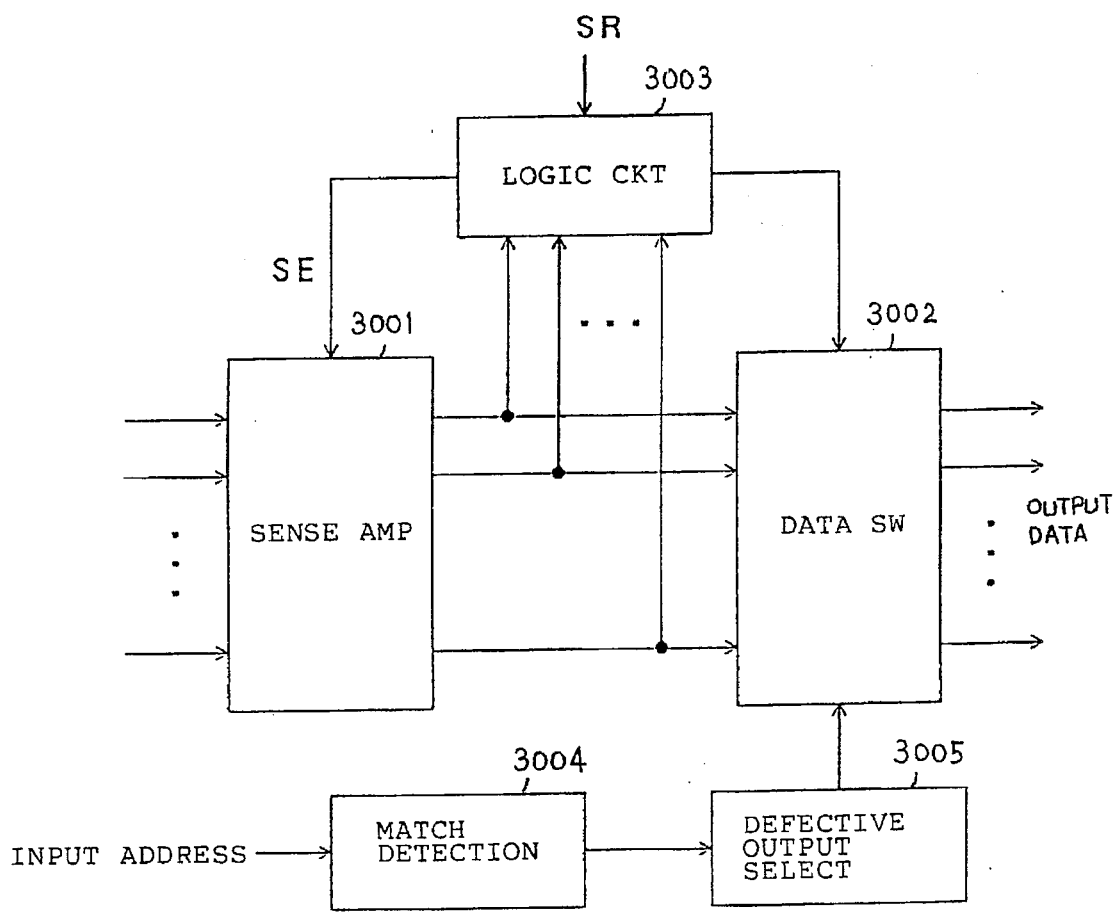
FIG. 111 is a system block diagram for explaining the operating principle of a tenth embodiment of the semiconductor memory device according to the present invention.

In FIG. 111, a semiconductor memory device includes a sense amplifier means 3001, a data switching means 3002, a logic circuit means 3003, a match detection means 3004, and a defective output selection means 3005.

The sense amplifier means 3001 in the active state amplifies the output data read from a memory cell part (not shown) and supplies the amplified output data to the data switching means 3002. On the other hand, in the active state, the sense amplifier means 3001 supplies output data having a fixed first logic level to the data switching means 3002.

The match detection means 3004 supplies a match detection signal to the defective output selection means 3005 when an input address and a prestored defective address match. The defective output selection means 3005 supplies to the data switching means 3002 a defective output selection data which is prestored and indicates the defective output, in response to the match detection signal.

The logic circuit means 3003 supplies to the sense amplifier means 3001 a first signal SE which makes the sense amplifier means 3001 active based on a mode signal SR which indicates the signature read mode. In the signature read mode, the defective address data stored in the match detection means 3004 and the defective output number data stored in the defective output detection means 3005 are read. In addition, the logic circuit means 3003 supplies to the data switching means 3002 a second signal which indicates a parity check result based on the mode signal SR and the output data and parity data read from the memory cell part.

The logic circuit means 3003 may include a NOR circuit 3025 which generates a first signal SE based on the mode signal SR and a chip enable signal /CE which enables the operation of the semiconductor memory device.

It is possible to further provide a circuit which includes elements Q1 through Q6, R, 3051 and 3052 and is coupled to first and second power supply voltages Vcc and Vss, to generate the mode single SR based on the chip enable signal /CE which gas a voltage higher than the first power supply voltage Vcc, where the first power supply voltage Vcc is higher than the second power supply voltage Vss.

The logic circuit means 3003 may include an exclusive-OR circuit 3016 for outputting a parity check result based on the output data and parity data read from the memory cell part, and an AND circuit 3021 for generating the second signal based on the parity check result and an inverted signal of the mode signal SR.

In addition, the match detection means 3004 may include first memory means 3181 and 3182 for prestoring the defective address, the defective output selection means 3005 may include second memory means 3191 and 3192 for prestoring the defective output, and the first and second memory means 3181, 3182, 3191 and 3192 may include rewritable memory circuit means 3182 and 3192 which is used exclusively for testing.

The logic circuit means 3003 supplies to the data switching means 3002 the second signal having the second logic level which is opposite to the first logic level when the mode signal SR is input.

In addition, with respect to the defective bit which is indicated by the defective output selection data from the defective output selection means 3005, the data switching means 3002 outputs the second signal from the logic circuit means 3003 in place of the output data from the sense amplifier means 3001.

As a result, a logic level different from the other output is output only for the defective output which is stored as the defective output, only when the input address matches the redundant address. For this reason, it is possible to know the contents of the defective address and the detective output from the input address and the output data of the data switching means 3002.

If the logic circuit means 3003 includes the NOR circuit 3025 which generates the first signal SE based on the mode signal SR and the chip enable signal /CE which enables the operation of the semiconductor memory device, it is possible to control the sense amplifier means 3001 by a simple circuit.

If the circuit which includes elements Q1 through Q6, R, 3051 and 3052 and is coupled to first and second power supply voltages Vcc and Vss, is additionally provided to generate the mode signal SR based on the chip enable signal /CE which has a voltage higher than the first power supply voltage Vcc, where the first power supply voltage Vcc is higher than the second power supply voltage Vss, it is possible to specify the signature read mode from the outside without increasing the number of terminals (pins) of the semiconductor memory device.

The construction of the semiconductor memory device becomes simple if the logic circuit means 3003 includes the exclusive-OR circuit 3016 for outputting the parity check result based on the output data and parity data read from the memory cell part, and the AND circuit 3021 for generating the second signal based on the parity check result and the inverted signal of the mode signal SR.

In addition, if the match detection means 3004 includes the first memory means 3181 and 3182 for prestoring the defective address, the defective output selection means 3005 includes the second memory means 3191 and 3192 for prestoring the defective output, and the first and second memory means 3181, 3182, 3191 and 3192 include the rewritable memory circuit means 3182 and 3192 which is used exclusively for testing, it is possible to use the selectively use the rewritable memory circuit means 3182 and 3192.

Therefore, according to this tenth embodiment, it is unnecessary to provide the switching circuit and the wirings to this switching circuit, which are essential in the case of the tenth conceivable example of the mask ROM. As a result, it is possible to reduce the area occupied by the redundant circuit and the wirings, and thus, the integration density of the semiconductor memory device can further be improved.

Figure 112:
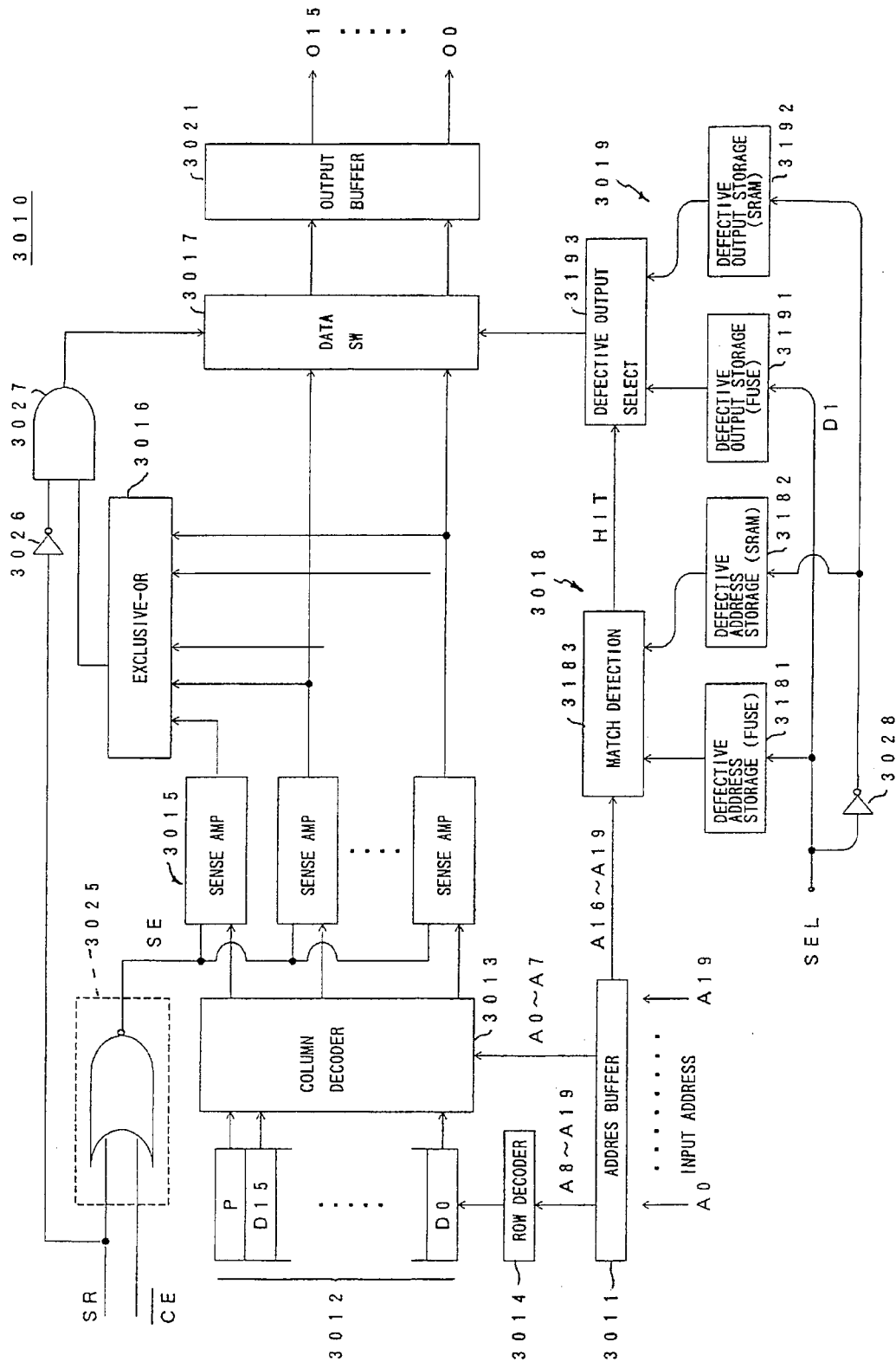
FIG. 112 is a system block diagram showing an important part of the tenth embodiment.

FIG. 112 shows an important part of the tenth embodiment of the semiconductor memory device according to the present invention. A mask ROM 3010 shown in FIG. 112 includes an address buffer 3011 to which the address is input, a memory cell part 3012, a column decoder 3013, a row decoder 3014, a sense amplifier part 3015, an exclusive-OR circuit 3016, a data switching circuit 3017, a match detection part 3018, a defective output selection part 3019, an output buffer 3021, a NOR circuit 3025, inverter circuits 3026 and 3028, and an AND circuit 3027. The match detection part 3018 includes a defective address storage circuit 3181 made up of fuses, and a defective address storage circuit 3182 made up of SRAMs. In addition, the defective output selection part 3019 includes a defective output storage circuit 3191 made up of fuses, a defective output storage circuit 3192 made up of SRAMs, and a defective output selection circuit 3193.

The exclusive-OR circuit 3016, the NOR circuit 3025, the inverter circuit 3026 and the AND circuit 3027 correspond to the logic circuit means 3003 shown in FIG. 111.

The column decoder 3013 and the row decoder 3014 respectively decode the column address bits A0 through A7 and the row address bits A8 through A19 of the input address bits A0 through A19, for example. The column decoder 3013 decodes the column address bits A0 through A7, and selects the column of the memory cell part 3012. The row decoder 3014 decodes the row address bits A8 through A19, and selects the row, that is, the word line of the memory cell part 3012.

The memory cell part 3012 includes memory cells for storing data, and memory cells for storing parity data. The data and parity data of the row which is specified by decoding the row address bits A8 through A19 in the row decoder 3014 are output from the memory cell part 3012. The column decoder 3013 selects and outputs the data bits D0 through D15 and the parity data bit P amounting to 1 address which is specified by decoding the column address bits A0 through A7, out of the data and parity data output from the memory cell part 3012. The parity data bit P is supplied to the exclusive-OR circuit 3016 via the sense amplifiers of the sense amplifier part 3015, and the data bits D0 through D15 are supplied to the exclusive-OR circuit 3016 and to the data switching circuit 3017 via the sense amplifiers of the sense amplifier part 3015.

Out of the input address bits A0 through A19, the bits A16 through A19 which are a part of the row address are also supplied to the match detection circuit 3183 of the match detection part 3018. The match detection circuit 3183 supplies a high-level match detection signal HIT to the defective output selection part 3019 when the row address bits A16 through A19 match the defective address bits (redundant address bits) prestored in the defective address storage circuit 3181 or 3182. The defective address bits are prestored in the defective address storage circuit 3181 or 3182 depending on the results of the test which is made after production of the mask ROM 3010, and are supplied to the match detection circuit 3183.

The defective output storage circuits 3191 and 3192 within the defective output selection part 3019 prestore the defective output number of the memory cell part 3012 depending on the results of the test which is made after production of the mask ROM 3010. The detective output selection circuit 3193 output the defective output selection data indicating the defective output, that is, the defective bits, depending on the match detection signal HIT from the match detection circuit 3183, based on the output of the defective output storage circuit 3191 or 3192. The defective output selection data from the defective output selection circuit 3193 is supplied to the data switching circuit 3017.

A select signal SEL is supplied directly to the storage circuits 3181 and 3191, and is also supplied to the storage circuits 3182 and 3192 via the inverter circuit 3028. Hence, the outputs of the storage circuits 3181 and 3191 or, the outputs of the storage circuits 3182 and 3192, are respectively supplied to the match detection circuit 3183 and the defective output selection circuit 3193 depending on the level of the select signal SEL.

Each sense amplifier of the sense amplifier part 3013 becomes active and operates only during a high-level period of a sense amplifier enable signal SE which is obtained by taking the NOR of a signature read signal SR and a chip enable signal /CE input to the mask ROM 3010 in the NOR circuit 3025. The chip enable signal /CE enables the operation of the mask ROM 3010. When the sense amplifier enters the standby mode and the output of each sense amplifier is fixed to the high level.

The data switching circuit 3017 receives the parity check results output from the exclusive-OR circuit 3016 via the AND circuit 3027 and the defective output selection data output from the defective output selection circuit 3193. Hence, when the high-level match detection signal HIT is supplied from the match detection circuit 3183 to the defective output selection circuit 3193, the data switching circuit 3017 corrects and outputs the defective bit of the data bits D0 through D15 output from the sense amplifier part 3015 based on the output of the AND circuit 3027.

The signature read signal SR is supplied to the AND circuit 3027 via the inverter circuit 3026. Accordingly, when the signature read signal SR has the high level to indicate the signature read mode, a low-level signal is supplied from the AND circuit 3027 to the data switching circuit 3017.

The output buffer 3021 buffers the data bits D0 through D15 output from the data switching circuit 3017.

In other words, when the signature read signal SR has the high level, each sense amplifier of the sense amplifier part 3015 is in the standby mode and the output data of each sense amplifier is fixed to the high level. On the other hand, the low-level signal is supplied from the AND circuit 3027 to the data switching circuit 3017 because the signature read signal SR has the high level. However, when the input address and the defective address match and the high-level match detection signal HIT is output from the match detection circuit 3183, the corresponding defective output selection data is supplied from the defective output selection circuit 3193 to the data selection circuit 3017. Hence, with regard to the defective output bit, the data switching circuit 3017 outputs the low-level signal from the AND circuit 3027 in place of the high-level output data bit of the sense amplifier of the sense amplifier part 3015. Therefore, it is possible to know the contents of the defective address and the defective output from the input address and the output data.

The construction of the address buffer 3011, the memory cell part 3012, the column decoder 3013, the row decoder 3014, the sense amplifier part 3015, the exclusive-OR circuit 3016, the data switching circuit 3017, the match detection part 3018, the defective output selection part 3019, the output buffer 3021 and the like may be the same as that of the tenth conceivable example of the mask ROM shown in FIGS. 103 and 107, and illustration and description thereof will be omitted.

In this tenth embodiment, the rewritable storage circuits 3182 and 3192 are provided exclusively for testing. However, it is of course possible to remedy the defective memory cell if there exist a means for storing the defective address and a means for storing the defective output.

Figure 113:
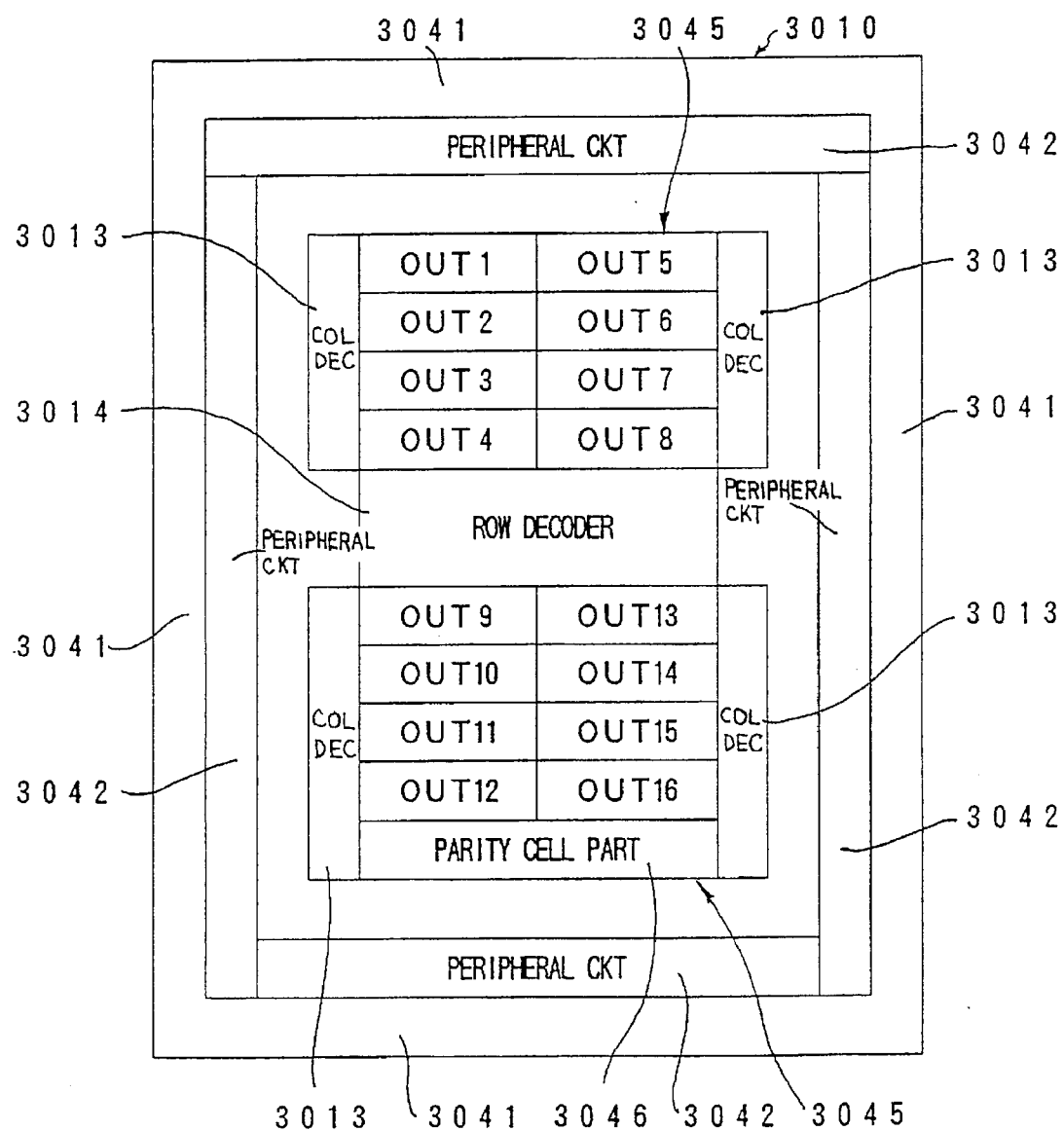
FIG. 113 is a plan view generally showing the layout of the tenth embodiment.

FIG. 113 shows the layout of the tenth embodiment. As shown in FIG. 113, the mask ROM 3010 includes a pad and wiring part 3041, a peripheral circuit part 3042, the column decoder 3013, the row decoder 3014, a main cell part 3045, and a parity cell part 3046.

The main cell part 3045 includes main cell arrays OUT1 through OUT16, and the column decoder 3013 includes a plurality of column decoder circuits having an arrangement corresponding to the main cell arrays OUT1 through OUT16. In addition, the row decoder 3014 includes a plurality of row decoder circuits which are arranged so as to drive a word line which traverses 8 memory cell arrays (8 planes). The parity cell part 3046 includes redundant parity cells for storing the parity data. The main cell part 3045 and the parity cell part 3046 form the memory cell part 3012 shown in FIG. 112.

The sense amplifier part 3015, the exclusive-OR circuit 3016, the data switching circuit 3017, the match detection part 3018, the defective output selection part 3019, the output buffer 3021 and the like shown in FIG. 112 are provided within the peripheral circuit part 3042 shown in FIG. 113.

Figure 114:
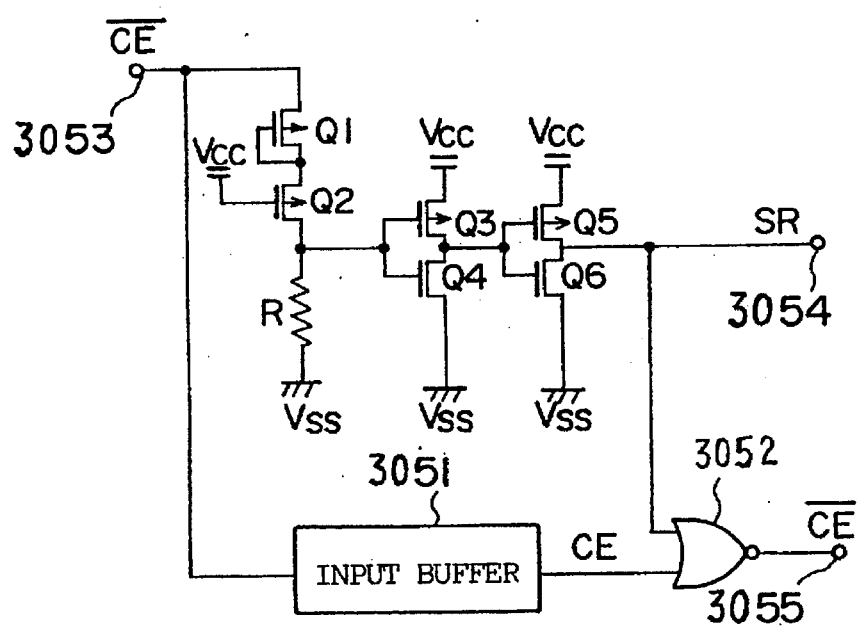
FIG. 114 is a circuit diagram showing the construction of a circuit for generating a chip enable signal and a signature read signal in the tenth embodiment.

FIG. 114 shows the construction of a circuit for generating the chip enable signal /CE and the signature read signal SR shown in FIG. 112. This circuit is provided within the peripheral circuit part 3042 shown in FIG. 113.

The circuit shown in FIG. 114 includes transistors Q1 through Q6, a resistor R, an input buffer 3051, and a NOR circuit 3052 which are connected as shown. A power supply voltage Vcc is set higher than a power supply voltage Vss. A chip enable pad 3053 is provided within the pad and wiring part 3041 shown in FIG. 113.

When putting the operation mode of the mask ROM 3010 into the signature read mode, a voltage higher than the power supply voltage Vcc is applied to the chip enable pad 3053 from the outside as the chip enable signal /CE. In this case, a high-level signature read signal SR is output from a terminal 3054, and a low-level chip enable signal /CE is output from a terminal 3055. On the other hand, when a low-level chip enable signal /CE is applied to the chip enable pad 3053 from the outside, a low-level signature read signal SR is output from the terminal 3054 and a low-level chip enable signal /CE is output from the terminal 3055.

Accordingly, by applying from the outside the voltage which is higher than the power supply voltage Vcc to the existing chip enable pad 3053 as the chip enable signal /CE, it is possible to specify the signature read mode from the outside without having to increase the number of terminals (pins) of the mask ROM 3010.

Figure 115:
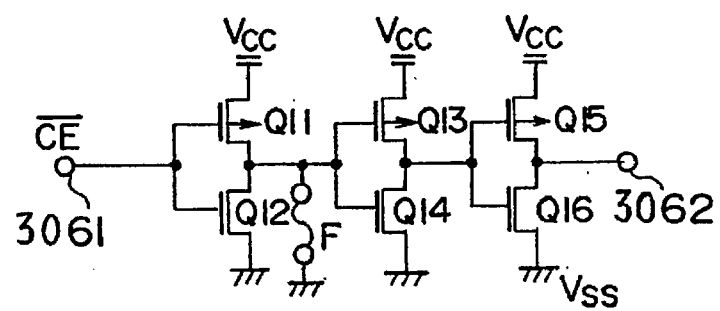
FIG. 115 is a circuit diagram showing the construction of a storage circuit of a defective output storage circuit for 1 bit in the tenth embodiment.

FIG. 115 shows the construction of a storage circuit of the defective output storage circuit 3181 or 3191 shown in FIG. 112 for 1 bit. This storage circuit includes transistors Q11 through Q16, and a fuse F which are connected as shown in FIG. 115. The power supply voltage Vcc is set higher than the power supply voltage Vss. The signal level (stored data value) output from a terminal 3062 when the chip enable signal /CE is applied to a terminal 3061 differs depending on whether or not the fuse F is cut. Hence, by using such a storage circuit, it is possible to supply the prestored defective address to the match detection circuit 3183 and to supply the prestored defective output to the defective output selection circuit 3193.

Further, the present invention is not limited to these embodiments, but various variations and modifications may be made without departing from the scope of the present invention.

What is claimed is:

1. A semiconductor memory device comprising:

input terminals receiving a chip enable signal and an address signal, each having active and inactive levels and undergoing transitions therebetween;

a controlled circuit coupled to said input terminals and responsive to the chip enable signal, said controlled circuit being deactivated in response to the inactive level of the chip enable signal and being activated in response to the active level of the chip enable signal; and a control signal generating circuit generating a corresponding control signal which causes an output of the semiconductor memory device to occur at an identical time interval, regardless of the level of the address signal, after the chip enable signal undergoes a transition from an inactive level to an active level.

2. A semiconductor memory device comprising:

input terminals receiving a chip enable signal and an address signal, each having active and inactive levels and undergoing transitions therebetween;

a controlled circuit coupled to said input terminals and responsive to the chip enable signal, said controlled circuit being deactivated by the inactive level of the chip enable signal and being activated by the active level of the chip enable signal;

a chip enable pulse signal generating circuit generating, and producing as an output thereof, a chip enable pulse signal having a predetermined pulse width when the chip enable signal undergoes a transition from an inactive level to an active level;

an address pulse signal generating circuit generating an address pulse signal having a predetermined pulse width if the chip enable signal undergoes the transition from the inactive level to the active level when the address signal has a first level out of first and second levels, and generating no address pulse signal if the chip enable signal undergoes the transition from the inactive level to the active level when the address signal has the second level;

an address pulse signal passing-through control circuit producing an output in accordance with controlling passing of the address pulse signal output from said address pulse signal generating circuit so as not to pass the address pulse signal if the chip enable signal undergoes the transition from the inactive level to the active level when the address signal has the first level; and a control signal generating circuit generating a control signal comprising a logical sum of the respective outputs of said address pulse signal passing-through control circuit and said chip enable pulse signal generating circuit.

3. The semiconductor memory device as claimed in claim 2, wherein said address pulse signal passing-through control circuit generates an address pulse signal passing-through control signal based on the chip enable signal and a delayed chip enable signal which is delayed by a predetermined time relative to the chip enable signal, and controls the passing of the address pulse signal output from said address pulse signal generating circuit, based on the address pulse signal passing-through control signal.

4. The semiconductor memory device as claimed in claim 2, wherein said address pulse signal passing-through control circuit generates an address pulse signal passing-through control signal based on the chip enable pulse signal and a delayed chip enable pulse signal which is delayed by a predetermined time relative to the chip enable pulse signal, and controls the passing of the address pulse signal output from said address pulse signal generating circuit based on the address pulse signal passing-through control signal.

5. The semiconductor memory device as claimed in claim 2, wherein said address pulse signal passing-through control circuit, further, generates an address pulse signal passing-through control signal, based on the chip enable pulse signal and the address pulse signal, and controls the passing of the address pulse signal output from said address pulse signal generating circuit, based on the address pulse signal passing-through control signal.

6. A semiconductor memory device comprising:

input terminals receiving a chip enable signal and an address signal, each having active and inactive levels and undergoing transitions therebetween;

a controlled circuit coupled to said input terminals and responsive to the chip enable signal, said controlled circuit being deactivated by the inactive level of the chip enable signal and being activated by the active level of the chip enable signal;

a chip enable pulse signal generating circuit generating, and producing as an output thereof, a chip enable pulse signal having a predetermined pulse width when the chip enable signal undergoes a transition from an inactive level to an active level;

an address pulse signal generating circuit generating, and producing as an output thereof, an address pulse signal when the chip enable signal undergoes the transition from the inactive level to the active level, regardless of a level of the address signal; and a control signal generating circuit generating a corresponding control signal by carrying out a logical sum process on respective output of said address pulse signal generating circuit and said chip enable pulse signal generating circuit.

7. The semiconductor memory device as claimed in claim 6, wherein said address pulse signal generating circuit comprises means for generating the address pulse signal based on the address signal that is received by the input terminals when the chip enable signal undergoes the transition from the inactive level to the active level, and an inverted address signal that is inverted from the address signal, said address signal and said inverted address signal being settled with a timing lagging the transition of the chip enable signal.

* * * * *

UNITED STATES PATENT AND TRADEMARK OFFICE
CERTIFICATE OF CORRECTION

PATENT NO.   : 5,661,694
DATED        : Aug. 26, 1997
INVENTOR(S)  : FUKUTANI et al.

It is certified that error appears in the above-identified patent and that said Letters Patent is hereby corrected as shown below:

Col. 1, line 57, change "and" to --an-- (both occurrences).

Col. 2, line 46, change "circuit 41" to --circuit 42--.

Col. 6, line 31, change "118" to --117--;
line 33, change "118" to --117--.

Signed and Sealed this

Thirtieth Day of December, 1997

Attest:

BRUCE LEHMAN

Attesting Officer

Commissioner of Patents and Trademarks